US006966040B2

(12) United States Patent
Ismailov

(10) Patent No.: US 6,966,040 B2
(45) Date of Patent: Nov. 15, 2005

(54) SYSTEMS AND METHODS FOR OPERATING AN ELECTROMAGNETIC ACTUATOR

(75) Inventor: Murad Ismailov, Lansing, MI (US)

(73) Assignee: Combustion Dynamics Corp., New York, NY (US)

( * ) Notice: Subject to any disclaimer, the term of this patent is extended or adjusted under 35 U.S.C. 154(b) by 118 days.

(21) Appl. No.: 10/634,436

(22) Filed: Aug. 5, 2003

(65) Prior Publication Data

US 2004/0181760 A1 Sep. 16, 2004

Related U.S. Application Data

(63) Continuation-in-part of application No. 10/389,183, filed on Mar. 14, 2003, now abandoned.

(51) Int. Cl.[7] .......... G06F 17/50

(52) U.S. Cl. .......... 716/1; 703/2; 703/14

(58) Field of Search .......... 716/1; 703/2, 14; 123/90.11; 318/254–255; 360/78.04, 69, 78.12; 250/515.1, 505.1; 251/257–263, 274

(56) References Cited

U.S. PATENT DOCUMENTS

| | | | | | |
|---|---|---|---|---|---|
| 6,479,954 | B1 | * | 11/2002 | Peritore et al. | 318/254 |
| 6,788,490 | B2 | * | 9/2004 | Schillaci et al. | 360/78.04 |
| 6,810,841 | B1 | * | 11/2004 | Peterson et al. | 123/90.11 |
| 6,812,476 | B1 | * | 11/2004 | Alexandre | 250/515.1 |

OTHER PUBLICATIONS

Compter et al., "Direct 3–D Method for Performance Prediction of a Linear Moving Coil Actuator with Various Topologies," IEEE, Jul. 2003, pp. 183–191.*

Y. Wang et al., "Modeling and Control of Electromechanical Valve Actuator," SAE 2002–01–1106, 2002, pp. 1–10.*

* cited by examiner

*Primary Examiner*—Vuthe Siek
(74) *Attorney, Agent, or Firm*—Greenberg Traurig, LLP

(57) ABSTRACT

One embodiment of the present invention relates to a method for constructing a circuit for controlling an electromagnetic actuator. Another embodiment of the present invention relates to a method for designing a circuit for controlling an electromagnetic actuator.

22 Claims, 72 Drawing Sheets

NORMAL HEPTANE REACTIONS STARTING AT 900 °K AND 83 BAR

TEMPERATURES

CHEMISTRY
SUMMARY OF FUEL BURNING PROCESSES

WAVE FORM DIAGRAM: OPERATION OF THE FUEL INJECTION NOZZLE

| # INJECTOR | L_mean μH max | L_mean μH max | R_mean Ω min | R_mean Ω max | TIME L/R μsec AVERAGED | ω21 FREQ R/L kHz AVERAGED | $0.5*I^2*L/T$ E_peak W I_p18A | E_hold W I_h12A | 4*E_peak W | ω22= w21/2 R/L_22 kHz | T22=T21*2 T=R/L_22 μsec | L_22 μH I_p18A | R_22 Ω R=L/T |
|---|---|---|---|---|---|---|---|---|---|---|---|---|---|
| BOSCH ENGINE | | | | | | | | | | | | | |
| 1 I | 65.73 | 65.75 | 0.45 | 0.45 | 146 | 6.85 | 72.9 | 4.7 | 291.6 | 3.42 | 292 | 526 | 1.80 |
| 2 II | 76.24 | 76.35 | 0.35 | 0.45 | 191 | 5.24 | 64.8 | 5.5 | 259.2 | 2.62 | 381 | 610 | 1.60 |
| 3 III | 68.48 | 68.41 | 0.35 | 0.45 | 171 | 5.84 | 64.8 | 4.9 | 259.2 | 2.92 | 342 | 548 | 1.60 |
| 3 IV | 69.42 | 69.58 | 0.35 | 0.45 | 174 | 5.76 | 64.8 | 5.0 | 259.2 | 2.88 | 348 | 556 | 1.60 |
| ADDIT: | | | | | | | | | | | | | |
| 4 V | 79.79 | 79.85 | 0.35 | 0.45 | 200 | 5.01 | 64.8 | 5.7 | 259.2 | 2.51 | 399 | 639 | 1.60 |
| 5 VI | 84.75 | 84.84 | 0.35 | 0.45 | 212 | 4.72 | 64.8 | 6.1 | 259.2 | 2.36 | 424 | 678 | 1.60 |
| 6 VII | 79.69 | 79.69 | 0.35 | 0.45 | 199 | 5.02 | 64.8 | 5.7 | 259.2 | 2.51 | 398 | 638 | 1.60 |

| No. | PARAMETER | CALCUL FORMULA | DIMENSION | VALUE | CONTROL | DEVICE/UNIT |
|---|---|---|---|---|---|---|
| 1 | INDUCTANCE | L, MEASURED | μH | #REF! | L/R METER IIB | BOSCH INJECTORI |
| 2 | RESISTANCE | R, MEASURED | Ω | #REF! | MUTIMETER | BOSCH INJECTORI |
| 3 | T-RESPONCE | L/R | μs | #REF! | HP INFINUM SCOPE 500 MHz, 1GSa/s | BOSCH PROFILE |
| 4 | F-RESPONCE | R/L | kHz | #REF! | HP INFINUM SCOPE 500 MHz, 1GSa/s | BOSCH PROFILE |
| 5 | CYCLE [Hz] 33.33 | CONSIDERED | DEGREE<br>ms<br>pts | 360<br>30.0<br>16000 | HP/AGILENT 33120A 15 MHz WAVEGENERATOR | INJECTOR SOLENOID PROGRAM |
| 6 | P INJECTION OFFSET "-X deg BTDC" | CONSIDERED START | DEGREE<br>ms<br>pts | 157.5<br>13.13<br>7000 | HP/AGILENT 33120A 15 MHz WAVEGENERATOR | INJECTOR SOLENOID PROGRAM |
| 7 | M INJECTION OFFSET "TDC" | CONSIDERED | DEGREE<br>ms<br>pts | 180<br>15.00<br>8000 | HP/AGILENT 33120A 15 MHz WAVEGENERATOR | INJECTOR SOLENOID PROGRAM |

| | | | | | | |
|---|---|---|---|---|---|---|
| 8 | P_M INTERVAL | P_off – M_off<br>X BTC | DEGREE<br>μs<br>pts | 22.5<br>1875<br>1000 | HP/AGILENT 33120A<br>15 MHz WAVEGENERATOR | INJECTOR<br>SOLENOID<br>PROGRAM |
| 9 | NORMAL INJECTION<br>"–X deg BTDC" | max 2.2 ms | DEGREE<br>μs<br>pts | 26.4<br>2200<br>1173 | HP/AGILENT 33120A<br>15 MHz WAVEGENERATOR | INJECTOR<br>SOLENOID<br>PROGRAM |
| 10 | P_DURATION=<br>M_DURATION | CONSIDERED | DEGREE<br>μs<br>pts | 7.2<br>600<br>320 | HP/AGILENT 33120A<br>15 MHz WAVEGENERATOR | INJECTOR<br>SOLENOID<br>PROGRAM |
| 11 | P_M_dwell | (P_off–M_off)–P_dur | DEGREE<br>μs<br>pts | 15<br>1275<br>680 | HP/AGILENT 33120A<br>15 MHz WAVEGENERATOR | SOLENOID<br>INJECTOR<br>PROGRAM |
| 12 | TOTAL INJECTION<br>DURATION | P_dur+dwell+M_d_off | DEGREE<br>μs<br>pts | 30<br>2475<br>1320 | HP/AGILENT 33120A<br>15 MHz WAVEGENERATOR | INJECTOR<br>SOLENOID<br>PROGRAM |

FIG.23B

| |
|---|
| FIG.23A |
| FIG.23B |

FIG.23

| | | | | |
|---|---|---|---|---|
| SCALES | I[A] | 2.0 | t[ms] | 0.200 |
| | L[mm] | 9.8 | L[mm] | 14.1 |
| | I/L[A/mm] | 0.204 | t/L[ms/mm] | 0.01418 |

| | | | |
|---|---|---|---|
| FIRST SHOT [us] | 600 | POINTS | 320 |
| SECOND SHOT [us] | 600 | POINTS | 320 |
| DWELL INTERVAL [us] | 1275 | POINTS | 680 |

| PROFILE MI_33_2x600_1275_SC | PHASE | τ_lin[mm] | L_lin[mm] | τ_abs[ms] |
|---|---|---|---|---|
| τ_off[pts] | | | | |
| 7000 | A | 0.0 | 0.0 | 0.000 |
| 157.5° | B | I-FUNCTION | FIRST PEACK | 0.175 |
| FIRST SHOT | C | 3.6 | 56.2 | 0.051 |
| | D | CALCULATION | 56.0 | 0.280 |
| | E | I-FUNCTION | 0.0 | 0.094 |
| | | | TOTAL | 0.600 |
| | CD_osc | 4.5 | 2.8 | 0.128 |
| τ_off[pts] | | | | |
| 8000 | A | 0.0 | 0.0 | 0.000 |
| 180° | B | I-FUNCTION | FIRST PEACK | 0.175 |
| SECOND SHOT | C | 3.6 | 56.2 | 0.051 |
| | D | CALCULATION | 56.0 | 0.280 |
| | E | I-FUNCTION | 0.0 | 0.094 |
| | CD_osc | 4.5 | 2.8 | 0.128 |

FIG.24A

| | |
|---|---|
| T[pts] | 16000 |
| V_arb[-] | 1 |
| R[Ohm] | 0.45 |
| T[ms] | 30.0 |

| FIG.24A | FIG.24B |
|---|---|

FIG.24

TOTAL pts 320 NUMBER OF SINE CYCLE 5
exp_rise 9.36
exp_fall 9.60

| I_abs[A] | pts[-] | I_arb[-] | V_abs[V] | Δτ_pts[-] | ΔI_arb[-] | ΔV_abs[V] |
|---|---|---|---|---|---|---|
| 0.00 | 7000 | 0.000 | 0.000 | 0 | 0.000 | 0.000 |
| 17.80 | 7093 | 1.000 | 8.010 | 93 | 1.000 | 8.010 |
| 11.46 | 7121 | 0.644 | 5.159 | 27 | −0.356 | −2.851 |
| 11.42 | 7270 | 0.642 | 5.141 | 149 | −0.002 | −0.018 |
| 0.00 | 7320 | 0.000 | 0.000 | 50 | −0.642 | −5.141 |
| | | | TOTAL | 320 | | |
| 0.57 | 61 | 0.032 | 0.257 | | | |
| 0.00 | 8000 | 0.000 | 0.000 | 0 | 0.000 | 0.000 |
| 17.80 | 8093 | 1.000 | 8.010 | 93 | 1.000 | 8.010 |
| 11.46 | 8121 | 0.644 | 5.159 | 27 | −0.356 | −2.851 |
| 11.42 | 8270 | 0.642 | 5.141 | 149 | −0.002 | −0.018 |
| 0.00 | 8320 | 0.000 | 0.000 | 50 | −0.642 | −5.141 |
| | | | TOTAL | 320 | | |
| 0.57 | 61 | 0.032 | 0.257 | | | |

FIG.24B

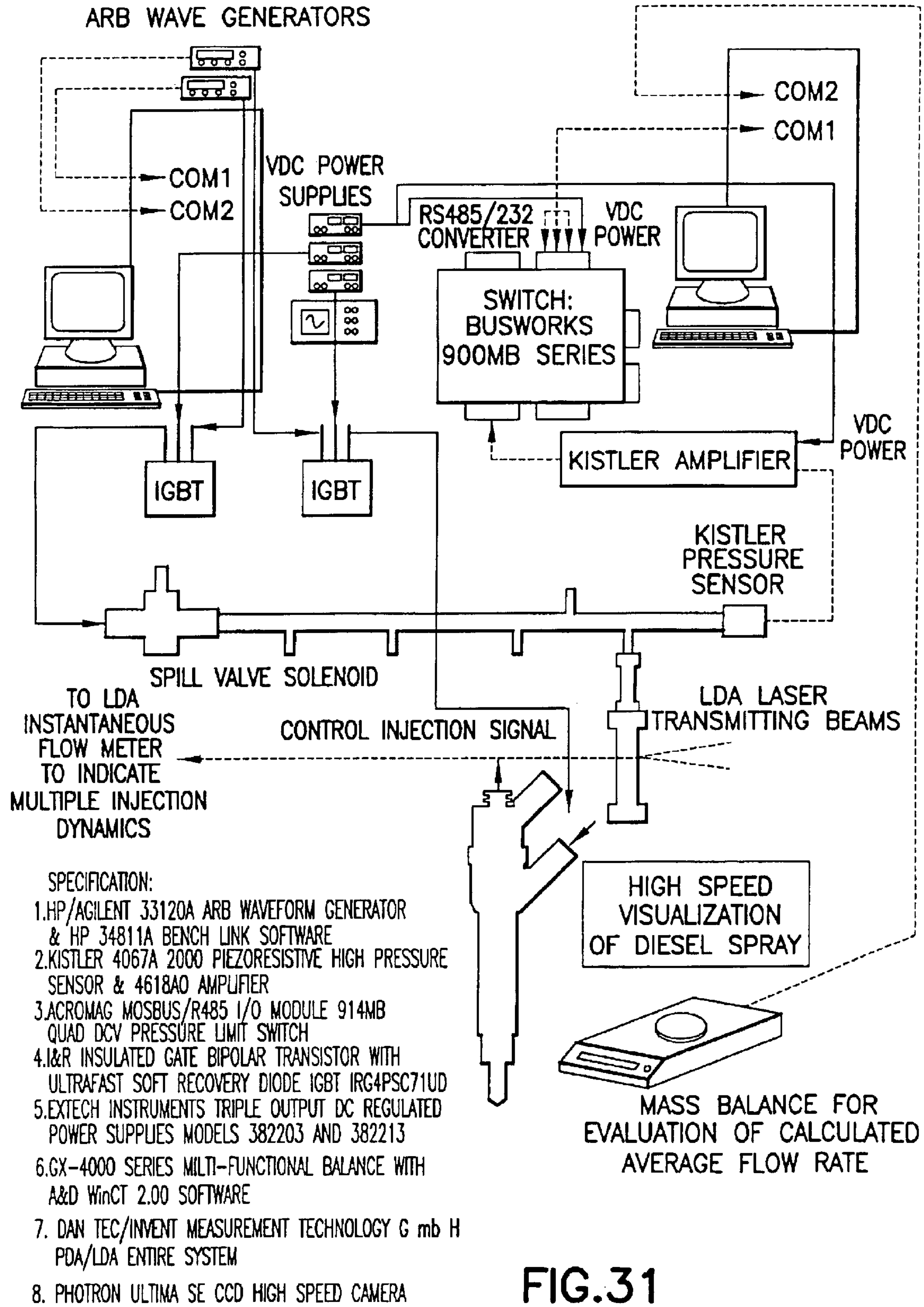

SPECIFICATION:
1. HP/AGILENT 33120A ARB WAVEFORM GENERATOR & HP 34811A BENCH LINK SOFTWARE
2. KISTLER 4067A 2000 PIEZORESISTIVE HIGH PRESSURE SENSOR & 4618A0 AMPLIFIER
3. ACROMAG MOSBUS/R485 I/O MODULE 914MB QUAD DCV PRESSURE LIMIT SWITCH
4. I&R INSULATED GATE BIPOLAR TRANSISTOR WITH ULTRAFAST SOFT RECOVERY DIODE IGBT IRG4PSC71UD
5. EXTECH INSTRUMENTS TRIPLE OUTPUT DC REGULATED POWER SUPPLIES MODELS 382203 AND 382213
6. GX-4000 SERIES MILTI-FUNCTIONAL BALANCE WITH A&D WinCT 2.00 SOFTWARE
7. DAN TEC/INVENT MEASUREMENT TECHNOLOGY G mb H PDA/LDA ENTIRE SYSTEM
8. PHOTRON ULTIMA SE CCD HIGH SPEED CAMERA

FIG.31

EXAMPLE OF SPRAY
AT LOW CAMERA SPEED

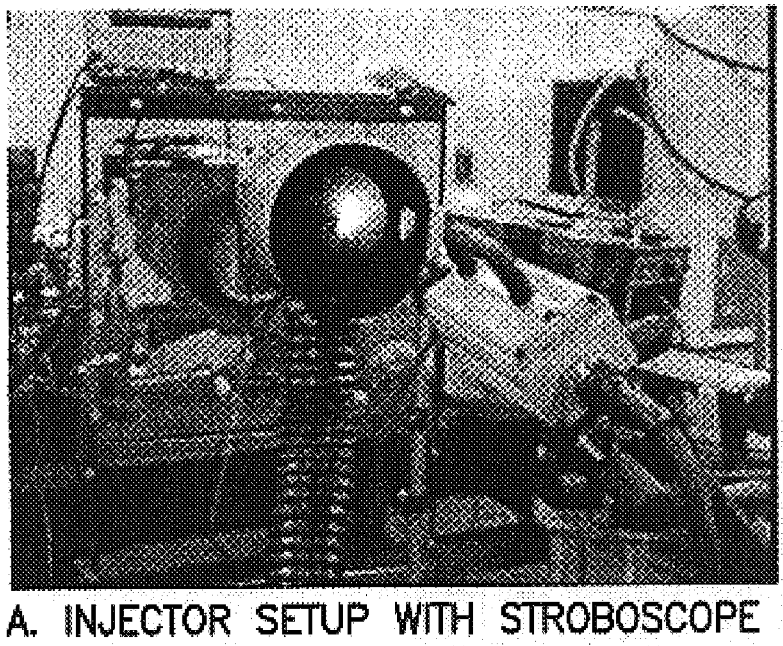
A. INJECTOR SETUP WITH STROBOSCOPE
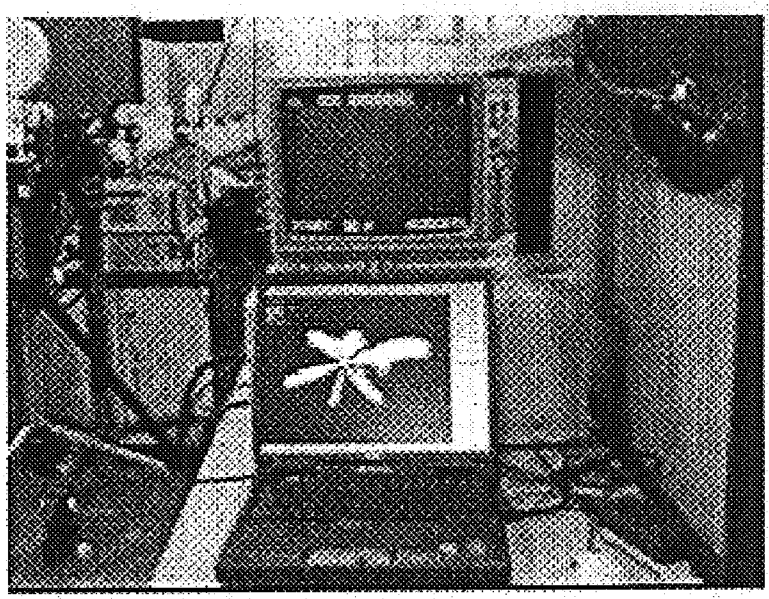
B. SIGNAL PROCESSOR WITH MONITOR
FIG.38

PILOT SHOT IN SIX–SHOT INJECTION: ENGINE SPEED 2,400 RPM, FRAME DURATION 55.56 $\mu$s, COIN SIZE 24.76 mm.

WAVEFORM ELECTRONIC SETUP, ENGINE SPEED 3,600 RPM

| | | DURATION PTS | DURATION MS | DURATION DEG | | PHASES PTS | PHASES MS | PHASES DEG |
|---|---|---|---|---|---|---|---|---|
| | PERIOD | 16000 | 33.3 | 360 | PERIOD | 16000 | 33.3 | 360 |
| 3 | Main | 288 | 0.6 | 6.5 | | 8000 | 16.667 | 180 |
| | dwell_1 | 96 | 0.2 | 2.2 | | | | |
| 2 | Pre_M | 192 | 0.4 | 4.3 | | 7712 | 16.067 | 173.5 |
| 1 | Pilot | 192 | 0.4 | 4.3 | | 5600 | 11.667 | 126.0 |
| | dwell_2 | 240 | 0.5 | 5.4 | | | | |
| 4 | Main_2 | 240 | 0.5 | 5.4 | | 8528 | 17.767 | 191.9 |
| 5 | After_M | 192 | 0.4 | 4.3 | | 12000 | 25.000 | 270.0 |
| 6 | Post | 192 | 0.4 | 4.3 | | 14000 | 29.167 | 315.0 |
| | | | | | Pilot-to-Pre_M | 1920 | 4.000 | 43.2 |
| | | | | | Pre_M-to-Main1 | 96 | 0.200 | 2.16 |
| | | | | | Main1-to-Main2 | 240 | 0.500 | 5 |
| | | | | | Main2-to-AfterM | 3232 | 6.733 | 73 |
| | | | | | AfterM-to-Post | 1808 | 3.767 | 41 |

HIGH SPEED CAMERA RECORD AT SPEED OF 40,500 FPS

| DURATION FRAMES | DURATION MS | DURATION DEG | | PHASES FRAME | PHASES MS | PHASES DEG |
|---|---|---|---|---|---|---|
| 1350 | 33.333 | 360 | PERIOD | 1350 | 33.333 | 360 |
| 11 | 0.272 | 2.9 | | 1969 | 17.210 | 185.9 |
| 21 | 0.518 | 5.6 | | | | |
| 8 | 0.198 | 2.1 | | 1940 | 16.494 | 178.1 |
| 8 | 0.198 | 2.1 | | 1762 | 12.099 | 130.7 |
| 28 | 0.691 | 7.5 | | | | |
| 14 | 0.346 | 3.7 | | 2008 | 18.173 | 196.3 |
| 9 | 0.222 | 2.4 | | 2302 | 25.432 | 274.7 |
| 7 | 0.173 | 1.9 | | 2472 | 29.630 | 320.0 |
| | | | Pilot-to-Pre_M | 170 | 4.198 | 45 |
| | | | Pre_M-to-Main1 | 21 | 0.519 | 6 |
| | | | Main1-to-Main2 | 28 | 0.691 | 7 |
| | | | Main2-to-AfterM | 280 | 6.914 | 75 |
| | | | AfterM-to-Post | 161 | 3.975 | 43 |

FIG.42

| | SHOT/PASS | START deg | END deg | DURATION ms | MASSES mg | % OF TOTAL % |
|---|---|---|---|---|---|---|
| 1 | DELIVER 1 | 0 | 125 | 34.72 | 10.74 | 14.8 |
| 2 | PILOT | 125 | 133 | 2.22 | 4.18 | 5.8 |
| 3 | DELIVER 2 | 133 | 175 | 11.67 | 4.33 | 6.0 |
| 4 | PRE-MAIN | 175 | 182 | 1.94 | 4.47 | 6.2 |
| 5 | MAIN 1 | 182 | 186 | 1.11 | 7.30 | 10.1 |
| 6 | MAIN 2 | 186 | 196 | 2.78 | 11.65 | 16.1 |
| 7 | DELIVER 3 | 196 | 269 | 20.28 | 10.62 | 14.7 |
| 8 | AFTER-M | 269 | 281 | 3.33 | 5.81 | 8.0 |
| 9 | DELIVER 4 | 281 | 315 | 9.44 | 5.02 | 6.9 |
| 10 | POST | 315 | 327 | 3.33 | 4.76 | 6.6 |
| 11 | DELIVER 5 | 327 | 360 | 9.17 | 3.54 | 4.9 |
| | TOTAL: | | | | 72.42 | 100.0 |
| | INJECTED | | | | 38.17 | 52.7 |
| | DELIVER | | | | 34.25 | 47.3 |

FIG.70

SYSTEMS AND METHODS FOR OPERATING AN ELECTROMAGNETIC ACTUATOR

CROSS-REFERENCE TO RELATED APPLICATIONS

This application is a continuation-in-part of U.S. application Ser. No. 10/389,183, filed Mar. 14, 2003 now abandoned.

FIELD OF THE INVENTION

One embodiment of the present invention relates to a method for constructing a circuit for controlling an electromagnetic actuator.

Another embodiment of the present invention relates to a method for designing a circuit for controlling an electromagnetic actuator.

For the purposes of the present application the term "physically remote" (e.g., in the context of a coil being physically remote from an electromagnetic actuator) is intended to refer to the fact that the electromagnetic actuator and the coil may be electrically connected but that any direct magnetic interaction between the two is negligible.

Further, for the purposes of the present application the term "theoretical" (e.g., in the context of a theoretical coil) is intended to refer to the fact that the theoretical coil does not exist in the physical sense.

BACKGROUND OF THE INVENTION

In general, a solenoid converts electric energy into magnetic flux, release of which is transferred into linear mechanical motion of a plunger installed in the center of a C-frame solenoid, a D-frame solenoid, or a tubular solenoid (as shown respectively in FIG. 1A, FIGS. 1B, and 1C). Current flow I through the solenoid coil winding with inductance L creates magnetic energy $$E = \frac{1}{2}LI^2,$$

which produces an attraction force $F_{mag}$ between a movable plunger and a fixed stop. Solenoids typically have a working, or variable, air gap between the plunger and the stop, as well as a fixed air gap between the outside diameter of the plunger and either its frame or mounting bushing. To complete the magnetic circuit, the magnetic flux lines flow through either air or the metallic frame through the stop, the plunger, the frame or the mounting busing of a tubular solenoid and return to their point of origination.

The performance of a solenoid is dependent on numerous parameters, including, but not necessarily limited to, its physical size, the wattage applied, duty cycle, ambient temperature, its coil temperature due to heat rise, the coil ampere-turns (NI where I and N are current and coil turns respectively), solenoid orientation, cross sectional area of the plunger, the coil winding and the plunger and stop geometry. FIG. 2 illustrates typical force-stroke relationships for different geometries of plunger and mating stops of a D.C. solenoid.

Typically, the greater the holding force of a given plunger and stop geometry, the lesser the pulling/pushing force at an extended stroke position. In this regard, the minimum pull/push force generated is typically at the extended stroke end where the plunger assembly begins it's lifting towards the stop. As the plunger approaches the stop position, the pulling/pushing force developed typically increases dramatically, and the slope of the force-stroke curve rises sharply. The differential equations for an electrical circuit and Maxwell's equations for dynamics, which define the forces according to the current and position, describe the full dynamic or switching response of an electromechanical actuator. In fact, there is a certain transient time needed to develop magnetic flux and transfer it's energy to mechanical momentum.

In many applications this intrinsic transient phenomenon may ultimately effects the dynamics of other mechanical parts dependent on the plunger position and it's speed. One of these applications is related to high-pressure fuel injectors used in direct injection gasoline and diesel engines. In internal combustion engines (especially diesel engines) the transient phases, including injection, ignition (or auto-ignition) and combustion, have ultra-short time fractions from a few tens to a few hundreds of a nanosecond. In this regard, FIG. 3 shows data regarding normal heptane reactions starting at 900K and 83 bar in connection with a two stage CI (diesel) combustion process. More particularly, FIG. 3 relates to: (a) a first stage including premixed flame (0.03 ms) having various short-lived species such as C7 radicals, aldehydes (PAH), and hydrogen peroxide; and (b) a second stage including rapid oxidation (0.06 ms) having hydrogen, water, carbon dioxide, carbon monoxide, methane, soot precursors, C3-compounds, and C4-compounds.

Further, FIG. 4 depicts certain ideally targeted or aimed or purposed injection events (e.g., hampered by unstably controlled injection shot duration and dwell interval) and FIG. 5 depicts a diesel diffusion flame in connection with a conventional single long shot per cylinder injection (with limited access of air resulting in incomplete combustion).

Further still, one conventional electronically controlled diesel fuel injector is called an "accumulator" type. In these injectors, a nozzle includes an accumulator chamber that is charged with fuel under high pressure, which communicates with a nozzle port. An actuating device is associated with the injection valve and is moveable within a control chamber that is also pressurized with fuel. A valve is associated with the control chamber and is opened so as to reduce the pressure and cause the pressure in the accumulation chamber to unseat the injection valve and initiate fuel injection. Typically, a main electromagnetic assembly that is contained within the housing of the fuel injection nozzle operates the valve.

FIGS. 6A–6D depict four strokes of unit injector ("UI") and unit pump ("UP") operation stages. The function of these single-cylinder injection-pump systems can be subdivided into four operation stages (corresponding, respectively, to each of FIGS. 6A–6D):

a) Suction stroke. The follower spring (3) forces the pump plunger (2) upwards. The fuel in the fuel supply's low-pressure stage is permanently under pressure and flows from the low-pressure stage into the solenoid-valve chamber (6) via the bores in the engine block and the inlet (or feed) passage (7).

b) Initial stroke. The actuating cam (1) continues to rotate and forces the pump plunger (2) downwards. The solenoid valve is open so that the pump plunger (2) can force the fuel through the fuel-return passage (8) into the fuel supply's low-pressure stage.

c) Delivery and injection stroke (or Prestroke). An electronically timed signal from the engine electronic control unit ("ECU") energizes the solenoid-valve coil (9) to pull the solenoid valve needle (5) towards the solenoid valve seat/stop (10). The connection between the high-pressure chamber (4) and the low-pressure stage is closed. Further movement of the pump plunger (2) causes increased fuel pressure in the high-pressure chamber (4); the fuel is also pressurized in the nozzle-needle (or nozzle assembly)(11). Upon reaching the nozzle needle opening pressure (typically over 300 bar), the nozzle needle (11) is lifted from its seat and fuel is injected into the engine combustion chamber. Due to the pump plunger's high delivery rate, the pressure continues to increase throughout the whole of the injection process (typically up to maximum peak of 1800–2000 bar).

d) Residual stroke. As soon as the solenoid-valve coil (9) is switched off, the solenoid valve (or solenoid valve needle) (5) opens after a short delay and opens the connection between the high-pressure chamber and the low-pressure stage.

FIGS. 7A–7D relate to the above-mentioned operating stages of FIGS. 6A–6D and show, respectively, coil current ($I_S$), solenoid-valve needle stroke ($h_M$), injection pressure ($P_e$), and nozzle-needle stroke ($h_N$).

FIG. 8 depicts a wave form diagram associated with operation of a fuel injector nozzle (an "accumulator" type injector) under use of two actuating solenoids installed into injector.

Finally, a number of conventional techniques and apparatuses achieve multiple injection, for instance, by using a piezoelectric actuator during individual injection phases or a rapid switching on/off of injection events strategy via the electronic control unit. Specifically with reference to application of rapidly operating electromagnetic actuators, studies have been carried out on variable valve actuators for valve train parts, rather than for high-pressure fuel injectors. Related documents include: 1) Robert Bosch GmbH (1999). Diesel-engine management. SAE, 2$^{nd}$ edition, 306 p.; 2) B. Riccardo, C.R.F. Societa' Consottile per Azioni (2000). Method of controlling combustion of a direct-injection diesel engine by performing multiple injections. European patent EP 1 035 314 A2; 3) N. Rodrigues-Amaya, et. al. (2002) Method for injection fuel with multiple triggering of a control valve. Robert Bosch GmbH, U.S. patent No. 2002/0083919 A1; 4) M. Brian, Caterpillar Inc. (2002). Method and apparatus for delivering multiple fuel injection to the cylinder of an engine wherein the pilot fuel injection occurs during the intake stroke. Intentional patent WO 02/06652 A2; 5) K. Yoshizawa, et. al., Nissan Motor Co., Ltd (2001). Enhanced multiple injection for auto-ignition in internal combustion engines. Us Patent US 2001/0056322 A1; 6) Y. Wang et. al., Ford Motor Company and K. S. Peterson et. al., University of Michigan (2002). Modeling and control of electromechanical valve actuator. SAE International,SP-1692, 2002-01-1106, 43-52; and 7) V. Giglio et. al. (2002). Analysis of advantages and of problems of electromechanical valve actuators. SP-1692, 2002-01-1106, 31-42.

BRIEF DESCRIPTION OF THE DRAWINGS

FIG. 20 depicts information relating an embodiment of the present invention—that is, information relating to RL measured (left, primary) and calculated data (right, secondary); Inductance and resistance data measured "out of circuit"; L/C meter IIB; L_stray=2.139 $\mu$H, R_stray=0.2–0.3 W;

FIGS. 23A–23B depicts data relating to one example secondary coil driver code (e.g., relating to the calculation of certain parameters) according to an embodiment of the present invention;

FIGS. 24A–24B depicts data relating to construction of a current waveform for multiple injection (e.g., associated with an HP Agilent 34811A/33120A configuration) according to an embodiment of the present invention;

FIGS. 28–45 depict the performance evaluation of a multi-burst rapidly operating secondary actuator according to an embodiment of the present invention as applied to a diesel injection system (of note, this rapidly operating secondary actuator according to an embodiment of the present invention may hereinafter sometimes be referred to as "ROSA"); and FIGS. 46–70 depict the quantification of instantaneous diesel flow rates in flow generated by a stable and controllable multiple injection system (i.e., "ROSA") according to an embodiment of the present invention.

Figure 1A:
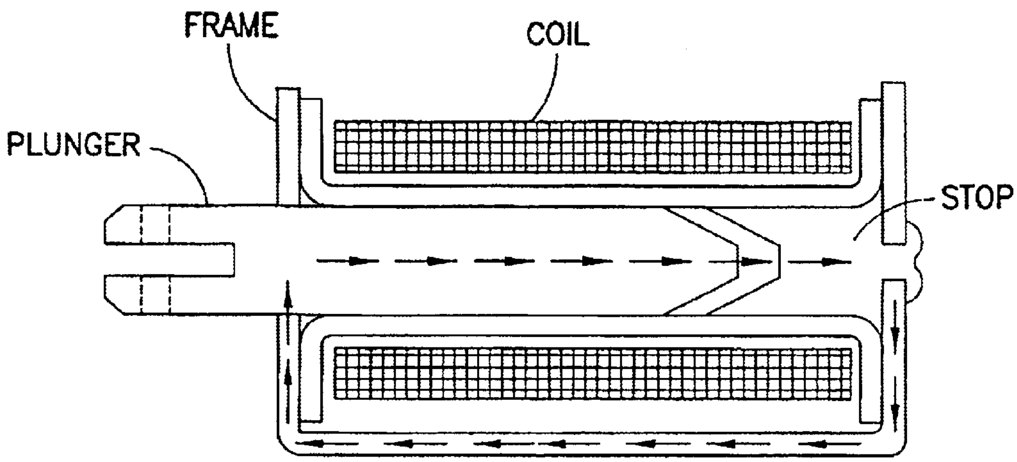
FIGS. 1A–1C depict, respectively, typical cross-sections (with magnetic flux line patterns) of a C-frame solenoid, a D-frame solenoid, and a tubular solenoid.
Figure 1B:
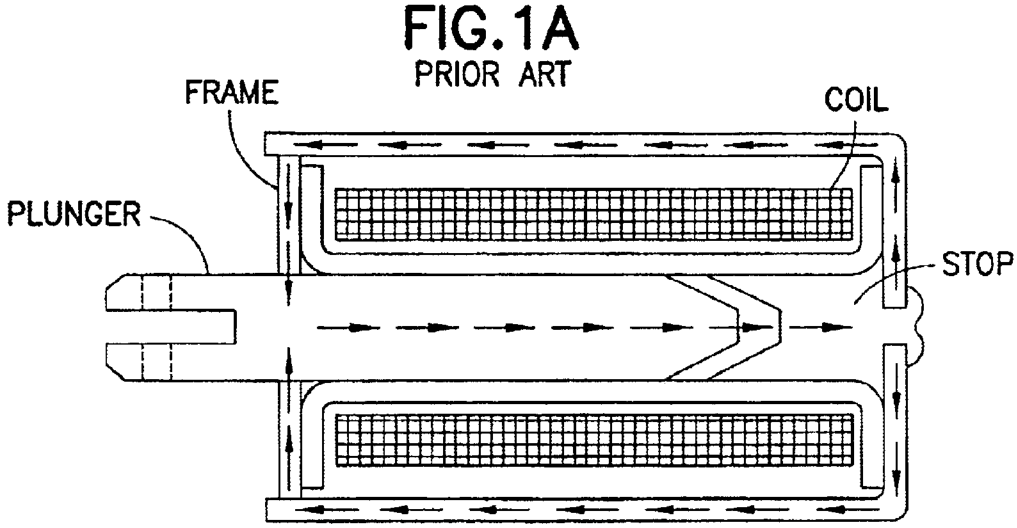
Figure 1C:
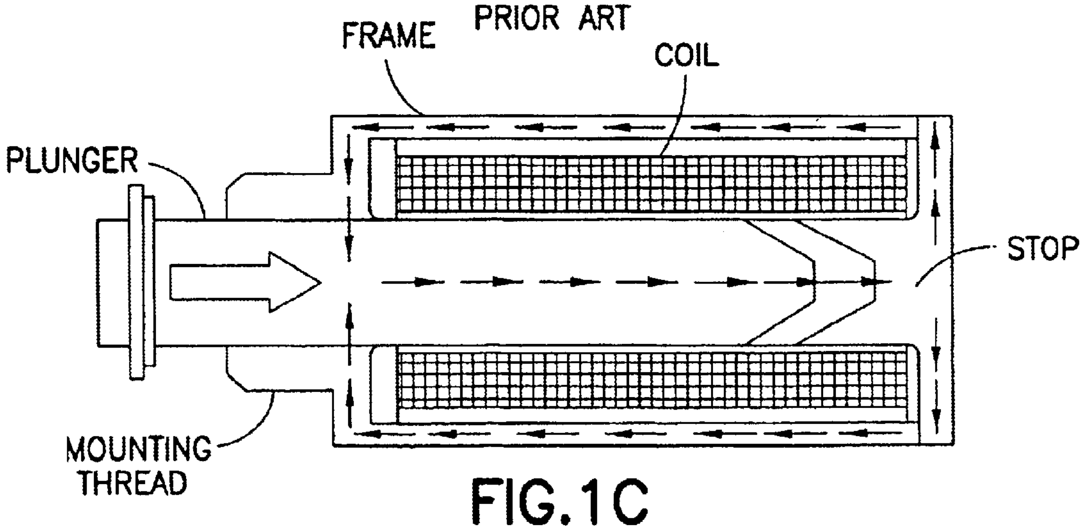
Figure 2:
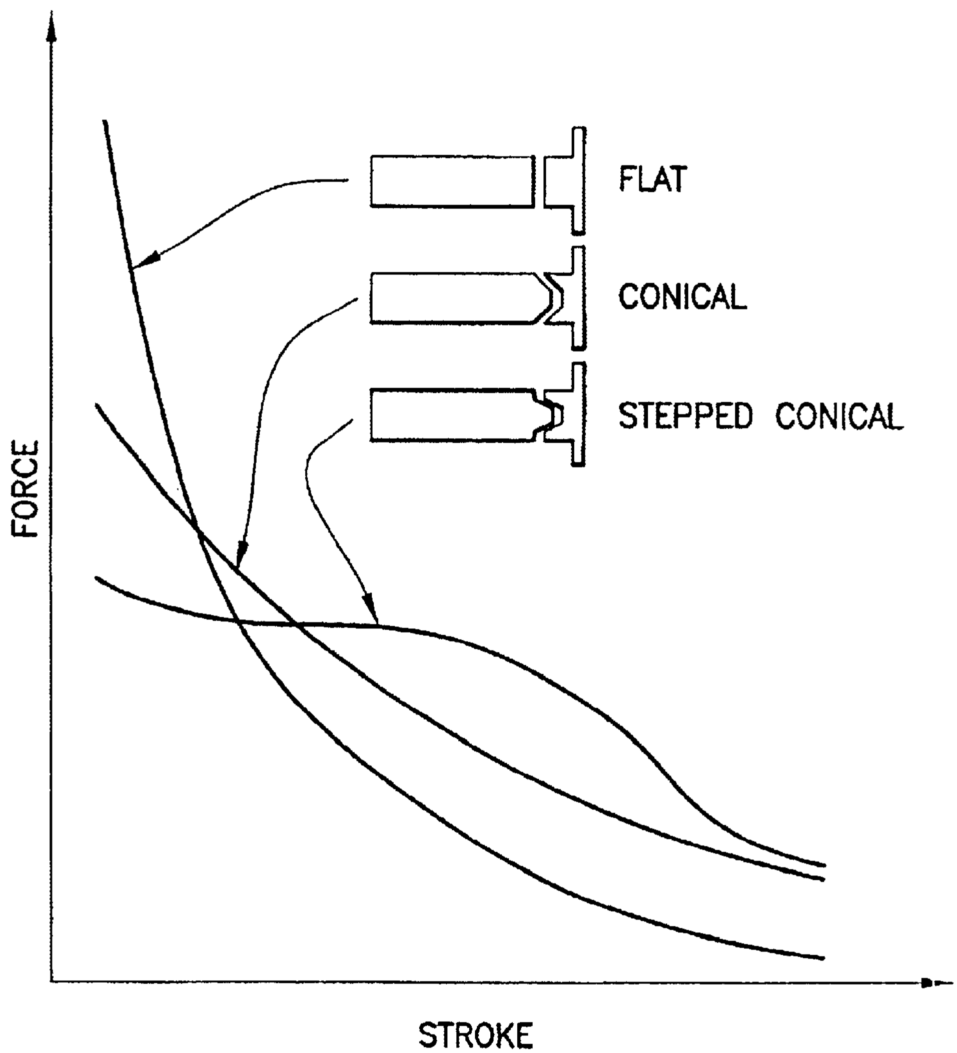
FIG. 2 depicts typical force-stroke relationships (curves) for various conical, flat face, and stepped conical plunger-stop configurations for a D.C. solenoid.
Figure 3:
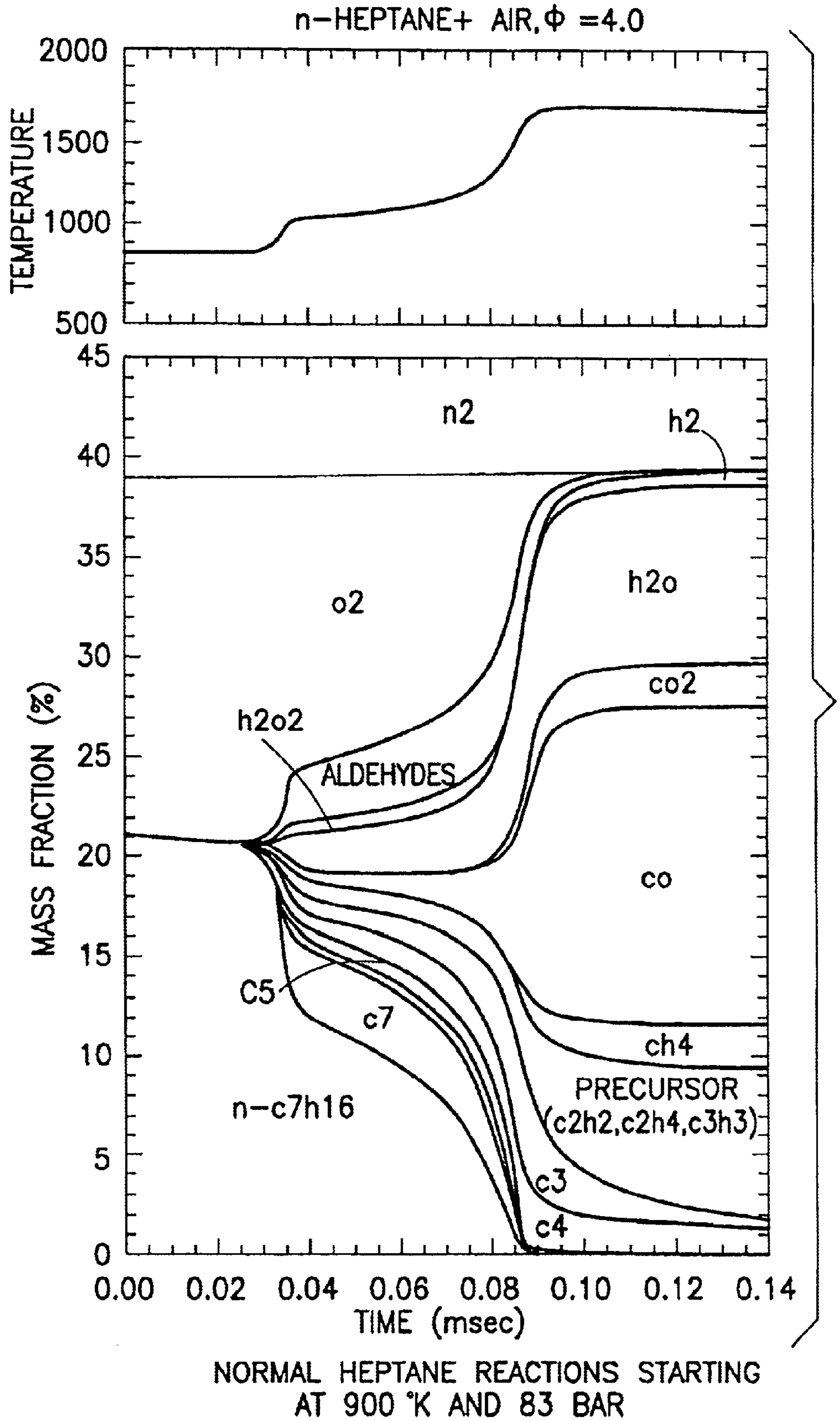
FIG. 3 depicts data regarding certain heptane reactions in connection with a two stage CI (diesel) combustion process.
Figure 4:
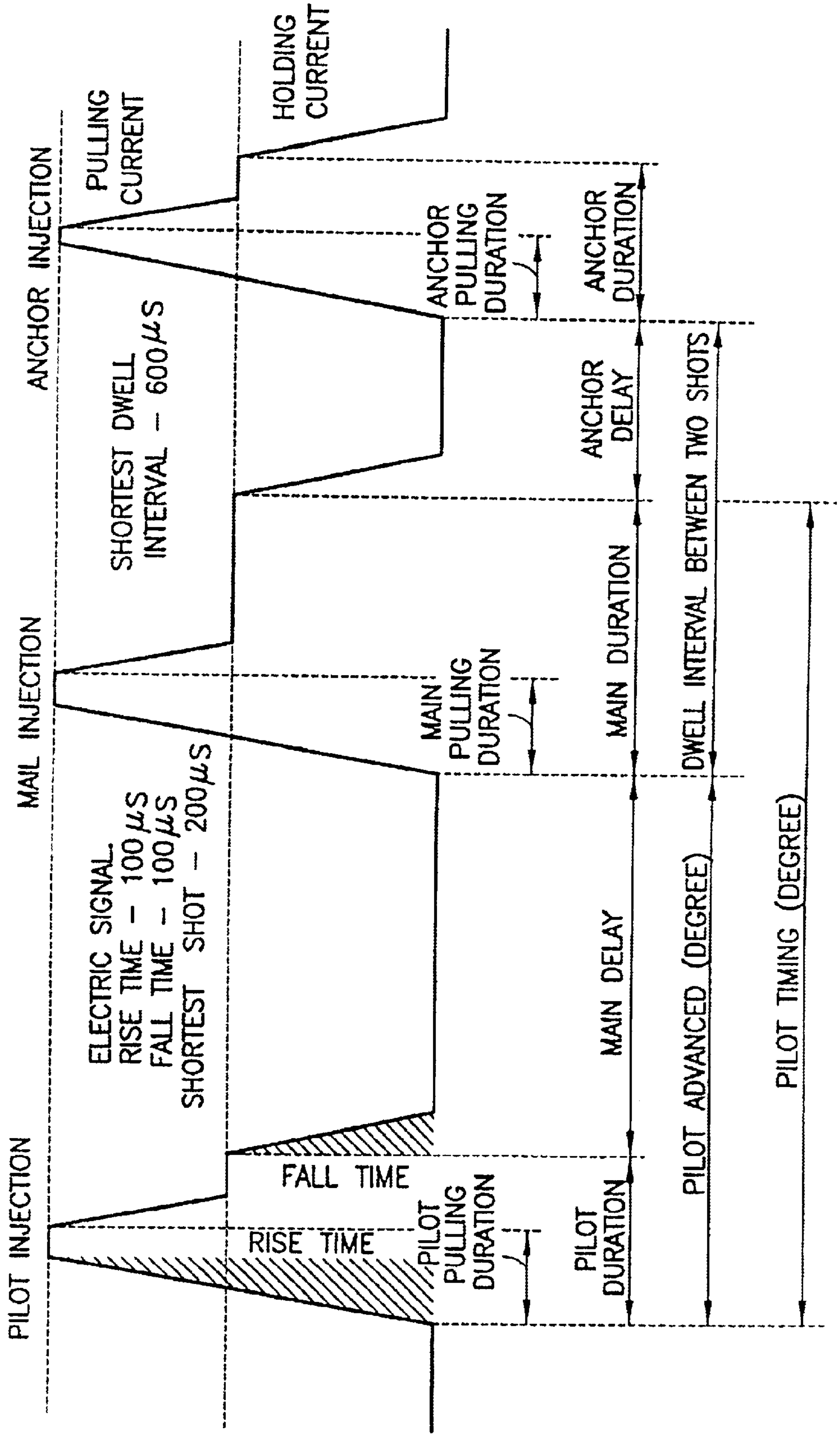
FIG. 4 depicts certain conventional injection events.
Figure 5:
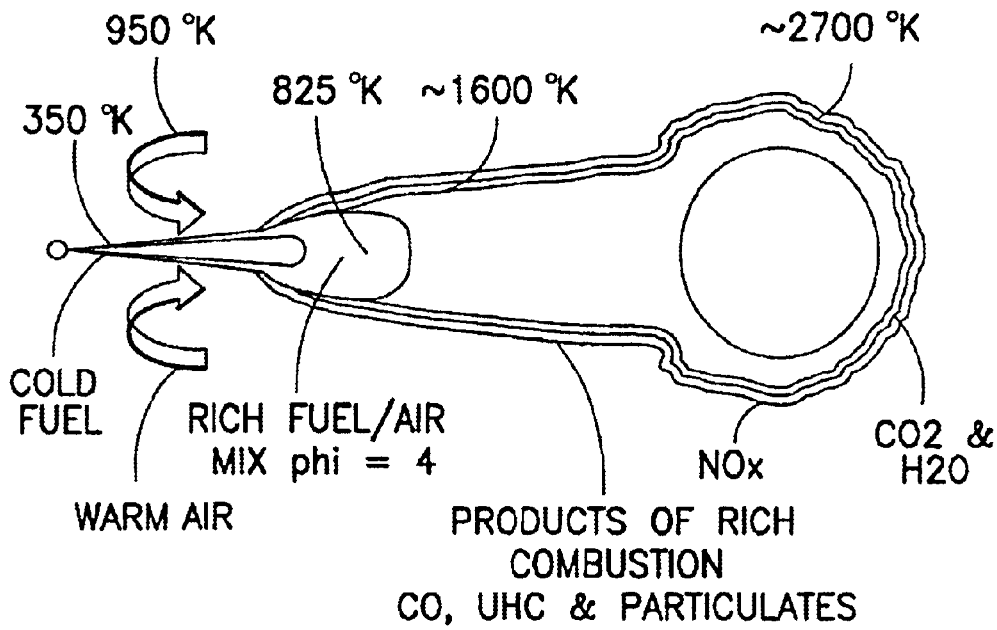
FIG. 5 depicts a typical diesel diffusion flame in connection with a conventional single long shot per cylinder injection (with limited access of air resulting in incomplete combustion)
Figure 6A:
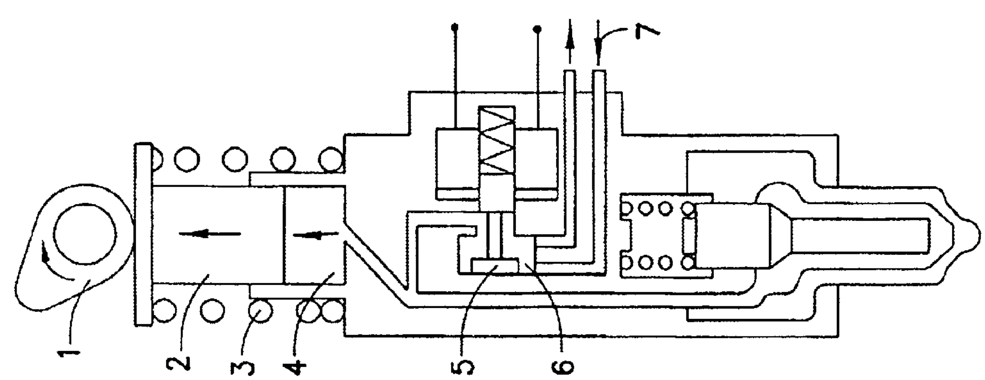
FIGS. 6A–6D depict four strokes of unit injector ("UI") and unit pump ("UP") operation stages.
Figure 6B:
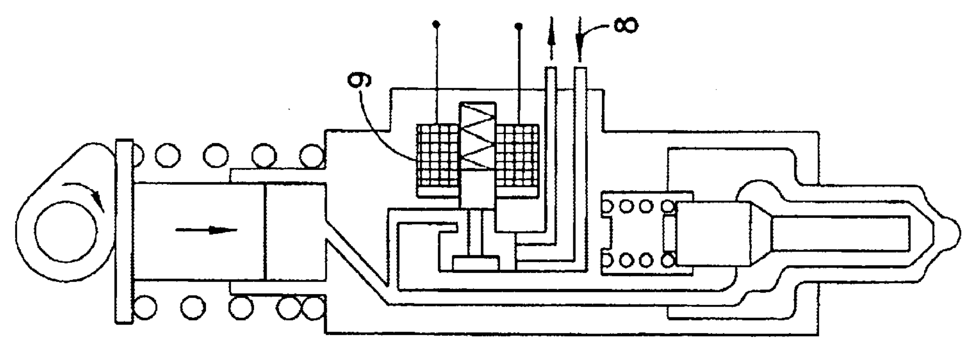
Figure 6C:
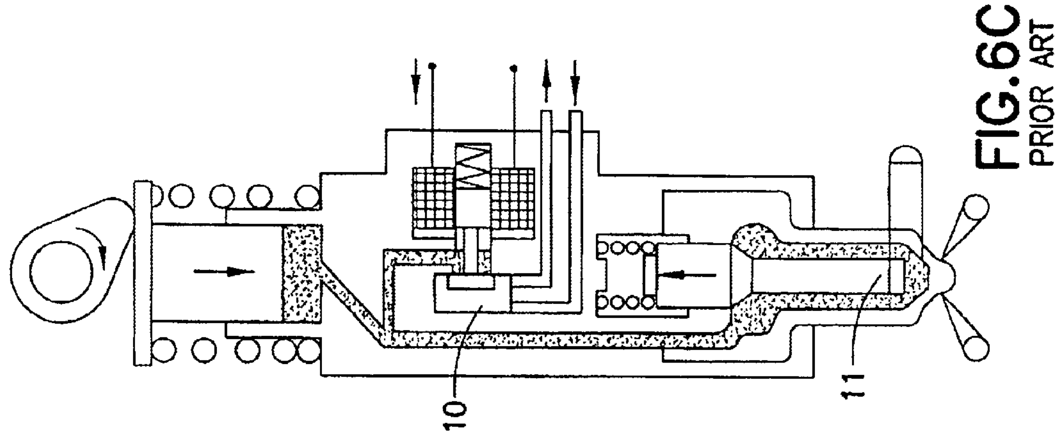
Figure 6D:
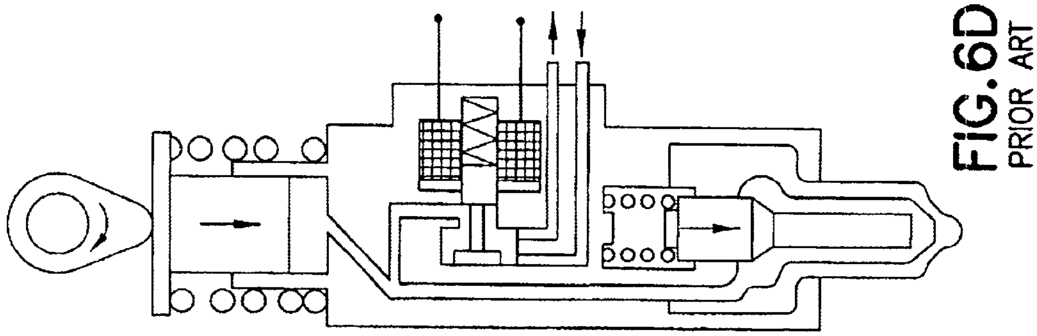
Figure 7A:
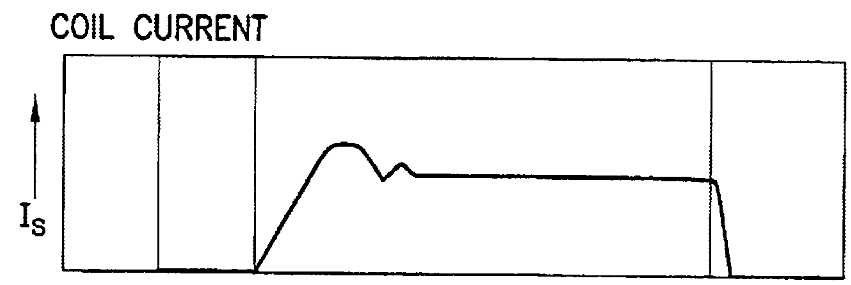
FIGS. 7A–7D relate to each of the stages of FIGS. 4A–4D and depict, respectively, coil current ($I_S$), solenoid-valve needle stroke ($h_M$), injection pressure ($P_e$), and nozzle-needle stroke ($h_N$).
Figure 7B:
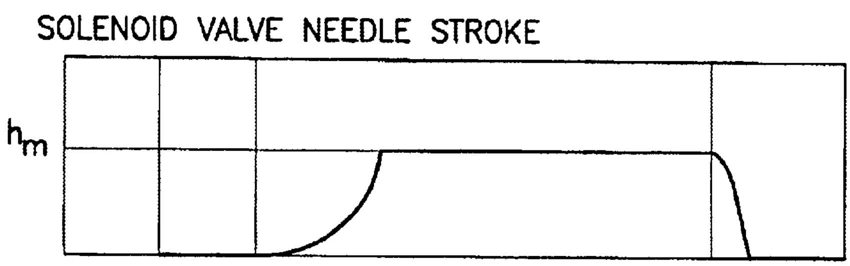
Figure 7C:
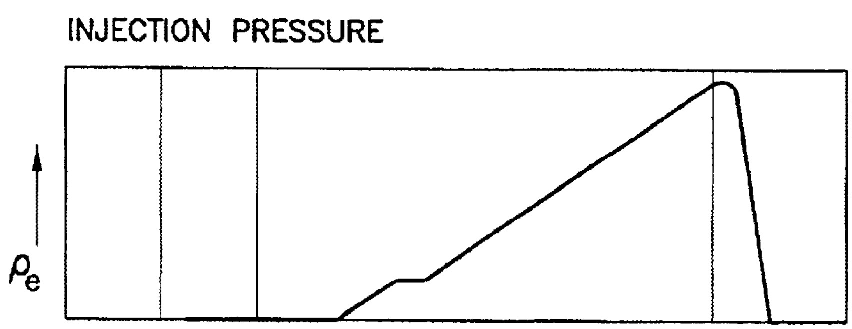
Figure 7D:
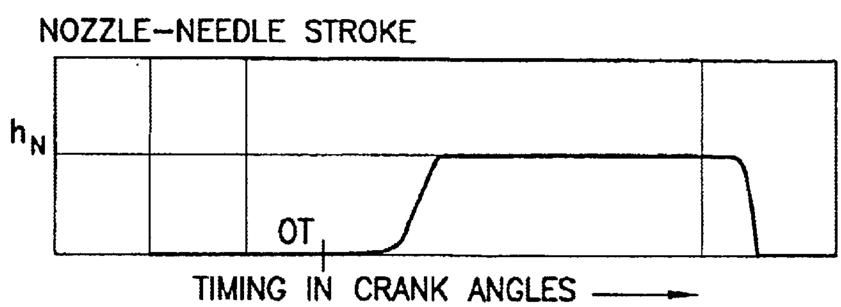
Figure 8:
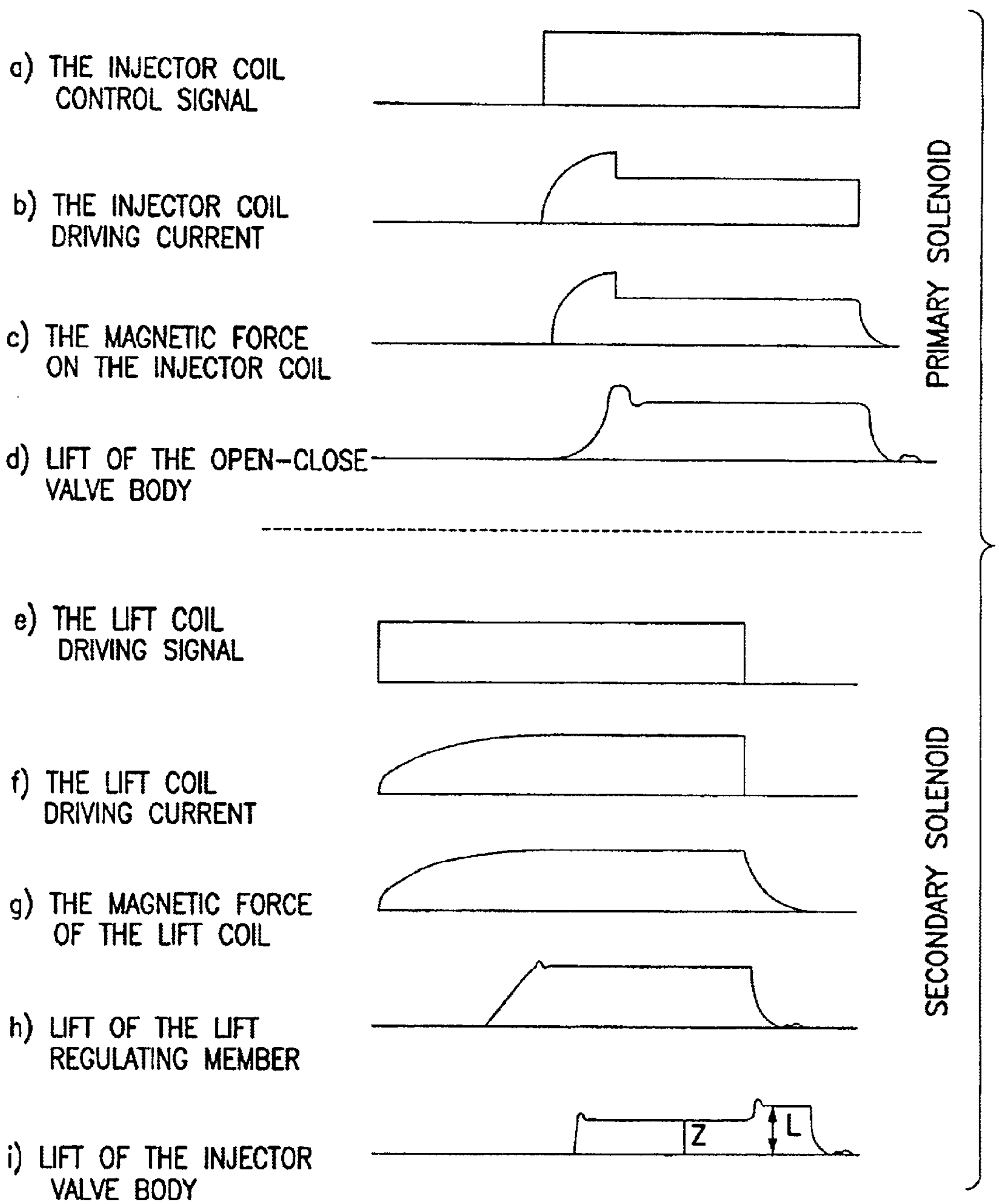
FIG. 8 depicts a wave form diagram associated with operation of a fuel injector nozzle example (an "accumulator" type injector) under use of two actuating solenoids installed into injector.

Among those benefits and improvements that have been disclosed, other objects and advantages of this invention will become apparent from the following description taken in conjunction with the accompanying figures. The figures constitute a part of this specification and include illustrative embodiments of the present invention and illustrate various objects and features thereof.

DETAILED DESCRIPTION OF THE INVENTION

As required, detailed embodiments of the present invention are disclosed herein; however, it is to be understood that the disclosed embodiments are merely illustrative of the invention that may be embodied in various forms. In addition, each of the examples given in connection with the various embodiments of the invention are intended to be illustrative, and not restrictive. The figures are not necessarily to scale, some features may be exaggerated to show details of particular components. Therefore, specific structural and functional details disclosed herein are not to be interpreted as limiting, but merely as a basis for the claims and as a representative basis for teaching one skilled in the art to variously employ the present invention.

In summary, various embodiments of the present invention relate to electromagnetic actuators used to control fuel injectors in internal combustion engines, linear solenoids, and other electromagnetic devices (e.g., which convert electric energy into a linear mechanical motion to move an external load a specified distance). More specifically, various embodiments of the present invention describe the theory, electric circuit, charge time computing code, and engineering applications of a secondary coil ("SC") that generates what is herein referred to as an "I-Function" to be used for energizing a first main coil (e.g., installed in a device such as an internal combustion engine's fuel injectors). Of note, effects produced by the SC according to the present invention may be realized via means taking at least three different forms: (a) an extra, secondary coil installed physically remote from the first one (e.g. medium and heavy load solenoids for gasoline and diesel engines, for example); (2) an electronic current simulation circuit (e.g. lower load devices, for example); and/or (3) a digital/binary code generating an I-Function applied to a desired application (e.g., a fuel injector).

Of further note, three basic problems of mechanic dynamics, induction dynamics, and a rapidly operating control unit using an SC are addressed in connection with suppression of any transient inertia (delays). In one embodiment the analytical solution is based on a series of differential equations. A two-coil configuration of an embodiment of the present invention, for example, does not rely upon the physical placement of the second solenoid relative to the first solenoid in order to improve valve-lifting response based on the magnetic flux interference between the primary and secondary coils. Rather, the present technique realizes an "I-Function" current to be applied onto the primary coil. The current may be generated in a secondary coil (which need not be physically present in vicinity of the first coil). The secondary coil may be a remote unit that may be located away from the first one. The secondary coil may alternatively be presented by a code of I-Function induction current to be transmitted and applied. Thus, essentially any desired kind of switch on/off process now may be released very rapidly without substantial time lag sensitive to the process (e.g., in connection with a combustion process in diesel engines).

Further, the present invention provides an embodiment in which an electric circuit is provided (as well as the code to compute the charging (energizing) time of the SC). In one example (which example is intended to be illustrative and not restrictive), the present invention may permit injection in a diesel engine in series of pilot and multi-shot injections for essentially complete combustion, cutting emission of particulate matter and NOx. In other applications the present invention may permit control of ultra-short opening and closing of the primary solenoid and short controllable dwell interval between two impulses (or a series of impulses). In other words, under the present invention the dynamic time series may become very close to electromagnetic wave forms indicated by an electric signal output from the actuators.

Figure 9:
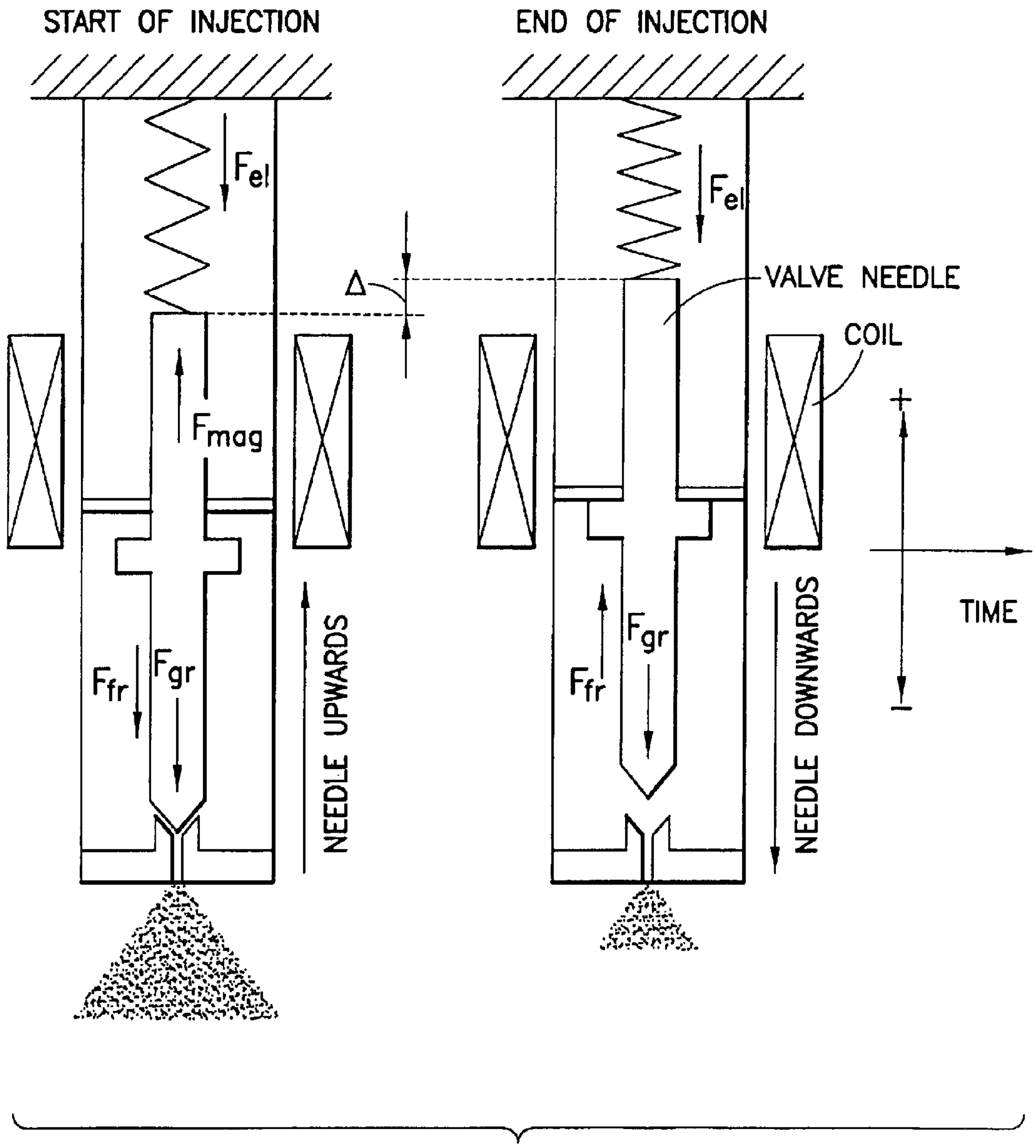
FIG. 9 depicts applied forces at the start and the end of injection according to an embodiment of the present invention.

Referring now to FIG. 9 (with its x-axis coordinate setup), it is seen that at the start of injection $0 \leqq t \leqq \tau$, while the needle moves upwards, a force accelerating the needle valve with mass m is superposed by: magnetic force $F_{Mag}$ induced by an energized solenoid (primary coil), elastic force $F_{el}$ produced by a compressed spring, gravity force $F_{gr}$ due to universal Earth gravitation (9.98 $m/s^2$) and side friction force $F_{fr}$ because of contact of the needle surface to a thin fuel layer occurring in a high pressure fuel passage:

$$m\frac{d^2x}{dt^2} = mx'' = F_{Mag} - F_{el} - F_{gr} - F_{fr} \quad (1)$$

$$F_{Mag}=BIl\sin(0°)=\mu_r u_0 HIl=u_r u_0 I^2 N \quad (2)$$

$$F_{el}=k(\Delta_0+x)=F_{el_0}+kx \quad (3)$$

$$F_{gr}=mg \quad (4)$$

$$F_{fr}=q_{lam}x'+q_{turb}(x')^2 \cong q_{lam}x' \quad (5)$$

where B is magnetic flux density (induction), $u_r$ is relative permeability of ferromagnetic iron, $u_0=1.257*10^{-6}$ H/m is magnetic field constant, l is coil (solenoid) length, I is current supplied to coil, N is number of turns on coil, k is spring constant according to Hooke's law, $\Delta_0$ is initial spring compression, and $q_{lam}$ is friction coefficient under laminar conditions (turbulent component of the friction force is neglected due to very thin layer in the fuel passage resulting in low Re-number).

Temporal transition conditions are:

t=0:

$$I=0[A], x=\Delta_0[m], x'=0[m/s] \quad (6)$$

t=τ:

$$I=I_\Delta[A], x=(\Delta_0+\Delta)[m] \quad (7)$$

In general, an exponential law presents transient time dependent current:

$$I=I_\Delta f(t) \quad (8)$$

Now, eq. (1) can be rewritten in the form of:

$$x' = \frac{u_r u_0 N}{m} I_\Delta^2 f^2(t) - \frac{q_{lam}}{m}x' - \frac{k}{m}x - \left[\frac{F_{el_0}}{m} + g\right] \text{ or} \quad (9)$$

$$x' + \alpha_{fr}x' + \alpha_{el}x = \underbrace{\alpha_{mag} I_\Delta^2 f^2(t)}_{non-linear} - \underbrace{\alpha_{sys}}_{linear}$$

The above implies that a solution of this second-order non-homogeneous ordinary differential eq. (9) will be obtained using superposition of two exponent type functions $x(t)=x_1(t)+x_2(t)$ of the arguments dependent on time t and amplification factors γ, so they have a transient oscillatory nature during start-up of transition, with respect to linear and non-linear parts on the right hand. The first function regarding linear part of the eq. (9) has a generalized form as $$x_1(t) = \Delta_0 e^{\beta_1 t} \quad (10)$$

Using derivatives of x' and x" from the function $x_1(t)$ in the eq. (9), the linear part becomes in form of:

$$\Delta_0(\beta_1^2+\alpha_{fr}\beta_1+\alpha_{el})e^{\beta_1 t}=-\alpha_{sys} \quad (11)$$

At very beginning, when $t \rightarrow 0$, this expression is transferred to a quadratic equilibrium:

$$\beta_1^2+\alpha_{fr}\beta_1+(\alpha_{el}+\alpha_{sys}/\Delta_0)=0 \quad (12)$$

which can be resolved with respect to variable $\beta_1$, i.e. basic frequency of oscillation:

$$\beta_1 = \frac{-\alpha_{fr} \pm \sqrt{\alpha_{fr}^2 - 4(\alpha_{el} + \alpha_{sys}/\Delta_0)}}{2} \quad (13)$$

In general, there are three classes of solution depending on the sign of square root in eq. (13). However, in the case of solenoids applied to move a needle inside of a high pressure fuel barrel, for example, the friction force is negligibly small versus elastic and gravity forces $\alpha_{fr}^2 << 4(a_{el}+\alpha_{sys})$, the solution to basic frequency β can be rewritten as:

$$\beta_1=\pm\sqrt{\alpha_{el}+\alpha_{sys}/\Delta_0}=\pm i\omega_1 \quad (14)$$

and general solution $x_1(t)$ for the upward lifting dynamics at the start of injection is:

$$x_1(t)=\Delta_0 e^{\pm\omega_1 t}=\Delta_0[\cos(\omega_1 t)\pm i\sin(\omega_1 t)] \quad (15)$$

The second function regarding non-linear part of the eq. (9) has the same generalized form as:

$$x_2(t) = \gamma_2 e^{\beta_2 t} \quad (16)$$

Taking derivatives of x' and x" from the function $x_2(t)$ in the eq. (9), one can obtain equilibrium of:

$$(\beta_2^2 + \alpha_{fr}\beta_2 + \alpha_{el})\gamma_2 e^{\beta_2 t} = \alpha_{mag} I_\Delta^2 f(t) \quad (17)$$

Given an electric circuit of solenoid composed of an inductor with inductance L and a resistor with resistance R in series connection, the Kirchhoff loop rule requires that the sum of the changes in potential around the circuit must be zero, so:

$$L\frac{dI}{dt} + IR = 0 \quad (18)$$

The solution for this eq. (18) is:

$$I = I_0 e^{-\frac{R}{L}t} \quad (19)$$

The magnetic field of a current-carrying conductor or a coil changes with the conductor current. A voltage proportional to the change in current is induced in the conductor itself and counteracts the current change producing it. Therefore, for the self-induction, eq. (18) is transformed to:

$$-L\frac{dI}{dt} + IR = 0 \quad (19.1)$$

which solution is:

$$I = I_0 e^{\frac{R}{L}t} \quad (20)$$

Now, assuming only one solenoid or coil forcing the needle upward, which current is described by eq. (19), one can rewrite (17) as:

$$(\beta_2^2+\alpha_{fr}\beta_2+\alpha_{el})\gamma_2 e^{\beta_2 t}=\alpha_{mag} I_\Delta^2 e^{-\frac{2R}{L}t} \tag{21}$$

from which the solution can be found using equality of constant and time dependent parts:

$$(\beta_2^2+\alpha_{fr}\beta_2+\alpha_{el})\gamma_2=\alpha_{mag} I_\Delta^2 \tag{22}$$

$$e^{\beta_2 t}=e^{-\frac{2R}{L}t} \tag{23}$$

and general solution, expressed by eq. (16), assuming negligibility of friction force versus magnetic and elastic forces, becomes:

$$x_2(t)=\frac{\alpha_{mag} I_\Delta^2}{\left[\frac{4R^2}{L^2}+\alpha_{el}\right]}e^{\pm\frac{2R}{L}t}=kI_\Delta^2 e^{\pm\omega_{21}t} \tag{24}$$

where "+" sign reflects start up (switch-on) of the solenoid and "−" reflects switch off of the solenoid, $\omega_{21}$, is a transient frequency determined time response, k is amplification factor due to combination of the injector and solenoid construction parameters, and $I_\Delta$ is a current level which is limited because resistance heat-cooling balance suffering burn damage. This second lift component $x_2$ (t) is much greater than $x_1(t)$ while the solenoid of injector (or of an actuator) is energized. The time response is limited by all three factors indicated in eq. (24) and for a given injector/solenoid configuration can be controllable only through possible control (increase) of transient frequency $\omega_{21}$.

Now, assuming that at the transient moments the current applied to a primary coil characterized by $k_1$, $I_{\Delta 1}$ and $\omega_{21}$ is generated by a remote (not installed physically on the same injector or actuator housing) solenoid characterized by $k_2$, $I_{\Delta 2}$ and $\omega_{22}$, on which is also just energized or de-energized (opened or closed). Transmission of the self-induction transient current from secondary solenoid to the first coil will generate a very special sharply shaped current that can be performed by super-exponential "I-Function":

$$I_F(t)=e^{\frac{\omega_{21}t}{\exp(\omega_{22}t)}} \tag{25}$$

Figure 10:
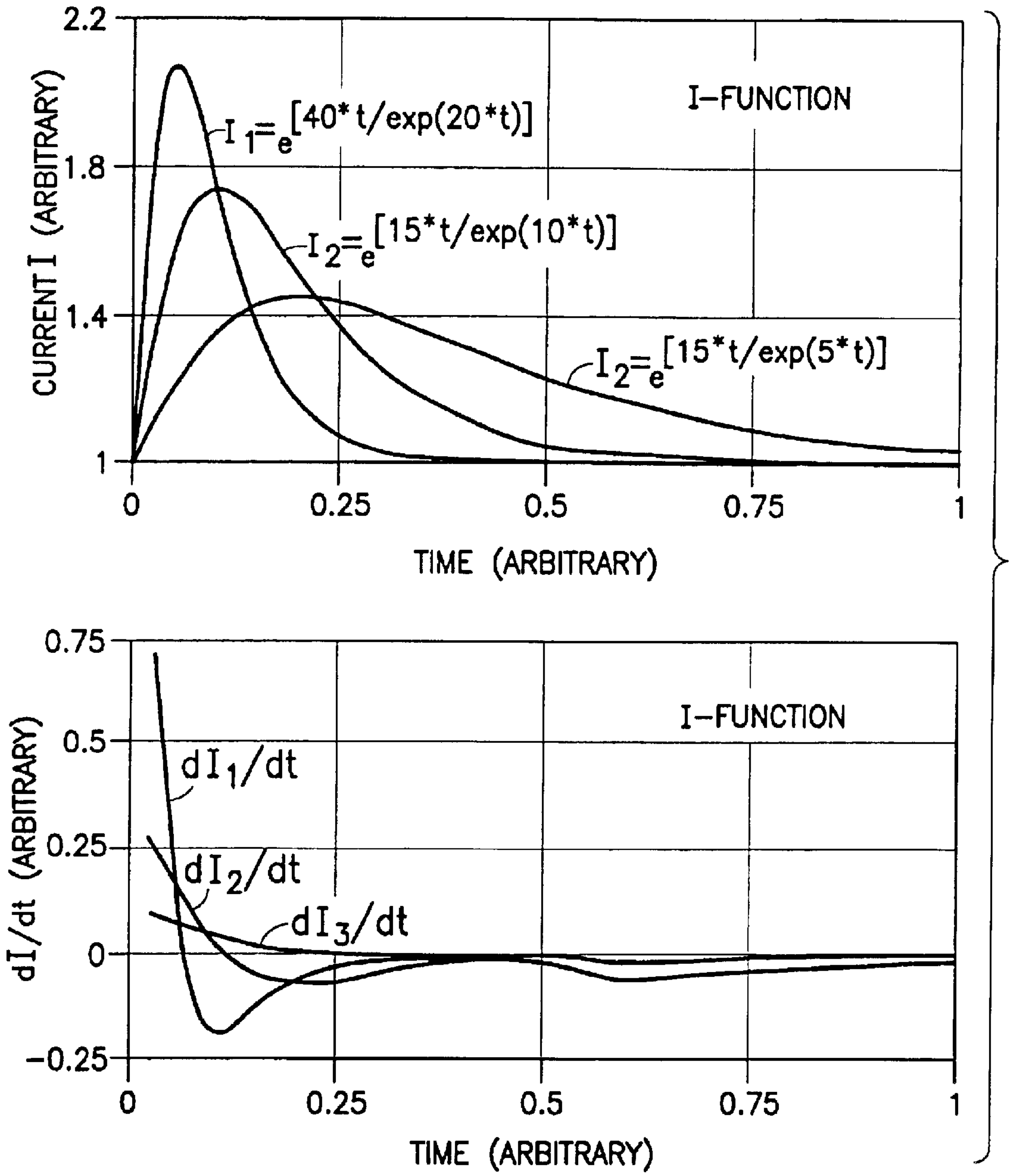
FIG. 10 depicts a graphic of one example of an I-Function (i.e., $I_F$ (t) and its first order derivative $dI_F(t)/dt$) according to an embodiment of the present invention directed to a single injection event.

This function operates as a modulation function $f(t)$ in eq. (17), i.e., it implies a speed of dynamic influencing directly on transient frequency (or time response) of the primary "physically" installed solenoid. Some basic features of the I-Function and its first order derivative are shown in FIG. 10. As seen in this Fig., the maximum peak phase of the current is gradually shifted upon a magnitude of $\omega_{22}$ (in other words by a factor $R_1/L_2$ of the secondary coil) while the peak amplitude is dependent on $\omega_{21}$ (in other words by a factor $R_1/L_1$). The transition period is also controllable depending upon the ratio between $\omega_{21}$ and $\omega_{22}$. The higher magnitude of this ratio determines the shorter transition.

The same ratio factor controls the speed of lifting indicated by the first order derivatives: the higher ratio $\omega_{21}/\omega_{22}$ reflects more rapid speeding of the needle lift. The turnover points in the bottom plot of FIG. 10 indicate that rapid "one-peak" acceleration is achieved at higher ratio values. The lower ratio may reflect a series of acceleration peaks. Of note, the secondary solenoid may be presented by a non-physically installed remote coil. It can be also coded as a signal (e.g., a digital signal) and, using a D/A converter, for example, supplied to the primary coil. An illustrative secondary and primary coil configuration may utilize a highest ratio of $\omega_{21}/\omega_{22}$ that excludes a longer transition and makes possible to induce strong magnetic flux in the primary coil within shortest time permitting a long time of heat dissipation (e.g., the shortest transient induction duty cycle permitting afterwards to run ultra-shot multi-injection cycle per each injection stroke).

Criteria to select operation parameters of the coils are determined by the momentum equations:

$$(\beta_2^2+\alpha_{fr}\beta_2+\alpha_{el})\gamma_2 e^{\beta_2 t}=\alpha_{mag} I_\Delta^2 I_F(t) \tag{26}$$

which implies that:

$$(\beta_2^2+\alpha_{fr}\beta_2+\alpha_{el})\gamma_2=\alpha_{mag} I_\Delta^2 \tag{27}$$

$$\beta_2 e^{\beta_2 t}=\frac{dI_F(t)}{dt} \tag{28}$$

The first equation (27) determines construction of the primary coil in terms of inductance $L_1$ and time response $R_1/L_1$. The second equation (28), the rapid speeding, permits to calculate ratio of $\omega_{21}/\omega_{22}$ which is used for deduction of the secondary coil properties: inductance $L_2$ and time response $R_2/L_2$ or take out the input signals to a secondary solenoid digital (electronic) model.

Figure 11A:
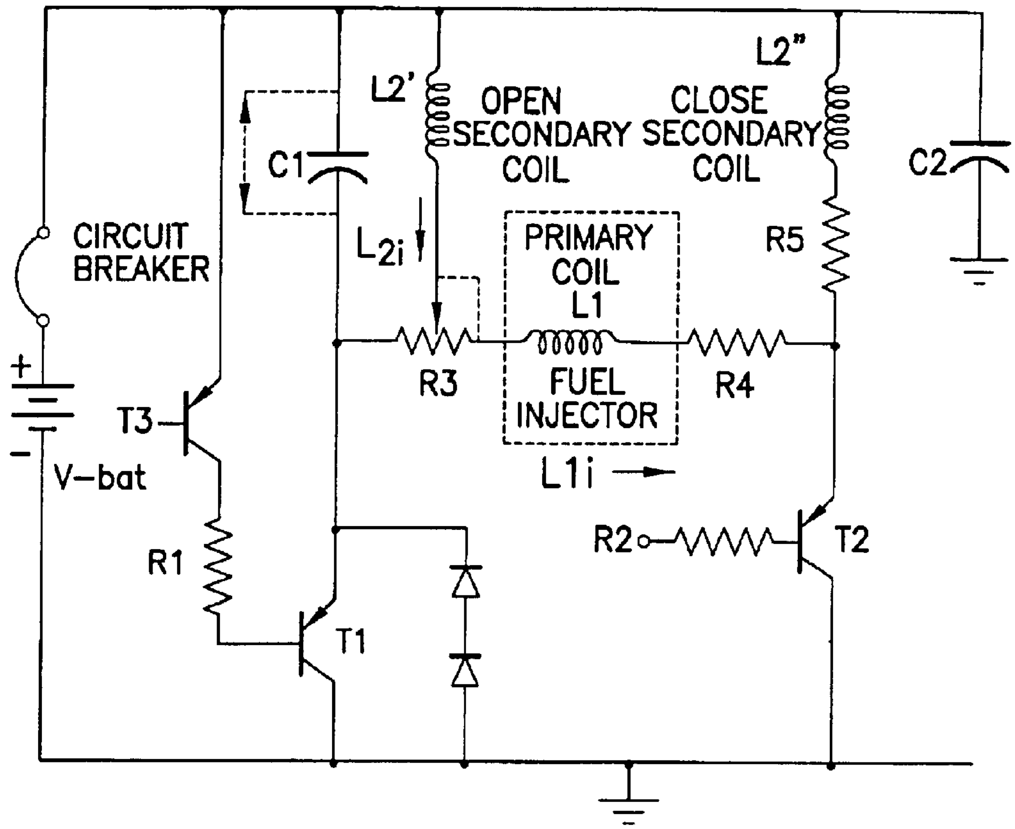
FIG. 11A depicts one example of a secondary coil incorporated into an electric control circuit according to an embodiment of the present invention and FIG. 11B depicts two associated timing scenarios according to an embodiment of the present invention (wherein the top diagram in FIG. 11B indicates charging of a secondary coil simultaneously with injector firing (simultaneous charge) and the bottom diagram in FIG. 11B shows charging of the secondary before the injector firing (pre-charge))
Figure 11B:
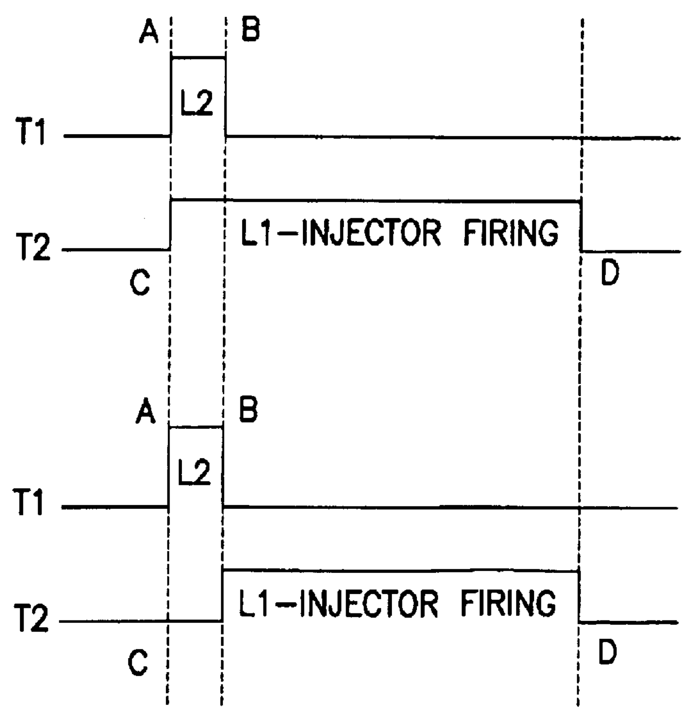

Referring now to FIG. 11A, one example of an electric circuit incorporated secondary coil (which example is intended to be illustrative and not restrictive) is shown. More particularly, FIG. 11A shows a simple inductive pre- and post secondary inductor circuit (e.g., for a fuel injection system) and FIG. 11B shows two associated timing scenarios. In these Figs. the secondary inductor or secondary coil (SC) is designed to create a fuel injector driver, which uses one or two secondary inductors to enhance injector performance. Of note, this equipment may generate much higher voltages than normal fuel injector drivers, which may break the injector's dialectic insulation and/or can cause injury to the unwary operator. Therefore, critical parameters may first be simulated using code (e.g., the code described below). In addition, although quicker fuel injector currents are expected, there is no guarantee as to the physical speed or change in speed of the injector. Therefore, each new model may be verified using specially developed test equipment. Later on, one can find a description of the test procedures with regard to the fuel injectors for internal combustion engines In any case, the circuit in FIG. 11A may operate as follows:

Before the injector solenoid with inductance L1 is fired the secondary inductors, L2 and L3 will be pre-charged. Both transistors T1 and T2 are turned on at this time.

Transistor T1 is turned off when injection is desired.

The current, pre-charged on the secondary L2, generates a high voltage that drives the injector inductor, i.e. primary coil ("PM").

Afterwards, the current stabilizes to maintain the valve open.

Turning off transistor T2 leaves currents in the injector (L1) and inductor (L3) competes causing much higher voltages at TP2. The competing currents will also terminate the injector current quicker.

Of note, the circuit schematic of FIG. 11A represents system basics generically, not specifically to the final circuit related to specific injector and/or other type of actuators. For instance, the secondary inductors may be varied and additional resistance may be added for steady state operations. The main driving transistors may also require their own drivers. The charge time is easily controlled through the charge time of L2. The R1 is the resistance added in the driver. That resistance is essentially only to safeguard the circuit. If the L2 charges too long the circuit may burn up. In final configuration, the ECU of the vehicle may protect the final circuit. The transistors are treated as switches, so they are ignored for the purposes of the simulation code discussed below. Since T1 is off and T2 is on, for the simulation program it is necessary to consider the current stream going from parallel C1-L1 loop farther through chain of injector components R3-L1-R4 to transistor T2. The T3 is in the event that a function generator could not drive the T1 transistor. The T1 transistor only has an amplification of about 12, hence it takes almost 1 amp for the transistor to drive 10 amps. To get supercharging of the secondary coil the electric circuit may need to be changed in such way that the secondary coil is connected to the primary injector coil skipping over the control resistor (in FIG. 11A the connection of L2 is going directly to L1 skipping over R3). One may need to drive transistors T1 and T2 through R1 and R2 respectively with a control device capable of 1 amp power supply. The values are dependent on voltages. Care may need to be applied in selecting the proper transistors (although MOSFETs are typically cheaper and easier to design with, practical experience shows that a good Bipolar may survive test more reliably). Accordingly, while various circuit parameters may be changed as desired and/or dictated by application, it is understood that such changes are readily within the reach of those of ordinary skill in the art in light of the present disclosure.

Referring now to code for the calculation of the secondary coil charging time (an example of which code is described below), it is noted that such code may compute a minimum time needed to charge a secondary coil for generating an I-Function like shaped current depending on inductance and resistance characteristics of the primary and secondary coils as well as initial current and voltage values applied to the capacitor and the coils. Direction of the current through secondary coil $L2_i$ and $L1_i$ as well as voltage onto the capacitor $C_V$ are schematically indicated in FIG. 11A. The calculation is based on basic current and voltage equations applied to a capacitor and an inductor:

$$I_c = C\frac{dV}{dt} \tag{29}$$

$$V_i = C\frac{di}{dt} \tag{30}$$

where V and i are time dependent variables. The change in voltage on the capacitor is:

$$dC_V = \frac{L2_i - L1_i}{C}dt \tag{31}$$

In addition, the voltages associated with resistances of secondary R2 and primary R1 coils are:

$$R2_V = L2_i R2 \tag{32}$$

$$R1_V = L1_i R1 \tag{33}$$

From FIG. 11A one can write the voltages balance on secondary $L2_V$ and primary $L1_V$ coils as:

$$L2_V = V_{battery} - R2_V - C_V \tag{34}$$

$$L1_V = C_V - R1_V \tag{35}$$

Therefore, according to equations (29) and (30), the changes in current through secondary and primary coils can be derived to:

$$L2_i = \frac{L2_i}{L2}dt \tag{36}$$

$$L1_i = \frac{L1_i}{L1}dt \tag{37}$$

Turning now to a specific example of computer code for determining various parameters associated with the present invention (which example is intended to be illustrative and not restrictive), the following code may be used:

```
program secondary solenoid

c     +12V---L2---R2——o——L1----R1----Gnd
c             +-+        |
c                        C
c                        |
c                       Gnd
c

c     Ic = C dv/dt --> dv = Ic / C * dt
c     Vi = L di/dt --> di = Vi / L * dt
      real L2, L1, R2, R1
      real L2i, Lli, L2v, L1v, R2v, R1v
      real t, dt
      real C, Cv, Vin
      integer i
c----------------------------------------------------
c input basic parameters
open (4,file='Input_Electric.dat')
      read (4,'(a80)')dummy
      read (4,*) L2
      read (4,'(a80)')dummy
      read (4,*) R2
      read (4,'(a80)')dummy
      read (4,*) L1
      read (4,'(a80)')dummy
      read (4,*) R1
      read (4,'(a80)')dummy
      read (4,*) C
      read (4,'(a80)')dummy
      read (4,*) Vin
      read (4,'(a80)')dummy
      read (4,*) L2i
      read (4,'(a80)')dummy
      read (4,*) L1i
      read (4,'(a80)')dummy
      read (4,*) R2v
      read (4,'(a80)')dummy
      read (4,*) R1v
      read (4,'(a80)')dummy
      read (4,*) Cv
      read (4,'(a80)')dummy
      read (4,*) t
      read (4,'(a80)')dummy
      read (4,*) dt
      read (4,'(a80)')dummy
      read (4,*) Nt
      close (4)
c================================================
      open (10,file='AllData.dat')
      write (10,*) 'L2', L2*1e3, ' [mH]'
```

-continued

```
      write (10,*) 'R2', R2, ' [Ohm]'
      write (10,*) 'L1', L1*1e3, ' [mH]'
      write (10,*) 'R1', R1, '[ Ohm]'
      write (10,*) 'C=', C*1e6, ' [uF]'
      write (10,*) 'Vin=', Vin, ' [V]'
      write (10,*) 'L2i', L2i, ' [A]'
      write (10,*) 'R2v', R2v, ' [V]'
      write (10,*) 'L1i', L1i, ' [A]'
      write (10,*) 'R1v', R1v, ' [V]'
      write (10,*) 'Output Data:'
      write (10,*) 'L2 charge time=', L2i*L2/Vin/1e-6, ' [ us]'
      write (10,*) 't[us] Cv[V] L2i[A] L1i[A]'
      do i= 1, Nt
      Cv = Cv + (L2i-L1i)/C*dt
      if(Cv.le.-1.4) Cv= -1.4
      R2v = L2i * R2
      R1v = L1i * R1
      L2v = Vin - R2v - Cv
      Liv = Cv - R1v
      L2i = L2i + L2v / L2 * dt
      L1i = L1i + L1v / L1 * dt
      write (10,89) t*1e6, Cv, L2i, L1i
89 format (f5.1, 2x, f6.1, 2x, f5.1, 2x, f5.1)
      t = t + dt
      enddo
      close(10)
      stop
end
```

Input Data File

L2 is inductance of secondary solenoid, [H]
0.000209
R2 is resistance of secondary solenoid, [Ohm]
0.5
L1 is inductance of primary (injector) solenoid, [H]
0.0005
R1 is resistance of secondary solenoid, [Ohm]
20.0
C is capacity, [F]
0.33e−6
Vin is supply voltage, [V]
24.0
L2i is initial current through secondary solenoid, [A]
8.0
L1 is initial current through primary (injector) solenoid, [H]
0.0
R2v is initial votage applied on secondary solenoid, [V]
0.0
R1v is initial votage applied on primary (injector) solenoid, [V]
0.0
Cv is initial volage on capacitor, [V]
0.0
t is initial time, [s]
0.0
dt is time increment, [s]
2.0e−7
Nt is number for timing, [—]
1200
M is number for data print control
10

Output Data File

L2 0.209000006 [mH]
R2 0.500000000 [Ohm]
L1 5.00000000 [mH]
R1 1.29999995 [Ohm]
C= 0.330000013 [uF]
Vin= 24.0000000 [V]
L2i 8.00000000 [A]
R2v 0.00000000E+00 [V]
L1i 0.00000000E+00 [A]
R1v 0.00000000E+00 [V]
Output Data:
L2 charge time 69.6666718 [ us]
t[us] Cv[V] L2i[A] L1i[A]
0.0 0.0 8.0 0.0
2.0 53.3 7.9 0.0
4.0 99.8 7.3 0.0
6.0 141.4 6.4 0.1

-continued 8.0 175.7 5.0 0.2
10.0 200.6 3.4 0.2
12.0 214.8 1.6 0.3
14.0 217.5 −0.2 0.4
16.0 208.4 −2.0 0.5
18.0 188.2 −3.7 0.6
20.0 158.3 −5.1 0.6
22.0 120.3 −6.2 0.7
24.0 76.6 −6.8 0.7
26.0 30.0 −7.0 0.8
28.0 −1.4 −6.9 0.8
30.0 −1.4 −6.6 0.8
32.0 −1.4 −6.3 0.8
34.0 −1.4 −6.0 0.8
36.0 −1.4 −5.8 0.7
38.0 −1.4 −5.5 0.7
40.0 −1.4 −5.2 0.7
42.0 −1.4 −5.0 0.7
44.0 −1.4 −4.7 0.7
46.0 −1.4 −4.4 0.7
48.0 −1.4 −4.2 0.7
50.0 −1.4 −3.9 0.7
52.0 −1.4 −3.6 0.7
54.0 −1.4 −3.4 0.7
56.0 −1.4 −3.1 0.7
58.0 −1.4 −2.9 0.7
60.0 −1.4 −2.6 0.7
62.0 −1.4 −2.4 0.7
64.0 −1.4 −2.1 0.7
66.0 −1.4 −1.8 0.7
68.0 −1.4 −1.6 0.7
70.0 −1.4 −1.3 0.7
72.0 −1.4 −1.1 0.7
74.0 −1.4 −0.8 0.7
76.0 −1.4 −0.6 0.7
78.0 −1.4 −0.4 0.7
80.0 −1.4 −0.1 0.7
82.0 −1.4 0.1 0.7
84.0 −1.4 0.4 0.7
86.0 −1.4 0.6 0.7
88.0 −1.2 0.9 0.7
90.0 0.2 1.1 0.7
92.0 3.0 1.3 0.7
94.0 6.9 1.5 0.7
96.0 11.8 1.6 0.7
98.0 17.3 1.7 0.7
100.0 23.1 1.7 0.7
102.0 28.9 1.7 0.8
104.0 34.2 1.6 0.8
106.0 38.9 1.5 0.8
108.0 42.5 1.3 0.8
110.0 45.0 1.1 0.8
112.0 46.1 0.9 0.8
114.0 45.7 0.7 0.8
116.0 44.0 0.5 0.9
118.0 41.1 0.3 0.9
120.0 37.0 0.1 0.9
122.0 32.1 0.0 0.9
124.0 26.7 0.0 0.9
126.0 21.0 0.0 0.9
128.0 15.5 0.1 0.9
130.0 10.4 0.2 0.9
132.0 6.1 0.3 0.9
134.0 2.8 0.5 0.9
136.0 0.7 0.7 0.9
138.0 −0.1 0.9 0.9
140.0 0.5 1.2 0.9
142.0 2.4 1.4 0.9
144.0 5.5 1.6 0.9
146.0 9.7 1.7 0.9
148.0 14.6 1.8 1.0
150.0 19.9 1.9 1.0
152.0 25.4 1.9 1.0
154.0 30.7 1.8 1.0
156.0 35.5 1.7 1.0
158.0 39.5 1.6 1.0
160.0 42.5 1.4 1.0
162.0 44.2 1.2 1.0
164.0 44.7 1.0 1.1

-continued

| | | | |
|---|---|---|---|
| 166.0 | 43.8 | 0.8 | 1.1 |
| 168.0 | 41.6 | 0.6 | 1.1 |
| 170.0 | 38.4 | 0.5 | 1.1 |
| 172.0 | 34.1 | 0.4 | 1.1 |
| 174.0 | 29.3 | 0.3 | 1.1 |
| 176.0 | 24.0 | 0.3 | 1.1 |
| 178.0 | 18.7 | 0.3 | 1.1 |
| 180.0 | 13.6 | 0.4 | 1.2 |
| 182.0 | 9.1 | 0.5 | 1.2 |
| 184.0 | 5.4 | 0.6 | 1.2 |
| 186.0 | 2.8 | 0.8 | 1.2 |
| 188.0 | 1.3 | 1.0 | 1.2 |
| 190.0 | 1.2 | 1.3 | 1.2 |
| 192.0 | 2.3 | 1.5 | 1.2 |
| 194.0 | 4.6 | 1.6 | 1.2 |
| 196.0 | 8.0 | 1.8 | 1.2 |
| 198.0 | 12.3 | 1.9 | 1.2 |
| 200.0 | 17.1 | 2.0 | 1.2 |
| 202.0 | 22.3 | 2.0 | 1.2 |
| 204.0 | 27.4 | 2.0 | 1.2 |
| 206.0 | 32.2 | 1.9 | 1.2 |
| 208.0 | 36.4 | 1.8 | 1.2 |
| 210.0 | 39.8 | 1.7 | 1.2 |
| 212.0 | 42.1 | 1.5 | 1.2 |
| 214.0 | 43.2 | 1.3 | 1.3 |
| 216.0 | 43.1 | 1.1 | 1.3 |
| 218.0 | 41.7 | 1.0 | 1.3 |
| 220.0 | 39.2 | 0.8 | 1.3 |
| 222.0 | 35.7 | 0.7 | 1.3 |
| 224.0 | 31.4 | 0.6 | 1.3 |
| 226.0 | 26.6 | 0.5 | 1.3 |
| 228.0 | 21.6 | 0.5 | 1.4 |
| 230.0 | 16.7 | 0.6 | 1.4 |
| 232.0 | 12.1 | 0.7 | 1.4 |
| 234.0 | 8.1 | 0.8 | 1.4 |
| 236.0 | 5.1 | 1.0 | 1.4 |
| 238.0 | 3.1 | 1.1 | 1.4 |

Referring now to secondary coil charging scenarios and electric wave forms, it is noted that at least two different charge-timing scenarios may be applied. In one, the secondary coil SC is charged (e.g., from zero to a few thousands of microseconds) essentially simultaneously with the injection duration signal applied to the primary coil (PC), in other words, essentially simultaneously with the primary coil. As seen in the bottom part of FIG. 11B, the charging period of the SC is controlled by the transistor T1 and indicated by triggering impulse AB. Closing, opening, and closing of the PC is controlled through transistor T2. Impulse CD at the transistor indicates injection duration pulse. This scenario is called "simultaneous charge".

In the second scenario, the SC is charged first and afterwards a signal is applied to the PC. In FIG. 11B this is shown as series of triggering impulses AB at T1 and CD at T2. This scenario is called "pre-charge" (there is another scenario when the SC starts charging and during this phase, after some delay, the PC also starts its duty cycle (injection duration signal at T2); this mixed charging scenario is called "shifted charge).

Figure 12A:
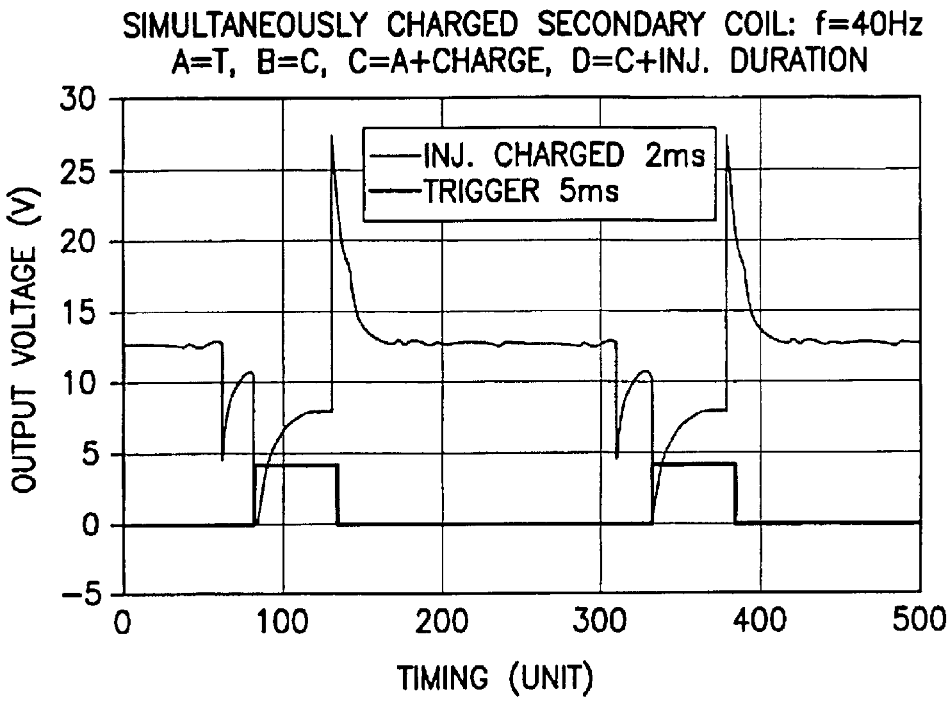
FIG. 12A depicts one example of waveform time series for a simultaneous charged secondary coil according to an embodiment of the present invention (wherein the bold solid line is a triggering signal controlling injection duration by T2 of FIG. 11A (CD cycle of FIG. 11B) and the regular solid line is output voltage measured from primary coil) and FIG. 12B depicts one example of waveform time series for a pre-charged secondary coil according to an embodiment of the present invention (wherein the bold solid line is a triggering signal controlling injection duration by T2 of FIG. 11A (CD cycle of FIG. 11B) and the regular solid line is output voltage measured from primary coil).
Figure 12B:
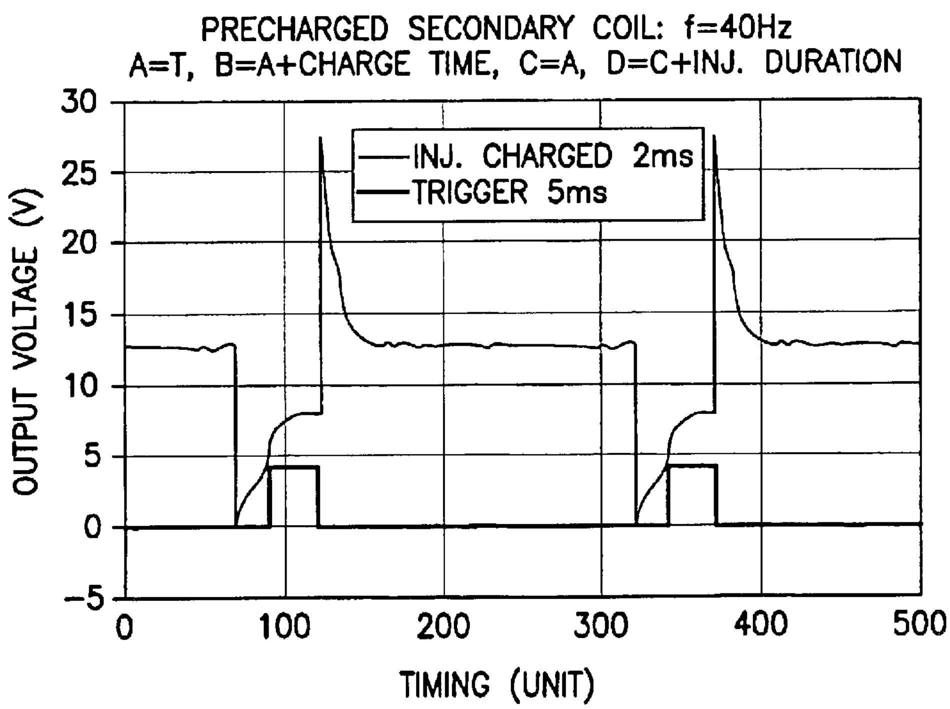

FIG. 12A illustrates typical waveforms for simultaneous charge of the SC and FIG. 12B illustrates typical waveforms for the pre-charge of the SC. Because of the inductance of the SC in the circuit and connection of L2 in series with L1, in both cases the charging of the PC starts with delay essentially equal to the time at which the SC is charged. However, the waveforms obtained from a tested injector are different.

Figure 13:
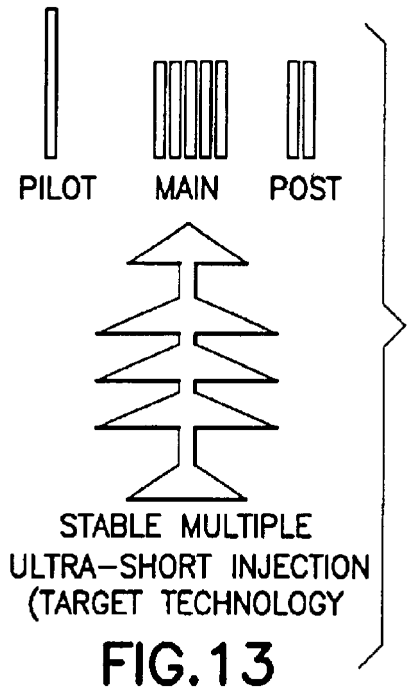
FIG. 13 depicts stable multiple ultra-short injection according to an embodiment of the present invention.

Under simultaneous charge, the diagram in FIG. 12A, the magnetic energy accumulated into the SC transfers rapidly and at higher level of amplitude. Two phase-separated spikes are observed. The first spike shows start of the SC charge. The second spike indicates startup of the PC operation (injection duration). This regime is very important for injection and combustion control (e.g., over diesel engines). It permits the split of the whole injection cycle per each stroke in multi-shot ultra-shot injection series (e.g., pilot injection and series main injection). This allows, as seen in FIG. 13, the transfer of a diesel stratified diffusion flame structure into a "Christmas-like" structure with multi access of air into the diffusion flame boundaries (resulting in more complete combustion at any given rate of the fuel; increase in fuel economy; and a cut-off emission of particulate matter and NOx).

Referring once again to FIG. 12B, it is seen that this diagram relates to the "pre-charge" case. The first spike indicates charging of the SC and in "cascade" the second spike shows charging of the PC and startup the injection. At the transition moment one can see a small "zigzag" type oscillation which indicates that the PC is rapidly interfered with magnetic flux of the SC. This regime is particularly applicable for gasoline engines (especially for direct injection gasoline engines where the spray structure is stratified). Rapid opening of the valve permits the spray to reach fine quality within very short time fraction. If the injector has swirl nozzle exit, this technique permits control of swirl speed (rotational speed) that results in a fine spray essentially immediately after fuel jet breaks up into the spray. The same case is important for the diesel engines at the moment when one needs to organize multi-shot injection, described above (e.g., a main injection with well controlled dwell intervals between injection shots).

Referring now to verification of injection system operation (e.g., speed), it is noted (as mentioned before) that there is no guarantee regarding the timing response of the whole injector system (i.e., even if the electric output signal from the fuel injector coupled with the SC controller indicates fast response). Direct applications of a secondary solenoid (SC) in automotive field are typically related to diesel and direct injection gasoline engines where a stratified charge of fuel mixed with tumbled or vortex airflow determines the quality of combustion and its completeness. The spraying of fuel typically ends immediately after dropping down the pressure in the accumulation injector chamber (or high-pressure gallery). In other words, the closing timing on the valve is a quite rapid process because propagation of the pressure waves with sound speed brakes the spray even before the mechanical sealing of needle at the nozzle exit occurs. So, in one embodiment the concentration is on the valve opening process.

In this regard, the focus may be placed on injection shot duration ("ISD") with controllable rise time and holding time and the dwell interval ("DI") between the shots. In one example (which example is intended to be illustrative and not restrictive) relating to common rail diesel injectors (e.g., a Bosch system) the ISD is matched at a few tens of microseconds (comparable with "fuel jet break-up time) and DI is matched at a few hundreds of microseconds (limiting to oxidation cycle per single shot to keep diffusion flame around the core spray).

The pilot injection and main injection may to be split into a multi-shot injection series. In DI gasoline engines these requirements may be different; instead, it may be necessary to have only one ~100 ms shot phased properly to the igniting moment. To make a robust and simple verification of SC impact and operation, one may have an injection system with initially controllable injection period (T) and injection duration (tau).

Figure 14:
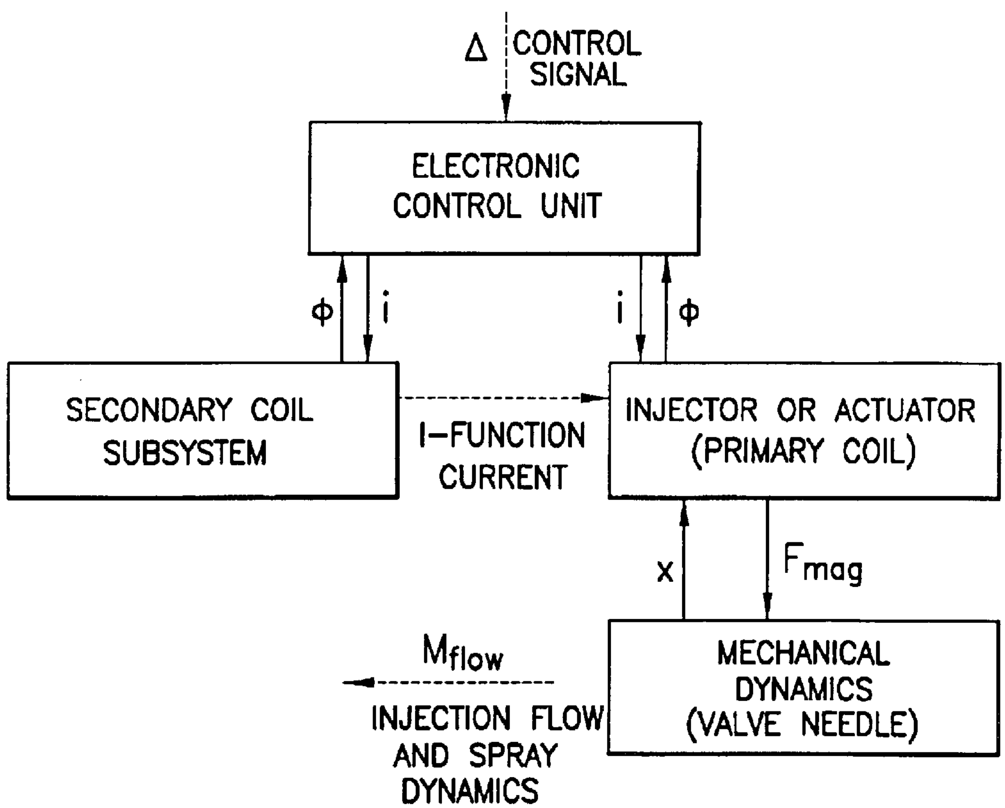
FIG. 14 depicts one example test system configuration used for verification of time response dynamics according to an embodiment of the present invention.

A configuration of a system for managing the injection flow according to an embodiment of the present invention is shown in FIG. 14. A control signal from a sensor (or any available feedback line) is fed to the ECU receiving the signal from all sensors on the engine board and transmitting control signals to the execution parts of the engine. The ECU output also manages the injector primary coil (PC) in terms of current and/or voltage applied onto the PC and depending on the engine run regime produces a current and/or voltage applied onto the secondary coil SC. The SC generates an I-Function like current and the injector rapidly starts to operate (rapid opening of the valve due to magnetic flux).

In order to help ensure that rapid opening of the valve actually takes place (not only electric wave front obviously seen on oscilloscope), the control measurement may be done using the LDV Instantaneous Flow Rate Measurement Stand described in applicant's pending U.S. patent application Ser. No. 20020014224, published Feb. 7, 2002.

Figure 15:
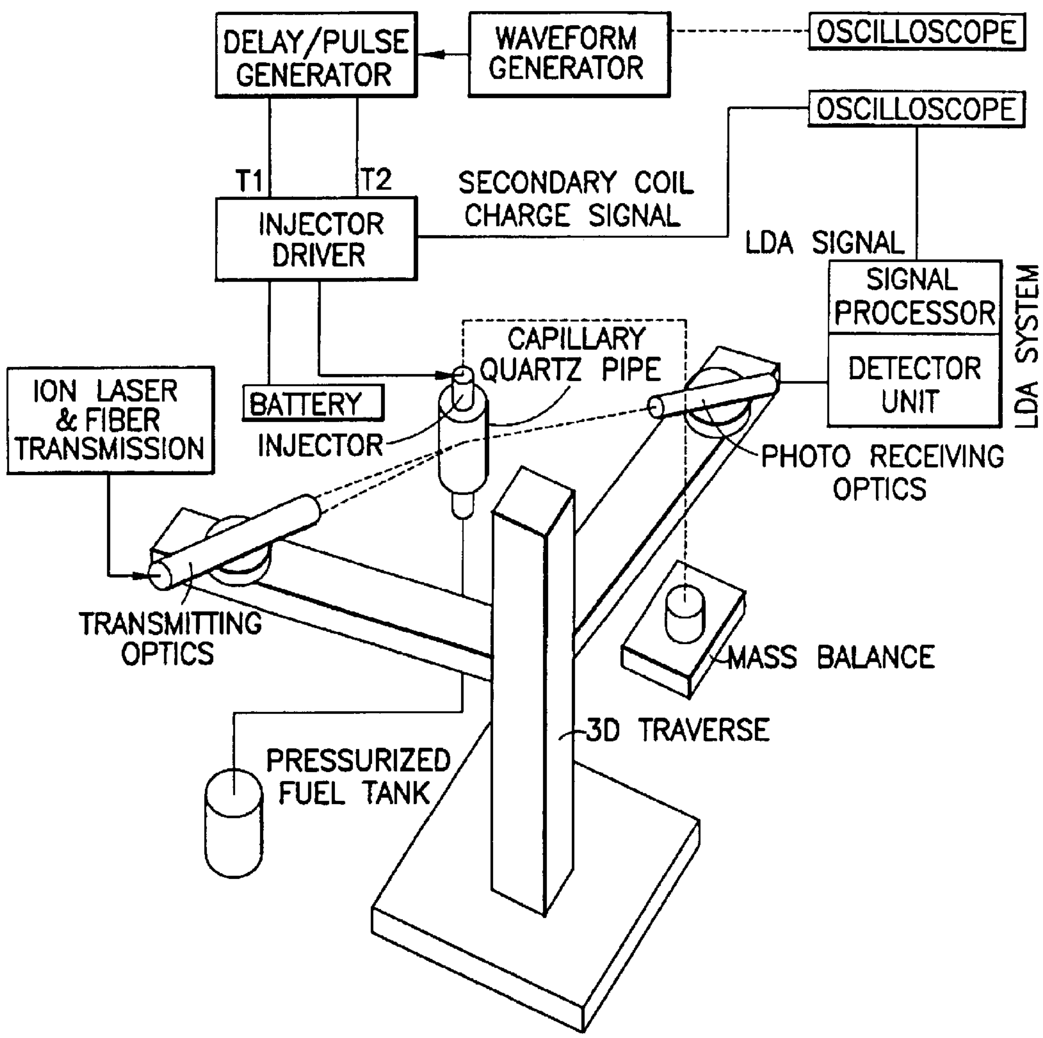
FIG. 15 depicts one example injection system test cell according to an embodiment of the present invention, which test cell is used to verify reaction of a fuel injector connected in series with a charged secondary coil (instantaneous fuel flow rate measurements using laser Doppler anemometer indicate real fuel dynamics while injection oscillatory flow in capillary quartz pipe).

For a demonstration of this rapid response even at low injection pressure, the inventor has built up a test cell, which simulates the injection system depicted in FIG. 14 and described above. The test cell is depicted in FIG. 15 and composes four sub-systems:

The injection system is represented by a fuel tank pressurized by inert nitrogen gas. The fuel delivering line is connected to a measurement intersection in which a capillary quartz pipe is installed. The measurement intersection is constructed to operate at both steady state and oscillatory fuel flow under high injection pressures generated in diesel injection systems. The metal intersection itself is mounted in heavy metal frame with 3D alignment and adjustment mechanics. The outlet of the measurement intersection is flexible to mount essentially any type of fuel injector.

A Laser Doppler Anemometer ("LDA") of Dantec/Invent Measurement Technology GmbH is used to measure centerline velocity into the fuel flow oscillating in the quartz pipe. The LDA consists of the Transmitting and Photo-receiving Optics, the Ion Laser coupled to the Fiber Transmission units, the Fiber PDA 58N70 Detector Units, the Multi PDA 58N80 Signal Processor and the Dantec 3D Traverse. An LDA signal can be observed using the Hewlett Packard Infinium 500 MHz 1 Gsa/s Oscilloscope. To monitor cyclically operating injection flow, the Cyclic Phenomena Dantec software is used to process and treat the output results. Angular encoding signal is provided from a Waveform Generator (e.g., the same one which controls injection duty cycle). The system measures forward and reversed velocity due to the Bragg Cells in the transmitting optics. The main parameters used for the demonstration measurements are:

Optical probe 77×77×945 mm
Fringe spacing 3.15 mm
Frequency shift 40 MHz
Cyclic length 360 degree
Phase averaging bins 360

The injector driver system starts from the Agilent 33120 A 15 MHz Function/Arbitrary Waveform Generator which precisely controls TTL signal frequency. The Stanford Research System, Inc. Model DG 535 Four Channel Digital Delay/Pulse Generator has 8 input/output ports that used to adjust various delays with respect to initially generated TTL trigger impulse waveform. Particularly, AB and CD ports are used to control charging time of secondary coil by transistor T1 and injection duration of injector primary coil by transistor T2, respectively. A Regular automotive battery of 12 V is used as the DC power supply. The output voltage from the secondary coil driver is directly connected to the test injector. The injector plug unit has input/output ports, so the output signal is observed at the Tektronix 2221 100 MHz Digital Storage Oscilloscope.

To verify accuracy of the LDA flow rate measurements, the injected mass time series are recorded using the A&D Company, Ltd. GX-4000 Multi-Functional Balance (simultaneously with the LDA time series). Measurements in steady state and oscillatory flows shows that in laminar flow accuracy lays within 1.1%, in turbulent flow it comes within 2.3%.

In the above example all demonstration measurements were conducted under pressure of 7.3 atm (105.85 psi) at the injection frequency of 50 Hz (20 ms cycle period). Two different charge-timing scenarios were applied. Firstly, SC coil was charged from zero to 2000 microseconds and afterwards the primary solenoid coil (PC) was opened. Injection duration in this particular example was the same for all measurements of 15 ms. Secondly, the secondary coil was charged from zero to 2000 microseconds simultaneously with the injection duration signal applied to the primary coil. Injection duration was setup at 3 and 5 ms, at each case a number of the instantaneous flow rate time series were measured.

Referring now to computer code for operating on each centerline velocity time series associated with the present invention, one example of such computer code (which example is intended to be illustrative and not restrictive) may be as follows (of note, this program reconstructs the measurement data into instantaneous series of volumetric/mass flow rate, pressure gradient and integrated (or accumulated) fuel mass within each injection cycle):

```
c For Turbulent Flows
  program FlowRate_MSU_07
  external bessj0,bessj1
  complex bessj0, bessj1
  complex i
  real tint, M_mean, M_beg, M_per, M_int
  character*2 A1, fname*12
  complex Q(4096), C(4096), P(4096)
  real U(8192), UB(8192), U_t(8192), ph(8192), U_cor(150,150)
  real Qcor(8192), P_Z(8192), Q_u(8192), Mass_int(8192)
  integer Nexp, l, j, NP, NR
  real nue, rho, T0, R, tau, k, d_tph
c-----------------------------------------------------
c input basic parameters
open (4,file='Input_Fuel_BKM.dat')
  read (4,'(a80)')dummy
  read (4,*) T0
  read (4,'(a80)')dummy
  read (4,*) nue
  read (4,'(a80)')dummy
  read (4,*) rho
  read (4,'(a80)')dummy
  read (4,*) R
  read (4,'(a80)')dummy
  read (4,*) tau
  read (4,'(a80)')dummy
  read (4,*) k
  read (4,'(a80)')dummy
  read (4,*) NR
  read (4,'(a80)')dummy
  read (4,*) NP
  close (4)
c-------------------------------------------------------
  f0= 1./T0
  i = (0.,1.)
  pi = 4.*atan(1.)
  w0 = 2*pi*f0
```

-continued

```
  Te0 = R*sqrt(w0/nue)
c---------------------------------------------------------
c input array of the measured velocity series
c within the period using "lvr" software, T0 is equal 720 degree
  open (5,file='ldv.dat')
  l= 0
  10 l=l+1
  read(5,*,end=12) nn, ph(l), nl, u(l), rms
c REVERSED Measurement!
  u(l)= (-1.)*u(l)
  goto 10
  12 continue
  close(5)
  write (*,*) 'experimental data file have been read'
  Tint= T0
  Nexp= l-1
c---------------------------------------------------------------------
c avarage parameters obtained from direct velocity
c time-series measurement
  doof = 0.
  do l = 1,Nexp
  doof = doof + u(l)
Q__u(l)= u(l)*pi*R*R/2.
  enddo
c mean of velocity
  U__mean = doof/float(Nexp)
c mean of mass rate
  M__beg = U__mean*pi*R*R*0.697*rho
c mean of mass per one statistical cycle
  M__per = M__beg*Tint/1000
c---------------------------------------------------------
c Fourier transform and its inverse
c with respect to equidistant time-phases ph(l)
  call fft (u,C,Nexp)
  call ffs (ub,C,Nexp)
  open (6,file='check.dat')
  do j= 1,Nexp
  write (6,*) ph(j),u(j),ub(j)
  enddo
  close (6)
  write (*,*) 'passed Fourier transform and its inverse'
c==================================================
c complex components of pressure gradient
c normalized by density rho
  open(66, file='prgr__comp.dat')
  P(1)= C(1) * 2.* nue / (R*R)
  write(66,*) real(P(1)), imag(P(1))
  do j= 2,Nexp/2+1
  Ten = R*sqrt((j-1)*w0/nue)
  P(j)= C(j)*(j-1)*w0*i/(1.-1./bessj0(i**1.5*Ten))
  write (66,*) real(P(j)), imag(P(j))
  enddo
write (*,*) 'normal.compl.component of press.gradient'
c==================================================
c computing the theoretical velocity time-series
c on a pipe axis
  open (7,file='theory.dat')
  do ln= 1, 100
  U__t(ln)= P(1)*R*R/(4.*nue)
  tph= float(ln)/float(Nexp)*2.*pi
  do j= 2,Nexp/2+1
  Ten = R*sqrt((j-1)*w0/nue)
wn= w0*(j-1)
  U__t(ln)= Real(U__t(ln)+ P(j)*i*cexp(i*tph*(j-1))/wn*
&   (1./(bessj0(i**1.5*Ten))-1.))
  enddo
  write (7,*) ph(ln), ub(ln), U__t(ln)
  write (*,*) ph(ln), ub(ln), U__t(ln)
  enddo
  close (7)
c==================================================
c complex component of flow rate
c   open (77,file='compl__FR.dat')
  Q(1)=0.697*P(1)*pi*R**4/(4.*nue)
c   write (77,*) Q(1)
  do j= 2,Nexp/2+1
  Ten = R*sqrt((j-1)*w0/nue)
  Q(j)= 0.697*P(j)*pi*R*R*i/(w0*(j-1))*
&   (4.*i**0.5*bessj1(i**1.5*Ten)/(Ten*bessj0(i**1.5*Ten))-2.)
```

-continued

```
c exponensial oscillation is given below
  write (*,*) Q(j)
  enddo
c==================================================
c computing of flow rate time-series
c and avarage parameters
  Q__int= 0.
  d__tph= T0/float(Nexp)
  do ln= 1,Nexp
  Qcor(ln)= Q(1)
  tph= float(ln)/float(Nexp)*2.*pi
  do j= 2,Nexp/2+1
  Qcor(ln)= real(Qcor(ln)+Q(j)*cexp(i*tph*(j-1)))
  enddo
  Q__int= Q__int+Qcor(ln)
  Mass__int(ln)= Q__int*rho*d__tph
  enddo
c mean of mass per one period
M__int = Q__int/float(Nexp)*rho
M__mean = Real(Q(1))*rho
  write (*,*) 'flow rate was integrated'
c==================================================
c computing of pressure gradient
  do ln=1,Nexp
  P__Z(ln)= P(1)
  tph= float(ln)/float(Nexp)*2.*pi
  do j= 2,Nexp/2+1
P__Z(ln)= P__Z(ln) + P(j)*cexp(i*tph*(j-1))
  enddo
P__Z(ln)= -rho*P__Z(ln)
  enddo
  write (*,*) 'pressure gradient was computed'
c==================================================
  open (10,file='AllData.dat')
  write (10,*) 'CA[deg] U[m/s] V__t[ml/s] P__z[MPa/m] Mass__int[g]'
  do ln= 1,Nexp
write (10,89) ph(ln), u(ln), Qcor(ln)*1.0e6, P__z(ln)/1.0e6,
&Mass__int(ln)
89 format (f6.1, 2x, f7.3, 2x, f7.3, 2x, f9.5, 2x, f8.5)
  enddo
  close(10)
  open (11,file='result.dat')
  write(11,*)'Injection cycle T0:',T0,'[ms]'
  write(11,*)'Mean velocity U__mean:',U__mean,'[m/s]'
  write(11,*)'MR: di vel int M__beg:',M__beg,'[kg/s]'
  write(11,*)'M/cycle: si vel int M__per:',M__per,'[kg]'
  write(11,*)'Integrated mass flowrate M__int:',M__int,'[kg/s]'
  write(11,*)'*Mass: the first Fourier term:',M__mean,'kg/s]'
  close(11)
stop
end
c==
complex function bessj0(x)
  external summe
complex x
complex summe,bess
integer j
bess=(1.,0.)
  do j=1,12
  bess=bess + summe(x,j)
enddo
  bessj0=bess
return
end
c---------------------------------------------------------------
complex function summe(z,n)
integer n
real prod
complex z
5
prod=1.
do j=1,n
prod= prod*float(j)
enddo
prod= prod*prod*((-1)**n)
summe= (0.25*z*z)**float(n)/cmplx(prod)
return
end
c---------------------------------------------------------------
```

-continued

```
complex function bessj1(x)
external summe1
complex x
complex summe1,bess
bess=(0.,0.)
  do j=1,12
  bess= bess +summe1(x,j)
enddo
bessj1= bess
return
end
c-----------------------------------------------------------------
  complex function summe1(z,n)
  integer n
  real prod
  complex z
  prod=1.
  do J=1,n
  prod=prod*float(j)
  enddo
  prod =((-0.25)**n)*2.*float(n)/(prod*prod)
  summe1=prod*(z**float(2*n-1))
  return
  end
c=================================================
  subroutine fft(X,C,N)
  integer N
  complex C(4098), pin
  real X(8192)
  do i=0,N/2
  pin = (0.,1.)*(8.*atan(1.)*dble(i)/dble(N))
  C(i+1)=(0.,0.)
  6
  do j=1,N
  C(i+1)=C(i+1)+dcmplx(X(j))*CDEXP(pin*dcmplx(-j))
  enddo
  C(i+1)=C(i+1)*dcmplx(2./dble(N))
  enddo
  return
  end
c=================================================
  subroutine ffs(X,C,N)
  integer N
  complex C(4098), argum
  real x(8192)
  do i=1,N
  argum = (0.,1.)*(8.d0*atan(1.)*dble(i)/dble(N))
  x(i) = dble(C(1)*0.5)
  do j=1,N/2
  x(i) = x(i) + dble(C(j+1)*cexp(argum*j))
  enddo
  enddo
  return
  end
```

Figure 16A:
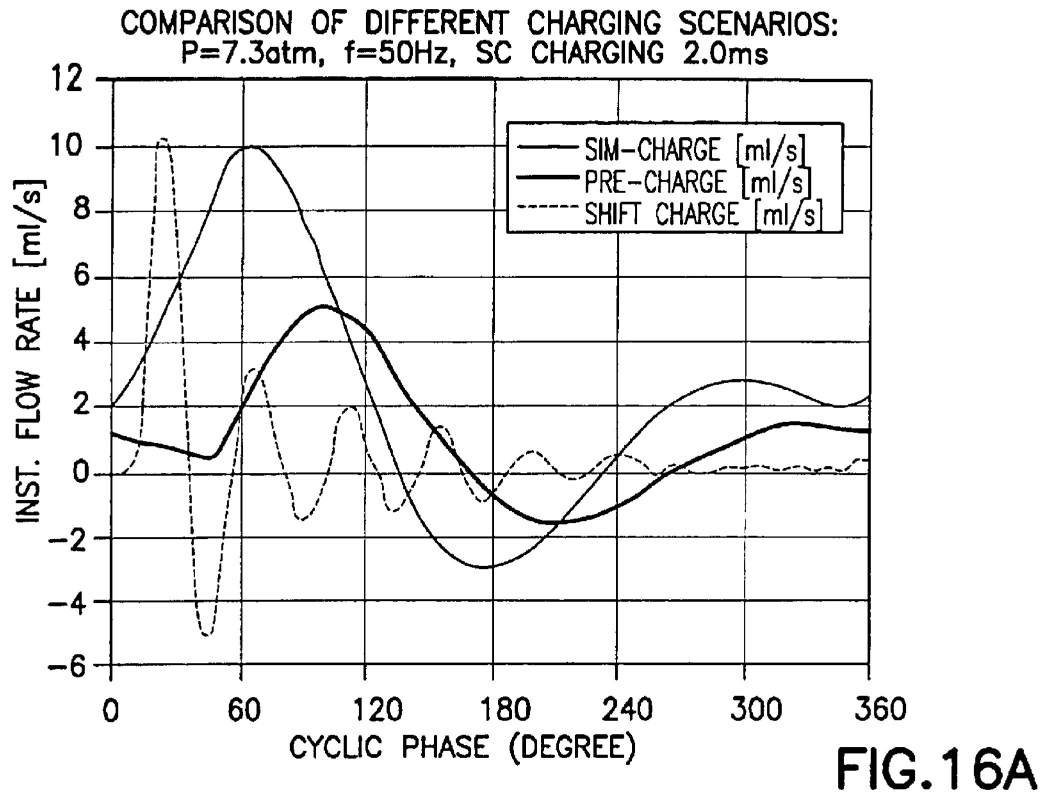
FIGS. 16A and 16B depict example plots according to an embodiment of the present invention of a comparison of different secondary coil ("SC") charging scenarios at the same injection condition (FIG. 16A relates to instantaneous volumetric flow rate and FIG. 16B relates to integrated injection mass) (flow measurement results)
Figure 16B:
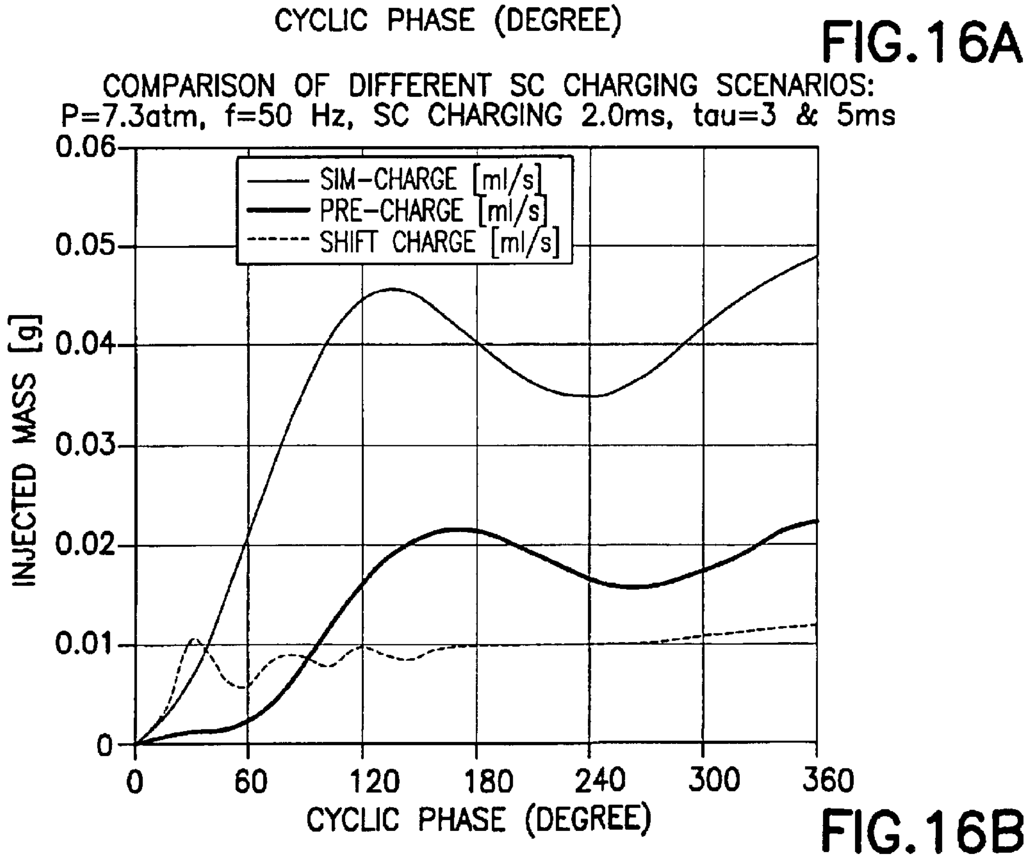

Three different SC charging techniques are depicted in FIGS. 16A and 16B. All the data in these FIGS. 16A and 16B were measured under the same conditions: injection frequency 50 Hz, injection pressure 7.3 atm and SC charging time 2.0 ms. FIG. 16A shows instantaneous volumetric flow rate series and FIG. 16B depicts integrated (or accumulated) injected fuel mass. The first time series in both plots relates to simultaneously charging of primary (injector) and secondary coils. The second line represents pre-charge scenario. The third curve is the case when charging of SC (AC-wave form of FIG. 11B) has been started before the injection (CD-wave form of FIG. 11B), however, at the moment of 1.4 ms when the SC-charging was continued the injection has been also run. So the overlapping time was 0.6 ms.

As one can see from instantaneous and integral time series, the fastest opening of the valve takes place under shifted charge conditions. The slowest opening is associated with the pre-charge. This case also gives lowest level of flow amplitude meaning the lowest speed of the needle at the opening moment. A rapid response without any substantial phase delay is associated with the simultaneous charge of the SC and the PC. Essentially the same flow amplitude characterizes both simultaneous charge and shifted charge. For diesel engines, where the pilot injection and multi-shot must be short and produce larger amount of the injected fuel, shifted charge technique is mostly suitable. Simultaneous charge is well applicable to direct injection gasoline engines and also for diesel engine at the stage of multi-shot main injection when less stratified fuel spray is desired.

Figure 17A:
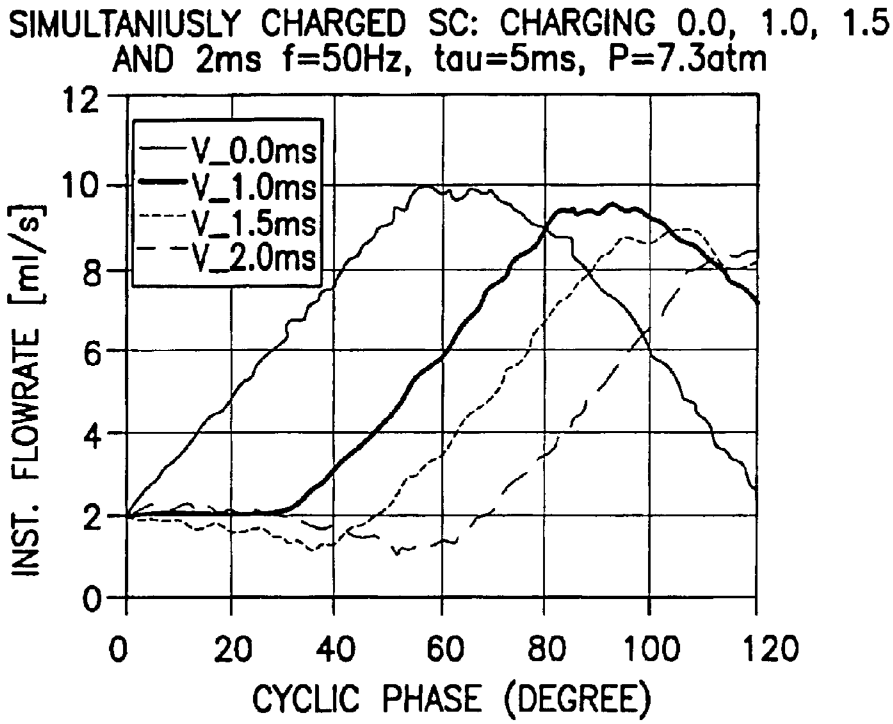
FIGS. 17A–17F depicts a series of example plots according to an embodiment of the present invention of instantaneous volumetric flow rate (top row) and integrated mass (bottom row) time series obtained for different charging schemes (i.e., simultaneous charge—1st column, pre-charge—2nd column; and shifted charge—3rd column) (flow measurement results)
Figure 17B:
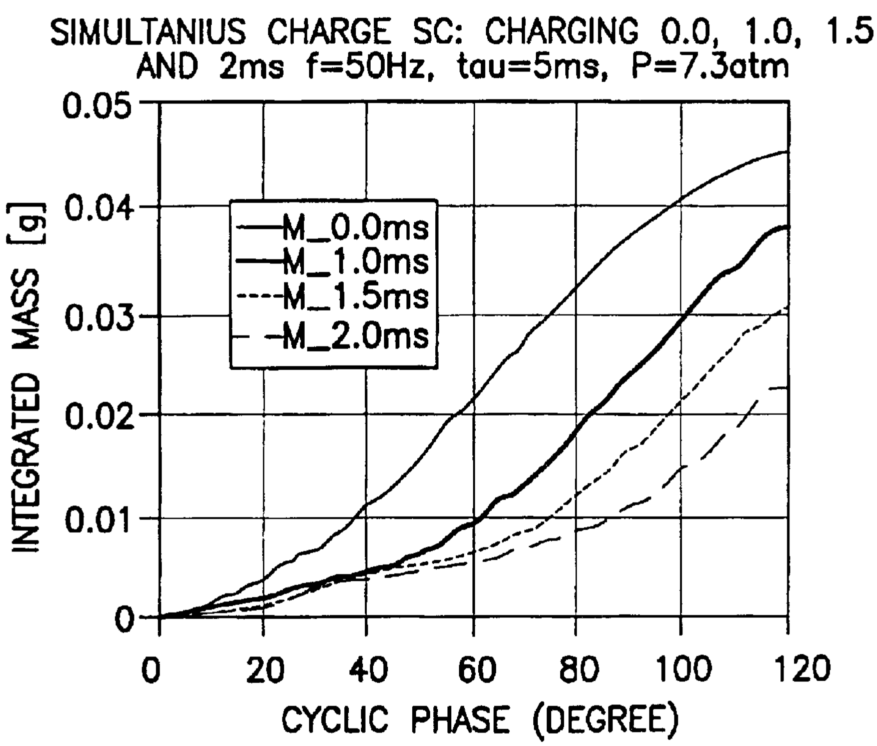
Figure 17C:
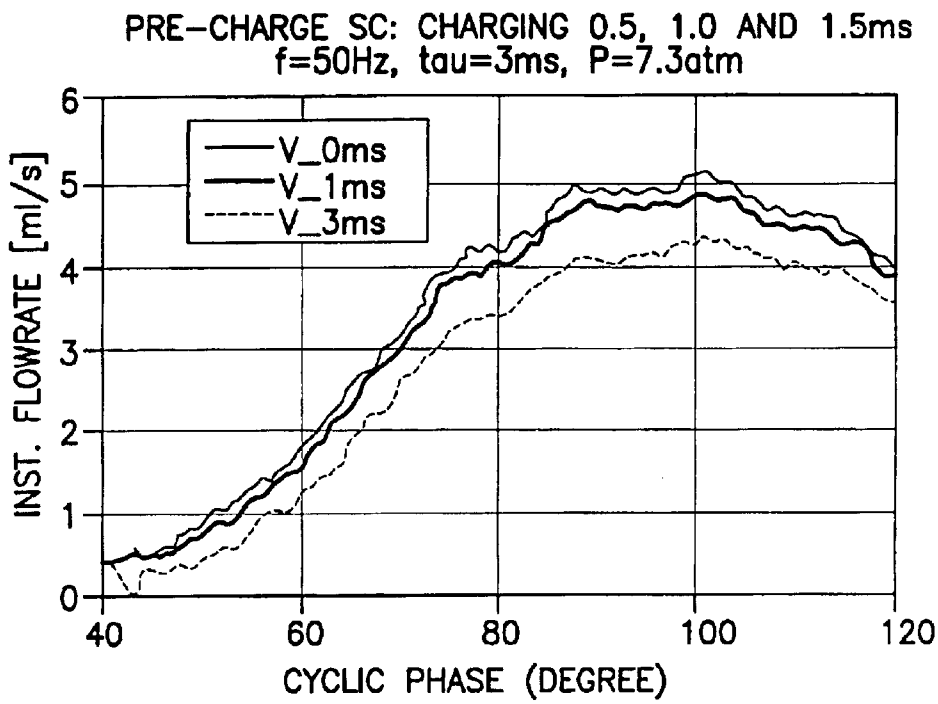
Figure 17D:
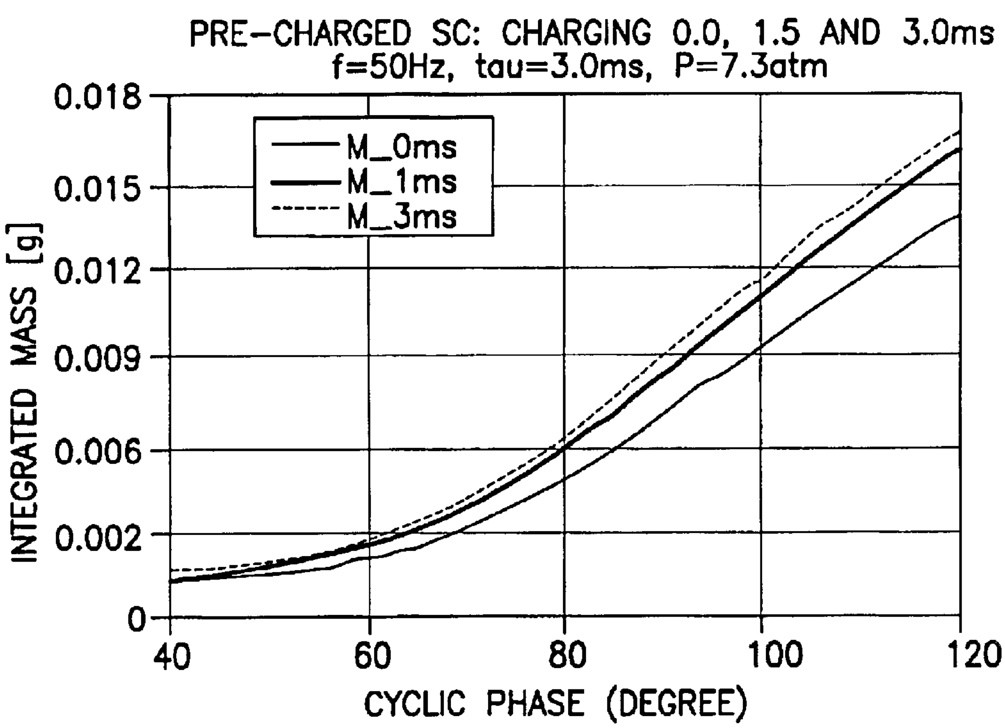
Figure 17E:
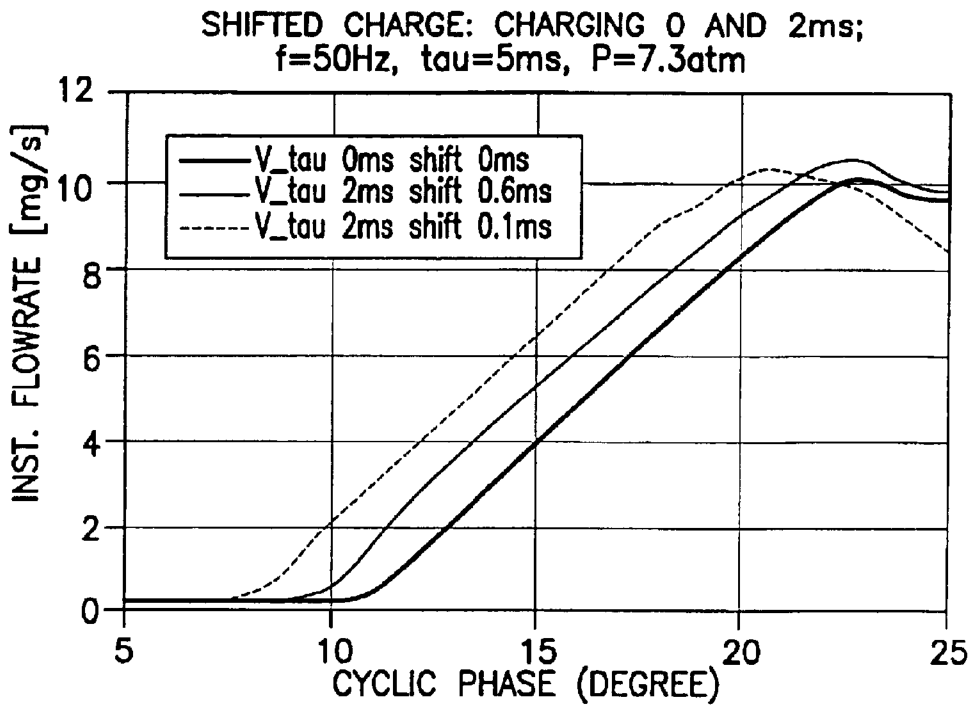
Figure 17F:
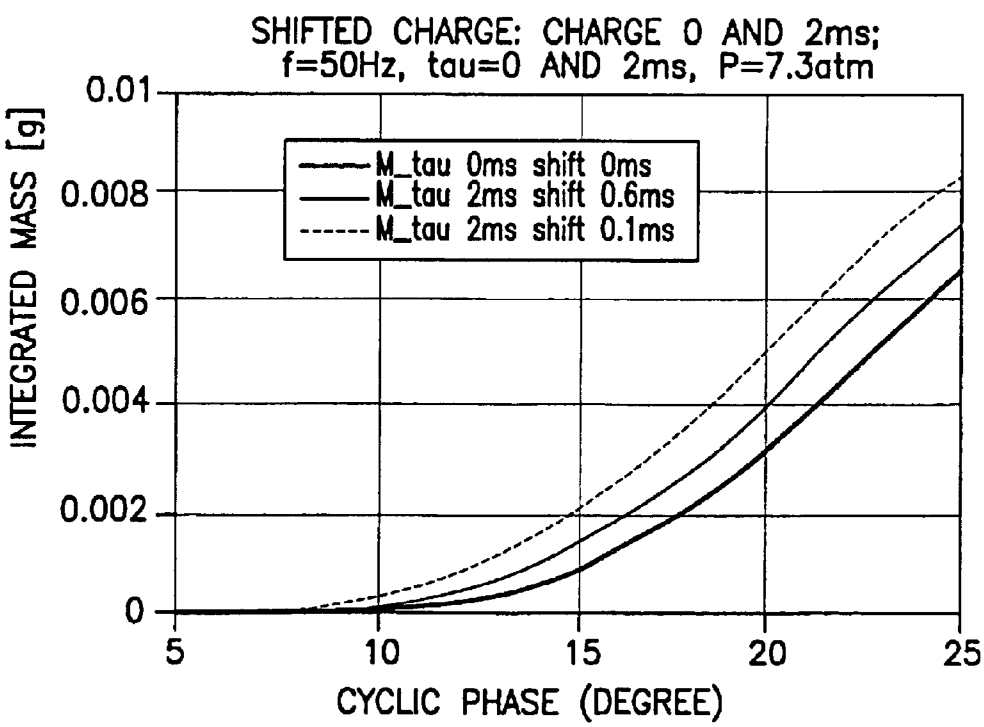

Some details with respect to each charging scenario at the beginning phases (opening of the valve and startup of injection) are shown in FIG. 17A–17B. There are three plots of instantaneous volumetric flow rates along the top row and three plots of integrated (or accumulated) fuel masses along the bottom row. Each of the three correspondents to each of the three different secondary coil charging scenarios. The first column reflects data obtained while the SC was simultaneously charged with the injector PC (i.e., according to FIG. 11B A timing was the same as C timing). The second column is related to measurements when the SC was precharged before the injector PC (i.e., first was AB of FIG. 11B and afterwards started CD, B=C of FIG. 11B). The third column shows results when the SC charging was shifted with respect to the injector PC operation (i.e., AB and CD intervals of FIG. 11B were overlapped).

Under simultaneous charge, the longer the charging time of the SC, the faster opening of the valve is observed in instantaneous series as the shift between different series towards the initial zero phase. The integrated mass series indicate increased speed of the valve that is seen through the slop [g/degree]. The fuel mean mass rate is characterized by Table 1 below:

TABLE 1

| | Simultaneous Charge | | | |
|---|---|---|---|---|
| | M_0.0 ms | M_1.0 ms | M_1.5 ms | M_2.0 ms |
| mean mass rate [g/s] | 1.955 | 2.07 | 2.306 | 2.467 |
| mass per cycle [mg/stroke] | 39.91 | 41.4 | 46.12 | 49.33 |

In the case of pre-charge, increasing the charge time results in the same phase of the injection startup, but the amplitudes in the instantaneous series and the slops in the integral mass series are gradually increasing that says about increased valve speed into the injector. Table 2 below represents mean mass rates:

TABLE 2

| | Pre-Charge | | |
|---|---|---|---|
| | M_0 ms | M_1 ms | M_3 ms |
| mean mass rate [g/s] | 0.95 | 1.084 | 1.122 |
| mass per cycle [mg/stroke] | 19.01 | 21.69 | 22.45 |

Both effects, the increased amplitude and slopes and more rapid opening resulting in the phase shift towards zero phase, which occur under shifted charge technique are shown in the third column of FIG. 17. The mean mass rates are in Table 3 below:

TABLE 3

| | Shifted Charge | | |
|---|---|---|---|
| | M_tau 0 ms shift 0 ms | M_tau 2 ms shift 0.6 ms | M_tau 2 ms shift 0.1 ms |
| mean mass rate [g/s] | 0.443 | 0.471 | 0.476 |
| mass per cycle [mg/stroke] | 11.06 | 11.77 | 11.89 |

Application of the SC onto a higher pressure injection system (e.g., over 40 atm of a direct injection gasoline system and over 600 atm of a diesel injection system like common rail Bosch) results in much more effect on rise time response at the valve opening and fall time response at the valve closing. As discussed, for diesel electronically controlled injection system, there may be no need to have another SC L2" to rapidly close the valve because fuel spraying will essentially be cut off immediately after first pressure drop. An SC electric circuit consists also of another secondary coil L2" shown in FIG. 11A at the position R5. When transistor T2 closes, L2" will produce I-Function current in direction opposite to the slowly damping current on the injector primary coil, so the resulting magnetic flux will work in parallel with the elastic spring force and results in rapid closing of the valve. In another example (which example is intended to be illustrative and not restrictive), application of the SC L2" may be important for gasoline and/or direct injection gasoline engines where injection pressures are lower than in diesel systems.

Referring now to the modeling of an electromagnetic actuator according to the present invention (e.g., with the second-order non-homogeneous ordinary differential equation (9)), it is noted that such electromagnetic actuator ("EMA") may be modeled with an equation different from eq. (9):

$$x''+\alpha_{fr}x''+\alpha_{el}x=\alpha_{mag}I_{\Delta}^{2}f^{2}(t)-\alpha_{sys} \tag{9.0}$$

by replacing timing components $\alpha_{mag}I_{\Delta}^{2}f^{2}(t)$ into the right part of the equation to the series of:

$$x''+\alpha_{fr}x'+\alpha_{el}x=-\alpha_{sys}+\theta_1 t'+\theta_2 t''+\theta_3 t'''+ \tag{9.1}$$

In this regard, the nature of the added timing derivatives relates to the dynamics of an electromagnetic subsystem of a device (or apparatus) to which this particular EMA is applied. The coil is ideally represented as an inductor in series with a resistor. In this circuit, the voltage drop $V_{in}$ across the circuit is expressed using the flux linkage $\lambda(x,t)$, dependent on current position of the plunger x and time phase t, and coil resistance r:

$$V_{in}=ri+\frac{d\lambda(x,t)}{dt} \tag{9.3}$$

Circuit current can be expressed as one of the system states by introducing the rate of change flux linkage in eq. (9.3) as:

$$\frac{d\lambda'(x,t)}{dt}=\frac{\partial\lambda(x,t)}{\partial x}\frac{dx}{dt}+\frac{\partial\lambda(x,t)}{\partial i}\frac{di}{dt}=\zeta_1(x,i)x'+\zeta_2(x,i)i' \tag{9.4}$$

The first term $\zeta_1(x,t)$ is determined from magnetic flux $F_{mag}$ (x,t)

$$\zeta_1(x,i)=\frac{\partial\lambda(x,t)}{\partial x}=\frac{dF_{mag}}{di}(x,t) \tag{9.4}$$

The second term $\zeta(x,t)$ is the instantaneous inductance of the coil during transitional charge or discharge that can be obtained from dynamic measurements of $V_{in}$, i, x, dx/dt and di/dt. Because of the parametric nature of such variables, not only the first order of time derivatives, but higher orders (second, third, etc.) may be needed to measure and calculate regressions to fully construct the right part of eq. (9.1). Of note, from a practical standpoint, obtaining an exact analytical solution for the eq. (9.1) may not be possible. However, a numerical solution may be found (which implies that on the engineering side it may be essentially impossible to have a waveform generator without known input parameters for the electronic circuit).

Referring now once again to an I-Function, it is noted that such I-Function may take a more general form than just the one mode (harmonic) frequency (time) response model of eq. (25):

$$I_F(t)=e^{\frac{\omega_{21}t}{\exp(\omega_{22}t)}} \tag{25}$$

More particularly, with regard to multiple injection (depicted, for example, in FIG. 19) control over a series of ultra-short injection shots (events) may be utilized for a variety of engine operation conditions. Good control of Main1 and Main2 may reduce the temperature peaks, and hence yield lower amounts of nitric oxides. Pilot shot may yield increased pressure in the engine at the end of the compression stroke, thus reducing the start-up time, noise, and smokiness of the engine at the warm-up stage as well as increasing the torque at low engine speeds. Pre-M may result in reduction of ignition delay that reduces the combustion noise. After-M may provide for post oxidizing the exhaust gas and so reduce the amount of particulate matter generated during combustion. Post-M is injection of fuel mainly during the exhaust stroke, thus increasing the hydrocarbons HC at the exhaust, and in return, activating and increasing efficiency of the DeNOx catalyst. For military vehicles (for example), to increase driving range (fuel efficiency) the first three shots, pilot, pre-M and main1 through mainN, may be the most important. The present multiple injection driver ("MID") technique may be performed in numerous engineering versions. It may be constructed as: (i) a remote electronic driver installed inside a secondary coil; (ii) an electronic circuit generating the present I-Function current; and/or (iii) a programmed electric current code (e.g., to be incorporated into the main vehicle Electronic Control Unit).

Figure 19:
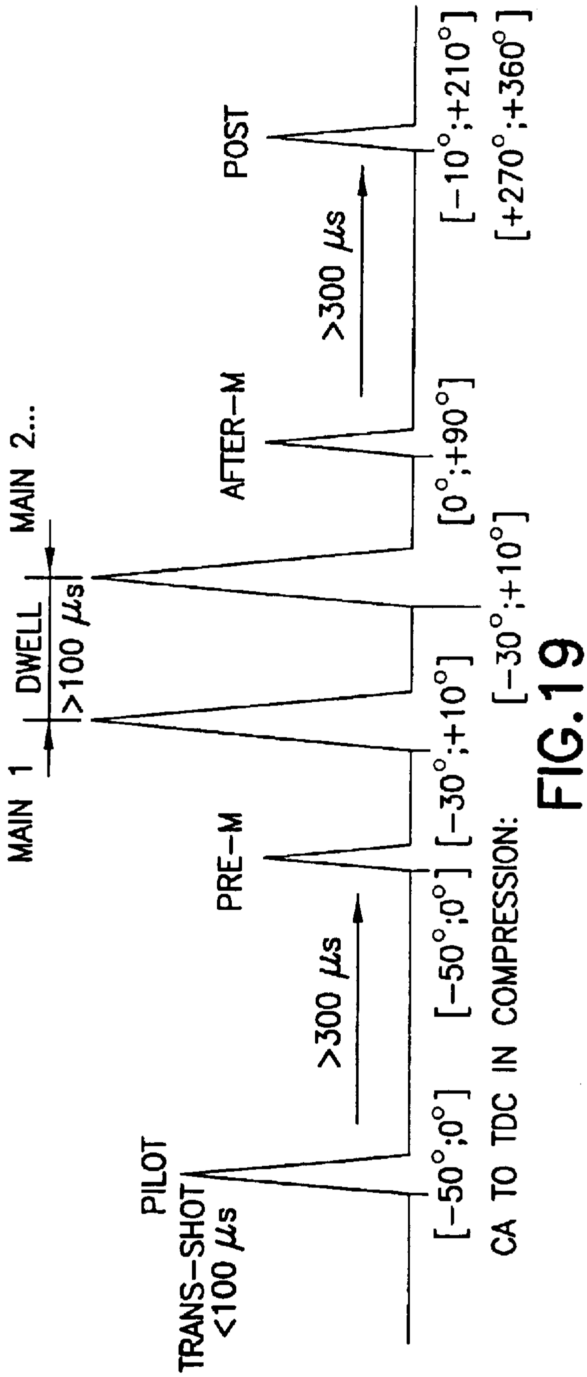
FIG. 19 depicts certain injection events associated with one example of an embodiment according to the present invention (wherein the injection events are identified with reference to certain combustion effects and engine runs/injection strategies)

Accordingly, in connection with a generalized form of the I-Function related to a multi-channel MI, each injection shot (event) within an engine cycle may need to be controlled by its own channel (e.g., six channels related to the six shot injection sequence of FIG. 19). Each channel may have its own time response $(R_2/L_2)_j$ and phase $\phi_j$ in order to have flexible control over each specific shot (and flexibility in combination of different shots upon the engine run conditions). The channels for control of opening and closing the valve may be parallel connections and each channel may have a switch controlled by the main Electronic Control Unit that permits a variety of possible combinations of the shots. That implies a generalized form for the I-Function as:

$$I_F(t) = \exp^{\frac{\omega_{21}t}{\sum_j [\exp(\omega_{22j}t - \varphi_j^{open})] + \sum_j [\exp(\omega_{22j}t - \varphi_j^{close})]}} \tag{25.1}$$

where the primary coil $\omega_{21}=2\pi R_1/L_1$ works in conjunction with a series of secondary coils $\omega_{22j}=2\pi R_{2j}/L_{2j}$ each of which is switching on $\phi_j^{open}$ and off$\phi_j^{close}$ at its own time phases specified within injection cycle.

Referring now once again to the basic frequency $\beta_1$ representing the linear part of the complex solution $x(t)=x_1(t)+x_2(t)=\gamma_1 e^{\beta_1 t}+\gamma_2 e^{\beta_2 t}$, it is noted that this basic frequency is course, solely related to the electrical parameters of the primary coil. Equations (11) through (13) show what is inside of $\beta_1$, i.e., the normalized parameters in eq. (9) related to the friction, elasticity of the spring, gravity and mass associated with all mechanical elements involved into dynamic process (needle, spring, sealing edges, etc.). More specifically, in the eq. (9):

$$x'' = \frac{\mu_r u_0 N}{m} I_\Delta^2 f^2(t) - \frac{q_{lam}}{m} x' - \frac{k}{m} x - \left[\frac{F_{el_0}}{m} + g\right] \text{ or} \tag{9}$$

$$x'' + \alpha_{fr} x' + \alpha_{el} x = \alpha_{mag} I_\Delta^2 f^2(t) - \alpha_{sys}$$

m—associated mass,
$q_{lam}$—friction coefficient under laminar flow conditions,
k—spring elastic constant,
$F_{el}$—initial elastic force produced by a compressed spring,
g—gravity acceleration,
$\mu_0$—magnetic field constant,
$\mu_r$—relative permeability,
N—number of turns on coil,
$\Delta_0$—initial spring compression ($F_{el_0}/m$),
$I_\Delta$—current amplitude,
$\alpha_{fr},\alpha_{el},\alpha_{mag},\alpha_{sys}$,—transform coefficients.

So, $\alpha_{fr},\alpha_{el},\alpha_{sys}$, related to the $x_1(t)=\gamma_1 e^{\beta_1 t}$ solution of the first, linear part, represents all mechanic, hydraulic and elastic elements of the system while $\alpha_{fr},\alpha_{el},\alpha_{mag}$, related to the $x_2(t)=\gamma_2 e^{\beta_2 t}$ solution of the second, non-linear part, represents the parameters of the system under impact of magnetic flux.

Referring now to time-dependent action (e.g., movement of various physical elements) and frequency-dependent action (e.g., movement of various physical elements) of the electromagnetic actuator (e.g., dependent upon the resistance $R_2$ and the inductance $L_2$), it is noted that a generalized impulse balance has been identified in eq. (1) as:

$$m\frac{d^2x}{dt^2} = mx'' = F_{mag} - F_{el} - F_{gr} - F_{fr} \tag{1}$$

Now, consider the moment at which magnetic force becomes over all others involved in the process. From this moment the equation can be simplified to:

$$m\frac{dU}{dt} = F_{mag} \tag{1.1}$$

To derive a relationship between the velocity U of lifting armature (or valve, or needle, or associated mass in general) and transient current (I-Function), one needs to make energy balance on electromagnetic and electric parts $E_{mech}=E_{em}$. That can be performed in terms of power release:

$$W_{mech}=W_{em} \tag{1.2}$$

Mechanical power is work dA over time dt, so using impulse, it can be expressed as:

$$W_{mech} = \frac{dA}{dt} = \frac{Fdx}{dt} = m\frac{dU}{dt}U = \frac{d(mU^2)}{2dt} \tag{1.3}$$

The voltage over the coil is dependent on current derivative:

$$V = L\frac{di}{dt} \tag{1.4}$$

Electromagnetic power is related to instantaneous voltage and current:

$$W_{em} = Vi = L\frac{idi}{dt} = \frac{d(Li^2)}{2dt} \tag{1.5}$$

In the case of balanced energy transfer, the relationship between lifting (pulling in/out, pushing in/out the armature) velocity and current time series becomes linear:

$$U = i\sqrt{\frac{L}{m}} \tag{1.6}$$

This equation implies that in order to get control on rapidness of the primary solenoid (injector solenoid) with known inductance $L_1$ and associated mass m, the speed and transient shape of the lifting is directly related to the current time series. The acceleration $\alpha$ (or force m$\alpha$) is proportional to the first order current derivation:

$$a = \frac{di}{dt}\sqrt{\frac{L}{m}} \tag{1.7}$$

Eqs. (1.6) and (1.7) are very important for both injectors and electromagnetic air valvetrains to control speed-acceleration control during opening and closing the valve. In the case of fuel injectors both the opening and the closing events must be rapid in order to make stability (e.g., gasoline injectors) and/or multiple injection (e.g.,diesel injectors) possible. In the case of air intake valve, the rapidness (maximum speed and acceleration) are important at the opening of the valve, however, by closing the valve at the end of armature movement, the speed and acceleration must be close to zero (problem of durability).

In this regard, the diagrams in FIG. 10 represent lifting velocity (top diagram) and acceleration/deceleration (bottom diagram) for three different ratios between primary and secondary coils in arbitrary units.

For the primary coil, the angular frequency $\omega_{21}=2\pi R_1/L_1$ is represented as series of 40, 15 and 5 units. For the secondary coil, its frequency $\omega_{22}=2\pi R_2/L_2$ is represented as series of 20, 10 and 5 units (always slower). The higher the ratio $\omega_{21}/\omega_{22}$, the higher the rapidness in both terms of velocity and acceleration.

The time phase where $(di/dt)_{22}$of the secondary coil becomes the minimum is a time phase when the transfer of energy from secondary solenoid to primary solenoid should be ended. This time $\tau_{22}$ has to be equal or proportional to the time response of the whole dynamic system $\tau_{dynam}$, as it sketched in FIG. 14, which is determined by injection combustion conditions. For example (which example is intended to be illustrative and not restrictive), to make possible diesel multiple injection, the dynamic rise/fall time should be not longer than about 200 us. To achieve that, under this example, the electromagnetic actuator (primary coil) must react in about 100 us. The factor of $\tau_{22}/\tau_{dynam} \leqq 1$ can be verified experimentally (e.g., using the instantaneous fuel flow rate technique discussed herein and/or high speed visualization of the fuel spray). So, the final setup of $\tau_{22}$ is an iterative process starting from a lower ratio of $\omega_{21}/\omega_{22}$ and incrementing it until the value of $\tau_{dynam}$ will be within a given range.

Referring now to how the time-dependent action and/or frequency dependent action of the electromagnetic actuator may be determined (e.g., calculated, measured), it is noted that one example algorithm (which example is intended to be illustrative and not restrictive) is described below. More particularly, this example algorithm of the determination of time response ($\tau_{dynam}$, $\tau_{22}$), frequency ($\omega_{22}$), and coil ($R_2$, $L_2$) is as follows:

Cycle #1—Construction of the secondary coil driver ("SCD").

1. Upon engine model, injection system model, fuel load map at different engine runs (speed versus torque-horsepower) timing strategy, exhaust emission requirements and electric configuration (ECU injection timing control, RL characteristics of the injector solenoid, voltage applied, etc.), the first injection pattern is designed such as shown in FIG. 19, specifically:
   Number of shots.
   Duration of shots
   Rise/fall times.
   Dwell intervals between the shots
   Fuel amount per shot (amplitude profiles).
   Tolerance range for time phases and amplitudes (fuel amounts).

One would understand that FIG. 19 could hypothetically form the basis of a corresponding curve having time on the x-axis (in arbitrary units) and current on the y-axis (in arbitrary units).

2. Determination of the $\tau_{dynam}$ using instantaneous fuel flow-metering technique.
3. Limitation of $\tau_{22} \leqq \tau_{dynam}$.
4. Determination of $\omega_{22}$ by doing numerous iterations to get curves of the I-Function at $\tau_{22}$ within given tolerances (time and amplitude). Of note, the iterations generate curves which can be compared to values of FIG. 19; the curve closest to the one capable of producing FIG. 19 indicates the value of $\omega_{22}$
5. Knowing lifting velocity $U=\text{lift}/\tau_{dynam}$ and $i_{max\ peak}$ calculate $L_2$ using eq. (1.6).
6. Calculation of $R_2=\omega_{22}L_2/(2\pi)$.
7. Construction of secondary coil driver (as physical unit or electric circuit or programmed I-Function code) with variable $R_2$,$L_2$.

Cycle #2—Testing of Multiple Injection with Applied SCD.

1. Test of injection pattern under various injection cycles (frequency, number of shots, shot duration, dwell intervals) to see output dynamic characteristics using instantaneous flow metering technique.
2. Repeat Cycle #1 to achieve required rapidness and stability.
3. Test injection system in long run (~100,000 cycles) to validate durability.

Cycle #3—Engine Test.

1. Install injectors in engine equipped with SCD between injection timing driver and injectors.
2. Test engine performance (power and torque release) to achieve max fuel efficiency at the required torque output using a dynamometer test cell.
3. Test engine exhaust emissions.
4. If necessary, repeat Cycle #2 to change injection pattern as required.
5. Test engine in long transient and steady state run.

Cycle #4—Road (Drivability) Test (Extended).

1. Install injectors on a vehicle with the same injection system, which has been tested during Cycle #3.
2. Measurements of the fuel consumption (continuously) and exhaust emission (selected test) at different driving and climatic conditions.
3. If necessary, repeat Cycle #2 to change injection timing/phasing strategy to minimize fuel consumption and exhaust emission.

Regarding Cycle #1 above, it is noted that in this example the phasing of the I-Function itself and its peaks are related to FIG. 19 in that FIG. 19 represents the injection mapping target upon certain engine demand (i.e., regime).

Further regarding Cycle #1 above, it is noted that in this example $\tau_{dynam}$ is determined on the basis of measured time series of instantaneous flow rate along with velocity, pressure gradient and integrated mass series. To determine this time factor one can use either flow rate or pressure gradient time series. In the first there is a dynamic rise sharp slope which is ended by a zigzag-type peak. This peak says that the valve is opened, the injection has actually occurred and the break-up point (transfer of the liquid jet into droplets) has taken place. The angle of this slope represents the speed of this dynamic process, i.e., how fast the whole system (mechanics, hydraulics and inertia of all associated masses) has reacted after a given electric wave form onto the primary coil (injector). In the series of pressure gradient this factor is determined by a rapid spike-like change of pressure gradient from negative (acceleration of the flow) to a positive derivative.

Further regarding Cycle #1 above, it is noted that in this example lift of the injector valve is a design property which is essentially a fixed parameter. For instance, in direct injection gasoline engines it is typically about 50 to 90 micrometer, in normal gasoline injectors it is typically up to about 300 micrometer, and in diesel injectors it is typically between 100 up to 500 micrometer. In other words, lift is a given parameter which represents a gap between a sealing position and a pushing upward/downward stop position.

Figure 18:
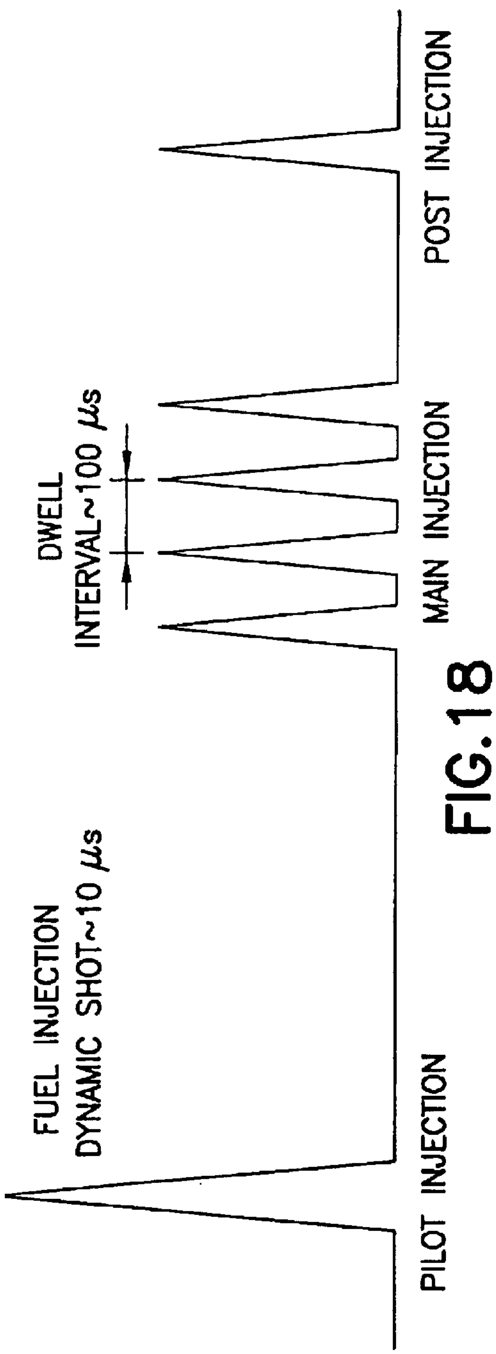
FIG. 18 depicts one example of controllable high-pressure multiple injection according to an embodiment of the present invention.

Referring now to another embodiment of the present invention regarding an application related to controllable high-pressure fuel injection in diesel and direct injection gasoline engines by means of stable multiple ultra-short injection events using a secondary coil driver (SCD), attention is directed to FIG. 18 (such multiple injection under stable timing and amount controlled by SCD provides a cascade-like fuel spray and flame structures with a more widely spread surface for the compressed air, as depicted in FIG. 13, for example). Of note, an important element in such an injection technique is the events' (shots') timing that may need to maintain a core flame to prevent a quenching effect. Thus, the final spray structure may have the appearance of a flipped-cascade Christmas Tree in which only the jet and premixed zones are fully developed without the appearance of the rich zone.

In this regard, the combustion process in reciprocating internal combustion engines is a complex dynamic phenomenon including fuel injection, air intake, air-fuel mixing flow, chemical and thermodynamic kinetics, mixture burning, and exhaust of combusted gas with pollutants. This dynamic process has different time scales in terms of the engine in-cylinder kit reciprocation, fuel injection, chemically inter-reacting species kinetics, fuel spray and flame formations. All these timing scales become extremely important in high-pressure injection engines such as diesel and direct injection gasoline engines.

More particularly, the reciprocating cycle fits an order of a few tens of millisecond (~$10^{-2}$ sec). Injection lag is about a few hundreds of microseconds (~$10^{-4}$ sec), and injection duration has a few milliseconds (~$10^{-3}$ sec) in gasoline engines. In diesel engines injection lag and injection duration are shorter, ~$10^{-6}$ sec and ~$10^{-4}$sec, respectively. In local flame domains, the ignition lag and premixed flame and rapid oxidation (combustion) in diesel engines have an order of magnitude of a few tens of microseconds (~$10^{-5}$ sec). In gasoline engines these factors become a few hundreds of microseconds (~$10^{-4}$ sec). Typically, in diesel engines all processes are more rapid having one or two orders shorter duration.

An important conclusion is that injection shot $\Delta t_{sh}$ and dwell duration $\Delta t_{dw}$ may have to be directly related to the early stages of diesel combustion, i.e., in the manner of timing of injection dynamics and chemical kinetics (in the case of single shot per cycle, the sequence may begin shortly after the start of fuel injection and may continue through the premixed burn and into the start of quasi-steady combustion).

The time between the start of injection and the premixed burn may be about a few hundred microsecond (~$10^{-4}$ sec). If, at that moment injection stops, the premixed zone may start to be developed in that space and completely burned as a regular premixed reacting substance. This factor may determine dwell interval to be close to ~100 usec in order to exclude in the combustion process a further development of a fuel-rich zone.

The injection ultra-short shot duration may be determined by the time limit needed to get the injection of about ~1 usec started, i.e., by injection lag. Depending on the fuel amount demand, the production factor may be varied, for example, from about 10 to 30, meaning that shot duration in this example may be about ~10 to 30 usec.

In another example (which example is intended to be illustrative and not restrictive), the exact set up $\Delta t_{sh}$ and $\Delta t_{dw}$ for a particular type of engine and injection system may be dependent on:

1. Fuel properties such as density, kinematic viscosity, surface tension, boiling temperature, specific heat and/or compressibility factor.
2. Injection pressure fluctuations.
3. Nozzle geometry.
4. Compression ratio.
5. Partial fuel load per cycle.

Thus, the need may arise to test a fuel injection system and engine at different loads and speeds to tune the SCD for the final setup of $\Delta t_{sh}$ and $\Delta t_{dw}$ at different mapping conditions. To make the SCD work in conjunction with a certain type of engine and injection configuration, it may be necessary to proceed with the following example subsequences (which example is intended to be illustrative and not restrictive):

1. Analysis of high-pressure injection dynamics (an OEM's original injection system) by means of the instantaneous flow rate measurements indicating exact positioning of breakup peaks and ICCD (Intensified Charge Coupled Device) high-speed fuel spray visualization in order to prove spray structure both in terms of liquid (fuel jets and droplets) and gaseous (evaporated fuel) phases.
2. Design, simulation and construction of a secondary coil driver (SCD) applicable to a production injection system.
3. Experimental verification of rapidly controlled multiple injection by means of flow rate and fuel spray dynamic measurements as in Step #1.
4. Experimental verification of in-cylinder diesel fuel mixture without and with applied SCD.
5. Tuning of engine performance and emissions in one-cylinder engine model without and with applied SCD.
6. Tuning of the OEM's engine performance and emissions in a production model without and with applied SCD under the tuned discharge method. All engine torque-speed operational diagrams may need to be mapped.
7. Design, construction and test of industrial SCD on-board prototype either in the form of SCD or electric circuit or encoded I-Function current electronics.

Referring now to FIG. 19, certain injection events associated with an example of the present invention (wherein the injection events are identified with reference to certain combustion effects and engine run/injection strategies) are depicted. More particularly:

With reference to certain combustion effects
- M1M2 . . .—reduces T-peaks (NOx), fuel consumption
- After-M—provides post oxidizing exhaust gas (PM)
- Post-M—increases HC in exhaust (DeNOx catalysts)
- Pre-M—reduces ignition delay (noise)
- Pilot—increase P in cylinder (start-up, noise/smokiness at warm-up, torque at low speed)

With reference to engine run/injection strategies
- Engine start-up/warm-up: Pilot-Pre-Main1
- $T_{exhaust} < T_{catalyst}$: Pre-Main1-After
- DeNOx TEC: Pre-Main1-Main2-After-Post
- High TEC: Pre-Main1-Main2- After
- High Torque, low speed: Pilot-Pre-Main1
- Medium/high speed & load: Pre-Main1-Main2
- Maximum-power conditions: Pilot-Main1

Reference will now be made to an example (which example is intended to be illustrative and not restrictive) of certain engineering calculations to design a secondary coil and coding electric current to be applied to an injector (e.g., a Bosch common rail injector). Of note, this example is aimed at a simple demonstration of what needs to be known, calculated, coded, and transferred to a primary solenoid actuation variety of device. This particular example is directly associated with a production Bosch common rail injection system (CRIS). A commercially available L/C Meter IIB in the uH range has been used to measure inductance of each of four injectors installed on the CRIS. An HP/Agilent 33120A 15 MHz Function/Arbitrary Wave Generator along with HP34811 A BenchLink Software are applied for output signal coding of the voltage/current time series. And HP Infinium 500 MHz 1 Gsa/s Oscilloscope has carried out verification of quality and time phases of the output control signal fed to the CRIS injectors.

In summary, the algorithm steps described below can be divided into three basic stages:

1. One needs to measure electric properties of the injector, such as inductance L and resistance R, to evaluate time/frequency response. That permits a calculation on energy transfer per each peak, spike or other fraction of the injection timely controlled electric current/voltage. Now, at a given factor of energy transform, it becomes possible to calculate R, L-parameters of the secondary coil (SC) which must generate a transient current to make rapid opening and closing of the valve.

2. Now, one needs to proceed on I-Function current as a time series and determine what time phase (charging time) is most applicable for rapid, stable control over actuator. For instance, with regard to gasoline injectors or diesel injectors with electronically controlled hydraulic valve, at the valve opening stage the part of time series may range from the beginning until a phase where the I-Function current has the maximum because instantaneous velocity of armature is proportional to instantaneous current $u=i\sqrt{L/m}$. In the case of an air intake valve it may be necessary to have the time series until the first current derivative becomes almost zeroed. This is due to proportionality between instantaneous acceleration (force) and current derivative $\alpha=(di/dt)^*\sqrt{L/m}$. If the SC will be incorporated into an injection system as firmware, at this stage the algorithm may switch to an electric fabrication of the SC driver and tuning it in terms of discharge mode (described above). If the SC is to be implemented as a code, the process continues to the third stage (below)
3. The obtained I-Function current time series may be fitted to a standard library function available in software to an arbitrary (ARB) wave generator. Now, after matching the derived I-Function upon R, L-characteristics of primary and secondary coils and the librarian one, the setup of mathematical parameters becomes available to construct different transient phases of the injection cycle including individual injection shots and their us time fractions. Finally, the constructed current code may be transferred into the given ARB-generator that controls the injection profile. This procedure may need to be repeated a number of times to cover an OEM's injection map. Afterwards, it is possible to transfer the entire SC driven injection map into a processor that is incorporated in the vehicle ECU. Depending on driving and engine run condition, the ECU may call either the OEM's or the ARB injection control current codes related to a particular injection event in each injector.

Figure 25:
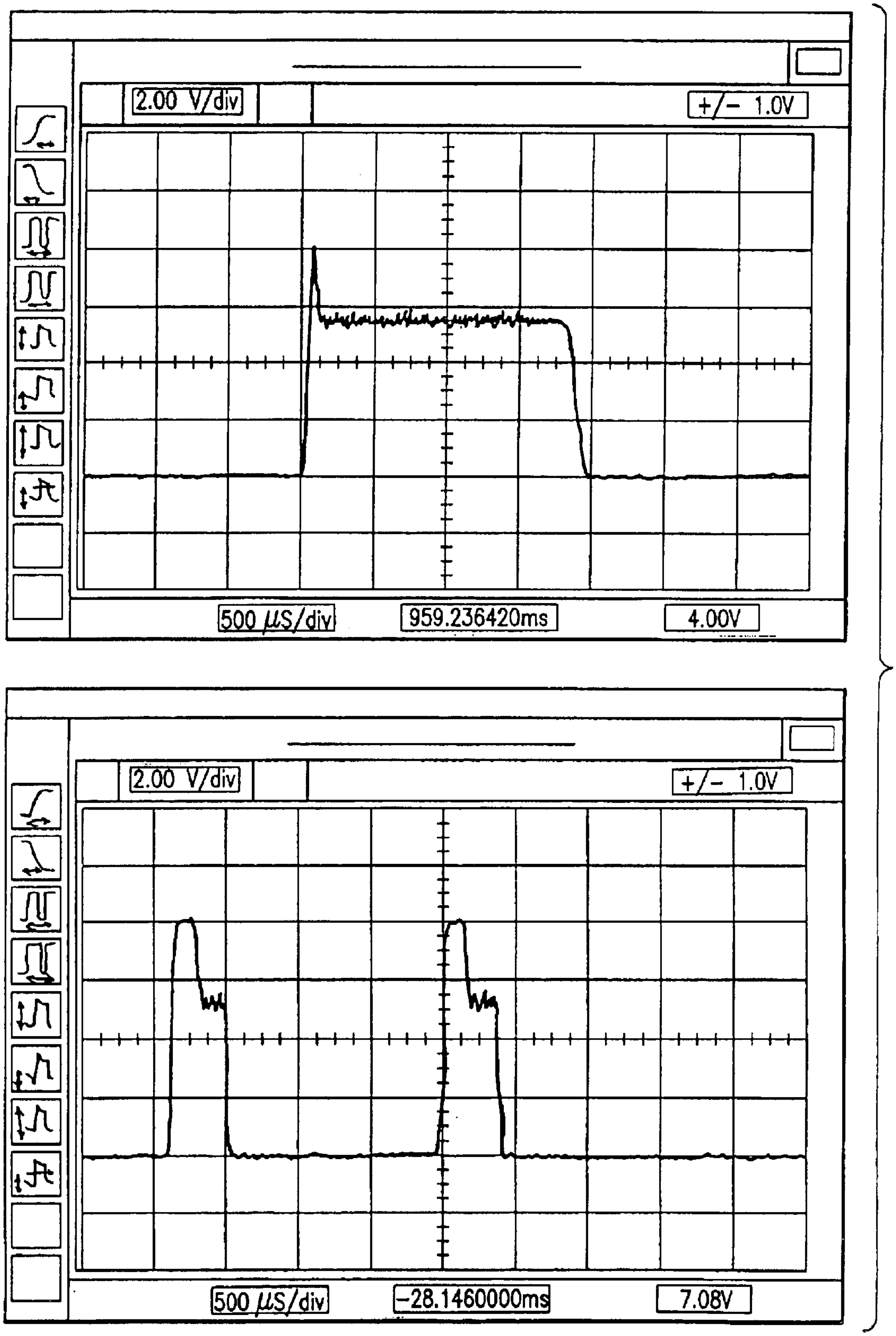
FIG. 25 depicts certain example signals constructed as arbitrary waveshapes (wherein the left plot is associated with an original Bosch CRIS injector signal and the right plot is associated with a two shot injection signal according to an embodiment of the present invention)
Figure 26:
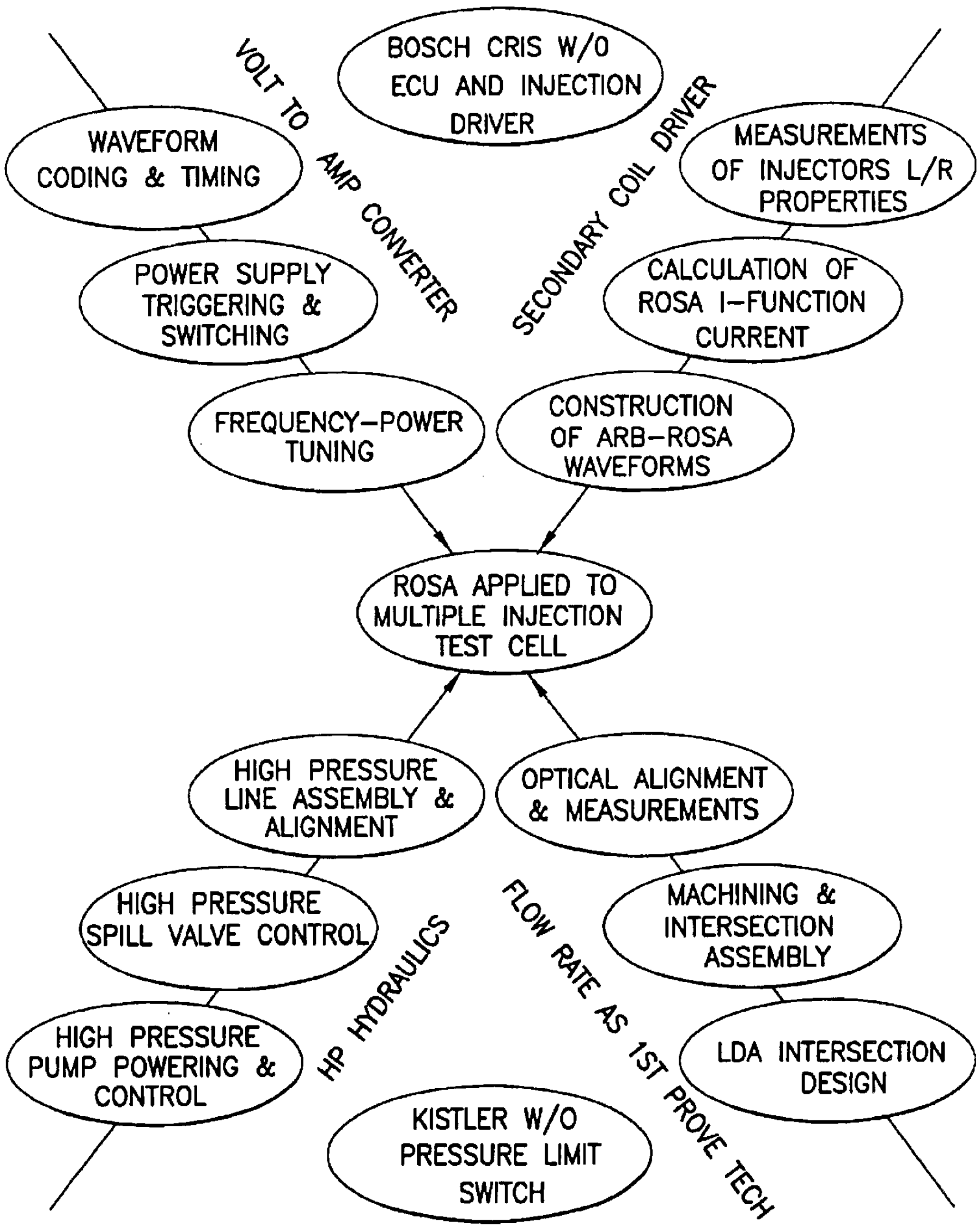
FIG. 26 depicts one example controllable multiple injection system (applied to a Bosch common rail system) according to an embodiment of the present invention.
Figure 27:
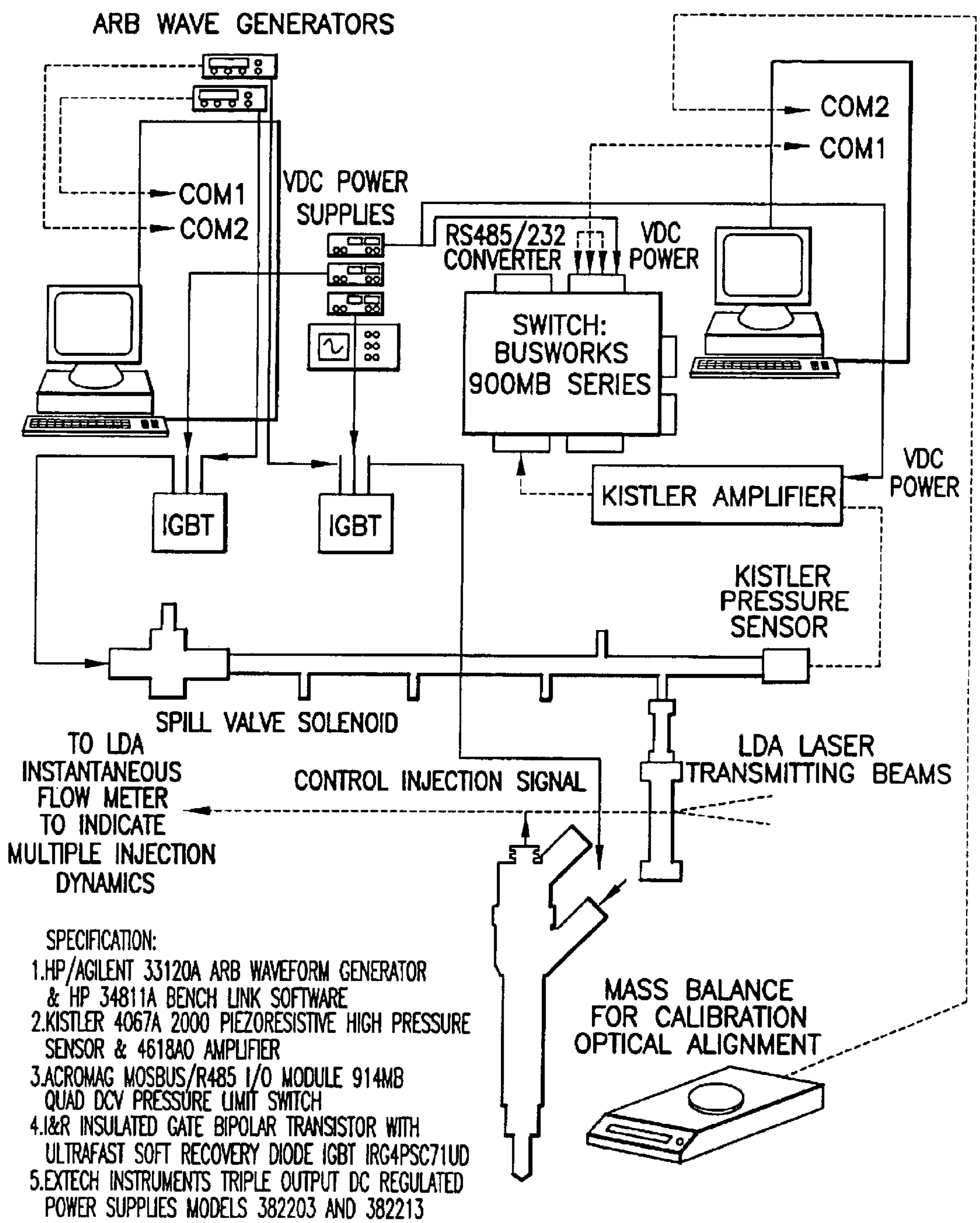
FIG. 27 depicts one example measurement setup to verify high pressure multiple injection according to an embodiment of the present invention.

Referring now to aspects of the detailed algorithm outlined in the 3 stages above:

1. OEM's Injection Map It may be critical to know the exact technical data regarding the OEM injection system, injector operation, and current/voltage trace applied onto the actuator may be required. The solenoid valve (triggering element) may control a valve ball and at the stage of its pulling in (energized solenoid) the bleed orifice may be opened (and a pressure difference between the feed passage to the nozzle and valve control chamber causes upward lift of the nozzle needle—resulting in injection event). The energizing time of this solenoid varies (e.g., from 1 to 2 ms) with a peak pulling-in current of, for example, 18A and holding current of, for example, 12A. The rise time and fall time are varied (e.g., from 80 to 100 us). During the holding stage the current oscillates (e.g., with amplitude of 0.57A and periodicity of 0.1–0.2 ms). A typical current trace applied to the Bosch CRIS injector is illustrated in the left plot of FIG. 25.
2. Actual Injector Solenoid RL Data Resistance R was measured using a multimeter. Inductance L has been obtained using L/C Metter IIB that has a wide range of L sensitivity from nH, uH, mH to H. Zero mode has been constantly applied to subtract the stray inductance which was initially about 1.8–2.2 uH due to measurement wiring and after Zero mode was oscillating at 0.007 uH due to the wire loop configuration and temperature dependence of resistance during measurements. Referring now to FIG. 20, the RL data are shown along with time and frequency response characteristics of the injector (primary) coils. According to both measurements, and the left plot of FIG. 25, the rapidness of different solenoids (rise-fall time) at the opening and closing the valve is varied from 146 to 212 uH (resulting in a frequency response of 4.72 to 6.85 kHz, respectively). In two columns of FIG. 20 the power $E=\Delta(LI^2)/\Delta t$ fluxed into the primary solenoid during energized state is calculated using measured inductance L, pulling-in peak $I_{peak}$=18A and holding $I_{hold}$=12A current, time response and holding duration respectively $\Delta t$ to peak and holding stages. As indicated, $E_{peak}$ varies from 64.8 to 72.9W and $E_{hold}$= 4.7–6.1W for various injectors. These power (energetic) values may be limited by construction of coil, i.e., its inductance L and currents $L_{peak}$, $L_{hold}$ upon dynamic time response.
3. Targeted Power and Time Response Conversion Ratios, SC RL—data To make the solenoid more rapid that results in stable ultra-shot injection needed for controllable multiple injection it may be necessary to have additional energy that will be released very rapidly may be required. In the Bosch CRIS the electromagnetic actuator (solenoid) controls opening and closing the valve. The distance between the high pressure inlet into the injector from CRIS to nozzle needle chamber is 0.11 m, the sound speed under 1600 bar is ~1700 m/s, so the time of pressure propagation is about 65 us. That implies a magnitude of time fraction that must be comparable with minimal rise/fall time of the actuator and very stable (repeatable) from cycle-to-cycle. The secondary coil does produce a quick additional power to speed the rise/fall phases. In the right part of FIG. 20 the calculation of RL-parameters are reflected. The first input is the power ratio between $E_{peak1}$ of the primary coil and $E_{peak2}$ of the secondary coil $E_{peak2}=FE_{peak2}$, where factor F is varied between 1.5 to 4.0 depending on the actuator type and its application. In this particular example, its maximized because for multiple injection in diesel injection with "light" inductance (high response time) the effect of rapidness is associated with high power ratio input F=4.0. That permits calculation of inductance of the secondary coil as $L_2=2E_{peak2}T_{peak2}/I^2_{peak2}$. Reversibly, the secondary coil has slower time response $T_{peak2}=kT_{peak}^2$, where 20<k<50. Once again, because multiple injection requires a quick control over both injection shot and dwell interval between injection shots, factor k=2.0 is minimized. That results in resistance value $R_2=L_2/T_{peak2}$. If the SC driver is desired to be made as a physical electronic circuit, $R_2L_2$–data are enough to design and construct as described above. If the I-Function current must be driven as wave-shaped code, it may be necessary to proceed on to the next four steps.
4. Construction of I-Function Having frequency responses of both primary and secondary coils, one can construct an I-Function current timely trace in normalized to unit form as:

$$i(t)=I\exp^{\frac{[2\pi R_1/L_1]t}{\exp([2\pi R_2/L_2]t)}}=1\exp^{\frac{43.0_t}{\exp(21.5_t)}}$$

Figure 21:
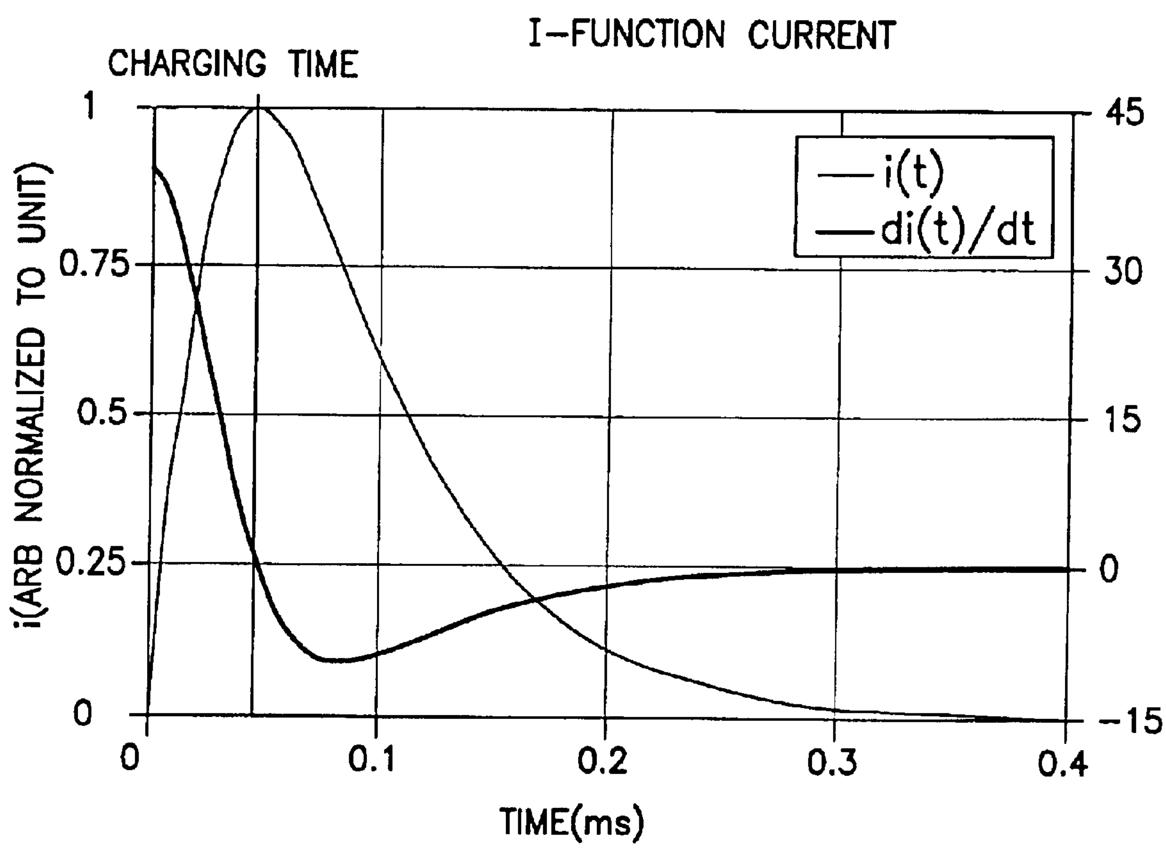
FIG. 21 depicts one example of an I-Function arbitrary current trace normalized to unit and its first derivative according to an embodiment of the present invention.

Such an I-Function current trace and its first derivative are shown in FIG. 21. Because R/L data are in kHz, the time scale is in ms. The maximum current peak corresponds to 0.047 ms which is related to the maximum velocity of the primary solenoid armature. That time duration is a time $t_{charge}$ that should be given to the secondary coil to be charged before transferring the energy to the primary coil.

Figure 22:
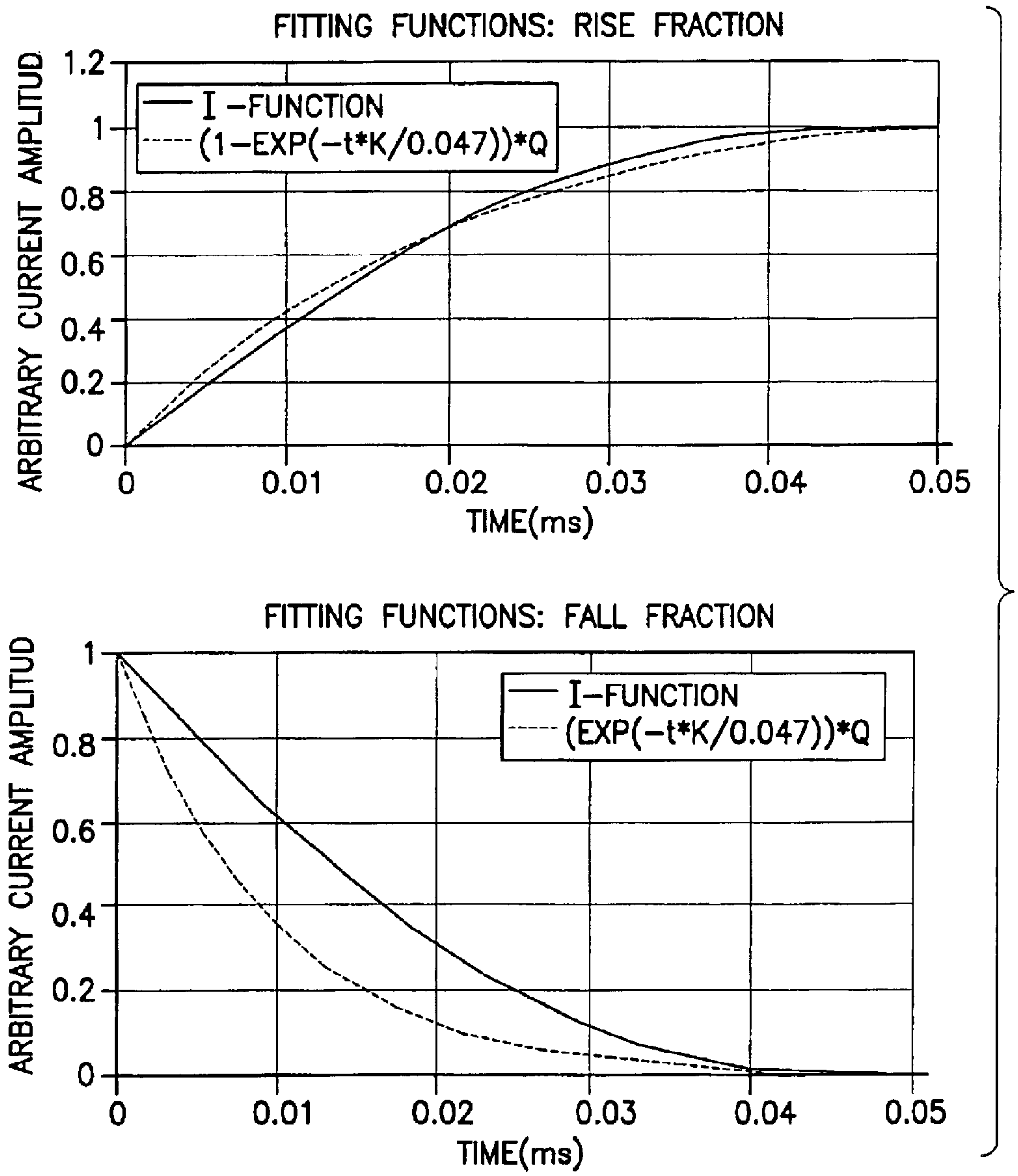
FIG. 22 depicts one example of an I-Function current fitted to certain library rise and fall exponential functions according to an embodiment of the present invention.

5. Fitting to Library Standard Waveform Waveform generator hardware can reproduce a variety of current traces calling so-called standard waveshapes and their combinations. That moves the algorithm to the next step, which is translation of an I-Function current into available library functions and time into number of points within the cycle. For example, in HP 33120A software one cycle is equal to 16000 points (pts). For the rise and fall I-Function current most fitting shapes are rise $V(1-e^{-bn})$ and fall $Ve^{-bn}$ exponential functions. In normalized to unit form, the amplitude V is equal 1. So, the damping fact b maybe be derived from comparison with I-functions at rise and fall fractions:

$$1-\exp^{\frac{-tK}{t_{change}}Q}=1-\exp^{-bn}$$

$$\exp^{\frac{-tK}{t_{change}}Q}=\exp^{-bn}$$

where K, Q, and n are determined during the fitting process (the result of which is shown in FIG. 22).

In this example, one has the following equations:

$$b_{rise}=\frac{0.175\text{ ms }2.25}{0.047\text{ ms}}1.118=9.36$$

$$b_{fall}=\frac{0.213\text{ ms }4.8}{0.047\text{ ms}}1=9.60$$

6. Targeted Multiple Injection Map and Time Scaling FIG. 23A–23B indicates translation of camshaft angular positions of various phases during an injection cycle. In this example, the engine speed is 400 RPM for four stroke cycle (f=33.33 Hz). The main injection is set at 180° (top death center TDC). Before TDC at −20° starts pilot injection. Both shots have duration of 600 us. Dwell interval is 1275 us. All phases are calculated in degree, us and pts.
7. Construction of Special Waveform Each phase may be coded. FIGS. 24A–24B illustrates the two shot injection per cycle calculated in previous step 6. As shown, each shot is divided into 5 phases and translated into absolute and arbitrary coordinates of time and voltage/current amplitude. The resulting output signal is shown in the right plot of FIG. 25.

In another embodiment of the present invention Angular frequency $\omega_{21}=2\pi R_1/L_1$[rad/s]; Frequency $f_{21}=R_1/L_1$ [Hz]; Time response (rise) $\tau_{21}=L_1/R_1$ [s or ms or us]; Angular frequency $\omega_{22}=2\pi R_2/L_2$ [rad/s]; Frequency $f_{22}=R_2/L_2$ [Hz]; and Time response (rise) $\tau_{22}=L_2/R_2$ [s or ms or us].

In another embodiment the present invention provides for application of I-Function ultra-short transient magnetic flux cutting transient inertia in wave form diagrams of solenoid-valve needle stroke (or more generally, coil-plunger stroke) that results in rapid dynamic of force-stroke response (solenoid performance).

In another embodiment the present invention provides for theoretical solution(s), actuation technique(s), engineering realization(s) and/or experimental method(s) related to rapidly operated injection.

In another embodiment the present invention provides an exact analytical generalized solution to a second-order nonhomogeneous ordinary differential equation describing complex dynamics in a primary solenoid including magnetic flux, elastic force, gravity and friction. Of note, this solution indicates that spectrum characteristics (frequency and/or time response) are fully dependent on time-dependent transient current applied at the opening and closing of the injector or any other like actuator. This current can be generated from an outside source (outer from primary solenoid).

In another embodiment the present invention provides an "I-Function" which satisfies a frequency and/or time response relationship between a remote secondary coil and a primary coil in terms of resistance to inductance ratios. Of note, the strongly exponential I-Function has unique features that help determine main criteria to construct secondary coil and/or a current electric circuit to the drive primary solenoid in an injector or an actuator.

In another embodiment the present invention provides inductive pre- and post-secondary inductor circuits for a fuel injection system or any other like actuator in order to control both rising and falling time response at the opening and closing of injector valve (or in more general application, the plunger opening and closing dynamics related to an electromagnetic actuator). In one example (which example is intended to be illustrative and not restrictive), this circuit may be flexibly constructed for wide application range by changing nominal characteristics of different circuit components with respect to a particular application case on the basis of primary solenoid characteristics and/or time response limits needed for injector or actuator rapid operation in a real environment.

In another embodiment the present invention provides at least two different secondary coil-charging techniques (referred to in the present application as simultaneous charge and pre-charge). Of note, these different charging scenarios indicate that transient I-Function current can be shaped in different ways in order to manage its aptitude-time-spike wave forms for different actuators. In another embodiment the shifted charge technique, which is combination of the first two scenarios, is also realized.

In another embodiment the present invention provides instantaneous fuel flow rate measurements applied to indicate that the remote secondary coil technique not only generates rapid electric I-Function current, but also results in rapid transient dynamics in the instantaneous flow. Such instantaneous fuel flow rate measurements support certain theoretical and engineering conclusions discussed above.

In another embodiment the present invention provides that the I-Function may be generated from the secondary coil driver without physical usage of the coil. That is, the I-Function relates to a current to be applied onto a primary solenoid in an actuator. In another embodiment an I-Function current generator may be utilized knowing basic parameters of primary solenoid. Such a current generator (or driver) may produce current to be applied in the form of a time-series coded waveform (e.g., from a resistor to which time-dependent voltage is applied).

In another embodiment the present invention provides that the I-Function may be directly coded (e.g., as a binary code into a chip installed into an Electronic Control Unit of a vehicle).

In another embodiment the present invention provides that the I-function may be coded as software. In another example (which example is intended to be illustrative and not restrictive), such software may be transmitted (e.g., through the Internet) to a solenoid to operate a remote actuator within given time limits of its opening and closing stages.

In another embodiment the present invention provides that the I-Function control technique may permit improvement in time response characteristics of existing devices in industries where timing is important for the whole dynamic process. In one example (which example is intended to be illustrative and not restrictive), application may be to diesel engines (to permit control of multi-shot injection as a series of ultra-short pilot injection and multi-shot injections within main injection as well as to control dwell interval between injection shots in order to get complete combustion and ultimately decrease fuel consumption and emission of particulate matter and nitrogen oxides (i.e., high injection repetition rate controller)).

In another embodiment the present invention provides for increasing vehicle fuel efficiency (e.g., diesel fuel efficiency) and/or driving range of vehicles equipped with either common rail or unit injector or unit pump or distribution injection pump systems.

In another embodiment the present invention provides for a multiple injection driver (MID) to implement controllable and timely repeatable multiple injection.

In another embodiment the present invention provides for a controllable injection phase shift (e.g., advanced and/or retarded), in order to get efficient and complete combustion and heat/pressure release.

In another embodiment the present invention provides for the utilization of existing serial electromagnetic actuators mostly constructed by using a single coil assembly. Analysis and realization of their rapid switch on/off operation essentially without transient delays are carried out with reference to FIGS. 6A–6D and 7A–7D, for example. More particularly, one or more of the following may be utilized:

- Analysis of the transient mechanic and electromagnetic dynamics which typically occur during an electromechanical actuator operation (with focus on the start/end transitions). This part considers general theoretical analysis through representation of an exponential type time dependent solution obtained under the gravity, magnetic, elastic and friction forces applied onto the injection valve.
- Introduction of an I-Function, which is generated by a remote secondary coil in the from of a rapid transient induction current to be applied onto primary solenoid.
- Engineer an electric circuit to realize SC-technique with respect to internal combustion fuel rapidly operated injectors.
- Realize a program which computes charging (energizing) time of the SC under defined properties of the PC.
- Experimental verification, including electrical measurements and measurements of instantaneous fuel flow rates, indicating simultaneously the complex dynamics of electromagnetic, hydraulic, mechanical and frictional factors contributed in final time response of the injector.

EXAMPLES OF PERFORMANCE TESTS AND QUANTIFICATION ACCORDING TO EMBODIMENTS OF THE PRESENT INVENTION

Figure 28:
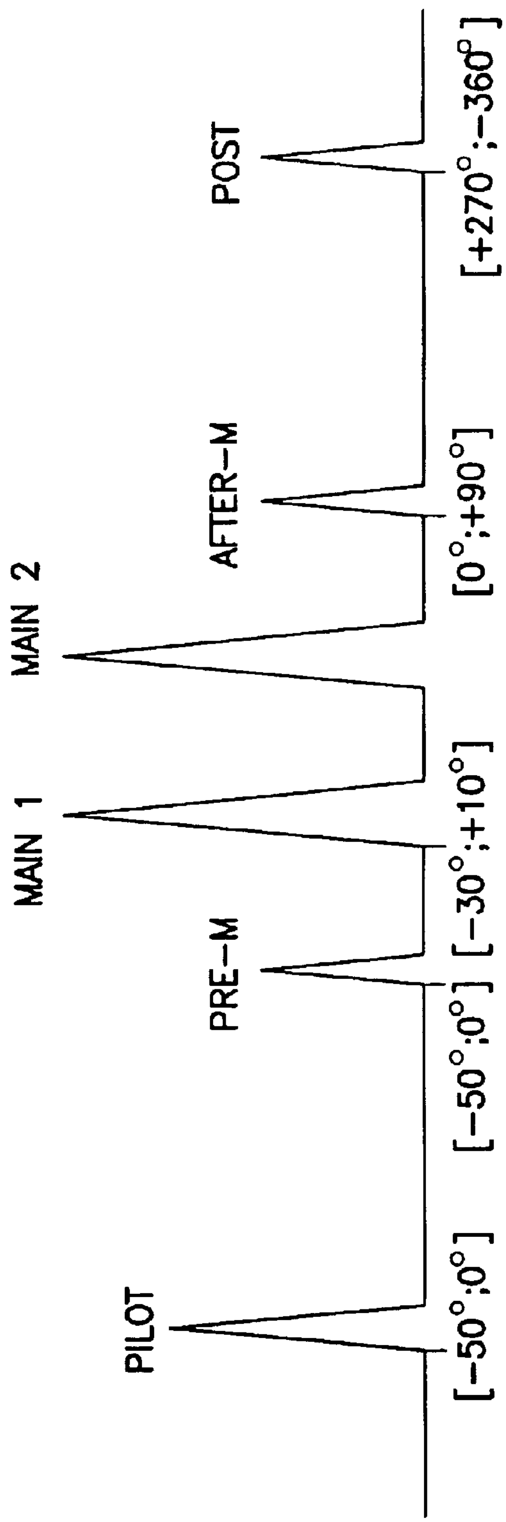

I. Performance Evaluation of a Multi-Burst Rapidly Operating Secondary Actuator Applied to Diesel Injection System Introduction The following now refers to a performance evaluation of a multi-burst rapidly operating secondary actuator according to an embodiment of the present invention as applied to a diesel injection system. This embodiment of the ROSA is aimed at further improvement of diesel fuel efficiency and exhaust emissions. In this regard, the inventor has conducted tests of ROSA aimed at providing controllable and repeatable multiple injection events, particularly in common rail injection systems ("CRIS"). Currently, fuel system suppliers are typically resorting to piezoelectric switches and other costly electric and electronic control units to provide the multi-firing effect in CRIS. ROSA generates a special current, which is applied onto the primary solenoid of the injector to control its transient fast response. An injection test cell has been constructed for this performance evaluation. Two test setups were available for both diesel spray visualization and instantaneous fuel flow rate measurements. Up to six shots per cycle were implemented under injection pressures from 1200 to 1800 bar. The injection repetition rate was equal to a four-stroke engine speed of 1200–3600 rpm. A high-speed digital camera was used to have accurate quantitative data regarding diesel spray rapid dynamics. An argon laser illuminated the spray field. Processed data were obtained for liquid spray tip velocity, injection shots duration, and their delay with regard to electric signal setup. The stability of phasing lies within 50 $\mu$s. The shortest injection shot duration is 74 $\mu$s, maximum variability of short duration is 50 $\mu$s. An advantage of ROSA is very stable phasing, dwelling and duration of multiple injection shots proved from cycle-to-cycle analysis. The ROSA technique also has a number of other unique applications including Electronic Unit Injector (EUI) and Hydraulic Electronic Unit Injector (HEUI) and variable air intake valve actuators. Recently, it was shown that multiple injection technique, applied to different diesel injection systems, has tremendous practical potentials to improve diesel combustion and after-treatment processes in variety of engine performance characteristics, including fuel consumption, emissions of soot/NOx and noise. There are numerous strategies in the split of single main injection into a series of sequential events, namely called Pilot, Pre-Main, Main-1 and Main-2, After-Main and Post injection event or shot. They can be summarized as is illustrated in FIG. 28 for six shot injection with arbitrary referenced cam phases within the injection cycle. For instance, good control of the Main injection(s) reduces the temperature peaks, and hence yields lower amounts of NOx. The Pilot shot yields increased pressure in the engine during the compression stroke, thus reducing the start-up time, noise, and smoke level of the engine at the warm-up stage, as well as increasing the torque at low engine speeds. The Pre-Main injection event results in a reduction of ignition delay thereby reducing combustion noise. The After-Main shot provides oxidization of the exhaust gas, which reduces the amount of particulate matter generated during combustion. The Post injection occurs during the exhaust stroke, thus increasing the hydrocarbons HC at the exhaust, which increases the efficiency of the DeNOx catalyst. Most of the multiple injection studies are directly related to the CRIS type injection systems. Fewer studies are highlighted with regard to EUI and HEUI, mostly applied for heavy-duty diesel engines.

To make multiple injection systems widely practical in automotive industries, it is necessary to provide very stable timing associated with four factors. The first is phasing of injection shots, the start of injection events. The second is injection duration of each event. The third is dwell interval between shots, especially related to Pre-Main, Main-1 and Main-2. And the fourth is delay factor dealing with the time needed for pressure propagation along the high-pressure pass from a pressure accumulation or generation source to an injector control valve as well as for pressure recovery. All these timing factors become very critical in the following cases: (i) increased number of shots, e.g., up to six; (ii) shorten dwells, e.g., down to 200 $\mu$s; (iii) enlarged dynamic (max/min) range of injection fuel flow rates for different shots, e.g., ~100 mg per Main and ~0.1 mg per Pre-Main; (iv) uncontrolled fuel pressure oscillatory frequency (~10–100 Hz) that can be in resonance with some multiple injection harmonics. These harmonics are widely varied from a few Hz to a few kHz.

As can be seen from various engineering conceptual designs of injectors and injection systems applied for multi-firing, there are one or two valves that control fuel pressure distribution between control and accumulation volumes associated with spill and needle valves, respectively. In older injector generations such as $1^{st}$ generation of CRIS an electromagnetic actuator controls a spill valve, which is hydraulically connected to a high-pressure line fed directly to the common rail (almost constant high-pressure source). While triggering the injector spill valve by energizing a solenoid type actuator, the pressure in control volume drops down below the pressure in accumulation volume. When the pressure difference applied on the sealing area of the injector needle overcomes the needle spring force, the injection starts. So, the actuation of injection in such solenoid type electronically controlled diesel injectors is a one-stage process. In some systems, where the piezoelectric actuator or second actuator (for instance, two-actuators EUI) hydraulically coupled to the needle valve in relatively closer position to the needle spring, the timing control on fuel pressure propagation to the accumulation volume can be flexible split into two stages.

At the first stage, the spill valve controls pressurization of the entire high-pressure gallery of injector by a common rail in CRIS or a pumping plunger in EUI or HEUI. Then, at the second stage, the needle valve controls the injection process itself. Practical implementation of new multiple injection techniques is quite costly and cannot be applied to the series of existing electronically controlled diesel injectors.

Only a few studies related to the timing stability of multiple injection are currently available. For example, cycle-to-cycle variability in injection characteristics was observed and explained by cyclic pressure deviation up to 22% in the common rail. Different timing strategies for the split of main injection into Pilot, Main and After with shifted phase and duration are studied, but only constant delay of the actual injection relative to the electric trigger signal of about 300 $\mu$s is outlined as a factor of stability. There is also a little data related to well-quantified amounts of fuel injected per each shot. Regarding a production multiple injection system, up to a 5-shot system with 400 $\mu$s dwell between Pre-Main and Main events and minimal injection fuel amount of 1 $mm^3$/shot with controllable variability of 0.5 $mm^3$ was mentioned in 2003.

The present inventor has developed a novel technique for a variety of applications related to the rapid acceleration and deceleration of a plunger into an armature, where the high timing stability is crucial for a specific process. With regard to automotive applications, primarily applied on any electronically controlled fuel injectors and variable air intake valves, this technique is based on a rapidly operating electromagnetic secondary actuator (ROSA) triggering the pressure control valve solenoid installed onto/into the injector. Physically, ROSA generates a specially shaped current called I-Function current, which is transferred onto the primary solenoid of the injector. This current controls the rise and fall transient response of the primary solenoid that results in controllable rapid and stable opening and closing of the injector valve.

Figure 29:
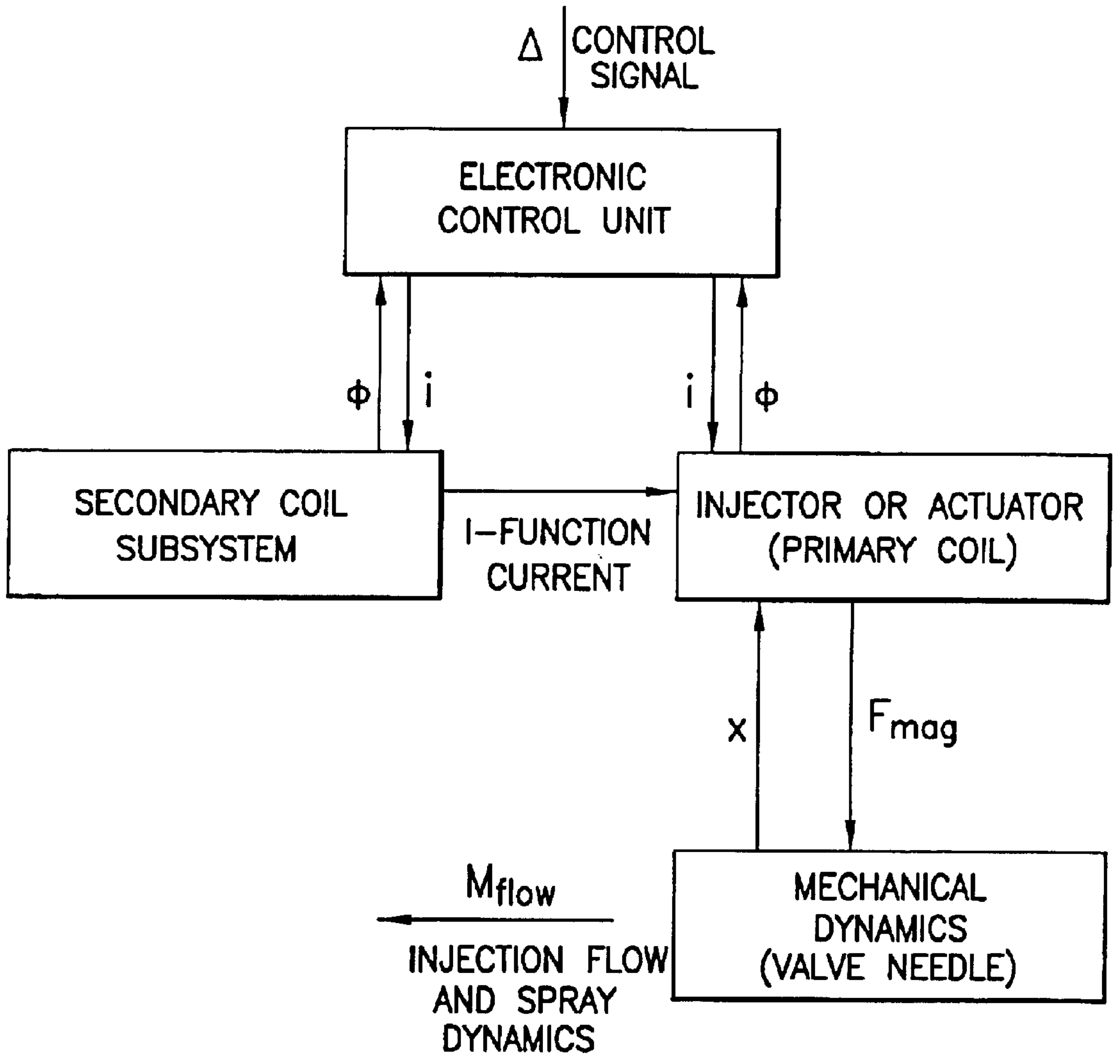

The ROSA technique can be performed in numerous engineering versions including (i) a remote secondary coil (for medium- and heavy-load solenoids of injectors and air intake variable valves for diesel engines), (ii) an electronic circuit (for lower load devices such as gasoline injectors), and (iii) a coded current profile incorporated into vehicle ECUs/EDUs. In this particular project, an in-coded version of ROSA was constructed and applied to a first generation Bosch type CRIS designed only for single shot injection with min/max energizing duration of 1–2 ms respectively. The main objective of this study was a quantitative validation of ROSA multiple injection control by means of a high-speed visualization of the diesel spray. In this case, the operation of the entire injection system results in a spray dynamics out the injector as shown in FIG. 29. Accurate temporal and spatial recording of the spray sequences provides detailed information about fast transitions occurring during high-pressure injection. The temporal resolution must be close to a few tens of microseconds to observe primary break-up transition, jet tip supersonic velocity and all injection timing characteristics needed for the required validation.

Details of the performance evaluation are as described below:

ROSA-CRIS Experimental Setup

Figure 30:
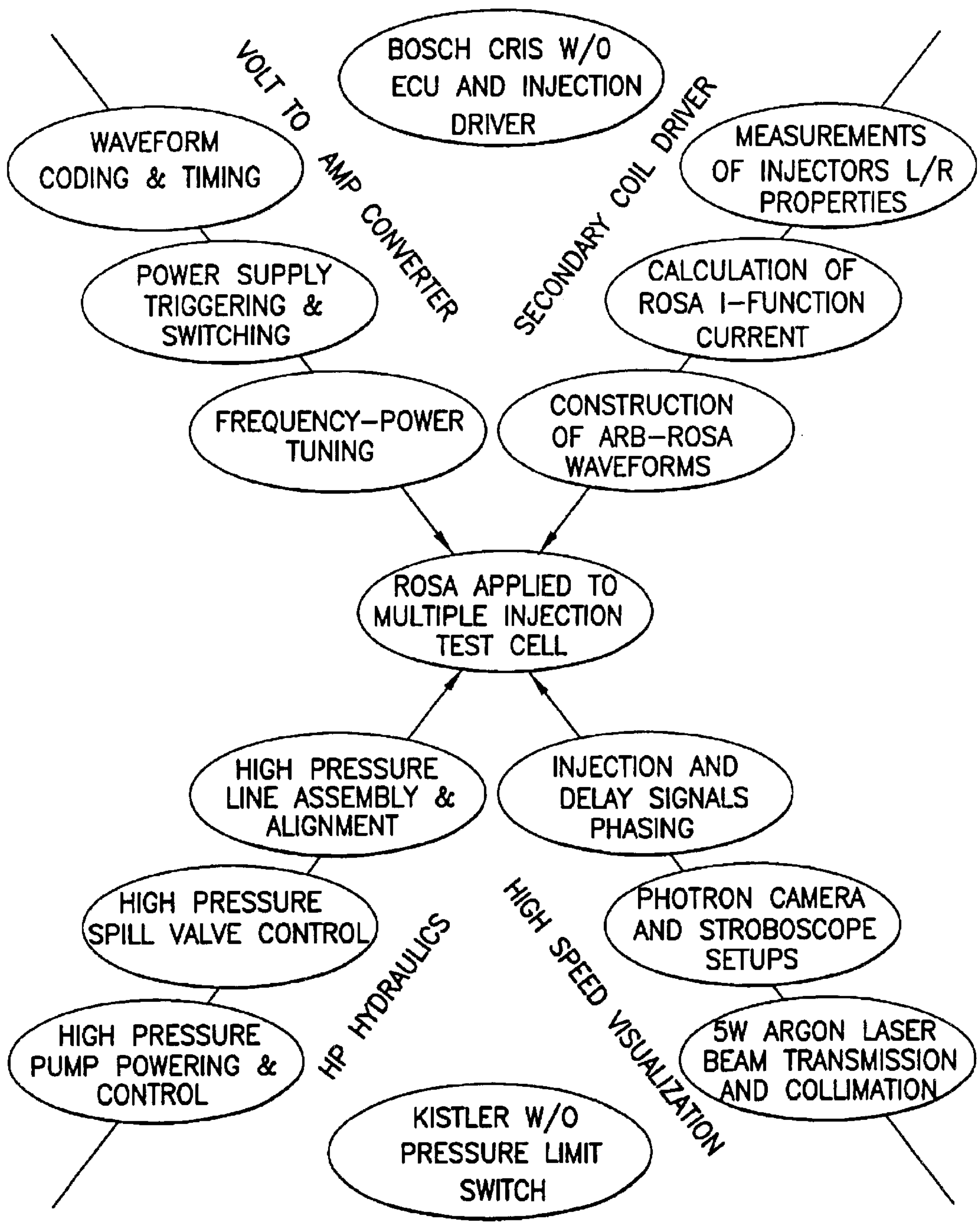

General Configuration Initially, the utilized CRIS was not equipped with a production electronic control unit (ECU). A Kistler 4067A2000 piezoresistive high pressure sensor along with a 4618AO amplifier measured pressure in the common rail, which was without a pressure limit switch to control the CRIS spill valve solenoid. FIG. 30 illustrates the technical stages that were carried out in order to construct an integrated test cell. Four subsystems, i.e., (i) a high-pressure (HP) hydraulics unit, (ii) a ROSA based electronic injection driving unit (EDU), (iii) a volt-to-amp converter, and (iv) a high-speed visualization channel have been constructed and incorporated into the test cell. The interconnections between all subsystems are shown in FIG. 31 along with the specifications of equipment used. The system allows very flexible and fully controllable setups of input and output data using two PCs.

High Pressure Hydraulics

The HP hydraulics unit is composed of a 40-liter fuel tank, a low-pressure pump with a fuel filter, a high pressure 5 □m-filter, an electric motor which motorizes a high pressure pump connected directly to the CRIS. An additional electric controller was used on the motor to have a gradual change in high-pressure level dependent on the motor rotational speed.

Only one from four production six-hole injectors was installed onto the CRIS. The injector was set up horizontally into a suction duct to remove residual diesel spray during the measurements. The fuel from both the common rail spill valve and the injector spill valve was returned back into the fuel tank through a flat plate water cooler.

To control the high-pressure level into the common rail through its spill valve, a pressure limit control was employed in the system. A TTL type 200 Hz 10 V 70% duty cycle voltage signal was coded into an arbitrary waveform generator by using bench link based software. An electronic limit switch controlled the final setup of pressure limit. This electric signal was transmitted to a voltage-to-current converter that was constructed by employing an insulated gate bipolar transistor with an ultra fast soft recovery diode.

The waveform generator output signal was connected to a gate pin of the transistor. The collimator-emitter pins were powered by a triple output DC regulated power supply, the same type of power supply used for the pressure limit switch. Therefore, the CRIS pressure level was set up in three stages. First, the low-pressure pump was set at 20 bar (290 psi) just using a hydraulic control valve. Second, using the motor rotation speed control, pressure was increased up to 100 bar (1450 psi). Finally, increasing the voltage through the gate of the transistor, pressure was set at the desired level between 1200 to 1900 bar depending on the multiple injection profile (the number and duration of injection shots).

ROSA Type EDU

To build up a ROSA EDU channel, the following subsystem has been designed, constructed and utilized on a production Bosch CRIS applied to E-class European passenger cars. A commercially available inductance L/C meter with resolution down to nH was used to measure inductance of each injector installed onto the CRIS. A second function/arbitrary wave generator was incorporated into the system in order to code ROSA type special voltage time series and afterwards to have an output that represents multiple injection signals. A 500 MHz 1 Gsa/s oscilloscope was applied to verify the quality and actual time phase setups of the output control signal directed to the CRIS injectors.

The entire multi-steps and multi-loop ROSA design algorithm of this embodiment can be divided into three large stages:

First. The procedure begins from measurements of electric properties of the injector such as inductance L and resistance R, to evaluate time (or frequency) response. That allows a calculation of energy transferred per each transient fraction of each injection event. Calculating a predetermined ratio of the energy transfer, e.g., the integral energy generated by ROSA over the integral energy that was designed for this specific injector solenoid reflected into current-time profile, it becomes possible to calculate R, L-parameters of the secondary coil (ROSA) which must generate a transient current for rapid operating of the valve.

Figure 32:
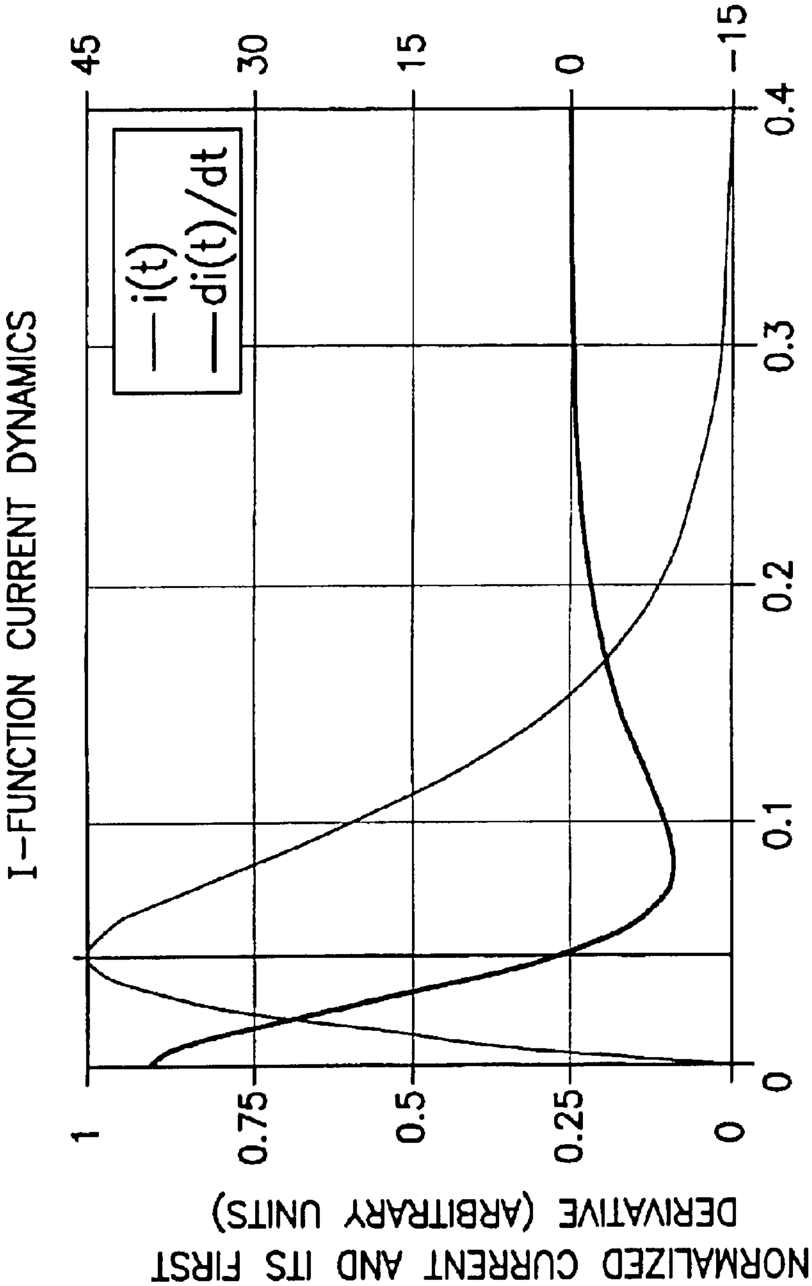

Second. In the next stage, one needs to construct a so-called "I-Function" current as a timely fractional series and determine a charging time interval that is applicable for rapid and stable control over the injector. An example of the I-Function shape is shown in FIG. 32. For internal combustion injectors with an electronically controlled hydraulic valve, at the valve opening stage the most critical part within given time interval is a fraction from the beginning of the injection profile to a phase where I-Function current reaches maximum because instantaneous velocity of the solenoid armature is proportional to instantaneous current $u=i\sqrt{L/M}$.

On other hand, in the case of an air intake valve it is necessary to have the time series extended to the moment where the first derivative of current becomes almost zero. This is due to proportionality between instantaneous acceleration (force) and current derivative $\alpha=(di/dt)*\sqrt{L/m}$. If ROSA is desired as firmware, at this stage the algorithm switches to fabrication of the ROSA electric circuit and its tuning upon a specified injection mode. If ROSA must be implemented as a code source, the algorithm continues to the third stage.

Third. The I-Function current time series must be fitted to a standard waveform function available in an arbitrary (ARB) wave generator. After fitting the derived I-Function to the waveform function algebraically, it is necessary to construct different transient phases of the injection cycle including individual injection shots and their $\mu$s-fractions. Finally, constructed current code is transferred into the given ARB-generator that next controls the injection profile.

The shots' profiles must be constructed for each engine mapping point according to the engine speed-load and emission control. A full combination of the multiple injection profiles forms a library of the injection different waveforms (LIW). Afterwards, the entire LIW must be transferred into an electronic injection-driving unit (EDU), which communicates with the main vehicle electronic control unit (ECU). Depending on the driving conditions, the ECU calls either OEM's or LIW's code related to the particular injection situation.

ROSA Bench Model

It is necessary to know the exact operation data of a production injection system, for instance, injector current/voltage trace applied on its actuator. In the Bosch CRIS injector, the solenoid triggers a ball type valve. At the stage of its pulling in (energized solenoid) the bleed orifice is opened and pressure difference between the feed passage to the nozzle and valve control chamber causes upward lift of the nozzle needle sequentially resulting in the injection event.

Figure 33:
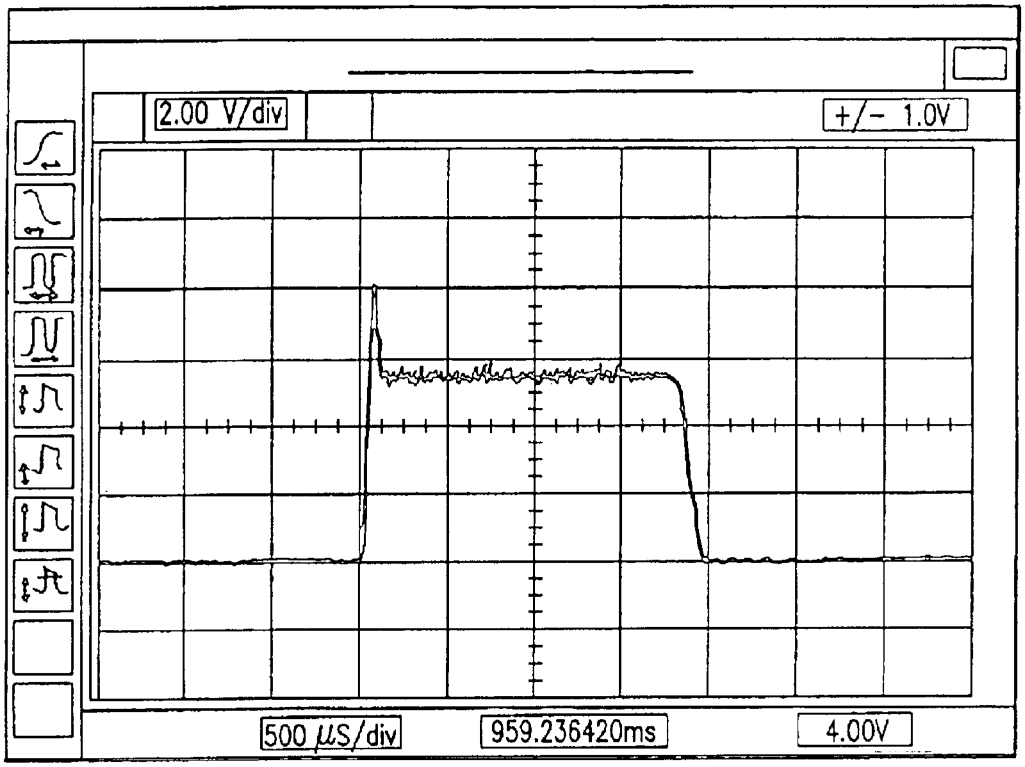

Typical current trace applied to the Bosch CRIS injector is illustrated in FIG. 33. The energizing time of this solenoid varies from 1 to 2 ms with a peak pulling-in current of 18A and holding current of 12A. The rise time and fall time are varied from 80 to 100 $\mu$s. During the holding stage current oscillates with amplitude 0.57A and periodicity 0.1–0.2 ms.

The power $E=\Delta(LI^2)/\Delta t$ fluxed into the primary solenoid during energized state is calculated using measured inductance L, pulling-in peak $I_{peak}$ and holding $I_{hold}$ current, time response and holding duration respectively $\Delta t$ to peak and holding stages. $E_{peak}$ varies from 64.8 to 72.9 W and $E_{hold}$=4.7–6.1 W for various injectors. These power (energetic) values are limited by construction of the coil, i.e., its inductance L and currents $I_{peak}$, $I_{hold}$ upon dynamic time response. To make the solenoid function very rapidly it is necessary to have an increased energy that will be released in a very short time.

The distance between the high-pressure injector inlet to its nozzle is about 0.11 m. The sound speed under common rail of 1600 bar is ~1700 m/s, so the time of pressure propagation is about 65 $\mu$s. That implies a magnitude of time fraction that must be comparable with minimal rise/fall time of the actuator resulting in high cycle-to-cycle stability (repeatability) of the multiple injection profile.

The secondary coil does produce a quick power release on the primary coil to facilitate both rising and falling transitions. In the right gray part of the table the first input is power ratio between $E_{peak1}$ of the injector coil and $E_{peak2}$ of ROSA coil $E_{peak2}=FE_{peak2}$, where factor F is varied between 1.5 to 4.0 depending on the actuator type and its application. In this particular case, it is maximized because for multiple injection with a fine inductance (high response time) the effect of rapidness is associated with high power ratio F=4.0. That permits the calculation of inductance of the ROSA coil $L_2=f(E_{peak2}, T_{peak2}, I_{peak2})$.

Conversely, the ROSA coil has a slower time response $T_{peak2}=kT_{peak2}$, where 2.0<k<5.0. Once again, because multiple injection requires very quick response over both injection shot and dwell interval between these shots, factor k=2.0 is minimized. That results in resistance value $R_2=L_2/T_{peak2}$. Now, having frequency responses of both injector and ROSA coils, one can construct the I-Function current (as discussed in detail elsewhere in the present application).

The I-Function current trace and its first derivative are shown in FIG. 32. Because R/L data are of the magnitude order of kHz, the time scale is scaled out to ms. The maximum current peak corresponds to 0.047 ms which relates to the maximum velocity of the primary solenoid armature. That time duration is a time $t_{charge}$ that should be given for the ROSA coil for its charging before the energy is transferred into the primary injector coil.

Waveform generator hardware can reproduce a variety of the current traces called standard waveforms as well as their different combinations. That moves the algorithm to the next step, which is a translation of the I-Function current into available standard functions and the time phases into a number of points within the injection cycle. For instance, in the software used in this ROSA development, one cycle is equal to 16000 points (pts). For the rise and fall I-Function current most fitting shapes are rise and fall. In normalized form, the voltage amplitude V is equal 1. So, a matching factor should be derived from the comparison of I- and ARB functions at rise and fall fractions. Each injection shot was divided into 3 main sub-phases: rise, holding and fall transitions. They were translated into absolute and arbitrary coordinates of time and voltage amplitude.

Figure 34:
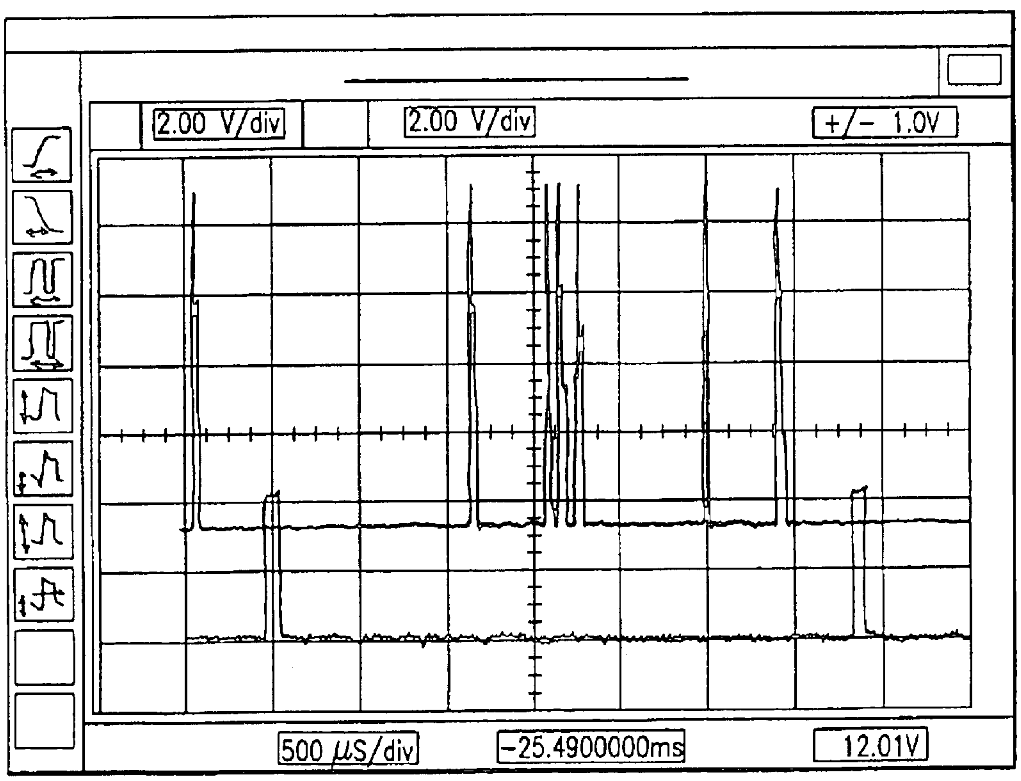

FIG. 34 demonstrates an example of the output signal for a six-shot multiple injection at engine speed of 3600 RPM, the cycle duration is 360 cam [deg]. Here, the beginning of each cycle is referenced by a stroboscope second channel signal. The "Main 1" 600 μs shot is set up at 180° (top dead center–TDC). Before TDC there are the "Pilot" 400 μs and "Pre-M" 400 μs shots, i.e., during compression stroke.

The dwell interval "Dwell 1" between "Pre-M" and "Main 1" is set up as 200 μs, while the dwell interval "Dwell 2" between "Main 1" and "Main 2" is 500 μs. The "Main 2", "After-M" and "Post" are during the combustion power stroke and exhaust stroke respectively, as was shown FIG. 28.

Volt-to-Amp Converter

Having voltage arbitrary waveform for multiple injection, one needs another voltage-to-current converter to power the injector. Therefore, the second injection control channel was constructed as shown in FIGS. 29 and 30. A voltage type injection signal coded as described above and transmitted to an arbitrary waveform generator. This signal was transferred onto a voltage-to-current converter of the same type that was used for the pressure spill valve control. The signal from the waveform generator controlled the gate pin while the transistor collimator-emitter pins were powered by the DC regulated power supply. This entire algorithm can be written as a program that will produce coding of all phases and shapes to generate the necessary waveforms including I-Function rise and fall fractions and holding stage. In other words, a special library can be written in a compressed form for easy translation of this library into hardware (EDU) for further "call" type functionality. On the other hand such a library provides a variety of physically manufactured secondary coil drivers for different automotive applications (injectors, valvetrains and other rapidly operating actuators).

High Speed Visualization

Three different high-speed techniques were used to visualize multiple injection dynamics. First, a film camera was used at a lower speed of 5,000 fps to document 5- and 6-shot multiple injections with a high spatial resolution and a high sensitivity. Evaluation of the liquid spray tip velocity resulted in a maximum speed of 250 m/s, which is below of the speed of sound ~320 m/s under normal ambient pressure and temperature in the laboratory room. However, it was obvious that during experimentation with diesel multiple injection the shock waves sound was clearly heard.

Second, a very thorough study was carried out using a stroboscope "freezing" technique to learn what level of temporal resolution must be applied to see more transient fractions in the spray dynamics, especially at the beginning of each shot during multiple injections, as well as to estimate the delay between the electrical command signal generated from the waveform generator and the actual shot. This study has shown that a faction of a few 10 μs equivalent to a high-speed visualization at a few 10,000 fps is essential to observe the spray dynamics. Delay time was estimated to be over 400 μs.

Third, a high speed CCD camera with a speed up to 40,500 fps (24.69 μs/frame) was used to make numerous measurements in a wide range of setups of the injection repetition rate, number of shots, shot duration and dwell intervals at various spatial resolutions of the camera. Below, more details for each of these studies are described.

Filming at 5,000 fps

Figure 35:
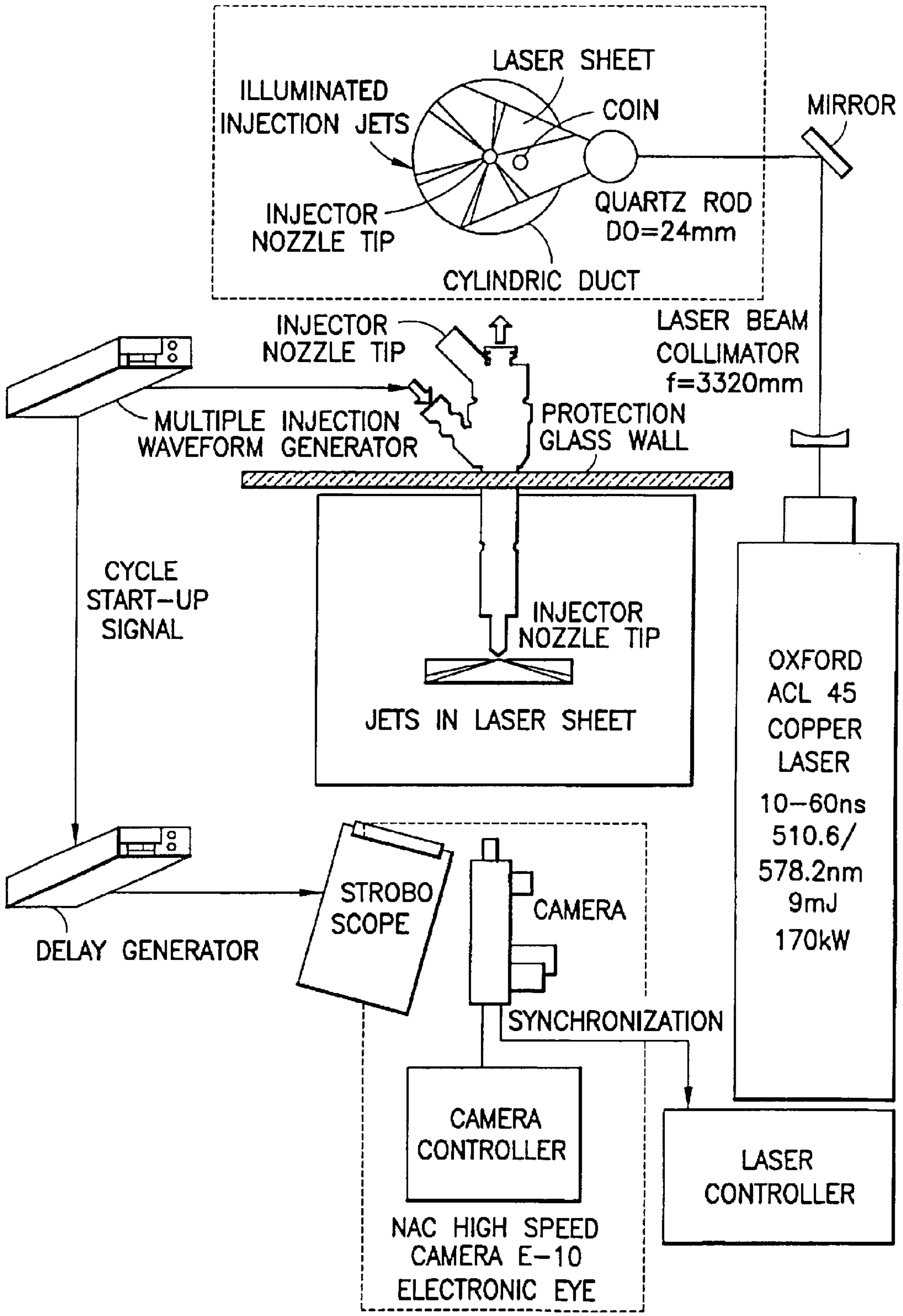

The setup for the filming is depicted in FIG. 35. The injector was mounted side-off through a glass wall of the protection box into the center of a 220-mm cylindrical black-wall duct in order to extract a residual mass of the spray into an exhaust hose connected to an external ventilation system. A US quarter of 24.76 mm was glued on the front black panel mounted just behind the injector nozzle tip in order to have a spatial scale on the observation disk. For illumination of the spray flow a laser channel was built up using a copper laser at 40 W output power. The pulse width was adjusted to 25 ns. An output beam of 25 mm was collimated by a 3320-mm plane-convex lens and redirected by a mirror to a 24-mm quartz rod in order to produce a laser sheet. Inclination of the injection jets at 35° to a vertical plane necessitated the use of such a thick laser sheet. A stroboscope was set up on a tripod to illuminate the beginning of each injection cycle. The injection ARB generator synchronized the cycle through a four-channel digital delay/pulse generator, which was used to set up the strobe light at any fixed time phase, i.e., to "freeze" the spray dynamics at this particular phase with very high temporal resolution available down to a Pico-second.

For preliminary filming of the spray a high speed camera with an electronic control system was used. The camera was mounted on a tripod in the front position normal to the laser sheet at a distance of 300 mm and connected to its power and control units. A synchronization signal from the camera was fed back to the laser controller. At a camera speed of 5,000 fps, the acceleration time was 0.90 s from total filming time of 3.60 s for standard film length of 122 m. A high sensitivity film of 400 as a was used because the duration of the laser pulse was only 25 ns per each 200 μs frame.

Figure 36:
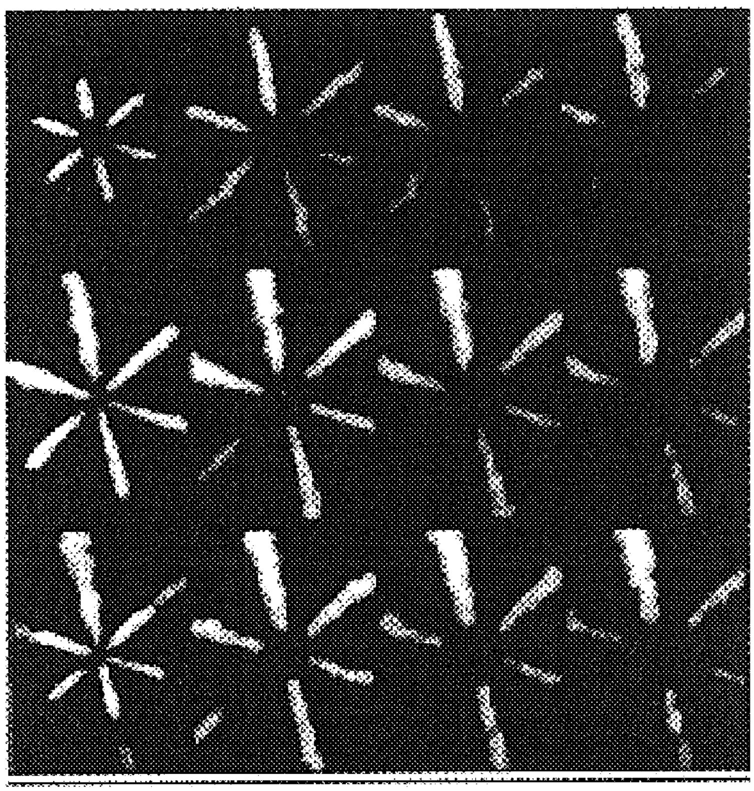

Two films were made. The first one was filmed for six shots per injection cycle at an engine speed of 1,200 RPM. The second was filmed for five shots per injection cycle at an engine speed of 2,400 RPM. An example of visualization of 400 μs Pre-Main (top raw), 600 μs Main 1 (middle raw) and 500 μs Main 2 (bottom raw) shots are illustrated in FIG. 36. An insufficiency of temporal resolution was observed due to the fact that the estimated spray tip velocity was less than sound speed. For example, the frame on top left shows a time phase of the beginning of Pre-Main shot. The length of each jet at this particular moment is twice the size of the reference coin, i.e., 49.52 mm. The frame duration is 200 μs. Therefore the estimated velocity is about 247.6 m/s, below the speed of sound of 320 m/s. This fact contradicts what was heard (a supersonic sound) during run of the injection.

Stroboscope "Freezing" Technique

Afterwards, a special study was conducted and focused on the minimum temporal resolution needed for the measurements. The stroboscope light with a pulse width of 176 μs and 247 μs at a repetition rate of 30 and 10 Hz, respectively, was gradually shifted along the cycle time phase. The delay generator was used to increment the shift at 100, 10 and 1 μs of time. In other words, a simulation of high-speed visualization was an equivalent to 10,000 and 100,000 and 1,000,000 fps. The second increment was the most balanced in terms of the time consumption and resolution high enough to resolve the spray dynamics.

Measurement of the jet length at the start of injection has shown that the spray tip velocity is over 360 m/s (supersonic). Increasing the number of shots per cycle from one to six, one can easily hear a very harmonic single tone sound becoming more and more husky under multiple injection runs because the shots are distributed in non-regular time intervals according to the multiple injection concept illustrated by FIG. 28.

The "voice" of multiple injection is very specific and can be recognized after getting some experience. At a repetition rate of 30 Hz, the frequencies of multiple harmonics are varied from 30 to 1,600 Hz. Another important observation that came out of the stroboscope study is that at any frozen phase within a given injection shot one can see a very stable picture over many cycles. There is no oscillation of any part of the jets, neither in length nor shape nor density. That was the first clear indication that ROSA produces multiple injections with very high stability at all reasonable low, medium and high engine speed.

Visualization at Higher Speed

Figure 37:
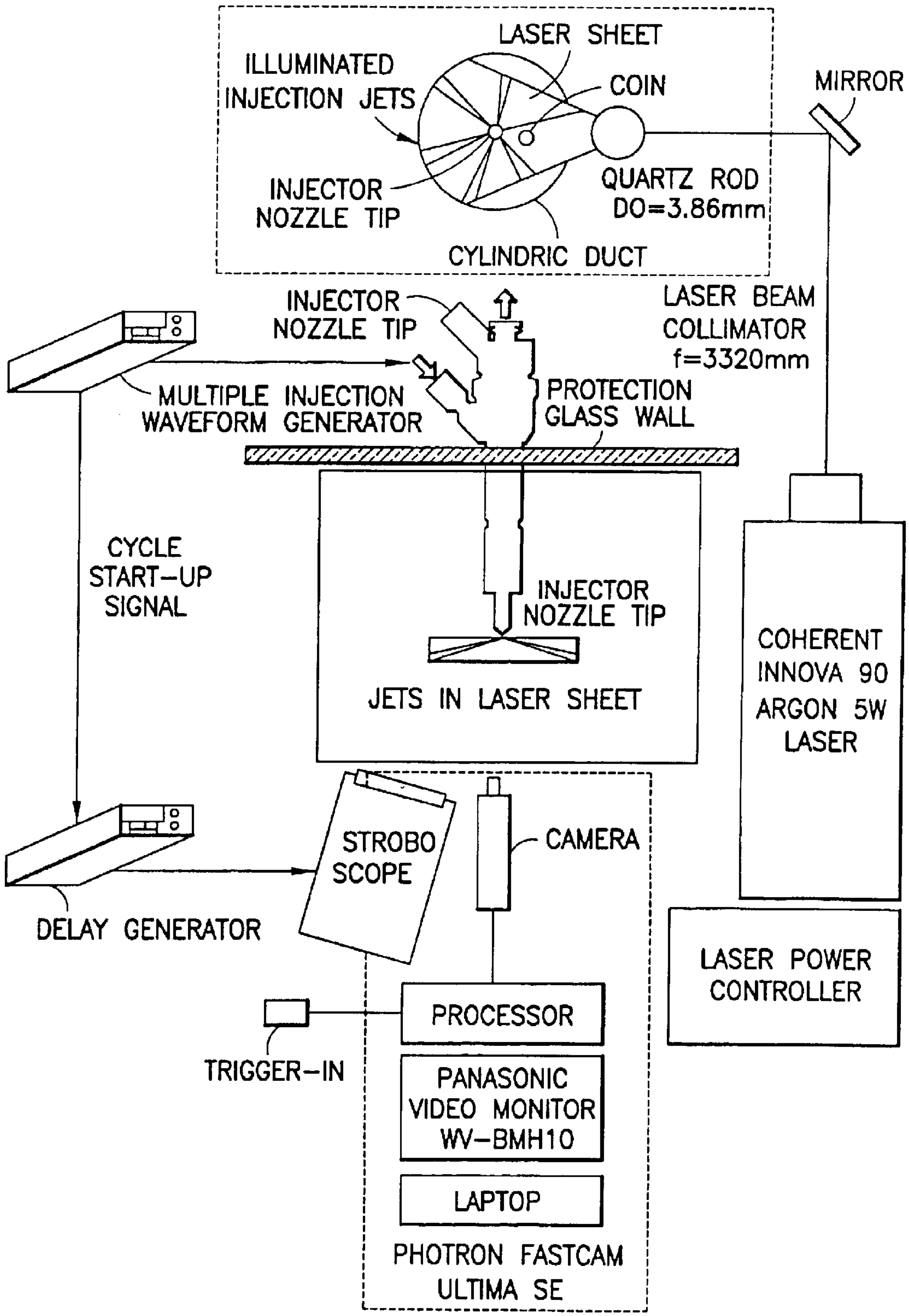

To monitor detailed diesel spray including the development of very initial transitions, a high-speed CCCD type digital video camera was adopted and used at various operational speed of 9,000/18,000/27,000 and 40,500 fps with spatial resolution of 256×128, 256×64, 256×64 and 64×64 pixels per frame respective to the camera speeds. By increasing the speed, the study was mainly focused on initial single spray development in order to measure the spray tip velocity and delay of the injection shots relative to electronic signal setups as well as the exact dynamic duration of shots and dwell intervals between them, especially between Pre-Main 1 and from Main 1 to Main 2. The layout and photo view of the setup of the equipment is depicted in FIG. 37 and 38. The camera system includes (i) a compact camera mounted on a tripod with a 3D rotational traverse, (ii) a processor with a memory capacitor of 200 GB, and (iii) a lap top computer with a recording and post-processing software. The processor was connected both to the PC through Ethernet card and a video monitor. A trigger-in remote control was used to start the recording process.

A 5 W argon laser continuously emitted a beam of 3 mm (488 and 514 nm wavelengths), which was re-directed through a mirror to a fused quartz rod of 3.86 mm. Because the laser beam was not specially conditioned (collimated) the final laser sheet thickness was about 12 mm. This thickness was less than the 21 mm needed to cover the whole spray field in the duct because the jets were inclined at 35 degrees from the cutting laser vertical plan. However, it was larger than the space maintained by the camera at its high operational speed.

The camera was mounted on a tripod in front of the injector nozzle tip at a distance of 180 mm and slightly rotated at 250 to capture the first jet counter clockwise from the direction of the laser sheet entrance. Again, the stroboscope was used to flash the injection cycle start. Using a light bulb and setup of the processor in "live" regime, the camera was carefully focused on the injector tip in such a manner that the quarter coin, which referenced spatial scale, was also clearly seen during flashing the stroboscope and the stroboscope together with the laser sheet as shown on photo A and B in FIG. 38.

During high-speed visualization the laser beam was set up at 80% of its peak power of 5W. Multiple injections simultaneously with stroboscope flashes were run and the recording process was started by the trigger-in signal. More than 20 films were recorded for various engine speeds, number of shots, variety of injection mapping setups and dwell intervals between Pre-Main 1 and Main 1 shots.

Treatment Process

Figure 39:
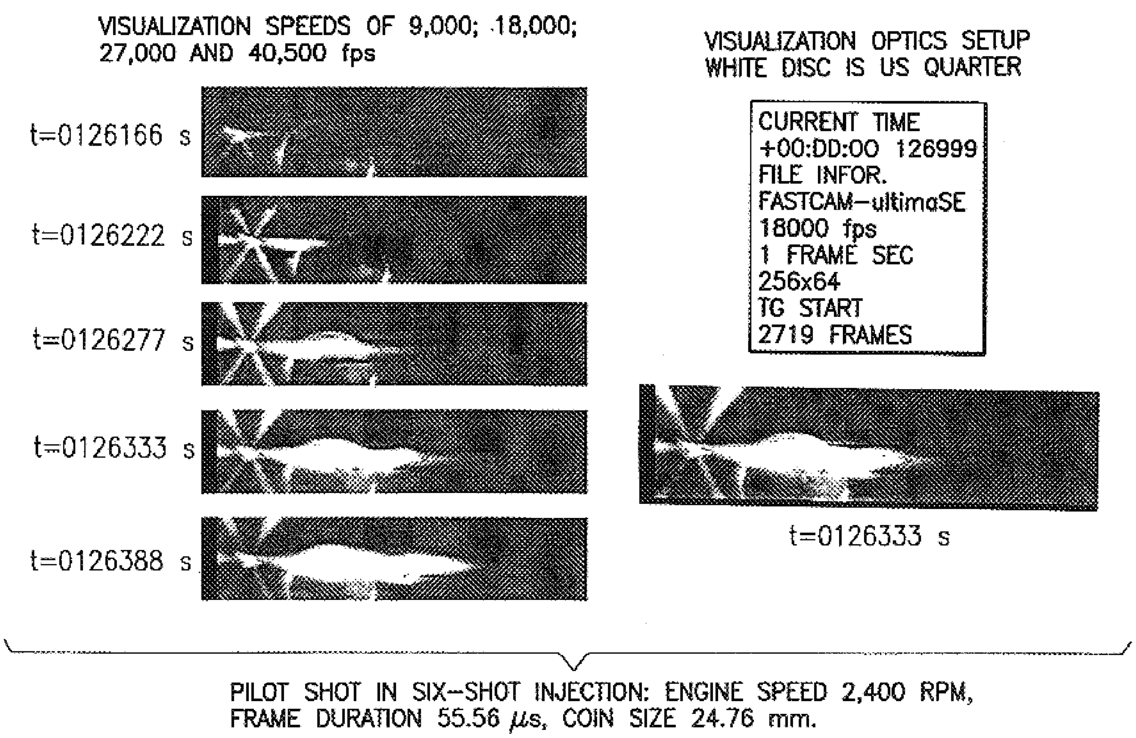

All recorded high-speed films were processed as sequential time-series. FIG. 39 illustrates an example of such series. It comprises 9 frames filmed during the Pilot shot of the six-shot injection cycle. The camera speed was 18,000 fps and the engine speed was set up at 2,400 RPM. Because a thin laser sheet was used due to the lack of energy at the high-speed visualization only a portion of flight trace associated with initial phases in the vicinity of the injection nozzle was recorded. As shown at the enlarged frame, a dark population of pixels presented in all digital films characterized the liquid jet tip.

Figure 40:
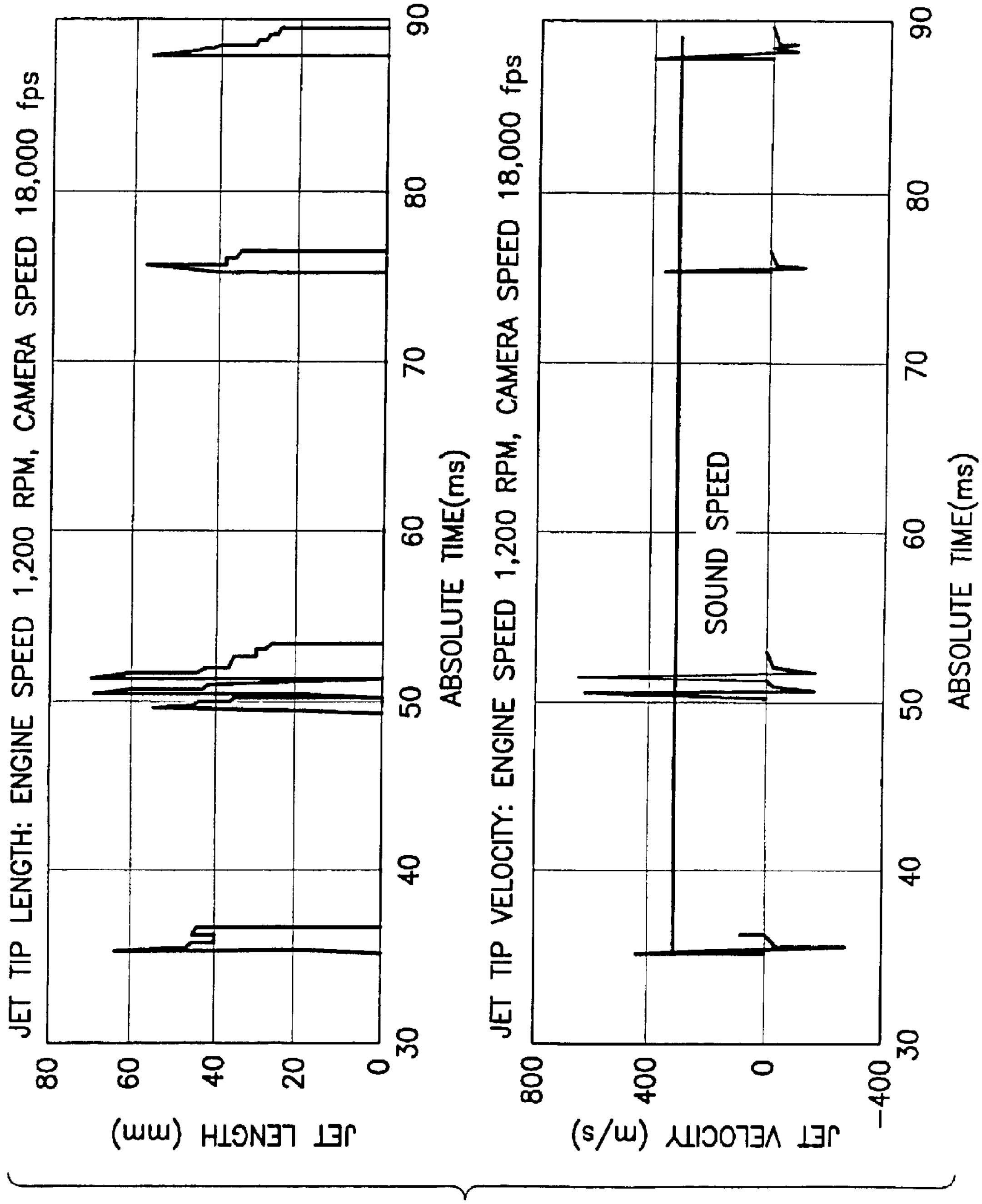

Within all injection events, four stages could be observed. During the first, a liquid jet is developed with supersonic speed that will be discussed later on. During the second, at the moment of closing the injector valve, the spray flow is detached from the injector nozzle but some portion of liquid jet is still taking place. During the third, only the spray field can be seen. During the fourth, the diesel spray that inclined from the vertical plan is moved out of the laser sheet and only its residual part is traced in the vicinity of the injector nozzle. The stroboscope flash indicated the start of each injection cycle $N_{st}$. This frame was set up as zero time, which was used for subtraction for each other sequential frames $N=N_{frame}-N_{st}$. The absolute time was calculated as a product of frame duration and sequential frame $t=N*T_{frame}=$ N/Camera Speed. A length of liquid jet tip $L_{jet}$ projected on the vertical plan was measured against the coin scale. A post-injection length of the visualized jet from the beginning of spray to the liquid population $L_{post}$ was also measured. This length was almost constant during a few frames and later it was decreased due to movement of the spray out of the laser sheet. Such a procedure allows an estimate of the lowest magnitude of the projected jet speed $V_{jet}=L_{jet}/t_{jet}$. This velocity is reflected in all processed data. The inclination of jet at angle a implies that projected velocity is $U_{jet}=V_{jet}/\cos(\alpha°)$. Because a thin laser sheet was used, the real jet tip velocity might be slightly higher. However, the measurement of exact jet speed velocity was not the main objective of this study. At the first stage of data processing, the main objective was to measure actual duration of each shot $t_{jet}$ upon the length $L_{jet}$ from the beginning of the injection event until the moment when the spray was detached and to estimate the velocity that was supposed to be supersonic. The length $L_{post}$ and time $t_{post}$ of post-injection spray were also measured, so $V_{post}=L_{post}/t_{post}$. Because this length represents only the visual part of residual spray, this velocity becomes zero and even negative, just to characterize a post-injection fraction of the injection event. An example of liquid jet dynamics for a six-shot injection under engine speed of 1,200 and at camera speed of 18,000 fps is depicted in FIG. 40. First, one can see that all shots have supersonic velocity. The end of injection in the velocity diagram is characterized by the fall crossing the ZERO line and the oscillation parts in negative zone are related to post-injection dynamics of the spray. The actual dynamic dwell interval between Pre-Main and Main 1 shots is 517 $\mu$s, between Main 1 and Main 2 it was 763 $\mu$s while the electronic setups were 300 and 500 $\mu$s, respectively. In this particular case, delay of the shot phases with regard to the electronic signals was about 500 $\mu$s. These aspects, i.e., the dynamic shot duration and delay, will be discussed in detail in the next paragraph.

Figure 41:
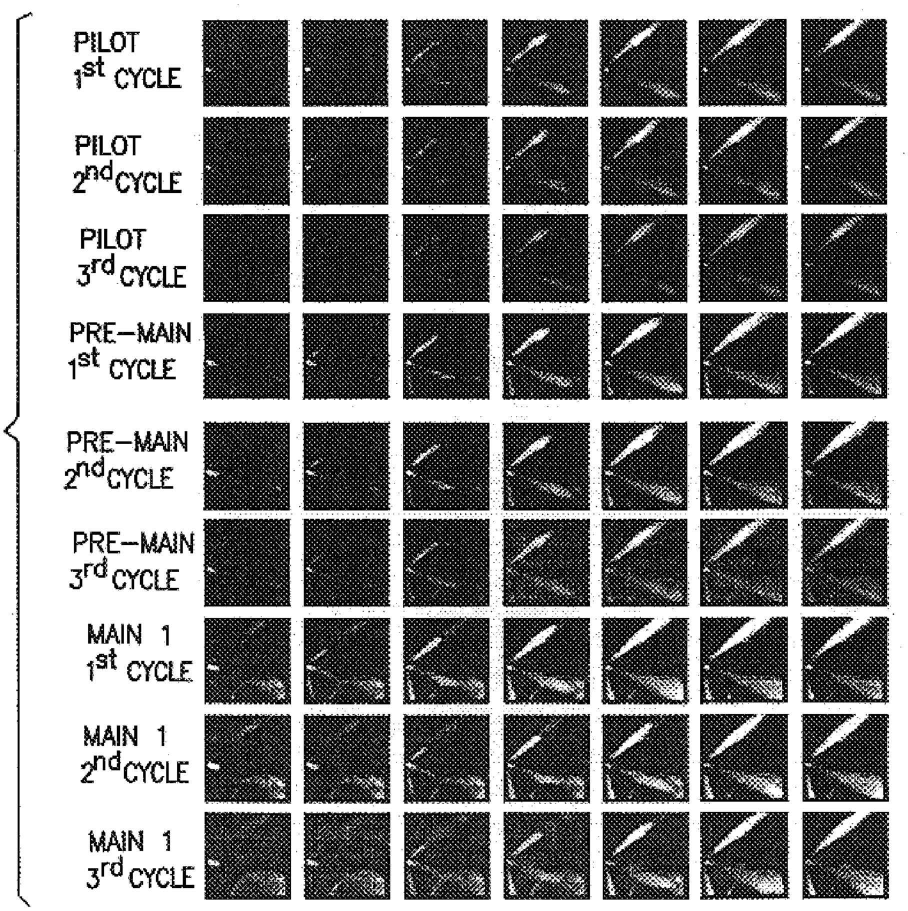

At the second stage special efforts were focused on cycle-to-cycle variation, in other words to estimate at which time fraction the variation can be detected. That was possible due to recording multiple injection events at different camera speeds. To analyze cycle-to-cycle variability, each injection setup was recorded as a series of sequential cycles. An example of the treatment process for the six-shot injection cycle monitored at the camera speed of 40,500 fps is illustrated in FIG. 41. Here, only four first injection shots, namely Pilot, Pre-Main, Main 1 and Main 2 are plotted as 7 frame series for each shot (horizontal raw) in three sequential cycle series (vertical columns). Because the duration of the frame is 25.69 μs, the total time scale for seven frames plotted in FIG. 41 is 172.84 μs. However, all injection event data were processed until the moment when the jet was detached from the injector nozzle, i.e., the real duration was longer than shown in this figure. The main objective of the treatment was to analyze actual timing of shots' duration and its time phasing within each given cycle. That allowed analysis of factors of stability and time/phase delay with regard to the electronic timing setup shown earlier in FIG. 34. From FIG. 41 one can see, at least qualitatively, a high repeatability of the injection events in sequential cycle-to-cycle series for each shot. It can also be seen that the most "weak" injection characterizes the Pilot shot. The most "dense" injection, as expected, is seen during Main 1 and Main 2 events.

Results and Discussions

Common Observations

Cycle-to-cycle analysis has shown that even at a camera speed of 27,000 fps (time resolution of 37.04 μs) there is no cyclic variability in all physical data processed and analyzed. That is why for all further illustrations obtained at the highest camera speed of 40,500 fps data will be discussed. All data processed for each cycle were put into the cycle summary as shown in FIG. 42. On the left side of this table are data related to the electronic signals came out from the wave generator. On the right side are data obtained from the high-speed visualization record.

From this particular example one can conclude the following:

1) The flow dynamic duration of each shot is shorter than was in the waveform setup. Duration of the Pilot, Pre-Main, After-Main and Post was equally setup to 400 μs, however, in real dynamics they have different duration varied from 173 μs up to 222 μs. The ARB duration of Main 1 and Main2 shots were 600 and 500 μs, respectively. During multiple injection they were shorten to 272 and 346 μs.
2) Controversially, the critical dwell intervals Pre-Main to Main 1 and Main 1 to Main 2 were increased from 200 to 518 μs (dwell 1) and from 500 to 691 μs (dwell 2), respectively.
3) All phases are shifted to about 400 μs. This delay is directly associated with the pressure wave propagation time in the common rail. Its equal to a fraction of the CRIS double length over sound speed of compressible diesel fuel under such high injection pressure (over 1,400 bar).
4) In terms of cam angle positioning at this high engine speed regime 3,600 RPM, there is quite small phase fraction well controlled during multiple injection. For instance, three injection events namely Pre-Main, Main 1 and Main 2 are laid within 21.9 degree while total these three shorts duration is 2.1 μs.

Further studies were focused on three physical parameters important to characterize stability or controllability of the ROSA multiple injection: (i) the injection shots duration, (ii) the stable phasing of injection shots and (iii) the delay between the dynamic injection events and the ARB setups produced by the injection generator. All these data will be presented in absolute time scale and cam phases within cycle of 3600. To make such analysis, all high-speed data filmed at 40,500 fps for 6-shot injection cycle at engine speed of 1,200/2,400 and 3,600 RPM were sorted per each three cycles for each injection case.

Analysis of Short Duration

Figure 43:
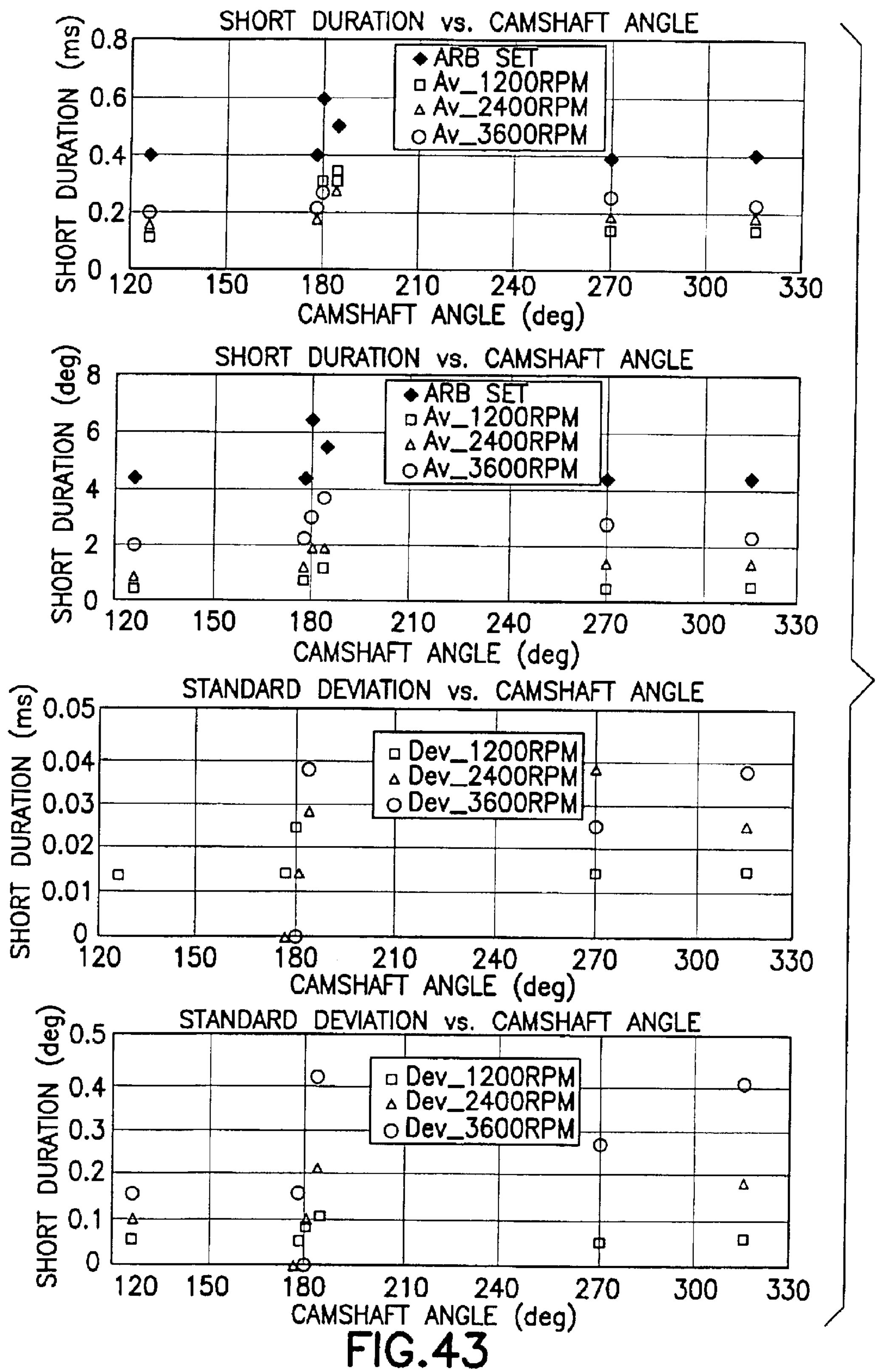

The shots duration and its standard deviation along with ARB shots duration setups are shown in FIG. 43. Looking at this parameter in absolute time scale (2 top plots) and in camshaft angular position (2 bottom plots), one can conclude that:

1) The higher engine speed, the longer injection duration actually generated from the injector. At higher engine speed the pressure, dropped during previous shot, has higher repetition rate to be recovered.
2) The shortest duration is dealt with Pilot, Pre-Main and Post injection shots, 115, 178 and 140 μs in average at engine speed of 3,600 RPM, respectively. The longest shot duration is observed always at Main 2 event being 337 μs at the same engine speed.
3) High standard deviation of 38 μs belongs to Main 2, After-M and Post injection while almost ZERO deviation shots are Pilot and Main 1, especially at higher engine speed of 2,400 and 3,600 RPM.
4) Each duration in cam degree scale is well resolved between shots on specific engine speed. There is no instability regarding misfiring of the injector. The standard deviation for most cases lies within 0.2° except Main2 and Post at high engine speed.

Phasing of Injection Shots

Figure 44:
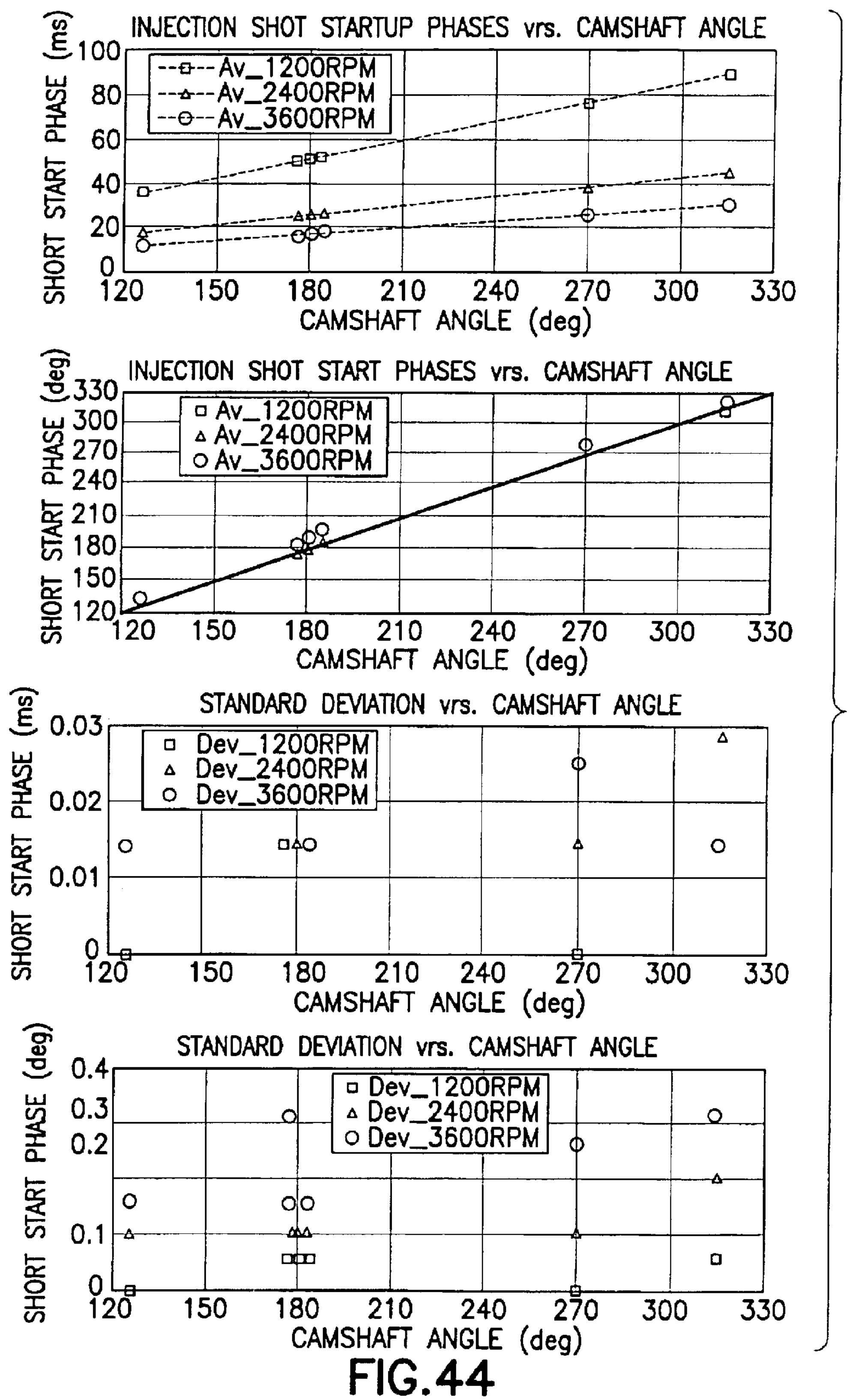

The phasing of shots and its standard deviation is summarized in FIG. 44. The top 2 plots are related to the absolute time scale, the bottom 2 graphs are presented in cam angular scale. Three points are important to outline here:

1. From the correlation diagram seen on third plot from the top, one can conclude that all injection events are delayed with regard to ARB waveform setups. Here, the vertical axis represents ARB setups; the horizontal is reveal to the actual phasing of the shots. Most long delay is suited for Main2 shot at high engine speed of 3,600 RPM. Instead of 183.96° it becomes 196.09°. That is why for multiple injection control it will be necessary to make start of the injection events in advance to the phases that desired from the point of combustion control. To decrease phasing delay it is also possible to increase the CRIS pressure level. That would results in increased sonic pressure wave propagation, since shortening a time to recover a pressure loss from previous Pre-Main and Main1 shots.
2. In general, actual phasing deviations are increasing with gradually increased engine speed. From the second (absolute time) and fourth (cam angular phase) plots all deviation data are clearly separated for the engine speed of 1,200 (red squares) to 2,400 (blue triangles) to 3,600 (brawn cycles) RPM, respectively.
3. Almost all shots are characterized by deviation of 14 μs, only at high engine speed the Main 1, After-M and Post shots have deviation of 29, 25 and 29 μs. In terms of cam degree, almost all deviations are laid within 0.2° and maximum high engine speed phase fluctuation is about 0.3°. These data prove the high stability in the phasing of injection shots within the injection cycle.

Critical Dwell Intervals

The most critical control of dwell intervals between multiple injection events (shots) is dealt with dwells between Pre-Main and Main1 (dwell-1), Main1 and Main2 (dwell-2). The are two physical phenomena that limit shortest dynamic dwell interval. The first is the time response constant of the injector solenoid. To get injection started, the injector solenoid needs a time $t_{response}$=L/R determined by inductance and resistance of the coil, i.e., its design characteristics.

For the Bosch CRIS injectors used in present study, this time is varied from 146 to 191 μs.

The second dwell shortest limit relates to a pressure recovery time needed after previous injection event and associated with double length of the common rail and sound speed (pressure wave propagation) $t_{pressure}$=2L/α. As discussed before, based on visualization measurements, this time is about 400 μs. That is why the total transient dwell time $t_{dwell} \geqq t_{response}+t_{pressure}$ is about 550 μs.

Figure 45:
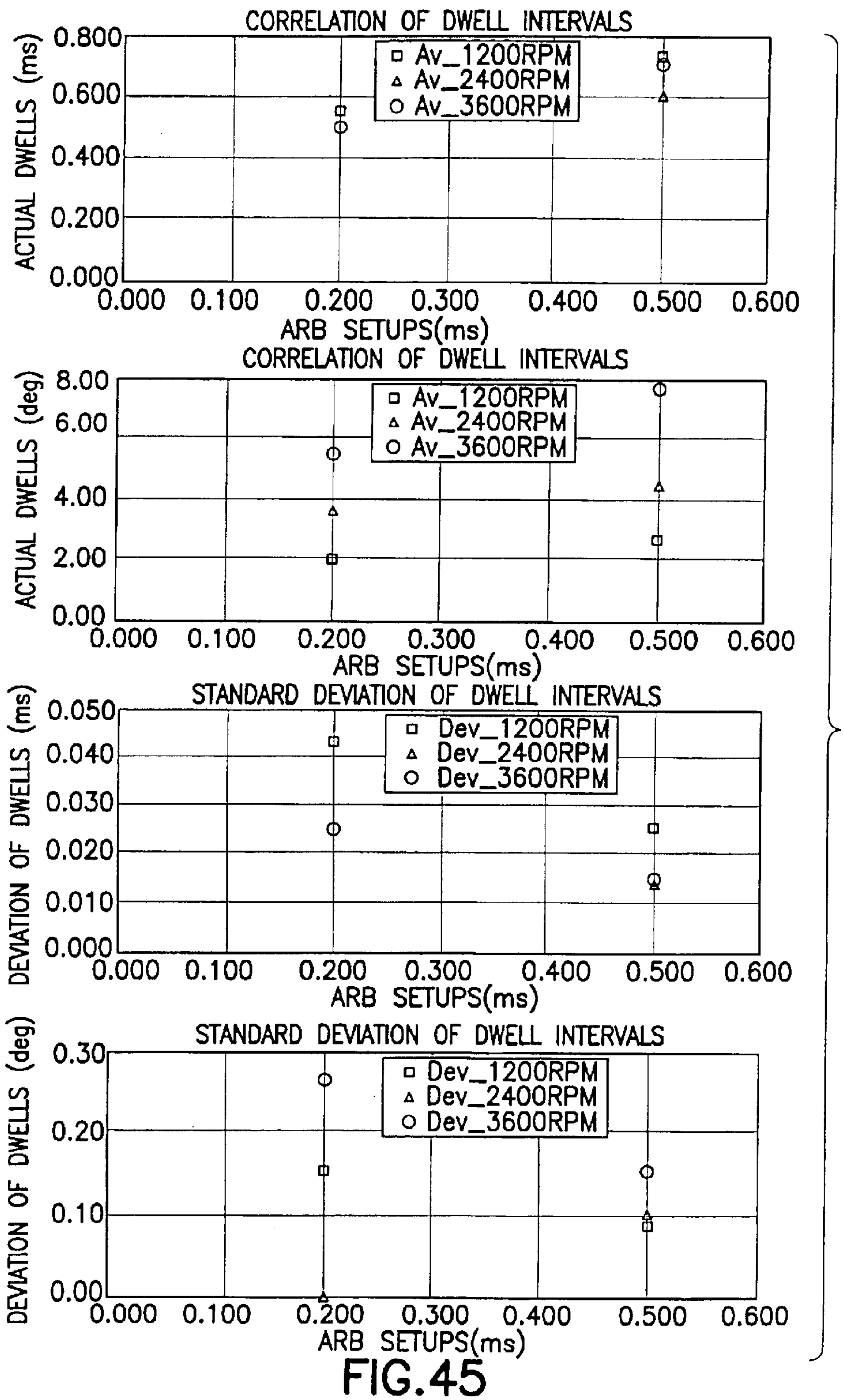

As example to such explanation, the processed data are reflected in FIG. 45. During the measurements, the dwell-1 and dwell-2 were setup by using ARB generator at 200 and 500 μs. The actual multi-injection dynamic dwells were measured by the high-speed camera with resolution of 24.69 μs. As shown, the dwell-1 is varied from 494 to 543 μs at different engine speed with standard deviation between ZERO and 43 μs while dwell-2 is oscillated between 601 and 716 μs with deviation of 14 to 25 μs.

On two diagrams in the bottom part of FIG. 45, one can see that there is clear gradual separation of measured data depending on engine speed. The faster engine speed, the longer cam interval is needed for both dwell-1 and dwell-2. The longer absolute dwell time, the longer camshaft rotation will occur. In terms of camshaft degrees, the standard deviation is lower than 0.3° at the high engine speed of 3,600 RPM.

To reduce pressure recovery time $t_{pressure}$, one needs either to fabricate a new multi-sectional common rail with shorten length of each chamber connected individually to each injector (in-line common rail—inexpensive solution) or drastically increase of the pressure level, which ultimately results in increased density and since that the sound speed (high pressure pump—expensive solution).

Conclusions and Final Remarks Regarding the Performance Evaluation of a Multi-Burst Rapidly Operating Secondary Actuator According to an Embodiment of the Present Invention In this study a ROSA-based diesel multiple injection test cell was constructed as a broad bench model that generated up to 6 shots with empirically proven high stability. This stable operation was evaluated over a wide range of the engine speeds varied from 1,200 to 3,600 RPM.

Up to six shots were produced with the shortest dwell setup between Pre-Main and Main1 of 200 μs that was almost equal to the time response constant of the CRIS injector solenoid. Moreover, the ROSA-based control system permits to generate more than 6 shots within injection cycle due to flexible setup of the current peaks released in ultra-shot time fraction.

On the basis of high-speed visualization of the diesel multiple injection spray dynamics, the cycle-to-cycle timing variability, the stability in the shots duration is detected to be within 40 μs in absolute timing or 0.4° in cam angle. The standard deviation of multi-shot phasing is not longer than 30 μs or 0.3°. The stability in cyclic variation of the shortest dwell intervals is also proven to be within 40 μs or 0.4° over entire range of the engine speed. Such high stability both in the timing of injection shots duration and dwell intervals and the phasing of injection events within sequential injection cycles is not currently demonstrated by using any other multiple injection techniques. A number of general technical conclusions and remarks came out from this study:

1. A third type of ROSA was constructed and applied to controlling of highly stable diesel multiple injection process. It was applied onto existing diesel injection system without any redesign of the original CRIS and injector unit. The ratio of the injector inductance to its resistance was very low; lower than for other type of the hydraulically/electronically controlled diesel injectors, the air intake valve and the gasoline injectors. That drafts the first principal conclusion that ROSA technique is applicable to numerous other devices where either rapidness (diesel multiple injection) or high cycle-to-cycle stability (gasoline injectors) or controllable almost zero sealing velocity (variable intake valves) are critical factors for the driving control.
2. The performed timing limits are not associated with ROSA itself, but rather with a complexity of the high-pressure wave dynamics and multi-frequency hydraulics. During multiple injections with different dwell intervals between injection events a series of harmonics is presented in the common rail and injector oscillatory flows.

The higher frequency of oscillation, the shorter length of pressure wave propagation occurs into pressure system. That necessitates a possible solution for decreasing delay by subdividing a high-pressure chamber, for instance common rail, into a series of short sections.

3. The ROSA technique generates multiple injections with the stability of 40–50 μs, which is detectable at the high-speed of visualization at 40,500 fps. Even at the speed of 18,000 and 27,000 fps, "instability" was not detectable. This level of stability is much higher that needed for injection and combustion control in automobile industry. For commercial implementation of ROSA, an electronic unit may be installed on the vehicle board to work in communication with its ECU. The code, obtained after tuning ROSA onto specified engine, may be either written into a remote chip (processor) or directly into OEM's ECU chip. Depending on the cost of the technology and engine type, the main advantage of ROSA is very stable phasing, dwelling and duration of multiple injection shots proved from cycle-to-cycle analysis.

II. Quantification of Instantaneous Diesel Flow Rates in Flow Generated by a Stable and Controllable Multiple Injection System

Introduction

The following now refers to a multiple injection technique according to an embodiment of the present invention that been applied to a common rail injection system (CRIS). This technique is based on a rapidly operating electromagnetic secondary actuator (ROSA) that generates transient current to control primary solenoid of the diesel injector with highly repeatable stability. Many advanced types of multiple injectors are designed by introducing a piezoelectric actuator. A control and test system was constructed to evaluate the ROSA multiple injection properties, particularly the instantaneous flow rates. The system has produced up to six shots per cycle under injection pressures of 120 to 180 MPa at repetition frequency from 10 to 30 Hz. An LDA-based system was applied to obtain centerline velocity into fuel feed pipe flow. The high-pressure flow passed through a specially fabricated transparent intersection. No artificially seeded particles were introduced into the flow. The data rate was high enough in order to accurately resolve cyclic-to-cyclic variation of injection shots. For each injection setup more than 1000 cycles were measured, sorted and processed to obtain angular resolved values of the flow rate, pressure gradient and integrated mass related to each individual injection event. The mass distribution per each shot can be accurately controlled by the ROSA system by means of the injection pressure, frequency and dwell/duration timing of the injection events. Applied instantaneous flow rate technique can be widely introduced for calibration and test of various high-pressure diesel multiple injection systems.

Volumetric or mass flow rate measurements are among the most important measurements applied into many industries and engineering control systems. Particularly, in the field of fuel injection systems (FIS) employed to internal combustion engines, precise instantaneous fuel/air flow rate measurements provide control of equivalence ratio that determines following after combustion process. Variety of measurement techniques and apparatuses are used to obtain such information. For instance, a Bosch type fuel flow rate indicator, based on pressure wave propagation forward and back to a gauge sensor, is widely used for quantification of fuel amount generated by high-pressure gasoline and diesel FIS. Fewer studies are related to other types of fuel flow rate sensors, for example, based on a miniaturized hot wire anemometer, i.e., two thin film sensors to measure bi-directional flow, that was installed into the body of common rail injection nozzle. Now, the flow rate measurements become more valuable since introduction of various diesel multiple injection systems and technologies. The inventor has developed a unique method according to an embodiment of the present invention based on a laser Doppler anemometer (LDA) and applied it to a low-pressure (6 bar or ~100 psi) gasoline FIS, a gasoline direct injection (DI) injection system which pressure was varied from 50 to 70 bar (~1,000 psi) using only a laminar flow solution due to a low oscillatory Reynolds number.

The full solution including a part for turbulent transient injection flow has been described with regard to higher injection pressures up to 2000 bar (~30,000 psi) and more that directly relates to diesel FIS. As it will be shown later, the full scope solution is also needed to measure complex flow dynamics in DI-gasoline injection systems, for instance, equipped with swirl dual switch injector where ultra-fast spray dynamics characterizes by a superposition of jet and umbrella type substructures.

There are two main objectives of this study. The first objective relates to instrumentation of an LDA flow rate meter (LDA FRM) and its application for various FISs such as a 4 bar gasoline, a 100 bar servo-jet and a 1800 bar diesel. It will be shown that in gasoline application one needs to seed the fuel flow due to lack of oscillatory pressure level needed to generate naturally seeded scattering particles in the flow. For higher pressure, the system works without a need to seed the fuel flow. This phenomenon was firstly proved in normal-heptane FIS and now used in diesel#2. The second object is continuation of the ROSA-controlled multiple injection system evaluation, which discussion was started above. Briefly, ROSA is a system that can be applied on any existing diesel injector equipped with a solenoid type actuator that controls injection active phase such as common rail (CR), electronic unit injector (EUI) or hydraulic electronic unit injector (HEUI). The same as in previous study, ROSA was employed to a CR based injection system (CRIS) and generated up to six injection events (shots) per each cycle. Integrated ROSA-CRIS system has demonstrated high stability and repeatability in multiple injection patterns. Now, to quantify the fuel amount injected per each individual injection event—active injection and passive injection, LDA FRM was newly constructed and applied to measure both cyclically averaged and time arrival time series to obtain the flow rate data.

Details of the quantification are as described below:

Experimental Techniques

Flow Rate Measurement Method

Figure 46:
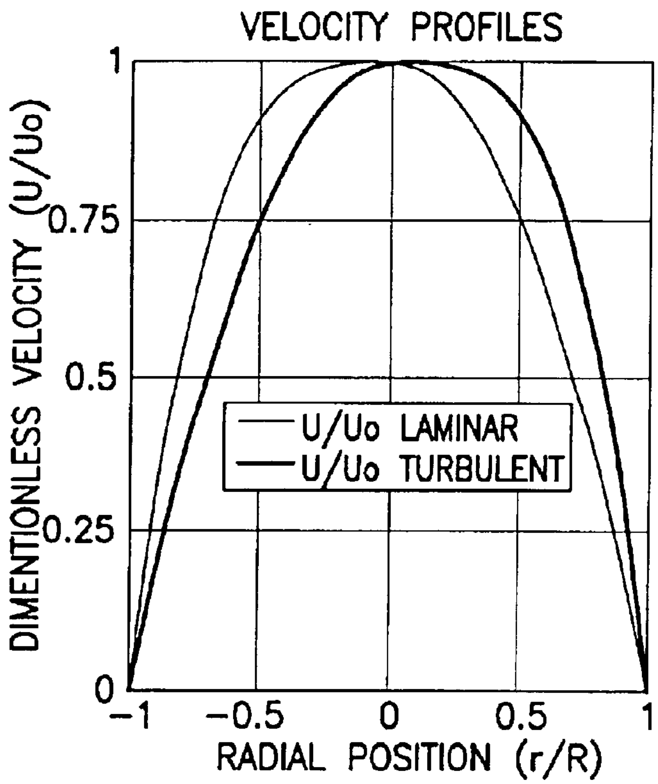

Initially, the method for measurement of instantaneous volumetric flow rate was developed for a laminar fast oscillating pipe flows. The analytical solution is based on three equations written with respect to a non-stationary flow from which three instantaneous values—velocity, pressure gradient and volumetric flow rate can be derived. The pressure gradient is superposed by a Fourier expansion to fit any arbitrary periodic flow:

$$\frac{\partial P}{\partial z} = -\rho\left[p_0 + \sum_{n=1}^{\infty}\left(p_n e^{in\omega t} + C.C.\right)\right] \quad (1),$$

where conjugated C.C. represent complex arguments of a given value. Taking into account linearity of the Navier-Stokes momentum equation on the pressure gradient term and using a superposition for each induced harmonics, the exact solution for velocity field can be found as $$U(r, t) = \frac{R^2 p_0}{4\nu}\left[1 - \left(\frac{r}{R}\right)^2\right] + \sum_{n=1}^{\infty}\left\{\frac{p_n}{n\omega} i e^{in\omega t}\left[\frac{J_0\left(i^{\frac{3}{2}} Ta_n \frac{r}{R}\right)}{J_0\left(i^{\frac{3}{2}} Ta_n\right)} - 1\right] + C.C.\right\} \quad (2),$$

where Taylor number $T\alpha_n = R\sqrt{\omega n/\nu}$ defines partial velocity profile that responds to a particular oscillation "n", R is inner pipe radius and $\nu$ is kinematic viscosity. Normalized ratio of dynamic and viscous forces results in the viscous time constant $T_\mu = R^2/4\nu$, being in present experiments a few hundreds of ms. In other words, if harmonic period $T_n = 2\pi/\omega n$ on longer than $T_\mu$, the corresponding velocity profile will be fully developed as shown in FIG. 46, i.e., a parabolic one in laminar flow. Otherwise, it will be not fully developed and built up as a flat-flow with a strong shear stress at the pipe wall. An integration of velocity over a circular cross section yields the volumetric flow rate:

$$\dot{V}(t) = \frac{\pi R^2}{2}\left(\frac{R^2 p_0}{4\nu} + \sum_{n=1}^{\infty}\left\{\frac{p_n}{n\omega} i e^{in\omega t}\left[\frac{4 i^{\frac{1}{2}} J_1\left(i^{\frac{3}{2}} Ta_n\right)}{Ta_n J_0\left(i^{\frac{3}{2}} Ta_n\right)} - 2\right] + C.C.\right\}\right) \quad (3).$$

Now, for reconstruction of equations (1), (2) and (3) one needs to deduce harmonics $\langle p_0 \ldots n \rangle$ from a time series either of velocity or pressure gradient. In dependence on measurement point into pipe flow and temporal resolution essential to detect pipe flow transitions, different measurement techniques can be applied. Present technique is based on a centerline time-dependent velocity deduced from equation (2):

$$U(r \equiv 0, t) = \frac{R^2 p_0}{4\nu} + \sum_{n=1}^{\infty}\left\{\frac{p_n}{n\omega} i e^{in\omega t}\left[\frac{1}{J_0\left(i^{\frac{3}{2}} Ta_n\right)} - 1\right] + C.C.\right\} \quad (4).$$

The velocity time series can be accurately obtained from LDA measurements that set up to a number of bins $N_{exp}$ within the injection cycle and transformed into Fourier expansion $$U(r \equiv 0, t) = \frac{c_0}{2} + \sum_{n=1}^{N\exp} (c_n e^{in\omega t} + C.C.) \tag{5.}$$

That permits to compute unknown values of $$p_0 = \frac{2c_0 v}{R^2} p_n = \frac{c_n in\omega}{1 - \frac{1}{J_0(i^{3/2} Ta_n)}} \tag{6.}$$

Capillary injection pipe flow includes short-time fractions when the injector opens and closes. Fast transient regime occurs at these moments and to reconstruct the transient flow dynamics a high temporal resolution is required. LDA-based flow rate metering technique meets this requirement. Basic limit of the method is dealt with the oscillation Reynolds number $Re_\delta \leqq 700$ based on the Stokes layer thickness $\delta = \sqrt{2\nu/\omega}$. The injection systems related to gasoline (3–6 bar) and DI gasoline (50–70 bar) engines can be satisfactory measured using this laminar transient pipe flow model.

In order to obtain accurate flow rate measurements in diesel FIS, more comprehensive solution of the Navier-Stokes equations for turbulent flow in a circular pipeline is required. The derivation of the turbulent flow rate solution has been fully described. There, the continuity, z- and r-momentum, conservation equations, governing a 2D time-dependent, compressible, axially symmetric, elliptic, turbulent pipe flow with the only force due to pressure, are resolved with respect to Reynolds decomposition parts, the mean and fluctuation (pulsation) parts, of the axial $\tilde{u} = U + u' = U_{st} + U_{osc} + \nu'$ and radial $\nu = V + \nu' = V_{st} + V_{asc} + \nu'$ velocity components, which are included to be measured by LDA system with required temporal resolution, and diffusion $\Gamma_\phi$-function potential $\phi = \Phi + \phi'$. The present technique is related to the following four timing variables:

- An injection cycle period T~10 ms.
- A total injection duration $\tau$~1 ms.
- LDA cyclic phenomena measurement time span $\Delta t = T/k$ where $k \sim 10^4$, controlled by an electronic bin number generator, so $\Delta t \sim 1\ \mu s$.
- A u'v' autocorrelation function delay $\Delta\tau$~1–100 $\mu$s, i.e., it is over the measurement time span $\Delta t$.

For a short dynamic period $\approx \Delta t$, the integration of the given variable $\alpha$ matches to its fluctuation part of the total value $\alpha(t)$. Wise versa, integration within a large time interval $\geqq T$ results in the mean part. The main criterion to determine clock-watch resolution is related to n-harmonic Stokes layer thickness $\delta = \sqrt{2\nu/n\omega} = \sqrt{\nu\Delta t/n\pi} \leqq \Lambda$, where $\nu$ is diesel kinematic viscosity (~2–4.5 mm$^2$/s) and $\Lambda$ is an optic fringe span (~1–4 $\mu$m) in the LDA beam intersection point.

With respect to pressure gradient, three parts are also superposed, so that:

$$\frac{\partial P}{\partial z} = -\rho(P)\left[p_{0z} + \sum_{n=1}^{\infty} (\{p_{nz} + p'_{nz}\} e^{in\omega t} + C.C.)\right] \tag{7.}$$

where $p_{oz}$ is the stationary portion, $p_{nz}$ is the oscillating portion and $p'_{nz}$ is the fluctuation portion. In the full turbulent pipe flow transport equations, there are diffusion terms of the first, second, third and higher orders. However, for the high-pressure fuel injection pipe flow, the radial partial derivatives are as small as two or three orders of magnitude vs. the axial partial derivatives.

Therefore, the first order of the pressure diffusion terms pu' and pv' has to be considered for the integration procedures. In other words, in order to obtain instantaneous volumetric flow rate over a pipe cross section in the direction of the pipe axis, it is necessary to integrate the $\tilde{u}$ velocity component and turbulent velocity correlation $\sqrt{\overline{u'v'}}$ projected on the same pipe axis as follows:

$$\begin{aligned}\dot{V}(t) &= 2\pi \int_D^R \left(\tilde{u} + \sqrt{\overline{u'v'}}\right) r\,dr \\ &= 2\pi \int_D^R \left[\frac{R^2 p_{oz}}{4v}\left(1 - \frac{r^2}{R^t}\right) + \sum_{n+1}^{n} \left(\frac{\rho_{oz} - \frac{p'_{oz}}{2} - \frac{\sqrt{p'_{oz} p'_{nz}}}{2}}{n\omega} i e^{in\omega t}\left\{\frac{J_0\left(i^{\frac{3}{2}} Ta_n \frac{r}{R}\right)}{J_0\left(i^{\frac{3}{2}} Ta_n\right)} - 1\right\}\right) C.C.\right] r\,dr \\ &= \frac{\pi R^2}{2}\left[\frac{p_t R^1}{4v} + \sum_{n=1}^{\infty}\left(\frac{p_{oz} - \left\langle\frac{p'_{oz}}{2} + \frac{\sqrt{p'_{oz} p'_{oz}}}{2}\right\rangle}{n\omega} i e^{in\omega t}\left\{\frac{4_i^{\frac{3}{2}} J_0\left(i^{\frac{3}{2}} Ta_n\right)}{Ta_n J_0\left(i^{\frac{3}{2}} Ta_n\right)} - 2\right\}\right) C.C.\right]\end{aligned} \tag{8.}$$

This flow rate reflects an effective axial velocity composing four terms, i.e., a stationary part associated with $p_{oz}$, an oscillatory part associated with $p_{nz}$, a u-pulsation part associated with $p'_{nz}$, and a uv-pulsation part, associated with $p_{nz} p_{nr}$. Expression for velocity measured on the centerline $r \equiv 0$ of the flow is:

$$\tilde{u}_{of} = \frac{R^2 p_{oz}}{4v} + \sum_{n=1}^{\infty}\left(\frac{p'_{nz} - \left\langle\frac{p'_{nz}}{2} + \frac{\sqrt{p'_{nz} p'_{nz}}}{2}\right\rangle}{n\omega} i e^{in\omega t}\left\{\frac{1}{J_0\left(i^{\frac{3}{2}} Ta_n\right)} - 1\right\}\right) \tag{9.}$$

Accordingly, the experimentally measured centerline velocity time series may be expressed as the Fourier expansion:

$$\begin{aligned}U_{LDA}(t) &= U_{st} + U_{osc}(t) + U_{puls}(t) \\ &= \frac{c_o}{2} + \sum_{n=1}^{N_\delta} c_n(e^{in\omega t}) + \sum_{n=N_\delta+1}^{N_{n\max}} c'_n(e^{in\omega t})\end{aligned} \tag{10}$$

where switching in FFT summation is dependent on the following criteria:

$$n \in [1, N_\delta], \text{ if } \delta_n \sqrt{\frac{2v}{n\omega}} > 10\ \Lambda$$
$$n \in [N_\delta + 1, N_{meas}], \text{ if } \delta_n \sqrt{\frac{2v}{n\omega}} \leq 10\ \Lambda \tag{11.}$$

Comparing equation (9) and (10) gives final expression for the pressure gradient series, which are needed to compute the instantaneous flow rate, expressed by the equation (8):

$$p_0 = 2\frac{c_0 v}{R^2} \tag{12}$$

$$p_{nc} = \frac{c_n nwi}{\left[1 - \frac{1}{J_0\left(i^{\frac{3}{2}} Ta_n\right)}\right]}, n \in [1, N_\delta]$$

$$p'_{nz} + \sqrt{p'_{nz} p'_{nz}} = \frac{2c'_n nwi}{\left[1 - \frac{1}{J_0\left(i^{\frac{3}{2}} Ta_n\right)}\right]}, n \in [N_\delta + 1, N_{meas}]$$

Therefore, two different FORTRAN-based programs according to the present invention were written with respect to laminar and turbulent oscillatory pipe flows. The output of this software permits obtain not only information about instantaneous volumetric or mass flow rates, but also pressure gradient and integrated (accumulated) fuel mass:

$$m_j = \int_0^t \dot{V}(t)\,dt = \frac{T}{N_{meas} - 1} \sum_{n=1}^{n_t} \rho_n \dot{V}_n n \tag{13}$$

which can be compared with a mass balance measurement to estimation accuracy of the LDA measurement (its optical alignment):

$$\delta = \frac{\dot{V}_{LDA}\rho - \dot{m}_{mass\ balance}}{\dot{m}_{mass\ balance}} \tag{14}$$

LDA Flow Rate Stand and Test Flow Rigs

Figure 47:
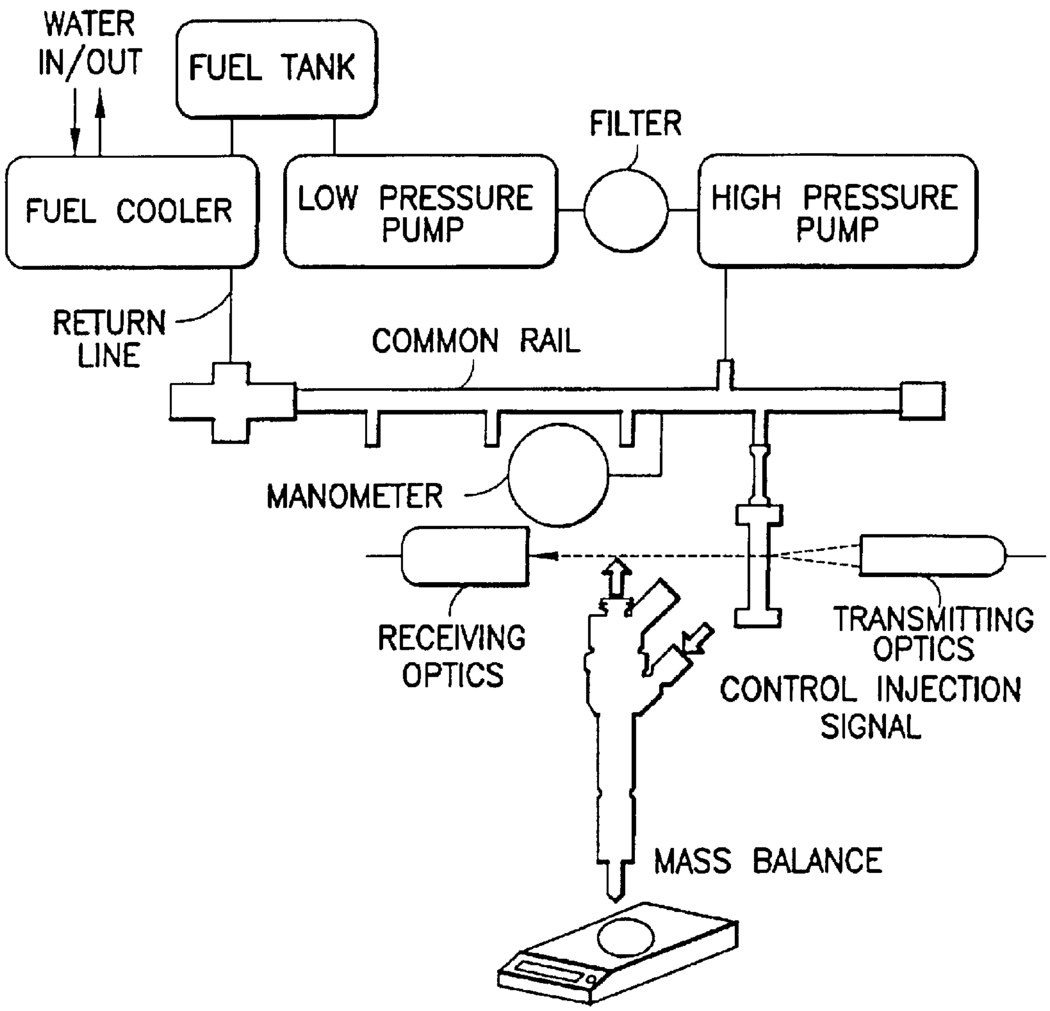

The diesel flow rate test stand is schematically depicted in FIG. 47. It consists from 4 subsystems: (i) a testing fuel injection system (FIS), here specifically based on a BOSCH CRIS type, (ii) an electronic injection driving unit (EDU), here constructed as a ROSA-control system described in detail elsewhere in the present application, (iii) a commercially available laser Doppler anemometer (LDA) and (iv) the present inventor's software that reconstructs LDA output velocity data into instantaneous volumetric/mass flow rates. The high-pressure fuel delivery line is connected to a measurement intersection (MI) mounted between pressure source (pump or CR) and injector. A capillary quartz pipe was installed into MI to have an access for the laser beams and the light scattered into the injection flow.

Figure 48:
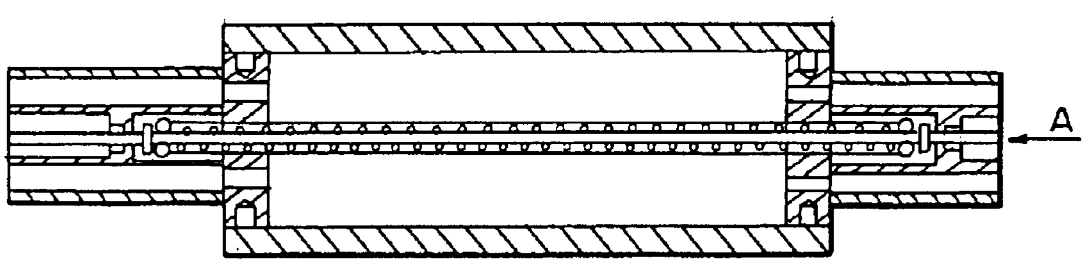
Figure 49:
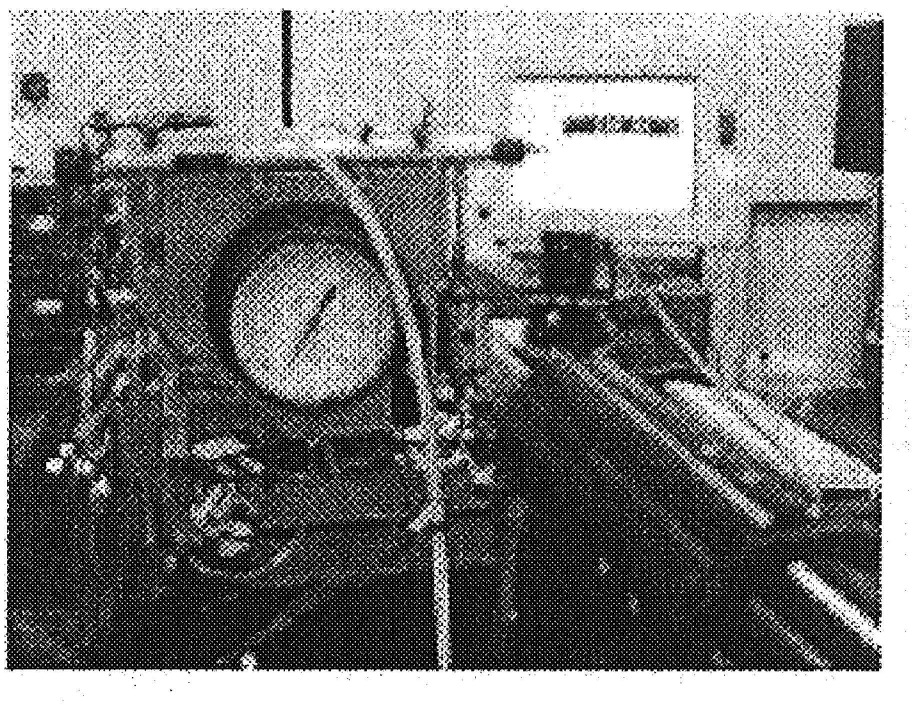

Two different MIs were constructed for present injection tests. The design details to the first one are shown in FIG. 48. This MI-1 worked under injection pressure up to 140 bar (~2,000 psi) and used in the present study for measuring flow rates generated by the gasoline and servo-jet type injectors. In this case the quartz pipe length was 300 mm, the factor of 100 times to its inner diameter of 3 mm that permitted to calibrate stand for both laminar and turbulent flows under transient injection as well as at steady state regimes, i.e., in very wide range of flow rates, very accurately due to fully developed flow profiles. Only two O-ring sets into the MI-1 construction hermetically isolated the quartz pipe. The second intersection MI-2, photo of which is shown in FIG. 49 (vertical steel MI-2 setup seen right to the pressure gauge), was designed for high pressures up to 2000 bar (~30,000 psi). The main part of MI-2 is a quartz pipe with inner diameter of 1.90 mm, outer diameter of 6.06 mm and length of 40.10 mm that was thermally pressed into a metal thick tube with outer diameter of 18.93 mm and length of 43.42 mm, designed and assembled according to the technique described earlier.

Inner diameter of the cold steel tube before its thermal expansion at ~600 C. was 5.95 mm. So, after mounting the quartz piece inside of the heated tube and its slow gradual cooling, the quartz tube was strengthened due to radial strength from outer steel tube. That provided very good withstanding to diesel injection pressures. Afterwards, this pressed-fit unit was assembled into the housing using eight M8 screws and another larger size three well adjusted steel sections: in/outlet parts and supporting middle section with two large holes for penetration true of the laser beam and scattered light. All parts were precisely machined for matching each other in the length and contact disks diameter. MI-2 was used for the test of ROSA-CRIS multiple injection system. To have a fine alignment, the MI was flexibly mounted onto a heavy metal frame with 3D alignment and adjustment mechanics. MI-outlet was further connected to the test injector. For instance, as shown in FIG. 49, the MI-2 housing with two 14 mm windows setup for laser beam penetration was installed between CRIS and injector fuel inlet. MI was installed on the feed line in close vicinity to the injector. Particularly, in this case the total length between LDA measurement point, where two laser beams were intersecting into a vertical plane having the flow axis in, and the needle part of injector was 0.34 m. Taking into account that acoustic speed into highly pressurized fuel liquid is about 2000 m/s, the time delay in velocity series, proportional to the double length, is about 300 μs. This delay was validated during the measurements.

Figure 50:
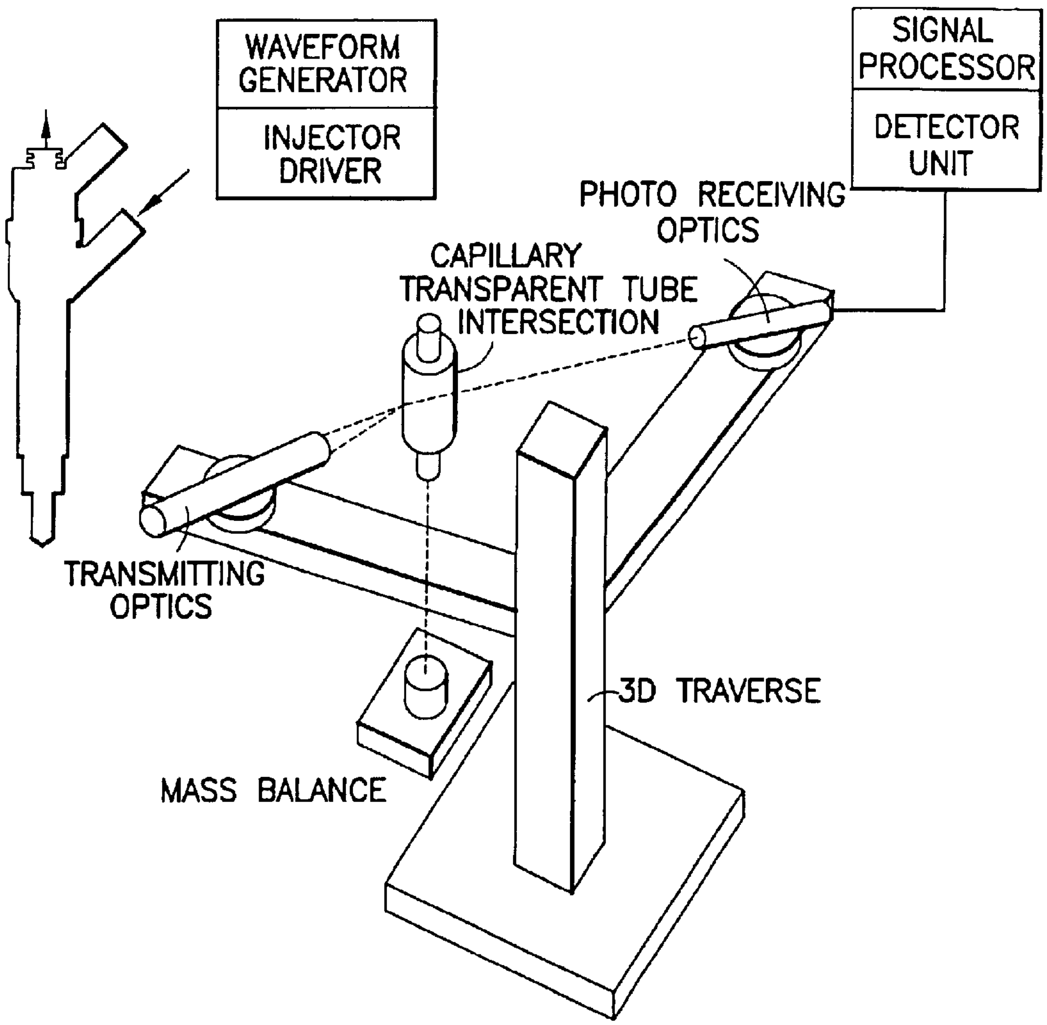

A fully configured LDA system, depicted in FIG. 50, was used to measure centerline velocity into the injection flow. LDA itself composes an ion 120-mW laser, the transmitting and photo-receiving optics, a photo-detector unit, a 2-channel signal processor and a 3D traverse system, on which 310-mm transmitting and 400-mm receiving optics was mounted as illustrated in FIGS. 49 and 50.

The receiving optics was setup off-axis from the transmitting plane. Off-axis angle is always varied upon the fuel and injection pressure. In the test of gasoline injection (law pressure of 3–6 bar), when 5-μm aluminum oxide solid particles were seeded into the flow, any off-axis angle, even backscattering, was reliable to receive an LDA signal with high data rate. While diesel servo-jet diesel injection (medium pressure of 100 bar) was tested, the off-axis angle was set at 22° after a number of alignment attempts. For ROSA-CRIS injection test (up to 2000 bar), it was found that 39° off-axis angle is the optimal for all measurement conditions.

To monitor oscillatory injection flow, a cyclic phenomena type software was applied to sort and process LDA measurement data. To use it, an angular encoded startup signal was synchronized via a time delay generator by the same waveform generator, which controlled the injection duty cycle. The data rate was varied from 0.4 to 18 kHz that was enough to reconstruct multiple injection cycle in all details of the magnitude and timely phased injection events. The LDA system measured velocity series in a reversible flow due to the electro-acoustic modulation (Bragg cells) in the transmition optics. Main parameters used for the measurements were:

1. Optical probe size 77×77×945 μm
2. Fringe spacing 3.15 μm
3. Frequency shift 40 MHz
4. Cyclic length 360°
5. Phase averaging bins 360–3600

Each centerline velocity time series were treated using the inventor's software. This program reconstructs the measurement data into instantaneous series of flow rate, pressure gradient and integrated (or accumulated) fuel mass within injection cycle. In order to determine whether laminar or turbulent flows are occurred during various injection runs, a variety of the flow rigs was studied:

To simulate steady state flow, a water-filled vessel was elevated at different height. Under gravity force a seeded flow was streamed to a gasoline type injector that permitted to align the optical setup using max-velocity and min-rms criterion.

Figure 51:
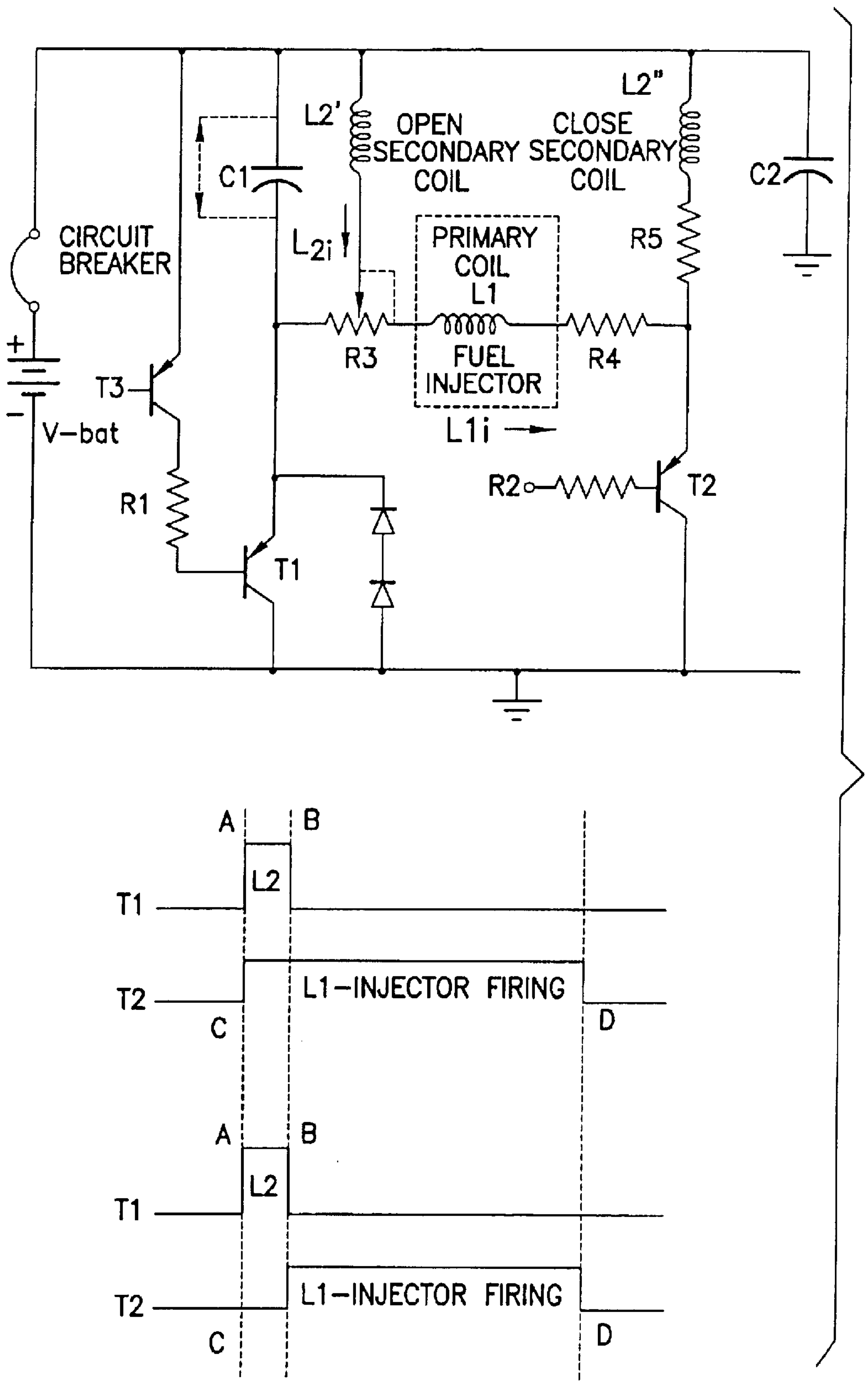
Figure 52:
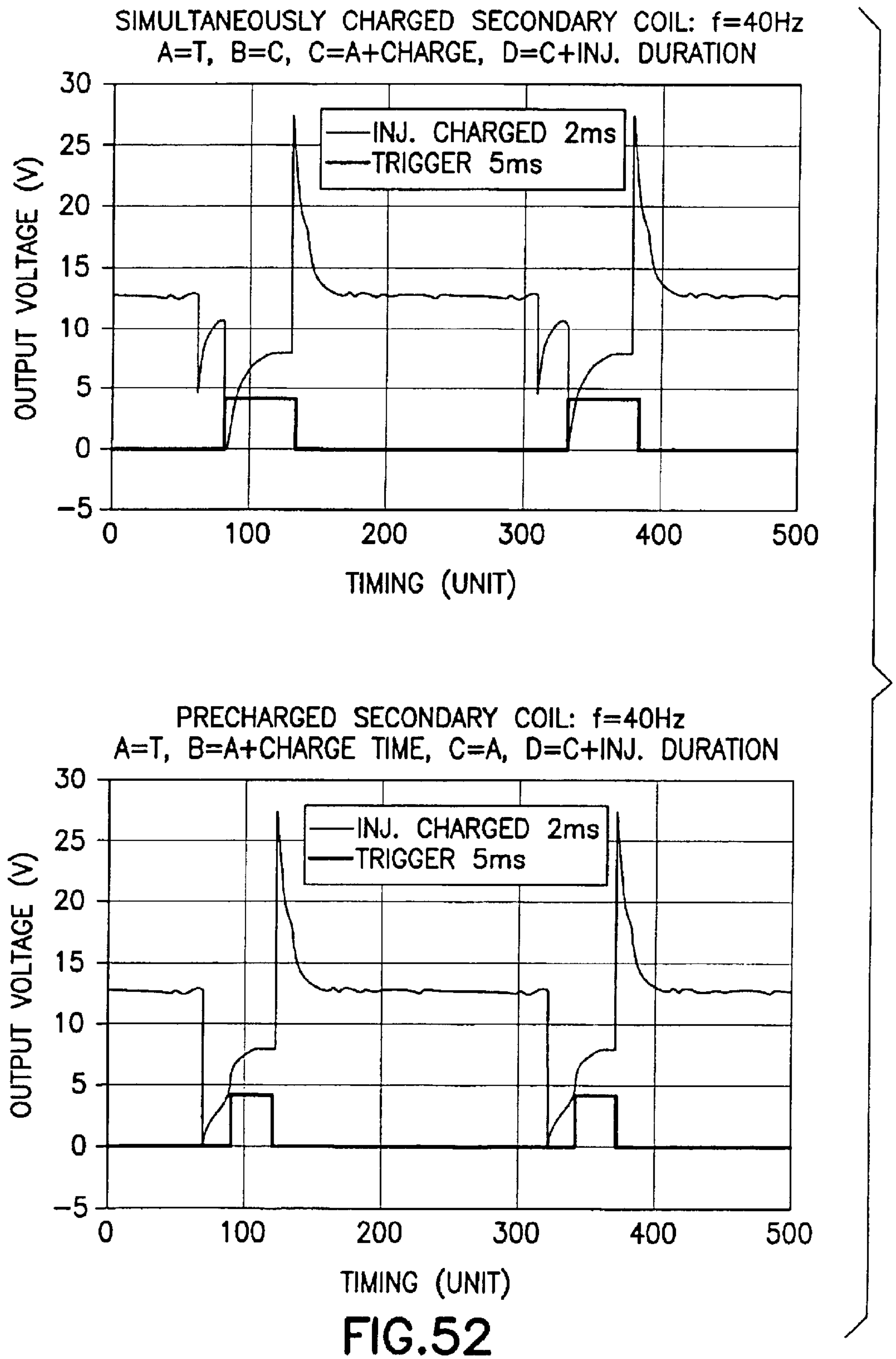

A steady 10-bar pressurized water vessel, from which the fuel rail was connected to a gasoline injector. The measurements were obtained under pressure of 7.3 bar (~1 06 psi) at the injection frequency of 40 Hz. For this particular measurement the ROSA EDU was made as an electronic circuit sketched in FIG. 51. Only one control lag was used to facilitate opening of the injector valve. Two different ROSA secondary coil (SC) charging scenarios were applied as illustrated by FIG. 52. Firstly, ROSA was charged from zero to 2000 microseconds and afterwards the primary solenoid (PS) in the injector was opened. The injection duration was the same for all measurements (15 ms). Secondly, the ROSA coil was charged from zero to 2000 microseconds simultaneously with the injection signal applied to the primary coil. Injection duration was setup at 3 and 5 ms, at each case a number of the instantaneous flow rate time series were measured. A combination of these two techniques results in phase-shifted or tuned charge scenario.

A servo-jet type FIS was generated up to 100-bar pressure into delivering rail and up to 1500-bar pressure in the injector accumulation branch. A stable LDA signal was obtained at the rail pressure over 40 bar. Non-seeded diesel #2 fuel was. For measurements in the ROSA-CRIS multiple injection system, the injector, used in high-speed visualization, was mounted vertically onto the CRIS rail as shown in FIG. 47. Injector nozzle housing with diameter of 18.88 mm, was fixed inside of a metal tube connected in series with a pipe directed into a glass vessel to collect the injected fuel settled on the mass balance.

Calibration Procedure

Figure 53:
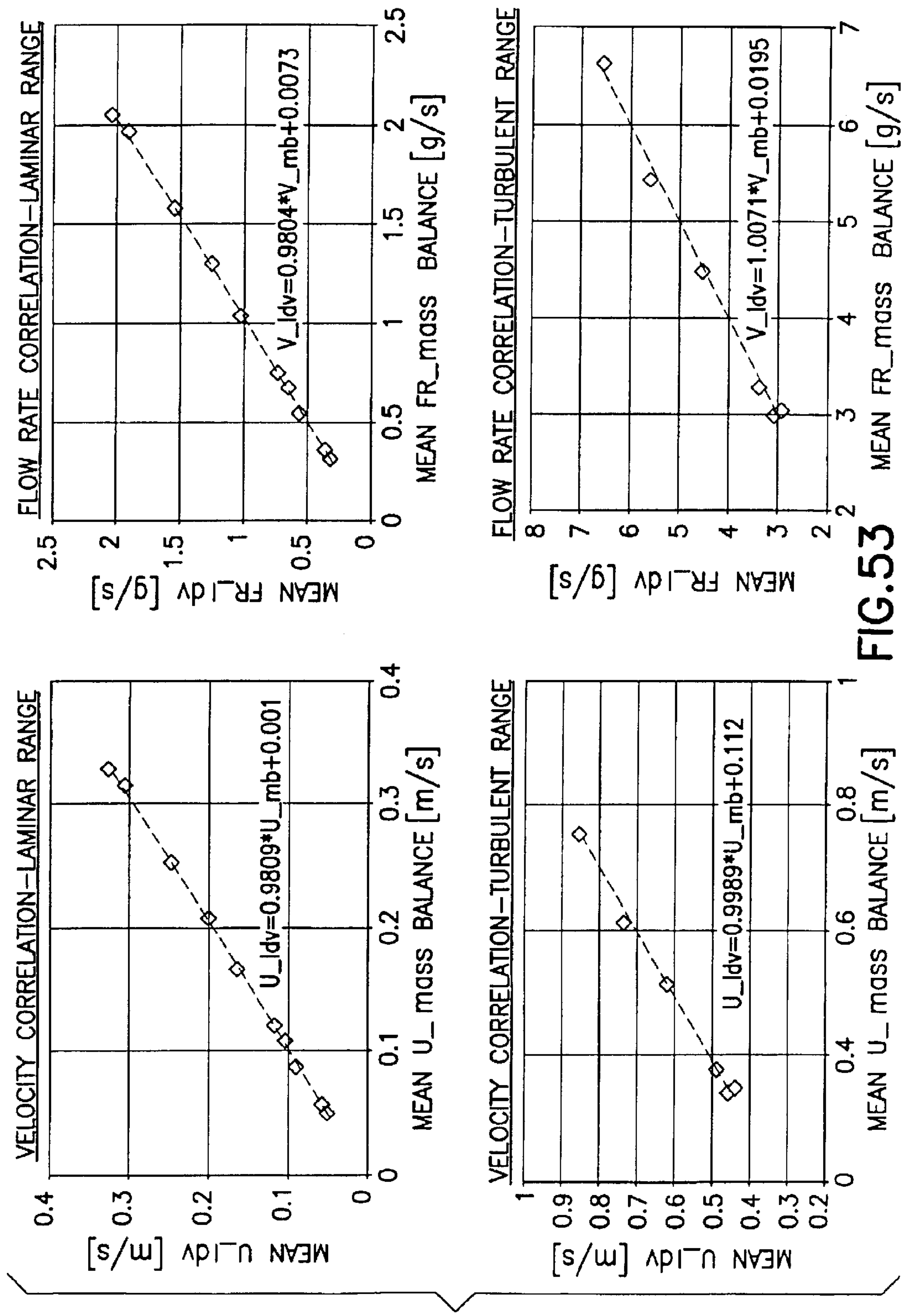
Figure 54:
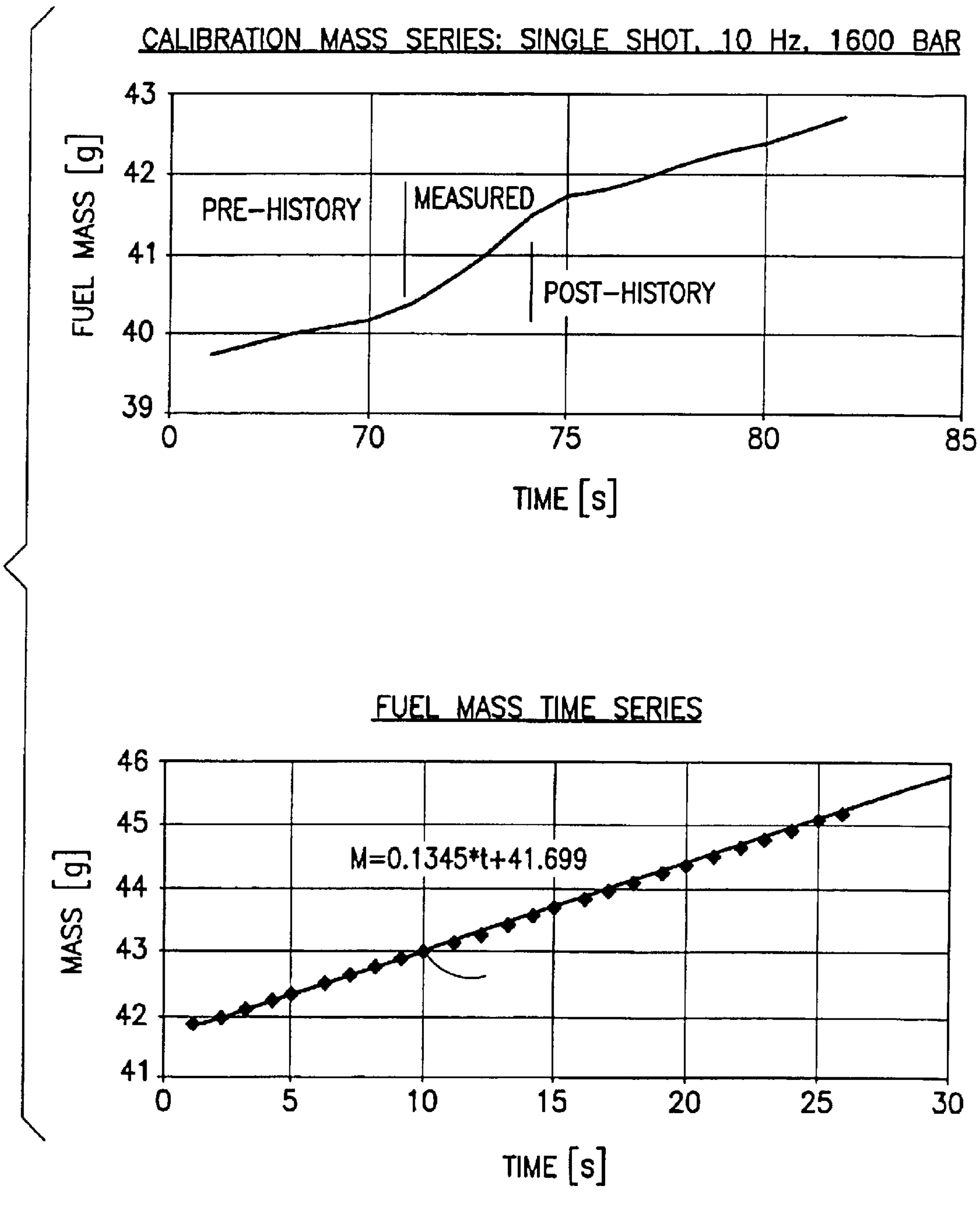

Simultaneously with LDA time series, an automated fuel mass data acquisition was run to obtain mean mass rate measurements accumulated into the vessel. The oscillating flows were measured in both laminar and turbulent areas. The results of comparison of the LDA and mass balance (MB) measurements in terms of mean velocity and mass rates are shown in FIG. 53. The split between laminar to turbulent zones lays at the mean velocity of 33 cm/s or the mean mass rate over 2 g/s. In laminar area the disagreement between LDA and MB is varied from −4 to +2%. In the turbulent zone it is shifted to −2 to 4%. Integrated LDA system and software gives a good agreement, enough for calibration different FIS. The statistic correlation between LDA and MB measurements shown as the trend-lines in the figure indicates accuracy of 0.1% for the mean flow rate in laminar flows and 0.7% for the mean flow rate in turbulent flows. The total injection rates in ROSA-CRIS injection are more than 2 g/s, so only turbulent model is applicable to treat LDA velocity time series. Because different transient stages occurred during fuel injection as shown in FIG. 54, only linear "measured" part of the trace with the highest derivative was used for the final LDA-MB correlation. Data acquisition transient time was varied from a few seconds to a few tens of seconds dependent on the injection repetition rate, so more than a few hundred cycles were averaged during the mass balance measurement.

In order to analyze and couple the fuel flow rates injected per each individual shot such as the Pilot, Pre-main, Main1, Main2, After-Main and Post, the same multiple injection profiles those used before for the high speed diesel spray visualization were applied to the flow rate measurements. For each engine speed the original Bosch-type injection profile with duration of 2 ms was also measured as a referenced fuel mass characterizing conventional CRIS operation.

Figure 55:
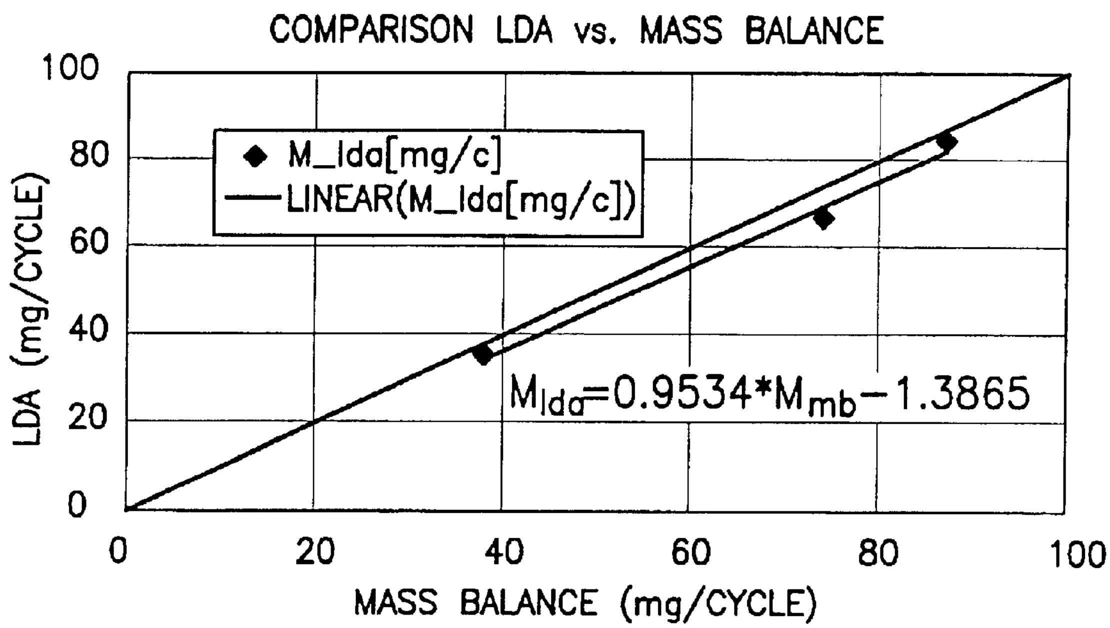

In FIG. 55 the data were measured at 30 Hz repetition rate for the referenced Bosch, ROSA single 600 $\mu$s shot and ROSA 6-shot injection cases. These are among most critical measurements because the high repetition frequency is associated with the high vibration of the fuel delivery line and pressure oscillation frequencies (30–1600 Hz). The disagreement between LDA and MB data is varied only in negative area from −11 to −4%.

In order to evaluate the fuel mass rates injected per each individual shot a mass extraction method was applied using only mass balance (MB) measurements. First, only one Main1 shot was generated by ROSA-CRIS system. The MB-time series was measured and the Main 1 averaged injected mass $m_{main\ 1}$ was obtained. Second, the Pre-Main shot was added and a fuel mass injected per two-shot injection cycles was measured. Since, the Pre-main injected mass was subtracted from current measurements $m_{Pre}=m_{inj}-m_{M1}$. This sequentially mass adding procedure was repeated until 6-shot injection profile was measured and last Post injection event was subtracted. Due to the problem of pressure recovery into CRIS, for the different engine speed the different pressures were generated: 1,600 bar at 1,200 rpm and 1,700 bar at 2,400 and 3,600 rpm. The Bosch type single-shot injection with duration of 1 ms was also measured as a reference.

Results and Discussions

Figure 56:
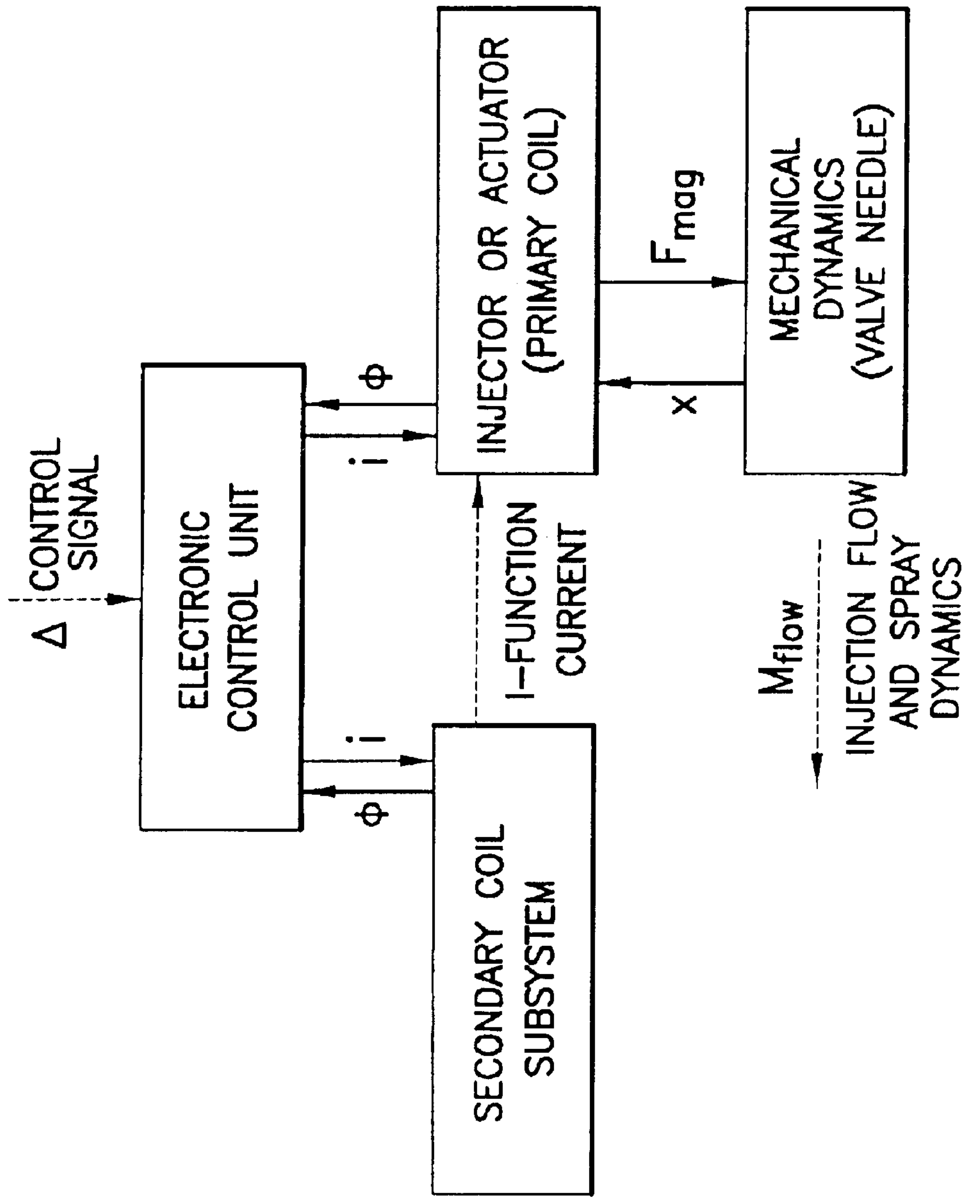

Referring now to verification of injection system rapidness and its stability in timing, there is no guarantee regarding the timing response of the whole injector system as depicted in FIG. 56, even if the electric output signal from ROSA EDU indicates fast response. Direct application of ROSA in automotive field is related to the diesel and direct injection gasoline engines where a stratified charge of the fuel mixed with airflow determines the quality of combustion.

According to the objectives, i.e., the LDA-based flow rate instrumentation and the ROSA-controlled multiple injection, the following results and discussions are separated into three sub-sections. The first two are related to the low- and mid-pressure FIS represented by the gasoline (ROSA-controlled) and servo-jet type injection systems to demonstrate capabilities of the instantaneous flow rate technique. The third is dealt with both objectives.

Gasoline Type Low Pressure Injection

Figure 57:
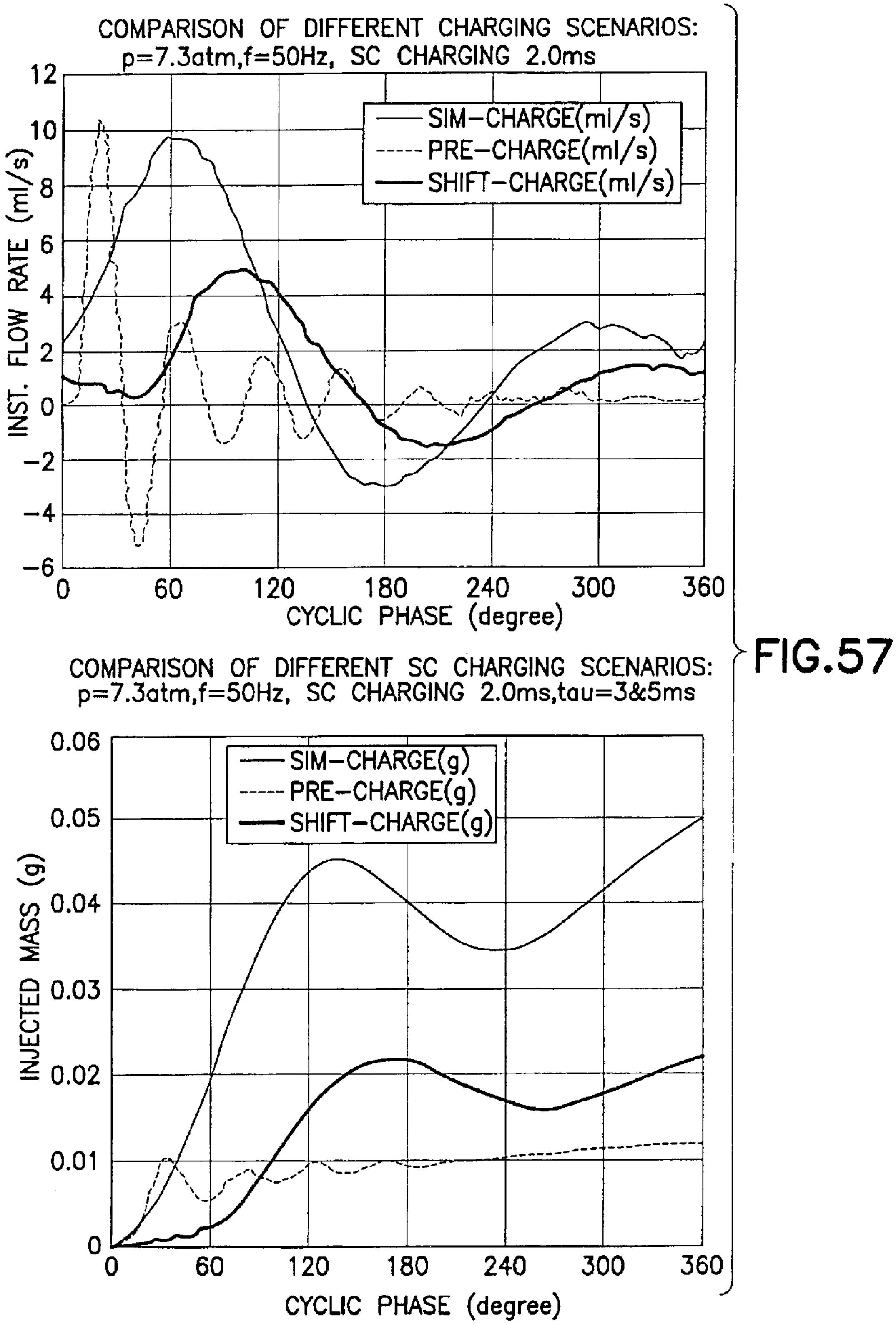

The flow rate series obtained by using three different SC charge techniques reflected in FIG. 52 are depicted in FIG. 57. All the data were measured under the same conditions: injection frequency 50 Hz, injection pressure 7.3 atm and SC charging time 2.0 ms. The right figure shows instantaneous volumetric flow rate series and the left plot depicts integrated (or accumulated) injected fuel mass. The first time series (black one) in both plots relates to simultaneously charging of the primary (injector) and secondary (ROSA) coils. The second line (red one) represents pre-charge scenario. The third curve (blue one) is the case when charging of SC (AC-wave form in FIG. 52) has been started before the injection (CD-wave form in FIG. 52), however, at the moment of 1.4 ms when SC-charging was continued, the injection has been already run. So, the overlapping time was 0.6 ms. As one can see from instantaneous and integral time series, the fastest opening of the valve takes place under shifted (tuned) charge conditions. The slowest opening is associated with the pre-charge. This case also gives lowest level of flow amplitude meaning the lowest speed of the needle at the opening moment. A rapid response without any substantial phase delay is associated with the simultaneous charge of SC and PC. Essentially, the same flow amplitude characterizes both simultaneous charge and shifted charge. For diesel engines, where multiple injection events must be precisely phased and inject a larger amount of fuel, the shifted or "tuned" charge technique is mostly suitable.

Figure 58A:
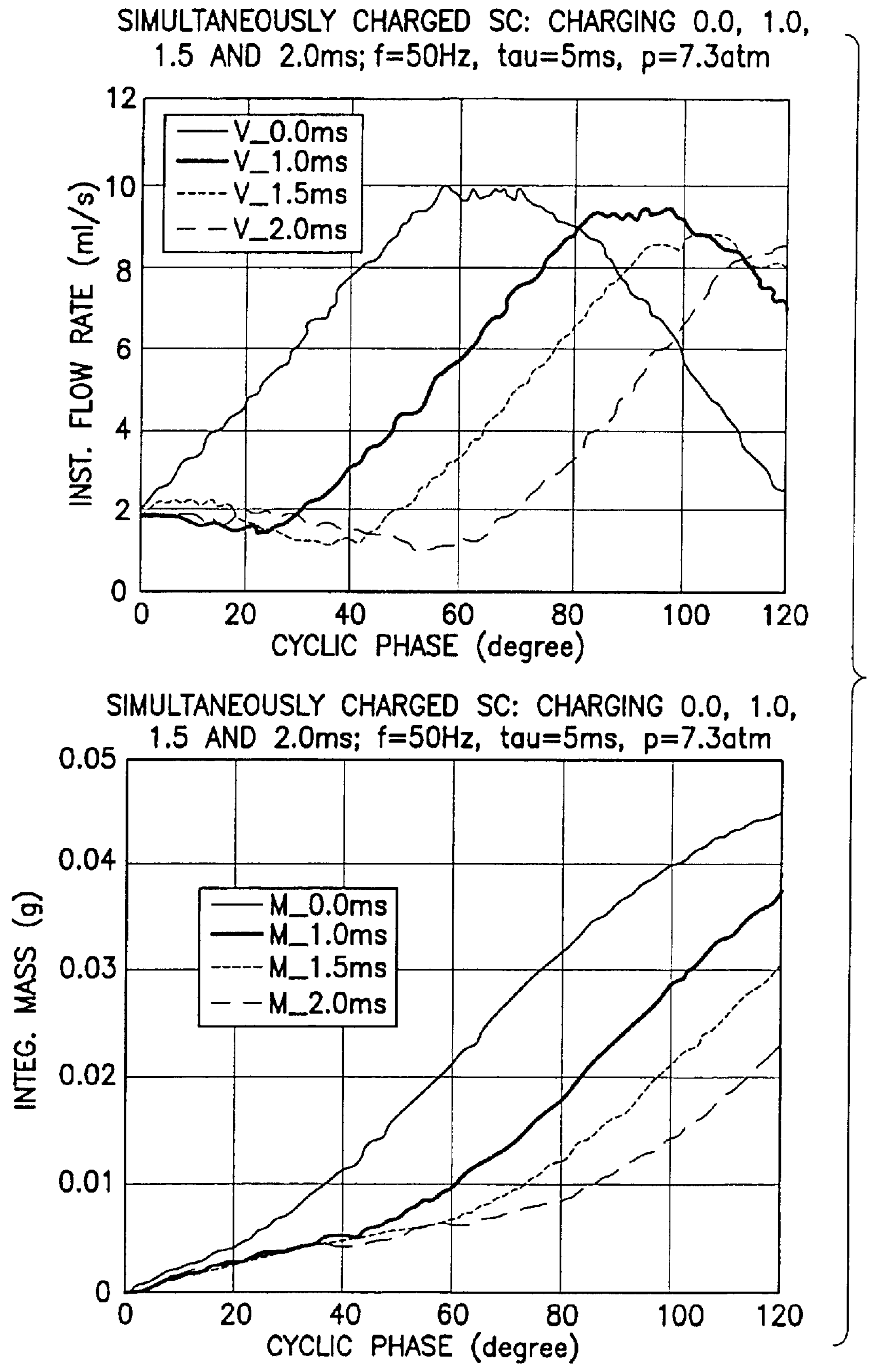
Figure 58B:
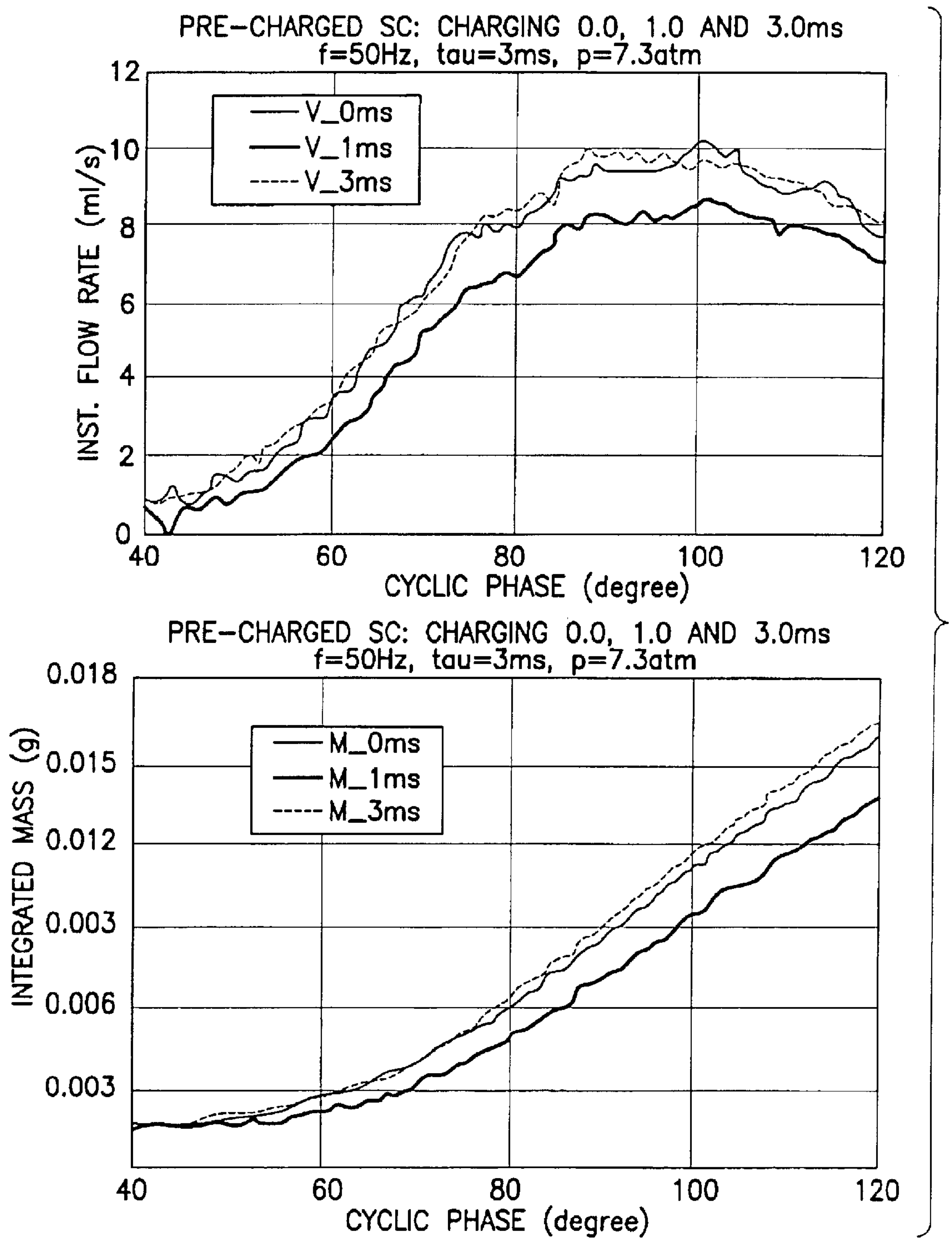
Figure 58C:
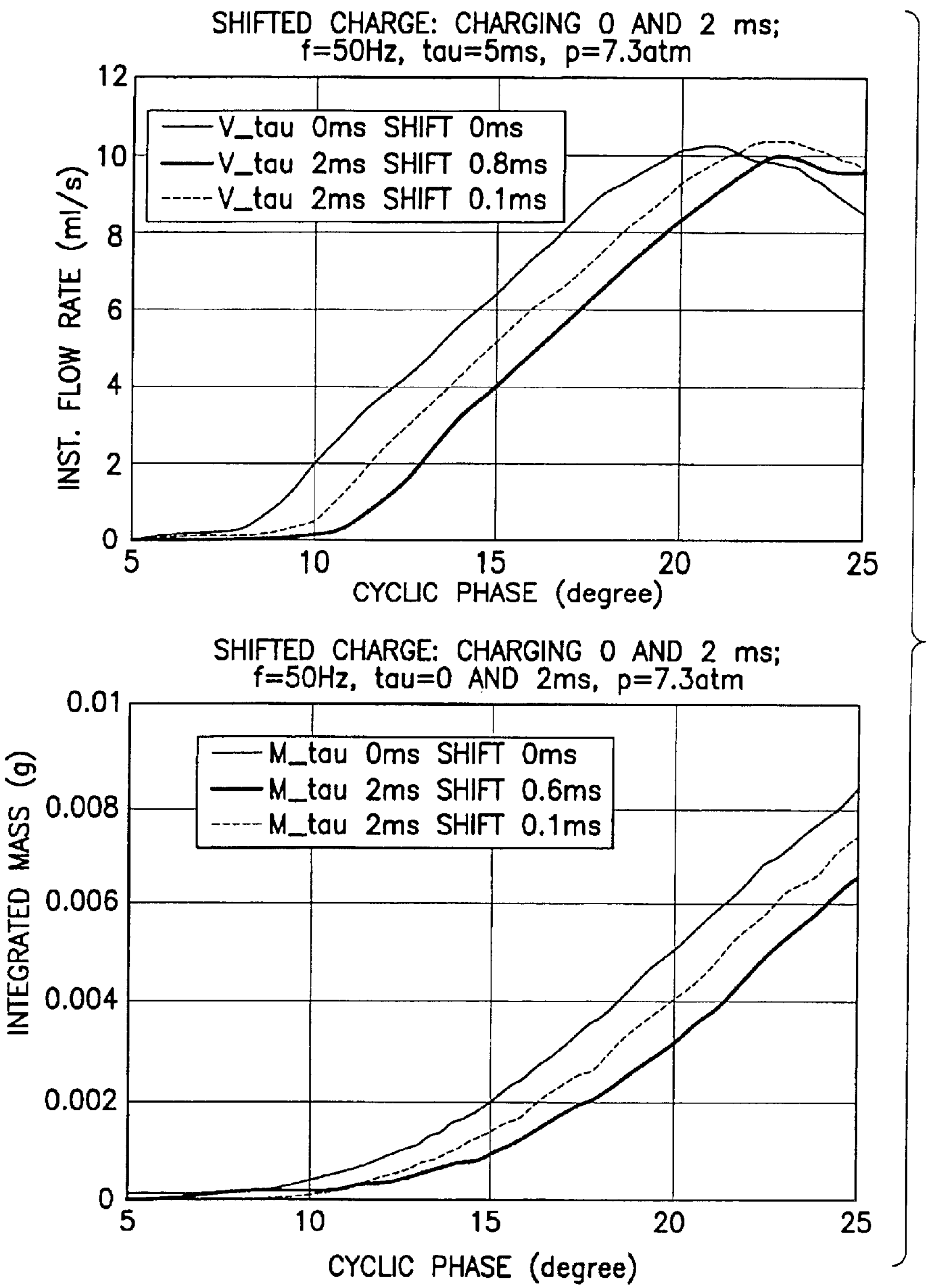

Details with respect to each charging scenario at the beginning phases (opening of the valve and startup of injection) are shown in FIG. 58. There are three plots of instantaneous volumetric flow rates at the top row and three plots of integrated (or accumulated) fuel masses at the bottom row. The first column reflects data obtained while SC was simultaneously charged with PC (injector), i.e. according to FIG. 51, i.e., A-timing was the same to C-timing. The second column is related to measurements when SC was pre-charged before the injector PC (first was AB and afterwards started CD, B=C in FIG. 51). The third column shows results when SC charging was shifted with respect to the injector PC operation, i.e., AB and CD intervals were overlapped. Under simultaneous charge, the longer the SC-charging time, the faster opening of the valve is observed in instantaneous series as the shift between different series towards the initial zero phase. The integrated mass series indicate increased speed of the valve that obviously seen through the slope g/deg. In pre-charge case, increasing the charge time results in the same phase of the injection startup, but the amplitudes in the instantaneous series and the slopes in the integral mass series are gradually increasing that means increased injector valve speed. Both effects, the increased amplitude/slopes and rapidness occur under shifted charge shown in the third column of FIG. 58.

Mid Pressure Injection (Servo-Jet/bkm)

Figure 59:
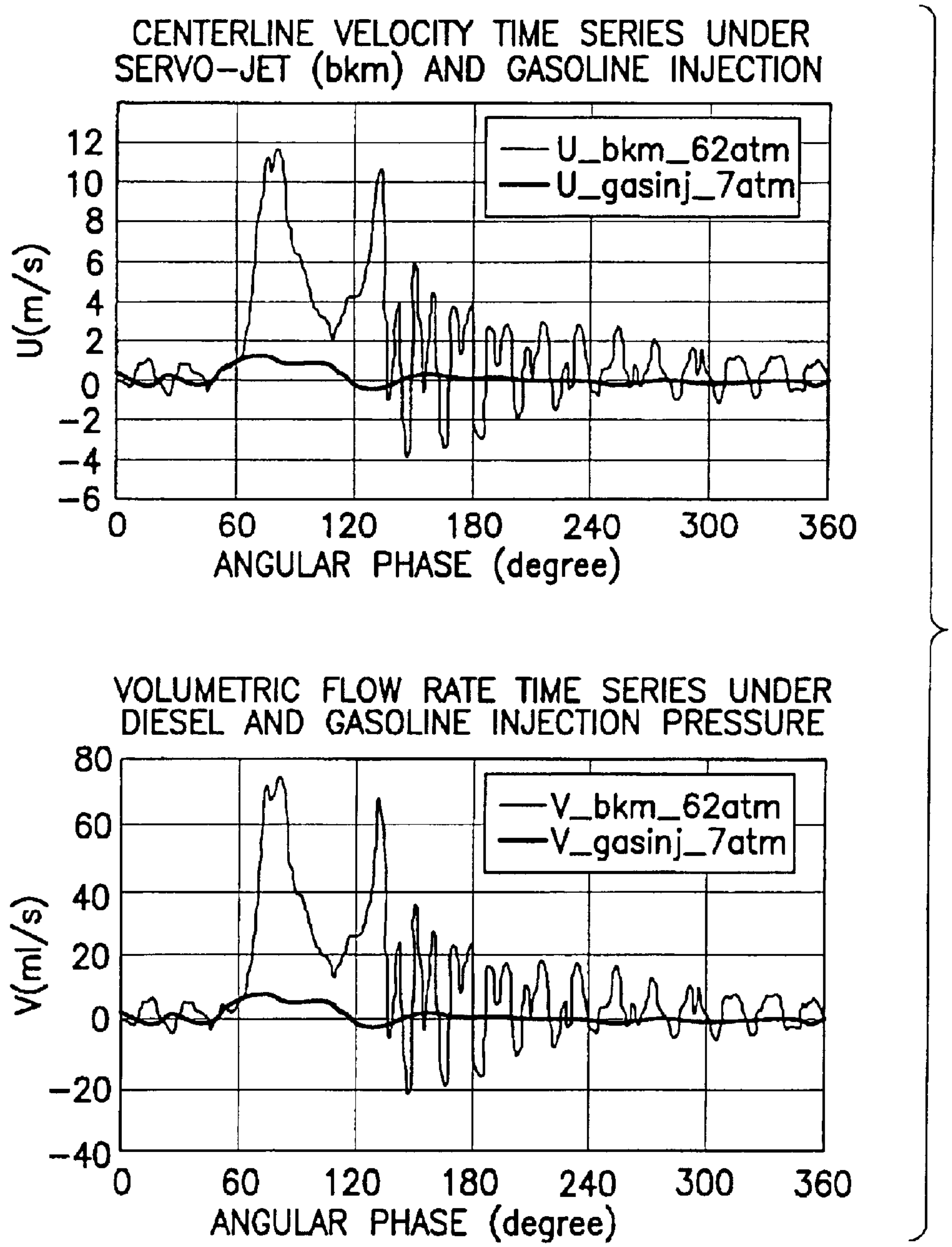

These measurements were objected to align hydraulic and optic systems in order to demonstrate LDA measurements without artificial seeding of the fuel (diesel #2). In FIG. 59 the time dependent centerline velocity and volumetric flow rate time series are plotted for two flows. The first (lower level) was obtained into seeded water flow while it was injected through a gasoline injector, p=7 bar. The second (higher level) is related to injection generated by a servo-jet type system, p=62 bar.

Figure 60:
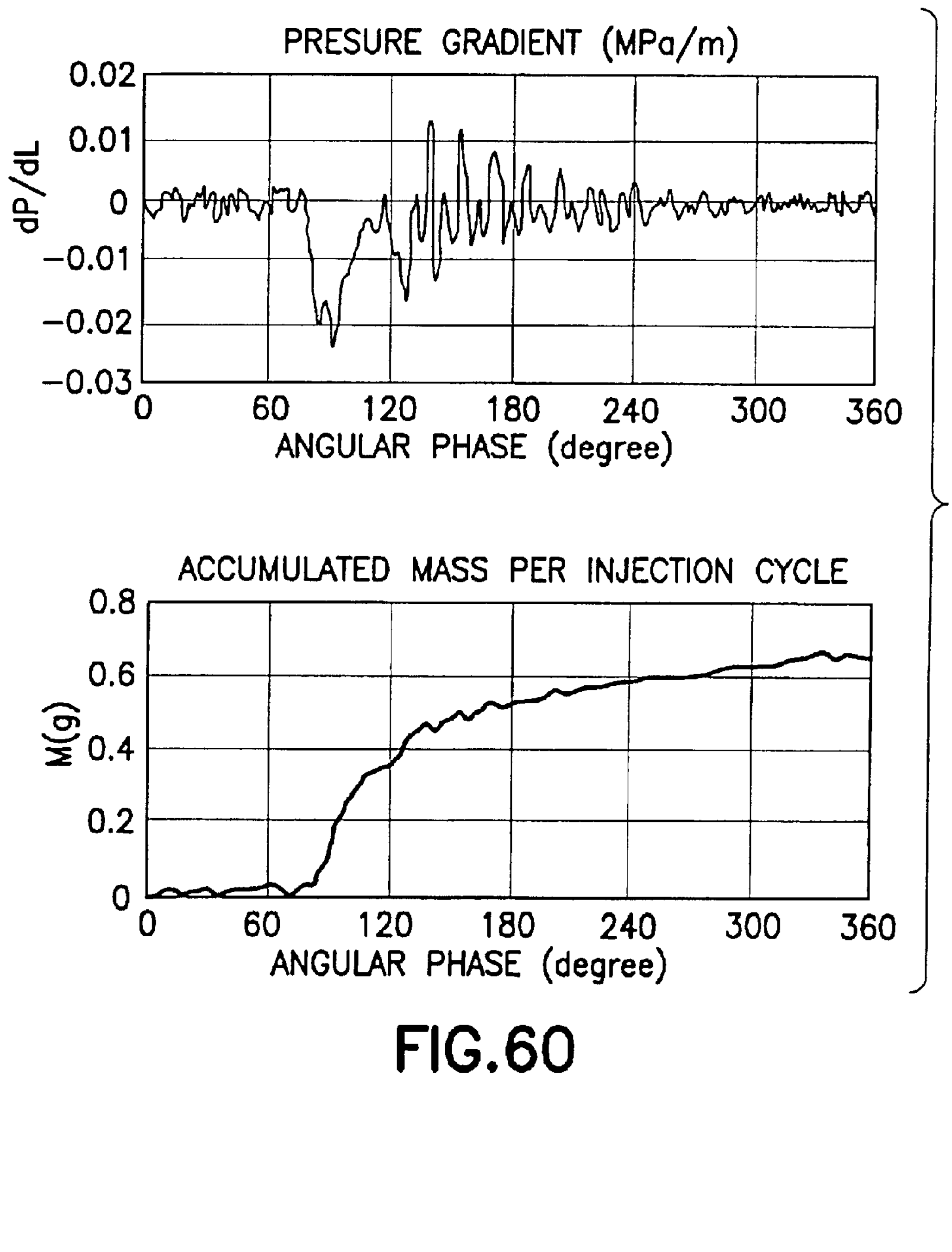

The timing of injection cycle was the same: injection repetition rate of 11 Hz (equal to 1,320 RMP) and duration of 15 ms. This simple comparison of different injection pressures shows that increased pressure is reflected by much more transient fuel flow before active injection phase (before the main rise slope), during injection (zigzag-type point in the rise indicating primary break-up into the fuel spray, and rapid closing of injection—main fall slope), and after injection (post injection oscillations). The velocity and flow rates are increased in one order of magnitude. Next FIG. 60 is related to the servo-jet series of the pressure gradient and occurred into high-pressure fuel upstream of the injector and integrated fuel mass injected per cycle. The fuel is flowing during entire cycle because it flows into return line while the injector triggering solenoid is de-energized.

Figure 61:
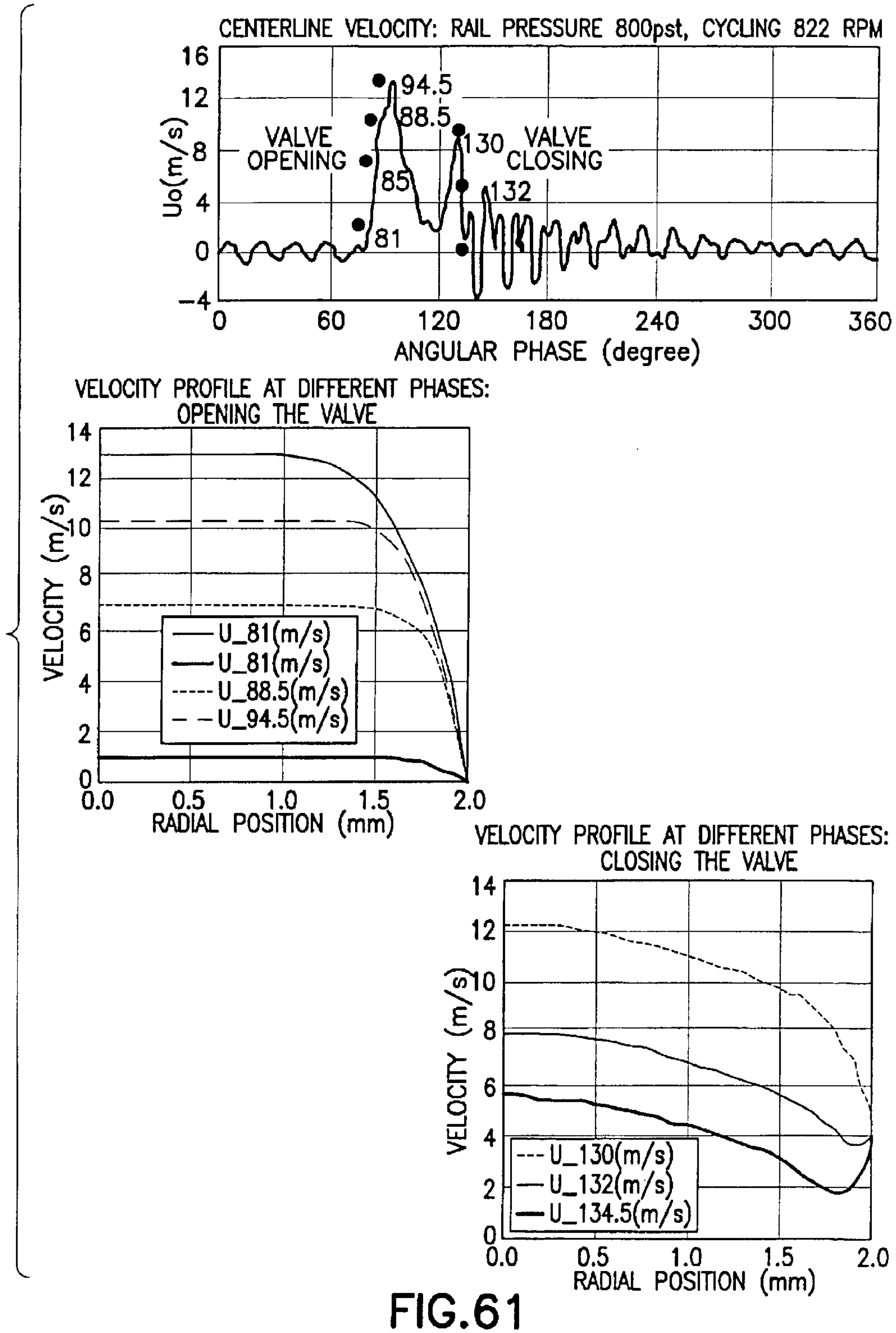

The injection transient dynamics can be characterized also in details related to specifically determined time/angular phases. As illustrated in FIG. 61, there are two parts of the interest. The first is when the injector valve is opening (4 points phased between 81° and 94.5°) and the second is when the injector valve commanded to be closed (3 points phased between 130° and 134.5°). On the bottom part of the picture one can see the dynamics of velocity profiles reconstructed for the same points. The opening process is performed by a series of a rapidly growing flat-type velocity shape in the central vicinity of the pipe flow and a shear stress at the pipe wall. Because the time of the transition is much shorter than viscous time constant, the velocity profile cannot reach a shape of the fully developed turbulent flow. The development process is continued, however the valve is closed. At that moment the velocity profile starts to be reversed at the wall and integration of the profile over the pipe cross section in many cases might result a negative flow rate following by a series of the pressure post-injection oscillations.

High Pressure Injection (Diesel)

Estimated Multiple Injection Masses

Figure 62:
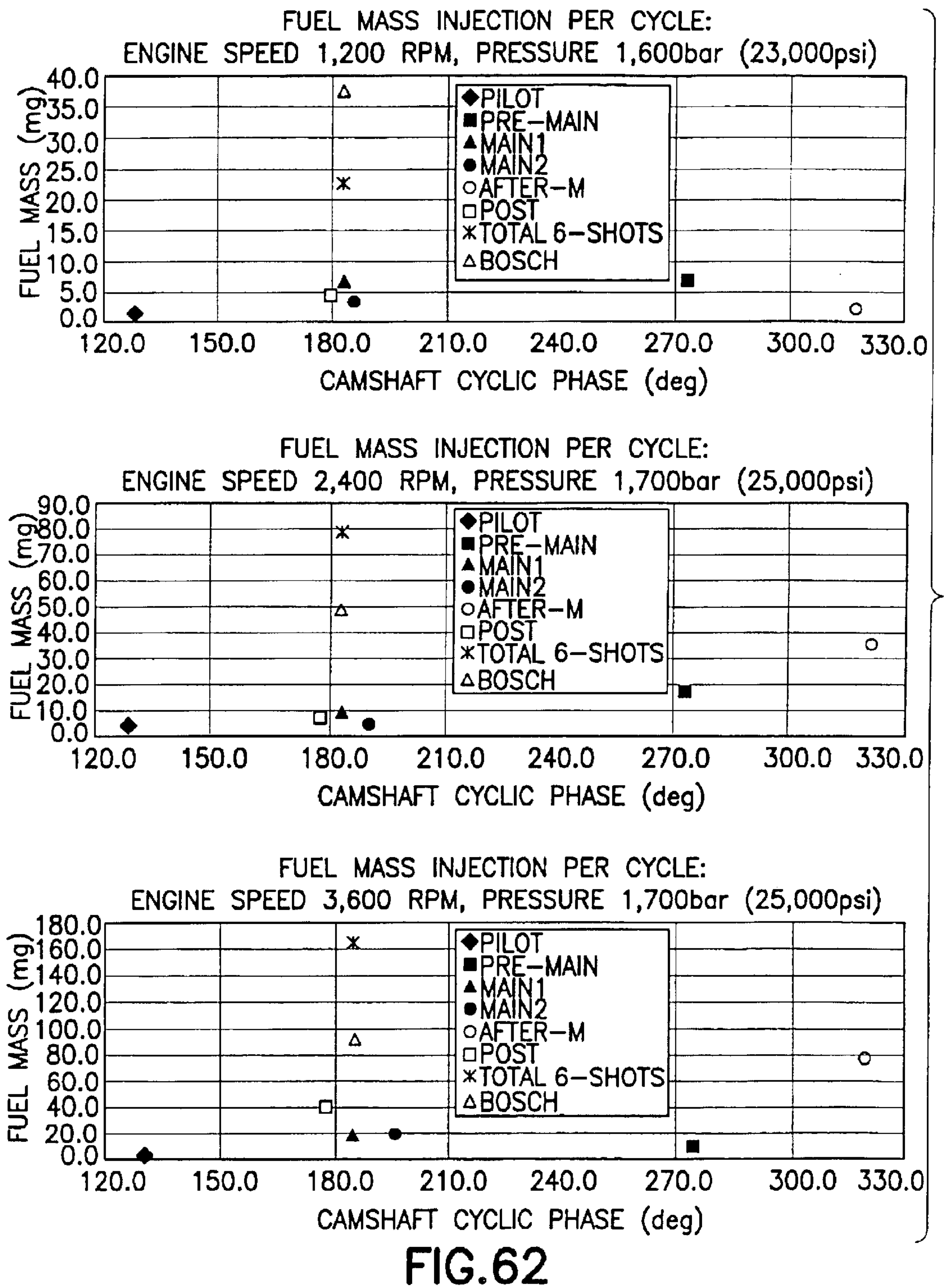

The fuel masses measured for each injection event are illustrated in FIG. 62 as a function of dynamic camshaft cyclic phase obtained from high-speed visualization. A number of conclusions can be drawn down as the following. With increasing engine speed, the values of multiple and single Bosch-type injections are gradually increased. This fact is also true for the measurements at speed of 2,400 and 3,600 rpm where the average pressure in common rail was equal. The smallest fuel mass of 1.1 to 2.7 mg/cycle characterizes the Pilot shot. All sequential three shots, e.g., Pre-Main, Main1 and Main2, are increased with the engine speed, but at low speed the highest mass is related to Main 1. At higher engine speed Pre-Main becomes the dominant. Regarding two last shots, i.e., After-M and Post, at low engine speed the Pre-Main is higher than even Main1 and Post. Increasing speed, the Post injection is increased drastically. For illustration purposes, at the same cyclic phase as the Main1, the integrated injected mass over entire 6-shot cycle and CRIS baseline single shot masses are also plotted. At low engine speed 1-ms referenced injection consumes almost two times more fuel (37.7 mg vs. 22.4 mg) than 6-shot multiple injection while the total actual duration of the last was 1.8 ms. At medium and high engine speed the situation is reversed, i.e., the 6-shot injection results in larger mass than 1-ms single shot injection, mostly due to the increased mass of the Post. It means that the After-M and Post injection duration setups must be decreased from 400 $\mu$s to 200 $\mu$s that could result in a fuel mass decreased in one order of magnitude. It is also important to outline that at the higher engine speed there is no need to have the After-M and Post injections. For instance, 4-shorts injection cycle consumes always fewer fuels than CRIS baseline injection cycle. The minimum measured value of injected mass is 1.2 mg, the maximum is 75.0 mg.

Figure 63:
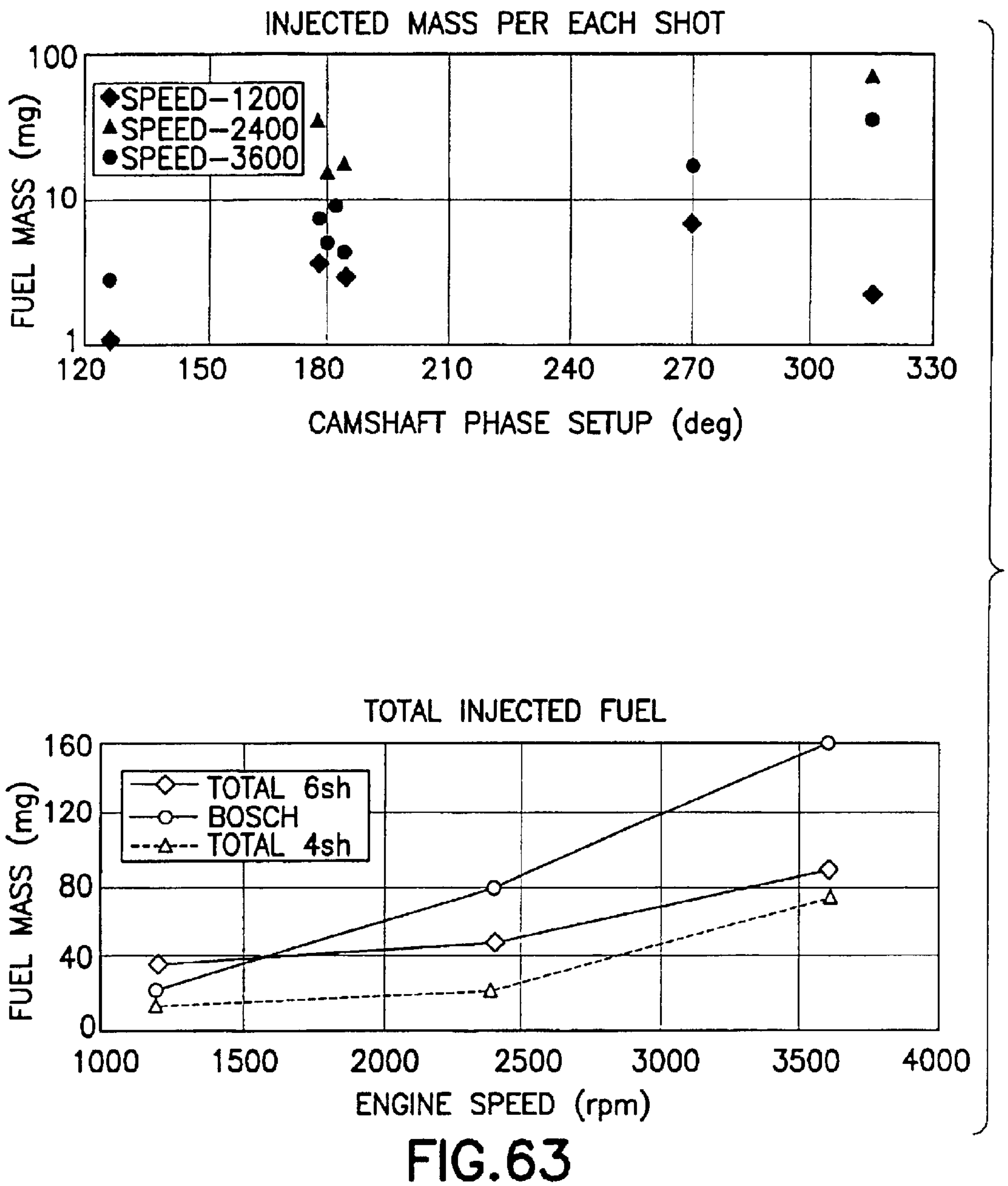

The ROSA-based multiple injection control has very wide dynamic range, which is very important for practical application. Multiple injection dynamics is summarized in FIG. 63. On the top of plot, in order to have better readout resolution, the injected massed are plotted vs. angular phases coded as the electronic setups. As one can see, the increased engine speed increases the injection masses per shot per cycle. On the bottom part of the figure, the total 6- and 4-shot injection and the 1-ms CRIS baseline single shot injections are plotted as function of engine speed. At the higher engine speed not more than 4-shot injection is essentially needed for diesel combustion process. The fuel consumption ratio between 4-shot and single shot injections is 0.35, 0.48 and 0.84 respectively to the engine speed of 1,200/2,400 and 3,600 rpm.

Frequency—Pressure Correlation

The process of high-pressure oscillation in diesel FIS during multiple injection is very complex due to the essential setup of irregular dwell intervals between shots. According to the measurements, the shortest dwells were varied from 0.556 to 1.001 ms observed between Pre-Main and Main 1, Main 1 and Main2, respectively. That results in a high frequency domain of 0.999 to 1.799 kHz. Because other dwells between Pilot/Pre-Main, Main2/After-M, After-M/Post, Post/Pilot are longer (~1–10 ms), the low frequency domain varied from 0.021 to 0.253 kHz can be implied. It is different in one or two orders of magnitude with respect to the high frequency domain. Each harmonics reflects different time delay, pressure recovery time and reaction of CRIS to increased engine speed because each harmonic frequency is doubled or tripled by increasing injection repetition rate, but this multiplication factor is very different for the low and high frequency domains. High timing stability tested during high-speed visualization is due to very stable control of multiple injection in such comprehensive environment.

Figure 64:
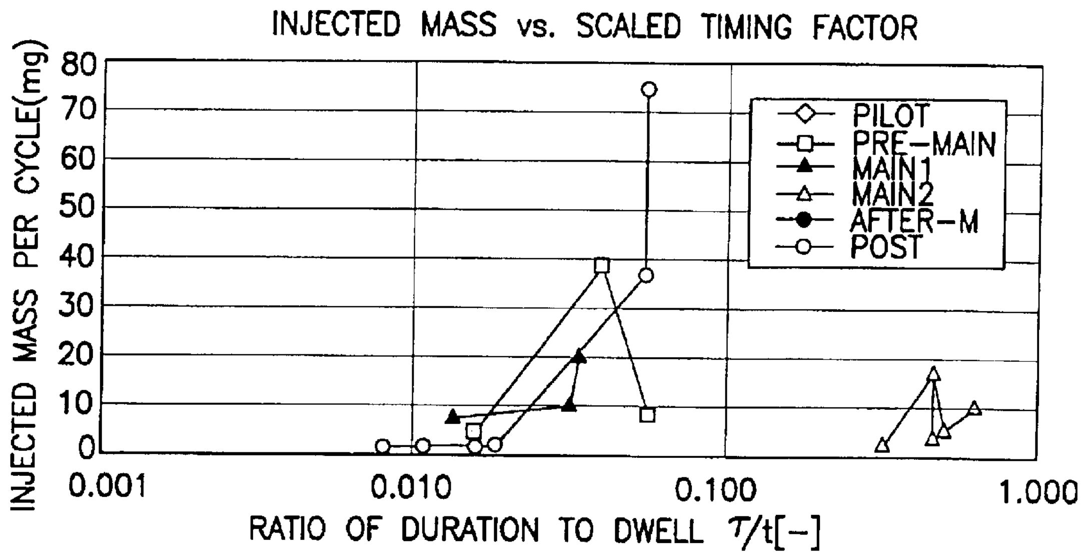

Ratio of the injection duration of each shot τ and dwell interval t suited before this shot plays a key role in control of stable injection. By relating each injection event to the factor of τ/t, the whole data are sorted into low and high frequency domains as shown in FIG. 64. The Main 1 and Main2 high frequency injection events are varied in very small range because for a wider variation they will need higher pressure level to damp pressure distraction at these frequencies of kHz. Reversibly, the low-frequency domain (Pilot, Pre-Main, After-M and Post) is very reactive to the change of any time scale, particularly dealt with engine speed at dwell interval of 3.498 ms (0.253 kHz) related to Post injection at 3,600 RPM. It is also obvious that every shot has own resonator frequency indicated by a spike with increased injection fuel mass at the medium engine speed.

LDA Instantaneous Flow Rates

Figure 65:
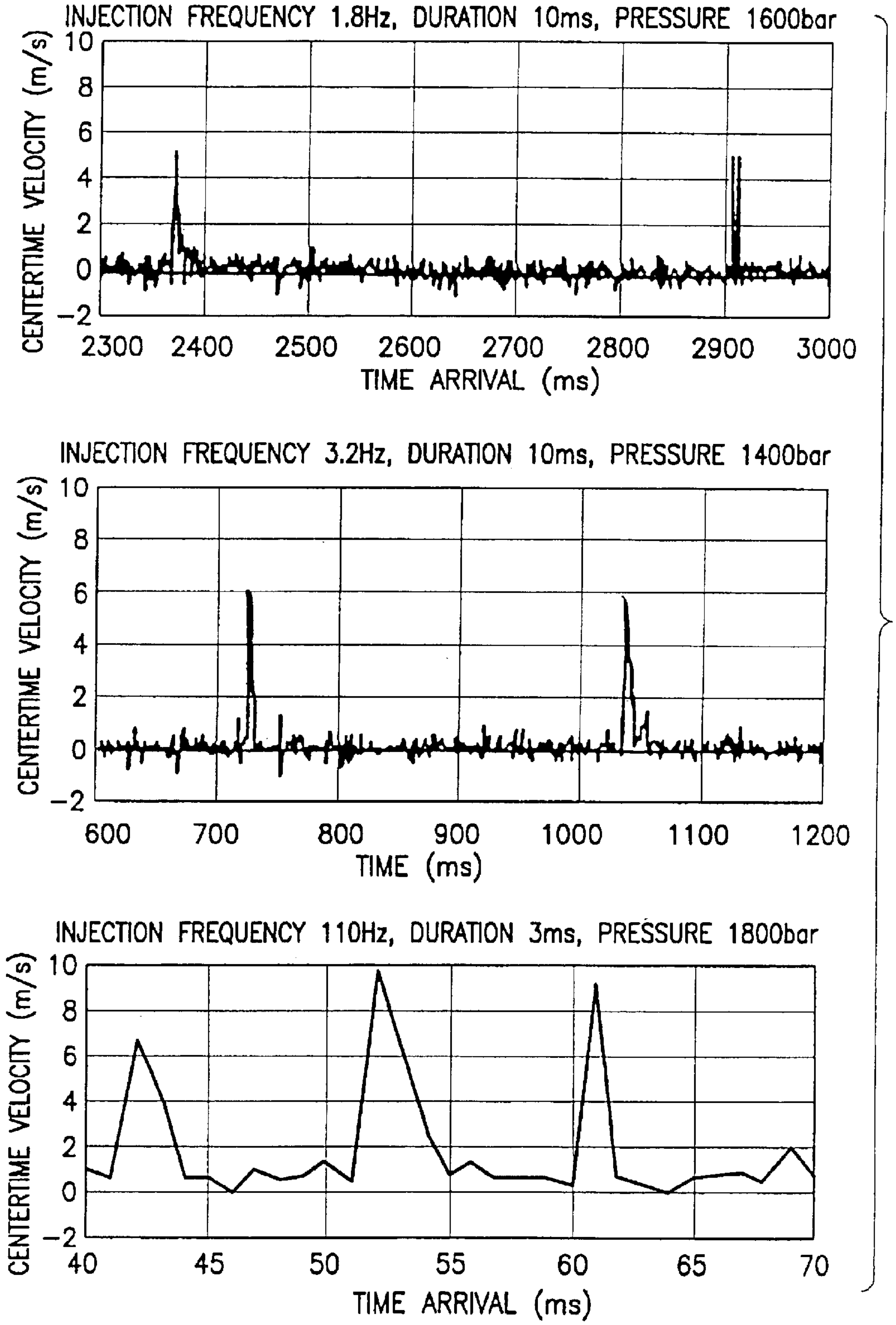

Applied LDA system permits to measure velocity time series either upon time arrival of Doppler bursts (TA-series) or using cyclic phenomena by sorting data according to the cyclic phase within injection cycle (C-series). Obtaining TA-series is important to make a plan for the measurements under various injection timing and pressure conditions and to analyze cycle-to-cycle variability. To illustrate various measurement situations, three single injection TA-series are plotted in FIG. 65. The top of figure related to a low frequency injection 1.8 Hz, injection duration 10 ms, p=1400 bar. In the mid, there is injection generated at frequency 3.2 Hz, duration 10 ms, p=1800 bar. At the bottom, the injection was produced at high frequency 110 Hz, duration of 3 ms, p=1800 bar. Along this order of diagrams, the data rate decreased from 3 kHz down to 51 Hz. That demonstrates that both, pressure and basic injection rate are very critical to have enough data to resolve injection transitions.

Pressure level gradually increases the data rate because increased intensity of the cavitation as expected.

In next four figures FIG. 66 through FIG. 69 the measured data are presented as TA-series phased within the injection period (data rate ~1–10 kHz). The following discussions are focused on four main output parameters produced by the processing code: (i) centerline velocity measured by LDA system, (ii) volumetric flow rate reconstructed through velocity and rms data using capillary pipe geometry and kinetic properties of the fuel, (iii) reconstructed pressure gradient and (iv) accumulated fuel mass. All data are correspondent to the injection cycle repetition rate is 10 Hz (1,200 RPM). In terms of camshaft, 1 ms is equal to 3.60 (100 μs fraction is 0.360).

Figure 66:
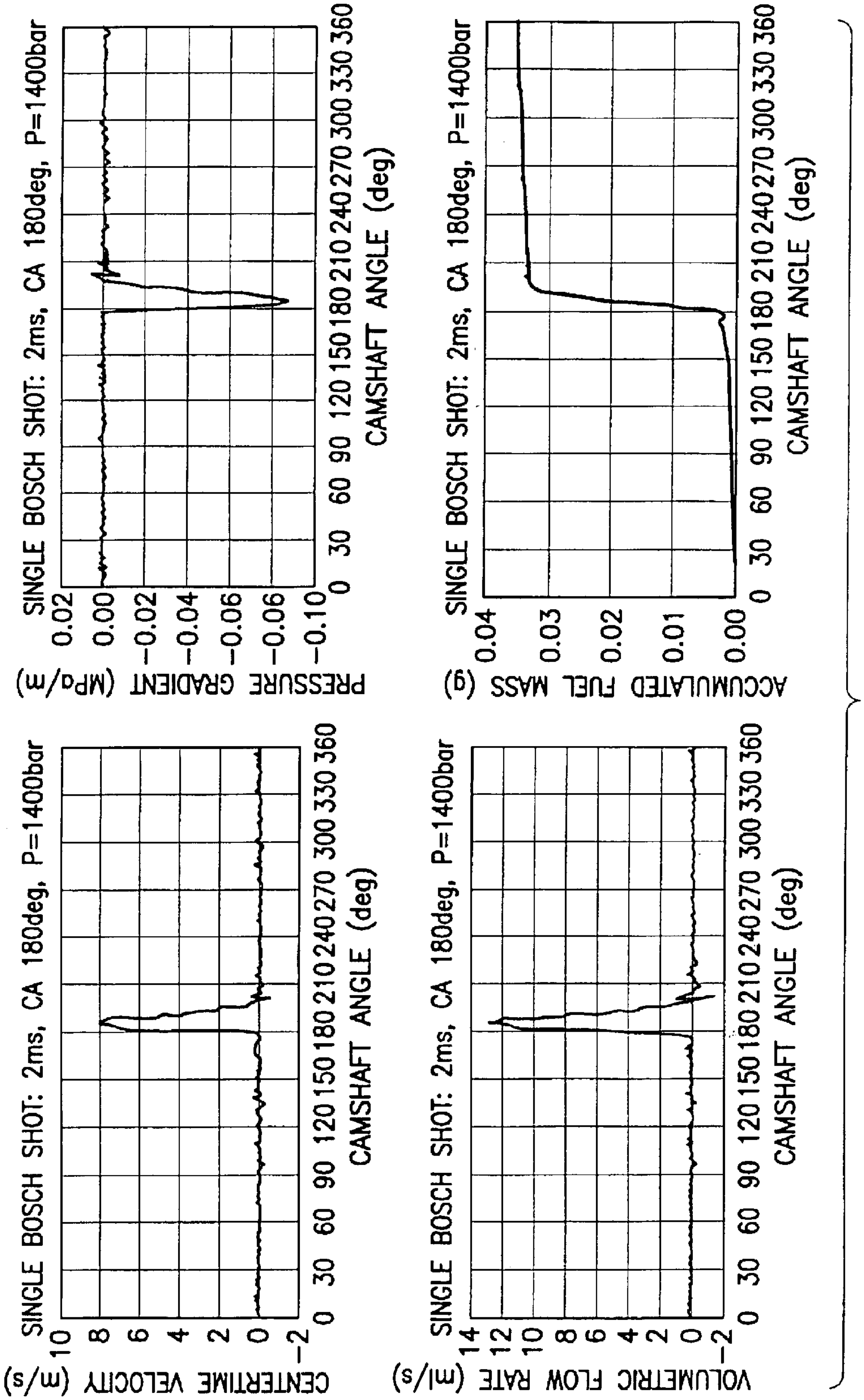

FIG. 66 illustrates injection dynamics generated by a 2-ms reference single injection. The start of injection (SOI) was setup at 180°, p=1400 bar (~22,000 psi). One can see that before and after active injection, the entire dynamics is smooth enough. The injection shaped profile ends by a zigzag spike. The smoothness of this process is due to a low frequency of the pressure wave oscillation; basic oscillatory harmonic is 10 Hz. No other harmonics are occurred within the cycle and the time needed to recover pressure is long enough. Looking at accumulated fuel mass plot in FIG. 66, one can see that some of the fuel is flowing through the measurement intersection before and after active injection phase. Each injection event creates a local negative pressure gradient spike. After active injection, due to accumulated pressure in CR, the fuel flows towards injector through the feed pipe to balance the volume (mass) to be injected in next shot. This recovering balance will be discussed later with regard to 6-shot injection cycle. Its derivative (slope) increases with increased injection pressure, frequency and fuel mass.

Figure 67:
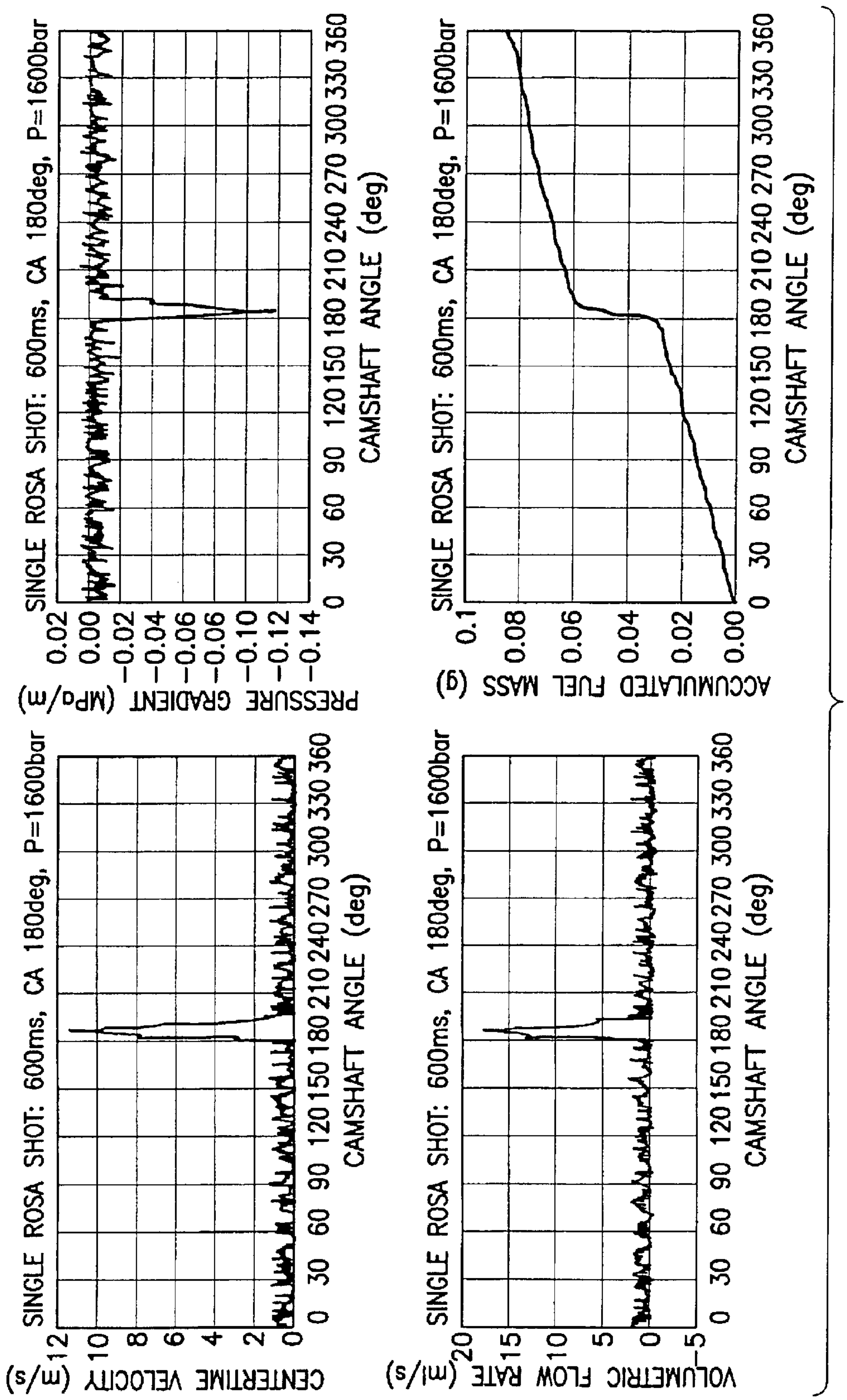

FIG. 67 represents dynamics for ROSA-controlled single injection, duration 600 ms, p=1600 bar. Here, it is possible to distinguish four different elements vs. previous lower pressure and long injection (2-ms single shot reference injection).

Before and after injection there is relatively strong background oscillation that seemed initially like a measurement noise. However, comparing the accumulated mass series in FIG. 66 and FIG. 67, one can conclude that the higher pressure applied in this case causes the higher flow rate. The active injection duration itself characterizes by a cascaded profile meaning that the fuel spray is split into a number of the primary breakup like phases. Duration of the injection profile is obviously shorter than 2-ms injection profile shown in FIG. 66 as supposed. All values of the output parameters are increased due to increased pressure.

Figure 68:
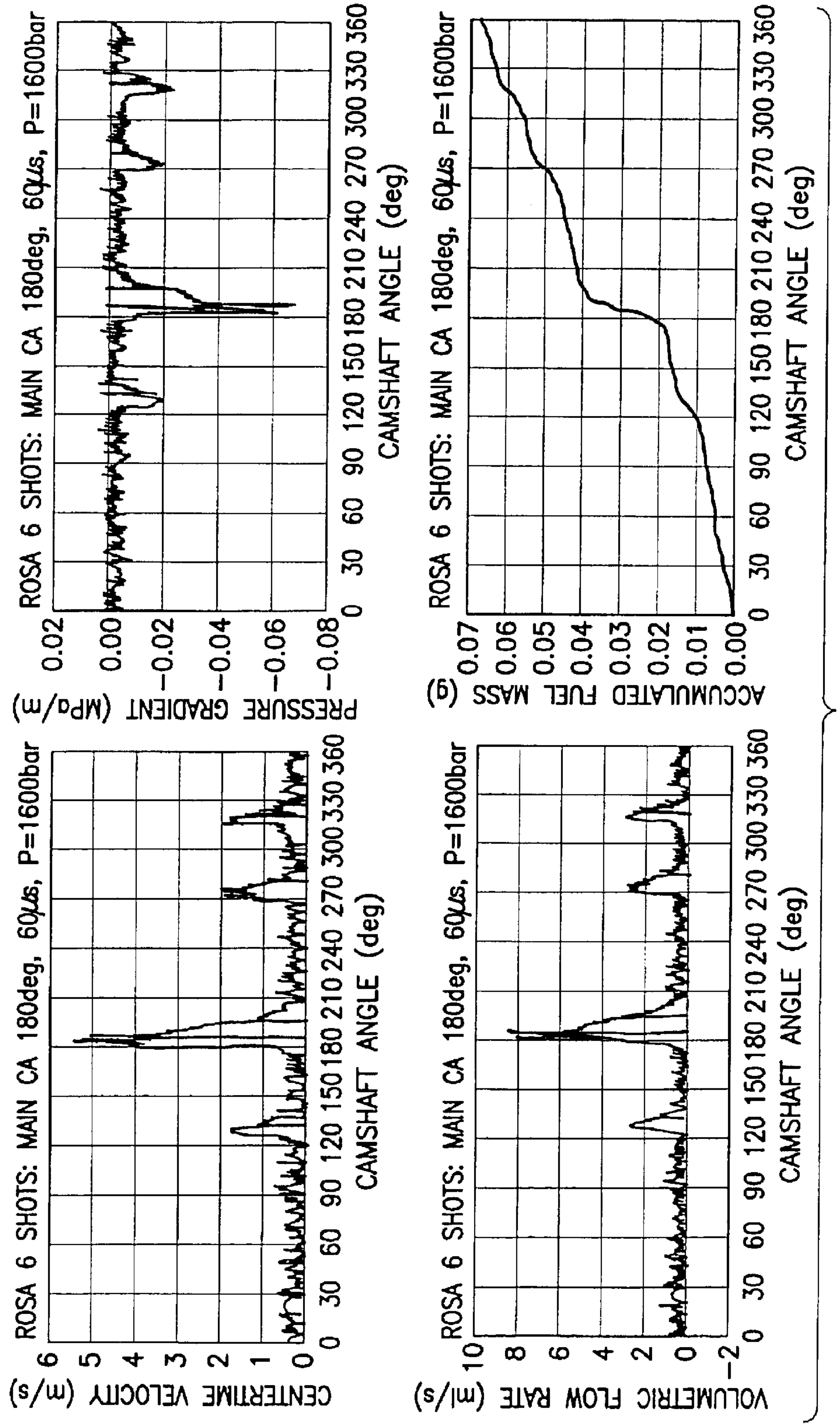

In FIG. 68, ROSA-controlled six shots injection dynamics is presented by TA-series. The SOI setups for each injection event were 126°, 173°, 180°, 192°, 270° and 315°, respectively to the Pilot, Pre-Main, Main 1, Main2, After-M and Post injection shots. According to the flow rate measurement, these phases are 126°, 175°, 182°, 186°, 270° and 315°. All events having long dwell interval before the shot are characterized by exact time/angular phase that was electronically setup; there is enough time to recover the pressure loss. Wise versa, in vicinity of 180° where three shots (Pre-M, Main1 and Main2) are setup closely (dwells 300 and 400 μs), the phases are shifted relatively to the initial SOI sets because pressure needs a time comparable with the delay constant (300 μs). The sequential injection events can be well seen from the accumulated mass series represented by a cascade; the number of cascaded stages is equal to the number of injection shots.

Figure 69:
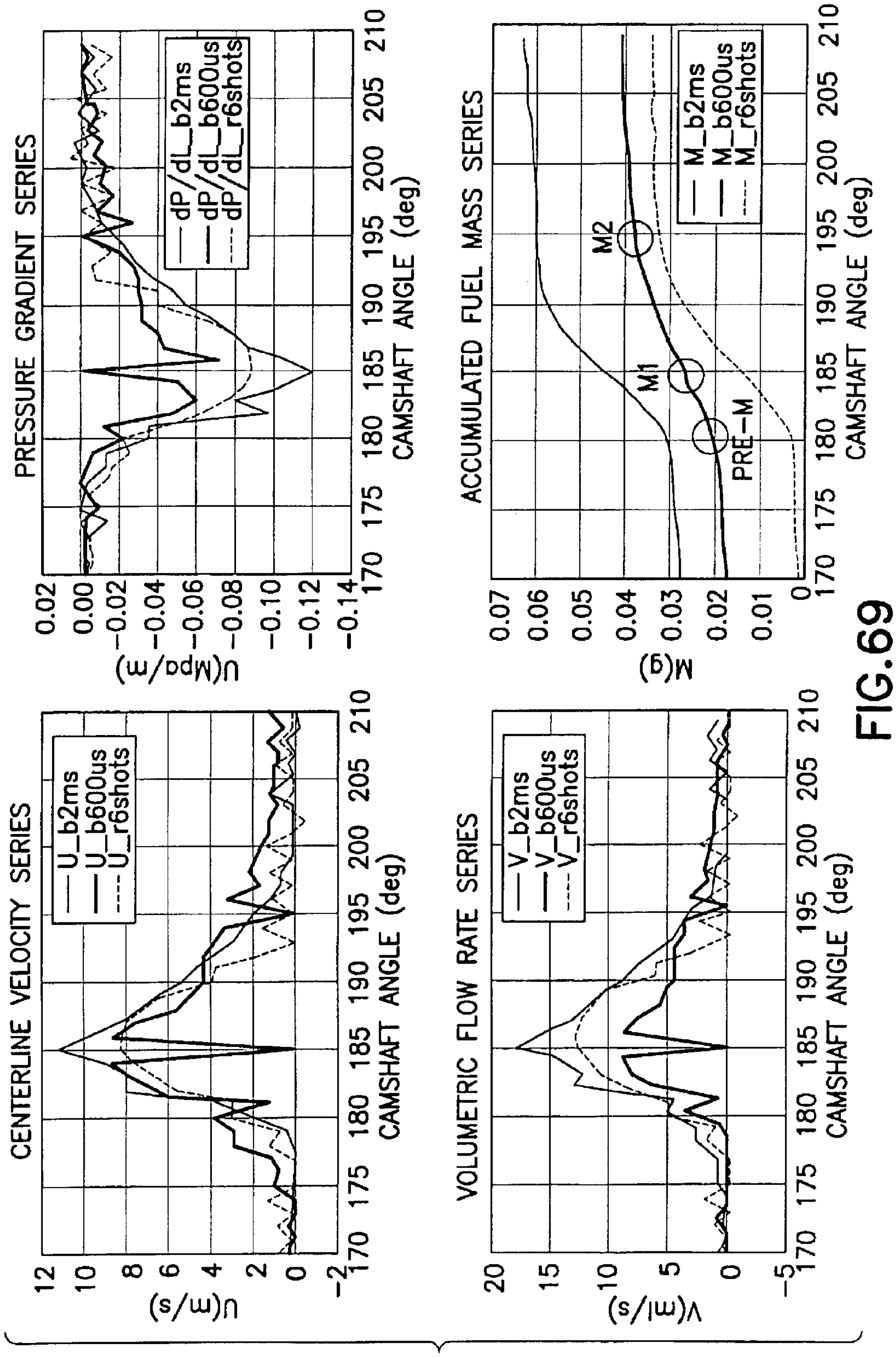

FIG. 69 shows details of all three injection series plotted together with a higher angular resolution. In velocities cycles, the peaks related to the referenced 2-ms single injection at 1400 bar has the same level that ROSA six-shot injection at 1600 bar, so the multiple injection requires increased either the high-pressure level or dwell intervals for pressure recover.

The peak flow rate per each shot is decreased during multiple injection while the pressure increased up to 1600 bar vs. 2-ms single shot injection at 1400 bar. In the accumulated mass series, in multiple injection line one can see three flatted stages corresponding to the Pre-M, Main 1 and Main2 events.

For obtaining the fuel masses injected per each individual event during multiple injection shown in FIG. 68 the injection cycle was split into 11 intervals including 6 active and 5 passive injection intervals related to the injection and no-injection (recovering balance) stages. This instantaneous flow rate measurements were made with accuracy of −4.6% according to eq. (14), i.e., mass measured by LDA system vs. direct mass balance rating.

The results of integration are reflected in FIG. 70. Within accuracy of LDA measurements, the mass injected (38.17 mg) is almost equal to the mass (34.25 mg) that was delivered to the feed pipe (recovering balance). The smallest amount of fuel 4.18 mg was injected during Pilot shot, the largest 11.65 mg was during Main2 shot. The cyclic resolution was setup at 360 bins per cycle. Increasing it to 3600 bins, the injection mass resolution can be about 1 $\mu$g. ROSA control was set to resolve the wave form generation with resolution of 0.01 V, so increasing it to 0.001 V, the multiple injection control can resolve mass dosing at the level of 0.01 mg. Such level of control requires a high data rate over 10 kHz that can be technically reached at the injection pressure level >1600 bar and injection frequency <60 Hz (7,200 RPM).

Conclusions Regarding Quantification of Instantaneous Diesel Flow Rates in Flow Generated by a Stable and Controllable Multiple Injection System According to the two objectives stated above, the conclusions are also grouped into two parts:

Instrumentation

To test fuel dynamics generated by ROSA-controlled multiple injection system, a laser Doppler anemometer (LDA)-based system was constructed and applied to obtain instantaneous volumetric/mass flow rates measured in a CRIS-type diesel injection system and processed using laminar and turbulent oscillatory pipe flow models. The high-pressure flow passed through a specially constructed transparent intersection in which press-fit steel-quartz tube cell was hermetically installed for introducing laser beams. No seeding particles were implemented for LDA measurements due to the nature of the high-pressure oscillatory pipe flow. High data rate permitted to resolve each injection event, i.e., its timing characteristics and masses distributed within injection cycle. Time arrival- and cyclic-type data were obtained and sorted upon the angular phase and processed to obtain time/angular resolved series of (i) flow rate, (ii) pressure gradient and (iii) integrated mass related to individual injections. This flow metering system was applied to a particular CR-type diesel injection system. But it is also applicable, for example, to any high-pressure FIS operating under injection pressure over 40 bar (600 psi): gasoline GDI- and diesel EUI- and HEUI-type systems. Such calibration stand can be used for the test, improvement, verification and certification of a variety of FIS components including injector itself. The technique provides wide dynamic range and high temporal resolution for flow rate measurements, including rapid transient reversible flow occurred during multiple injection cycle.

ROSA Performance

The mass rated measurements of individual fuel masses injected during multiple injection controlled by ROSA-CRIS test system are shown promising results both in fuel dosing and injection control using low- and high-frequency domains associated with pressure wave propagation harmonics.

The wide dynamic range (max-to-min) of the injected masses and well separated low and high frequency pressure oscillation domains provide a good validation for ROSA-type control in entire range of the engine speed, injection duration and setups of critical ultra-short dwells between injection events. ROSA injection control system produces highly stable phasing and duration of the multi-shot injection within 30 $\mu$s as it was also detected by means of high-speed visualization of diesel sprays. The smallest mass injected is 4 mg, the largest is 18 mg. The mass distribution per each shot can be accurately controlled by ROSA system at the level as low as 0.5 mg by means of injection pressure, frequency and dwell/duration timing of the shots with the high measurable accuracy ~0.01 mg.

While a number of embodiments of the present invention have been described, it is understood that these embodiments are illustrative only, and not restrictive, and that many modifications may become apparent to those of ordinary skill in the art. For example, the code routines may be written in Fortran, a Fortran-like program, and/or any other program that will produce coding of all phases and shapes to generate special waveforms (including, for example, the I-Function rise and fall fraction). Further, a special library may be written (e.g., in compressed form) for easy translation library into hardware (e.g., an ECU) for further call type functionality. Further still, such a library may permit a variety of physically manufactured secondary coil drivers for different automotive applications (e.g., injectors, valvetrains and/or other rapidly operating actuators).

What is claimed is:

1. A method for constructing a circuit for controlling an electromagnetic actuator, which electromagnetic actuator includes a coil having associated therewith a resistance $R_1$ and an inductance $L_1$, comprising:

modeling the electromagnetic actuator with an equation;

calculating at least one resistance $R_{2j}$ and at least one inductance $L_{2j}$, each of which is associated with at least one theoretical coil electrically connected to and physically remote from the electromagnetic actuator, wherein the resistance $R_{2j}$ and the inductance $L_{2j}$ are calculated by satisfying the equation using at least the function:

$$I_F(t) = \exp^{\frac{\omega_{21} t}{\sum_j \left[\exp\left(\omega_{22j} t - \varphi_j^{open}\right)\right] + \sum_j \left[\exp\left(\omega_{22j} t - \varphi_j^{close}\right)\right]}}$$

where $\omega_{21}$ equals $2\pi R_1/L_1$, $\omega_{22j}$ equals $2\pi R_{2j}/L_{2j}$; $\phi_j^{open}$ is a switching on phase, $\phi_j^{close}$ is a switching off phase, and j identifies a particular theoretical coil; and electrically connecting current supply means to the coil of the electromagnetic actuator, which current supply means are configured to substantially simulate the electrical effect of each theoretical coil having the calculated resistance $R_{2j}$ and the calculated inductance $L_{2j}$.

2. The method of claim 1, wherein j=1 and the resistance $R_{2j}$ and the inductance $L_{2j}$ are calculated by satisfying the equation using at least the function:

$$I_F(t) = e^{\frac{\omega_{21} t}{\exp(\omega_{22} t)}}$$

3. The method of claim 1, wherein the equation is a differential equation.

4. The method of claim 3, wherein the equation is a second-order non-homogeneous ordinary differential equation.

5. The method of claim 1, wherein the current supply means includes j number of coils, each having a resistance equal to substantially the calculated resistance $R_{2j}$ and each having an inductance equal to substantially the calculated inductance $L_{2j}$.

6. The method of claim 1, wherein the current supply means includes a coil having substantially the sum of each calculated resistance $R_{2j}$ and substantially the sum of each calculated inductance $L_{2j}$.

7. The method of claim 1, wherein the current supply means includes computer code.

8. The method of claim 7, wherein the computer code includes at least one of: (a) software; and (b) firmware.

9. The method of claim 1, further comprising determining the resistance $R_1$ and the inductance $L_1$.

10. The method of claim 9, wherein the step of determining the resistance $R_1$ and the inductance $L_1$ comprises measuring the resistance $R_1$ and the inductance $L_1$.

11. The method of claim 1, wherein each resistance $R_{2j}$ and each inductance $L_{2j}$ is calculated by selecting a desired value for one and determining a value for the other which satisfies the equality $\omega_{22j}$ equals $2\pi R_{2j}/L_{2j}$.

12. The method of claim 1, wherein each resistance $R_{2j}$ and each inductance $L_{2j}$ is calculated based upon a desired time-dependent action of the electromagnetic actuator.

13. The method of claim 1, wherein each resistance $R_{2j}$ and each inductance $L_{2j}$ is calculated based upon a desired frequency-dependent action of the electromagnetic actuator.

14. A method for designing a circuit for controlling an electromagnetic actuator, which electromagnetic actuator includes a coil having associated therewith a resistance $R_1$ and an inductance $L_1$, comprising:

modeling the electromagnetic actuator with an equation; and calculating at least one resistance $R_{2j}$ and at least one inductance $L_{2j}$, each of which is associated with at least one theoretical coil electrically connected to and physically remote from the electromagnetic actuator, wherein the resistance $R_{2j}$ and the inductance $L_{2j}$ are calculated by satisfying the equation using at least the function:

$$I_F(t) = \exp^{\frac{\omega_{21} t}{\sum_j \left[\exp\left(\omega_{22j} t - \varphi_j^{open}\right)\right] + \sum_j \left[\exp\left(\omega_{22j} t - \varphi_j^{close}\right)\right]}}$$

where $\omega_{21}$ equals $2\pi R_1/L_1$, $\omega_{22j}$ equals $2\pi R_{2j}/L_{2j}$; $\phi_j^{open}$ is a switching on phase, $\phi_j^{close}$ is a switching off phase, and j identifies a particular theoretical coil.

15. The method of claim 14, wherein j=1 and the resistance $R_{2j}$ and the inductance $L_{2j}$ are calculated by satisfying the equation using at least the function:

$$I_F(t) = e^{\frac{\omega_{21} t}{\exp(\omega_{22} t)}}$$

16. The method of claim 14, wherein the equation is a differential equation.

17. The method of claim 16, wherein the equation is a second-order non-homogeneous ordinary differential equation.

18. The method of claim 14, further comprising determining the resistance $R_1$ and the inductance $L_1$.

19. The method of claim 18, wherein the step of determining the resistance $R_1$ and the inductance $L_1$ comprises measuring the resistance $R_1$ and the inductance $L_1$.

20. The method of claim 14, wherein each resistance $R_{2j}$ and each inductance $L_{2j}$ is calculated by selecting a desired value for one and determining a value for the other which satisfies the equality $\omega_{22j}$ equals $2\pi R_{2j}/L_{2j}$.

21. The method of claim 14, wherein each resistance $R_{2j}$ and each inductance $L_{2j}$ is calculated based upon a desired time-dependent action of the electromagnetic actuator.

22. The method of claim 14, wherein each resistance $R_{2j}$ and each inductance $L_{2j}$ is calculated based upon a desired frequency-dependent action of the electromagnetic actuator.

* * * * *